United States Patent [19]
Almquist et al.

[11] Patent Number: 6,027,682
[45] Date of Patent: *Feb. 22, 2000

[54] THERMAL STEREOLITHOGRAPHY USING SLICE TECHNIQUES

[75] Inventors: Thomas A. Almquist, San Gabriel; Dennis R. Smalley, Newhall, both of Calif.

[73] Assignee: 3D Systems, Inc., Valencia, Calif.

[ * ] Notice: This patent is subject to a terminal disclaimer.

[21] Appl. No.: 09/080,981

[22] Filed: May 19, 1998

Related U.S. Application Data

[63] Continuation of application No. 08/795,166, Feb. 10, 1997, which is a continuation of application No. 08/299,887, Sep. 1, 1994, Pat. No. 5,776,409, which is a continuation-in-part of application No. 08/148,544, Nov. 8, 1993, Pat. No. 5,501,824, which is a continuation of application No. 07/900,001, Jun. 17, 1992, abandoned, which is a continuation of application No. 07/592,559, Oct. 4, 1990, Pat. No. 5,141,680, and a continuation-in-part of application No. 07/861,210, Mar. 31, 1992, Pat. No. 5,345,391, which is a continuation of application No. 07/331,644, Mar. 31, 1989, Pat. No. 5,184,307, which is a continuation-in-part of application No. 07/269,801, Nov. 8, 1988, abandoned, which is a continuation-in-part of application No. 07/182,830, Apr. 18, 1988, Pat. No. 5,059,359.

[51] Int. Cl.$^7$ .............................. B29C 35/08; B29C 41/02
[52] U.S. Cl. .................... 264/401; 264/308; 364/468.27; 425/135; 425/174.4; 425/375
[58] Field of Search ................................. 264/40.1, 40.7, 264/225, 308, 401; 425/135, 145, 147, 174.4, 375; 364/468.27

[56] References Cited

U.S. PATENT DOCUMENTS

| | | |
|---|---|---|
| 4,247,508 | 1/1981 | Householder . |
| 4,575,330 | 3/1986 | Hull . |
| 4,665,492 | 5/1987 | Masters . |
| 4,749,347 | 6/1988 | Valavaara . |
| 4,863,538 | 9/1989 | Deckard . |
| 4,999,143 | 3/1991 | Hull et al. . |
| 5,059,266 | 10/1991 | Yamane et al. . |
| 5,121,329 | 6/1992 | Crump ................................ 264/401 X |
| 5,134,569 | 7/1992 | Masters . |
| 5,136,515 | 8/1992 | Helsinki . |
| 5,140,937 | 8/1992 | Yamane et al. . |
| 5,141,680 | 8/1992 | Almquist et al. ....................... 264/401 |
| 5,216,616 | 6/1993 | Masters . |
| 5,340,433 | 8/1994 | Crump . |

FOREIGN PATENT DOCUMENTS

| | | |
|---|---|---|
| 250121 | 12/1987 | European Pat. Off. . |
| 426363 | 5/1991 | European Pat. Off. . |
| 2583333 | 12/1986 | France . |
| 5-11751 | 3/1989 | Japan . |

OTHER PUBLICATIONS

Wohlers, T., Cadence, "Plastic Models in Minutes", pp. 101–104 (Jul. 1990).

*Flexible Automation*, "Stratasys Makes 3D Models in Minutes", pp. 6–7 (Jul. 1990).

*Production*, "No–Mess Modeling in Minutes", p. 16 (Aug. 1990).

Primary Examiner—Leo B. Tentoni
Attorney, Agent, or Firm—A. Sidney Alpert; Ralph D'Alessandro

[57] ABSTRACT

The invention involves an improved system for producing a three-dimensional object by forming successive cross-sections of the object from a material which is normally solid but which may be made flowable, including using data manipulation for converting a three-dimensional object representation into cross-sectional representations.

10 Claims, 133 Drawing Sheets

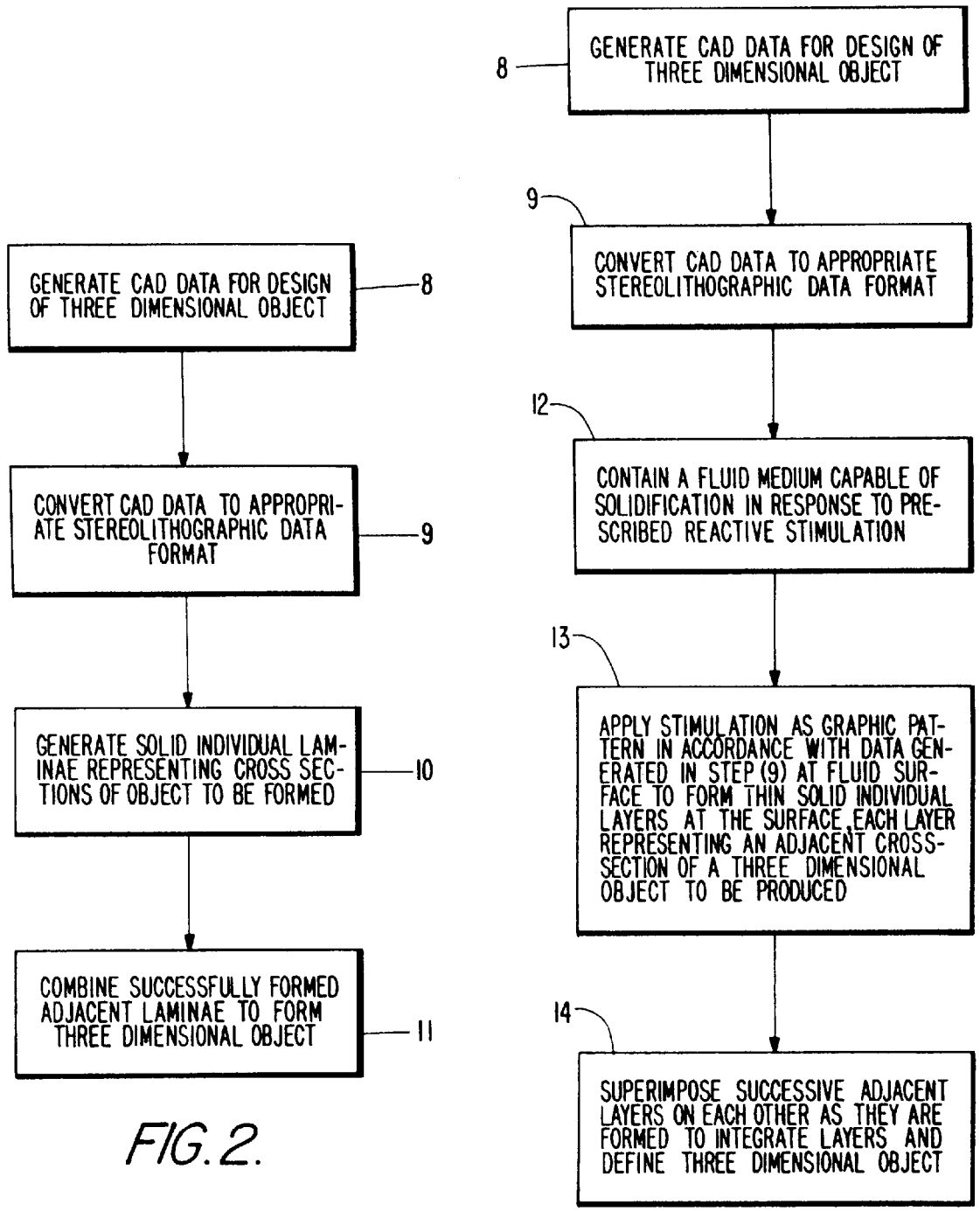

MAJOR COMPONENTS OF THE STEREOLITHOGRAPHY SYSTEM

MAJOR COMPONENTS OF THE STEREOLITHOGRAPHY SYSTEM

THE SLA-1 LASER AND OPTICAL SYSTEM

SOFTWARE DIAGRAM OF STEREOLITHOGRAPHY SYSTEM

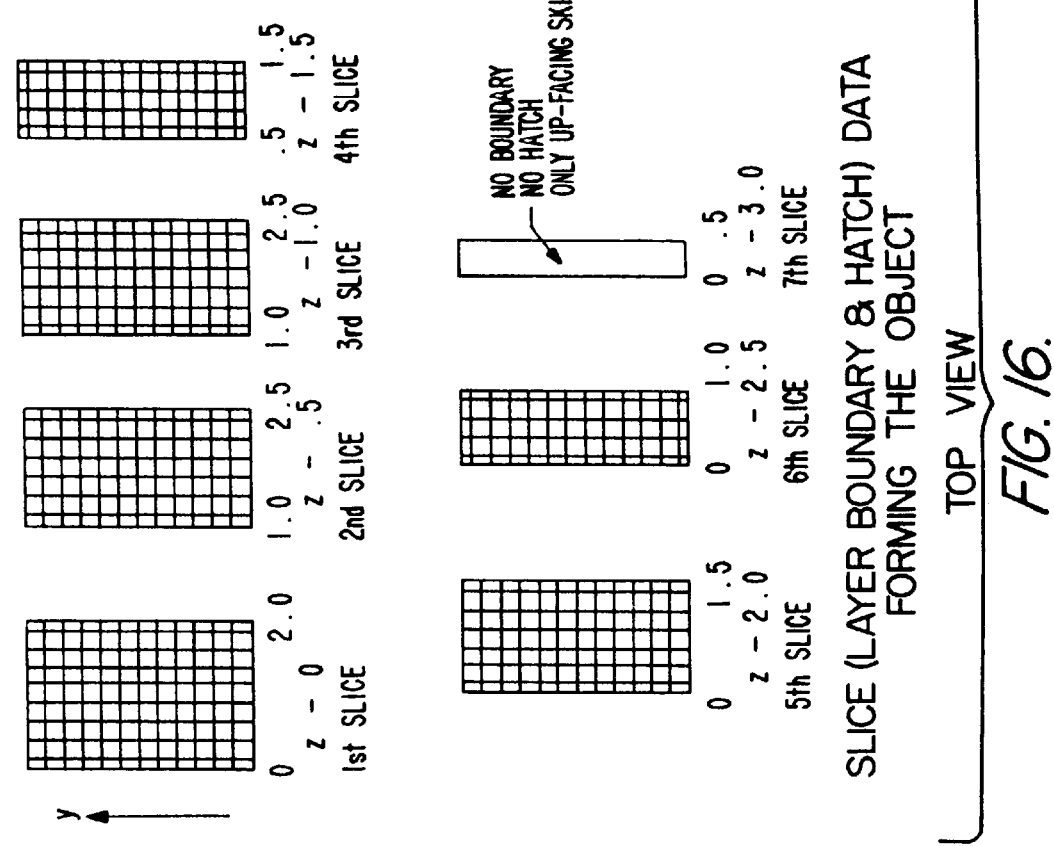
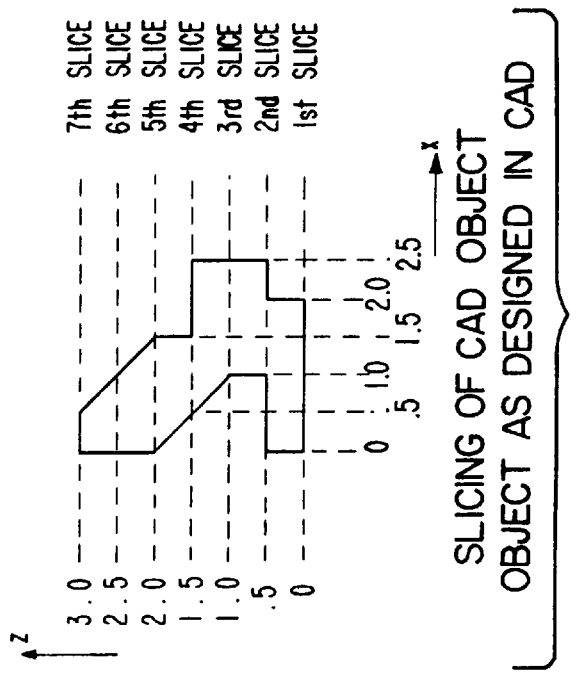
FIG. 16.
SLICE (LAYER BOUNDARY & HATCH) DATA FORMING THE OBJECT
TOP VIEW
FIG. 15.
SLICING OF CAD OBJECT
OBJECT AS DESIGNED IN CAD

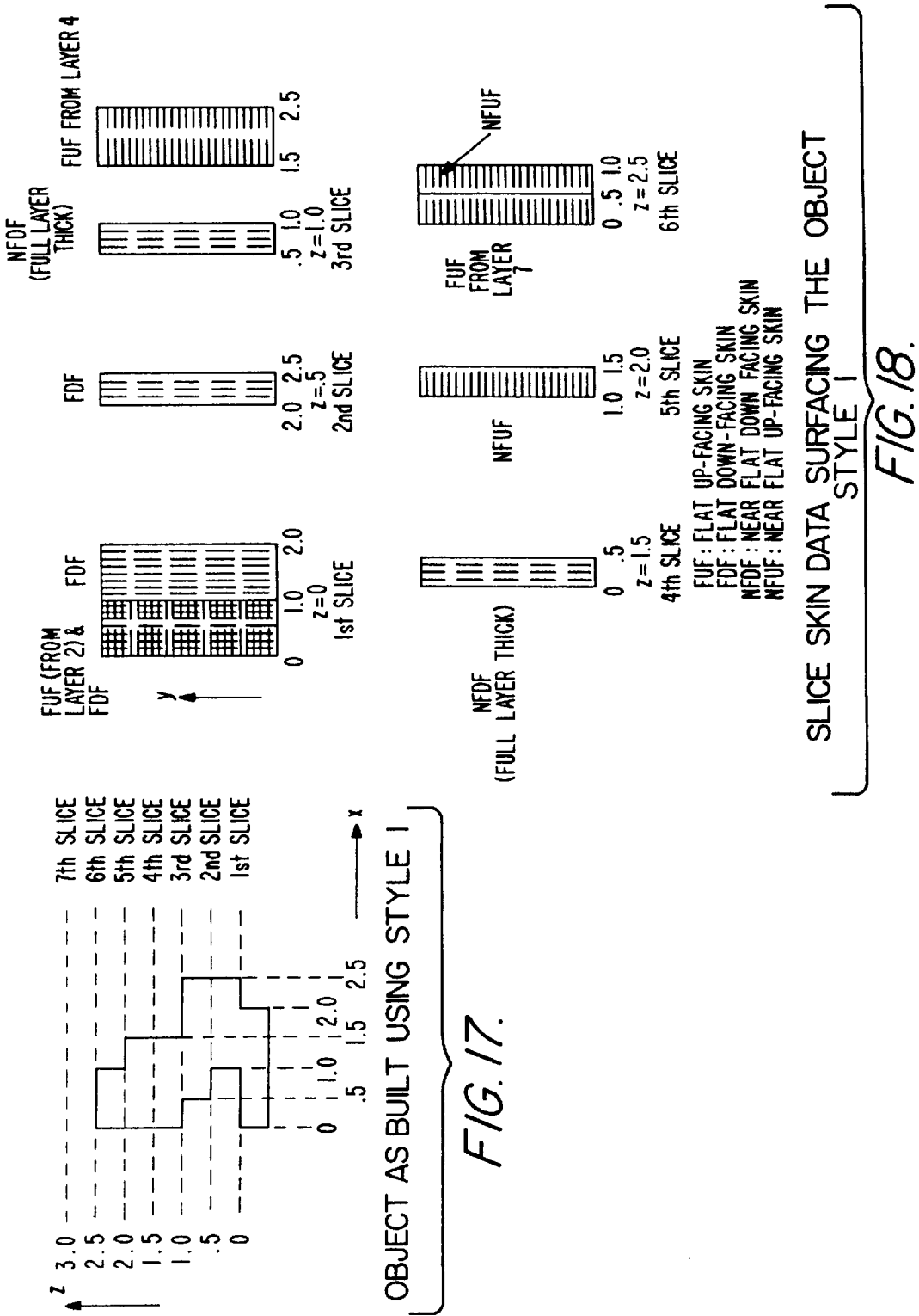

SOLID OCTAGON CYLINDER
NO. OF FACETS: 28

HOLLOW CUBE
NO. OF FACETS: 32

SOLID CUBE
NO. OF FACETS: 12 facets generated by CAD
in gridded space

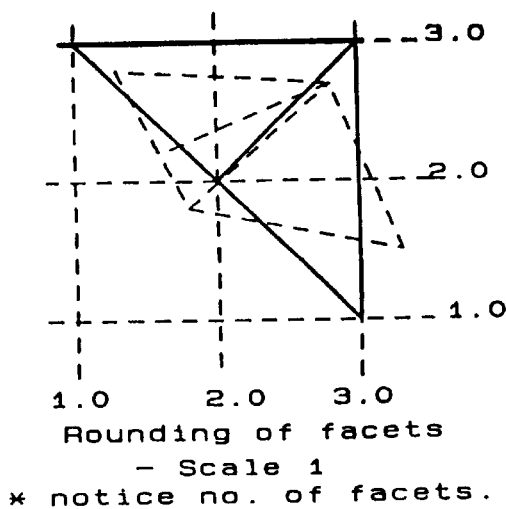
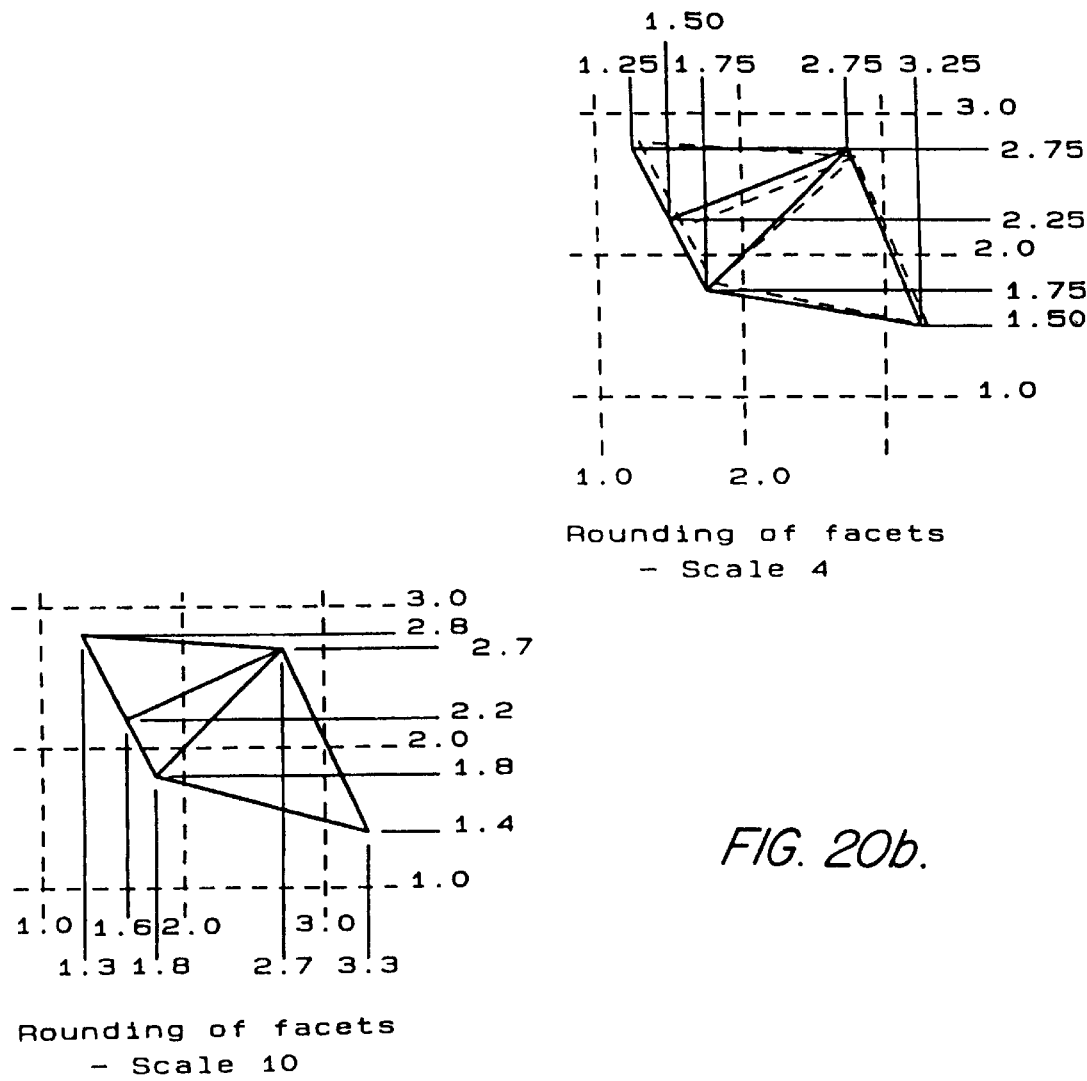
FIG. 20b.

SAME FACETS AFTER ROUNDING OF FACETS IN THE VERTICAL TO SLICING LAYERS—20 MIL LAYER THICK

5 MIL LAYER THICK

CAD GENERATED FACETS AFTER ROUNDING OF FACETS BASED ON SCALE FACTOR

FACETED CAD DESIGN OBJECT

SAME OBJECT SLICED AT
20 mil THICK LAYERS

VARIABLE LAYER THICKNESS OF 5 mil AND 20 mil

VIEW OF A CAD DESIGNED OBJECT WITH INTERNAL FEATURES (WINDOWS) AFTER ROUNDING HAS OCCURRED

VIEW OF THE SAME OBJECT AFTER BEING BUILT FROM OBTAINING BOUNDARY VECTORS AT THE SLICING LAYER

VIEW OF THE SAME OBJECT AFTER BEING BUILT FROM OBTAING BOUNDARY VECTORS AT 1 BIT ABOVE THE SLICING LAYER

HATCH PATHS ARE ORIENTED IN SCALED CAD SPACE REGARDLESS OF PART ORIENTATION. THE PART ORIENTATION ONLY TRIGGERS THE NEED TO MAKE A DECISION AS TO WHETHER TO TURN HATCH ON OR OFF.

A TOP VIEW OF A LAYER OF AN OBJECT PROPERLY FILLED IN BY CROSSHATCH (x & y)

A TOP VIEW OF A LAYER OF AN OBJECT COMPLETELY FILLED IN ITS SOLID REGIONS

TOP VIEW OF LAYER BOUNDARY ALONG WITH HATCH VECTORS GENERATED BY THE FIRST ALGORITM (X AND Y)

TOP VIEW OF LAYER BOUNDARY ALONG WITH HATCH VECTORS GENERATED BY THE SECOND ALGORITHM (X AND Y)

A TOP VIEW OF A LAYER OF BOUNDARY VECTORS ALONG WITH HATCH VECTORS GENERATED BY THE PROPOSED ALGORITHM (x AND x)

X AND Y CROSSHATCH USING MIA=0

X AND Y CROSSHATCH USING MIA=45°

| VECTOR LIST | | | |
|---|---|---|---|
| # | START | END | NORMAL +x −x +y −y |
| 1 | (3,1) | (1,1) | 0 0 , 0 1 |
| 2 | (1,1) | (2,2) | 0 1 , 1 0 |
| 3 | (2,2) | (3,1) | 1 0 , 1 0 |

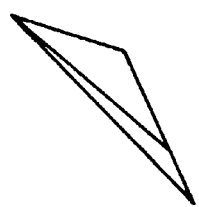
VIEW BEFORE FLIPPING
(SINGLE SURFACE)
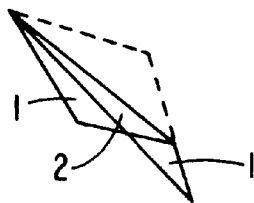
VIEW AFTER FLIPPING AND FORMATION
OF DOUBLE / SINGLE SURFACE
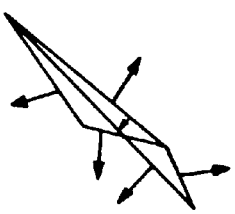
VIEW WITH SEGMENT NORMALS
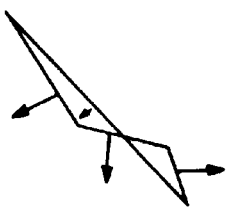
VIEW AFTER CANCELLATION
OF DUPLICATE PAIRS
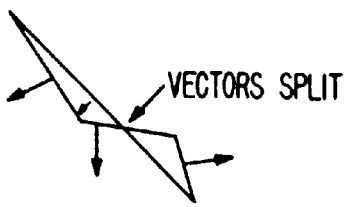
AFTER SPLITTING OF VECTORS
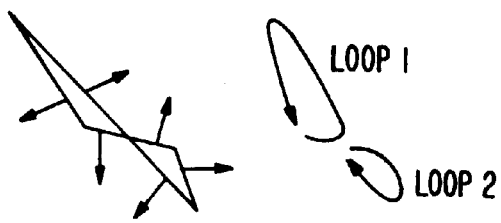
AFTER LOOP DETERMINATION AND
RECALCULATION OF NORMALS
*FIG. 25h.*

REQUIRES NEAR FLAT SKIN ON THIS SLANTED FACE

BOUNDARY SEGMENTS FORMED AT INTERSECTION POINTS

NEAR FLAT TRIANGLE BOUNDARY FOR
A CROSS SECTION OF A 4 SIDED PYRAMID

SAME CROSS SECTION AFTER REMOVAL
OF PAIRS OF DUPLICATE BOUNDARY
VECTORS

FIG. 27e.
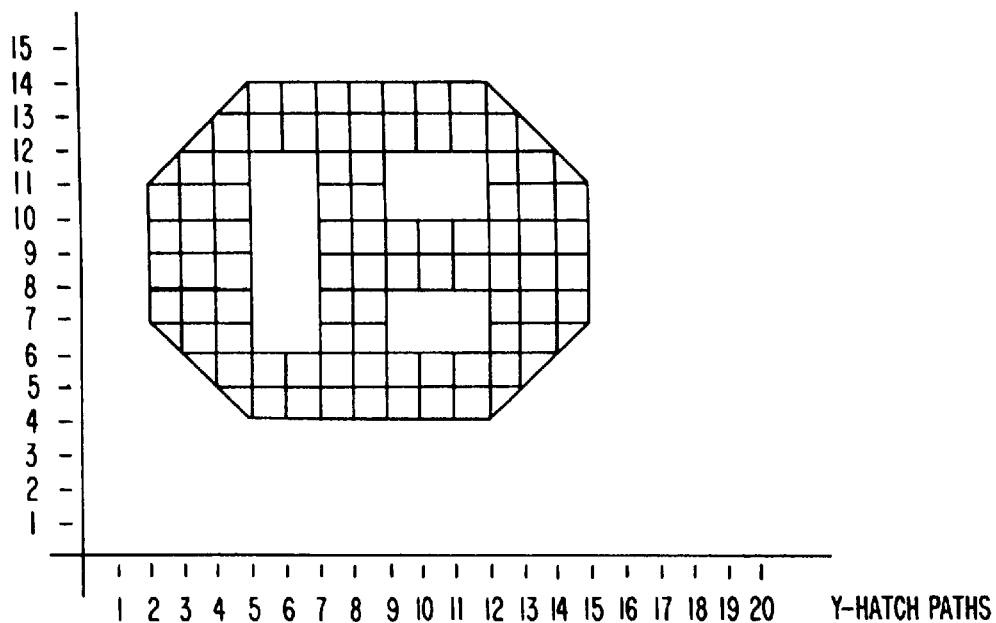
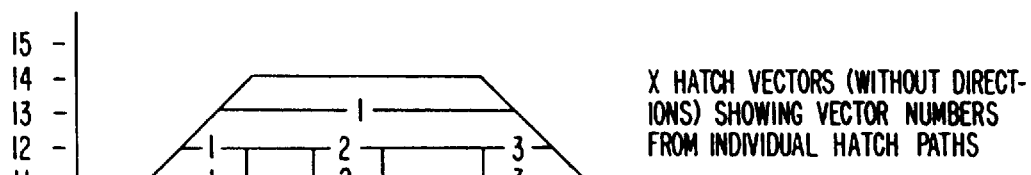
X HATCH VECTORS (WITHOUT DIRECTIONS) SHOWING VECTOR NUMBERS FROM INDIVIDUAL HATCH PATHS
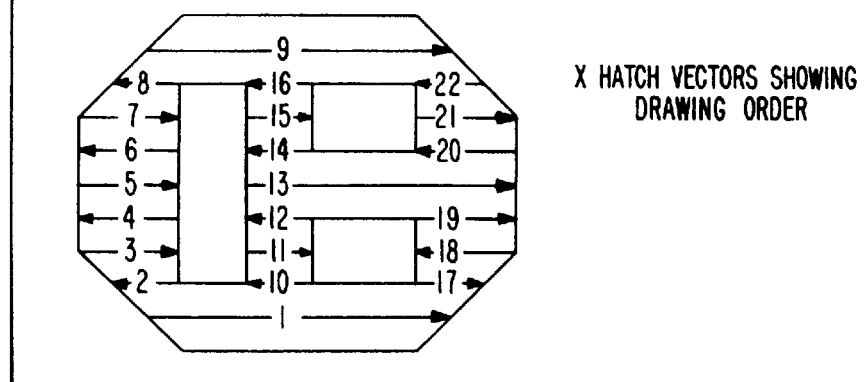
X HATCH VECTORS SHOWING DRAWING ORDER

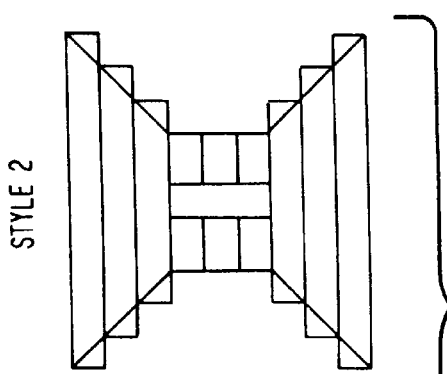
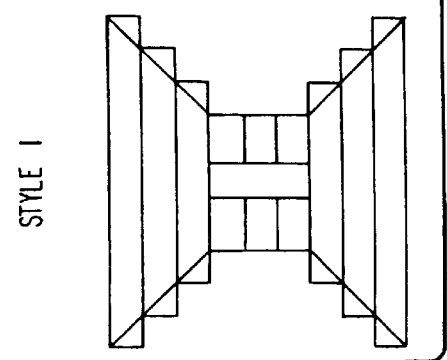
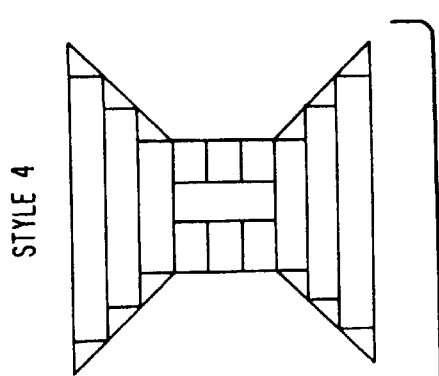
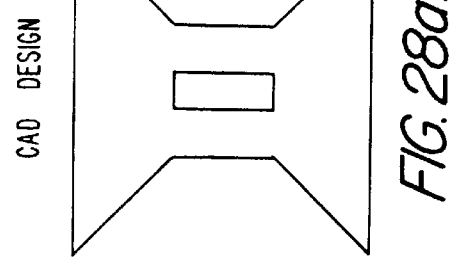
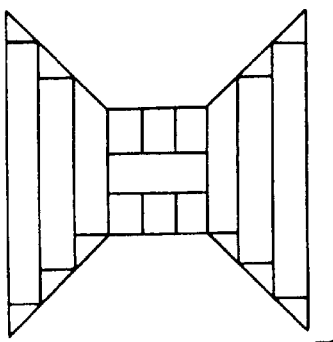

LAYERS AND PLANES 1 BIT UP (FOR CREATING BOUNDARY VECTORS)

FORMATION OF SOLID MATERIAL FROM CURING LAYER BOUNDARY VECTORS

SUPERPOSITION OF LAYER BOUNDARIES AND NEAR-FLAT BOUNDARIES
AFTER CURING

SUPERPOSITION OF LAYER BOUNDARIES & NEAR FLAT BOUNDARIES WITH
SKINS (DOWN-FACING SKINS DRAWN AT THE BOTTOM OF THEIR LAYERS

LAYERS & PLANES 1 BIT DOWN (FOR CREATION OF BOUNDARY VECTORS)

LAYER BOUNDARIES

NEAR FLAT BOUNDARIES (AT LAYERS GENERATED)

★ NEAR-FLAT UP-FACING BOUNDARIES   + NEAR-FLAT DOWN-FACING BOUNDARIES

NEAR FLAT BOUNDARIES AFTER BEING MOVED TO THE LAYER THEY WILL BE BUILT ON

FORMATION OF SOLID AFTER CURING NEAR FLAT BOUNDARIES

R—INDICATES OVERLAP WITH BOUNDARY AND HATCH

SUPERPOSITION OF LAYER BOUNDARIES AND NEAR FLAT BOUNDARIES AFTER CURING

FLAT SKIN BOUNDARIES (AT LAYERS GENERATED FROM)

FLAT SKIN BOUNDARIES AFTER BEING MOVED TO THE LAYERS ON WHICH
THEY WILL BE BUILT

LAYER BOUNDARY (N) = LB (N)(SI) - LB (N)(SI) ∩ NFUB(N)(SI)

(LAYER BOUNDARIES REMAIN ON THE SAME LAYER FOR BUILDING AS FOR CREATING)
LAYER BOUNDARIES AFTER BEING GIVEN A FULL LAYER CURE

NEAR FLAT BOUNDARIES (DOWN-FACING)

NEAR FLAT BOUNDARIES (DOWN-FACING) AFTER BEING MOVED TO THE LAYERS ON WHICH THEY ARE TO BE BUILT (SINCE THEY ARE CREATED FROM AN INTERSECTION WITH LAYER BOUNDARIES THEY ADD NOTHING NEW TO X Y DIMENSIONS OF THE LAYERS)

NEAR FLAT BOUNDARIES (UP-FACING)

NEAR FLAT BOUNDARIES AFTER BEING MOVED TO THE LAYER
THAT THEY WILL BE BUILT ON (UP-FACING)

FLAT BOUNDARIES (UP-FACING)

FLAT BOUNDARIES (UP-FACING) AFTER BEING MOVED TO THE LAYER
THEY WILL BE BUILT ON

FLAT BOUNDARIES (DOWN-FACING) (BUILT ON SAME LAYER FOUND ON)

SUPERPOSITION OF LAYER BOUNDARIES, NEAR FLAT BOUNDARIES, AND SKINS
(DOWN-FACING SKINS DRAWN AT THE BOTTOM OF THEIR LAYERS)

BOUNDARY VECTORS

BOUNDARY VECTORS AFTER BEING GIVEN FULL LAYER CURE

NEAR-FLAT DOWN-FACING BOUNDARIES

NEAR-FLAT DOWN-FACING BOUNDARIES AFTER BEING MOVED TO THE LAYER
THE WILL BE BUILT ON

NEAR-FLAT UP-FACING BOUNDARIES (NOT MOVED TO NEW LAYERS WHEN BUILT)

FLAT-UP FACING BOUNDARIES (STAY ON SAME LAYER WHEN BUILT)

FLAT-DOWN FACING BOUNDARIES

FLAT-DOWN FACING BOUNDARIES AFTER BEING MOVED TO THE LAYERS ON WHICH THEY WILL BE BUILT

SUPERPOSITION OF LAYER BOUNDARIES, NEAR FLAT BOUNDARIES AND SKIN AFTER ALL HAVE BEEN MOVED TO THE LAYERS ON WHICH THEY WILL BE BUILT AND LAYERS ARE GIVEN APPROPRIATE CURE DEPTHS. DOWN FACING SKINS DRAWN AT THE BOTTOM OF THEIR LAYERS.

DESIRED BOUNDARIES

BOUNDARIES AFTER CURING WITHOUT CURE COMPENSATION

VECTORS BEFORE COMPENSATION

VECTORS AFTER COMPENSATION WITHOUT GUARDING AGAINST CROSSOVERS.

VECTORS AFTER COMPENSATION WITH GUARDING AGAINST CROSSOVER.

FIG. 34e.   BOUNDARY OUTLINE (TOP VIEW)
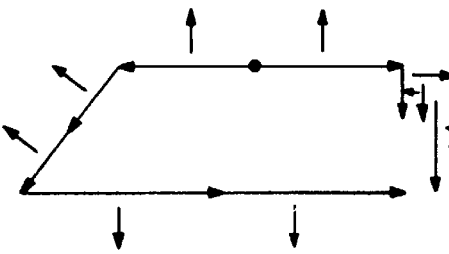
FIG. 34f.   ← COINCIDENT VECTORS
BOUNDARY OUTLINE SHOWING UNORDERED VECTORS
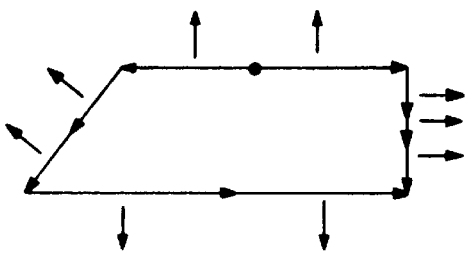
FIG. 34g.   BOUNDARY OUTLINE AFTER VECTOR BREAK-UP AND DETERMINATION OF NET VECTORS
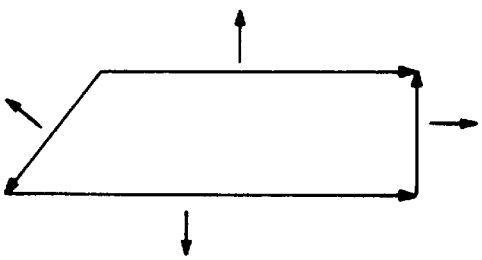
FIG. 34h.   BOUNDARY OUTLINE AFTER MAXIMIZED VECTOR LENGTH

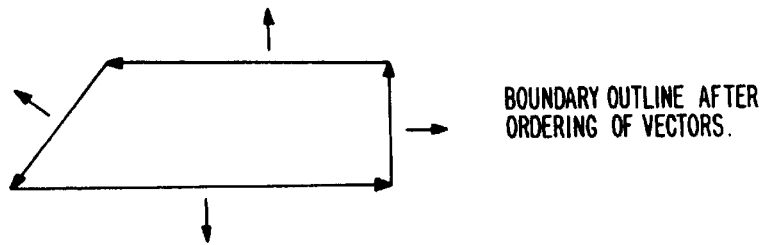
FIG.34i.   BOUNDARY OUTLINE AFTER ORDERING OF VECTORS.
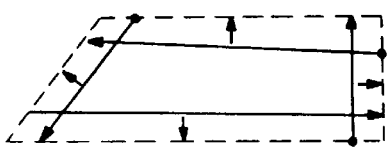
FIG.34j.   BOUNDARY OUTLINE AFTER OFFSETTING OF VECTORS.
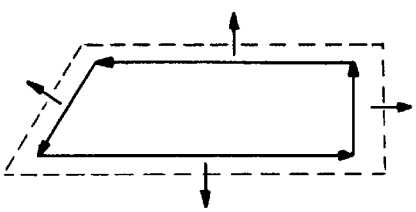
FIG.34k.   BOUNDARY AFTER RECALCULATION OF INTERSECTION POINTS.
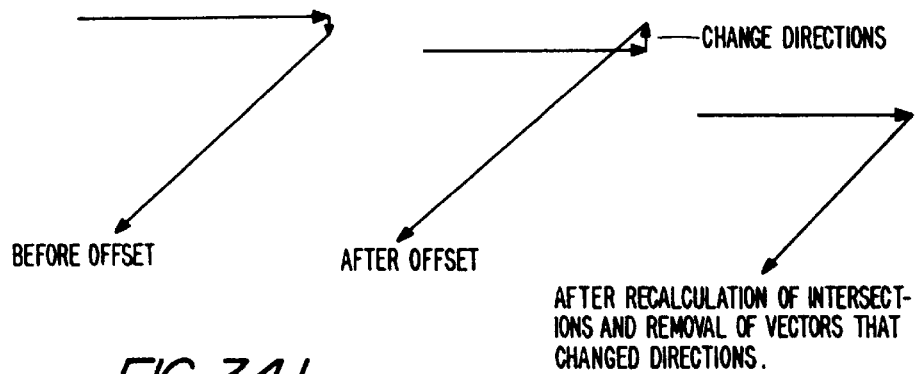
BEFORE OFFSET    AFTER OFFSET — CHANGE DIRECTIONS
AFTER RECALCULATION OF INTERSECTIONS AND REMOVAL OF VECTORS THAT CHANGED DIRECTIONS.
FIG.34L.

```
    ∇R←CURE A;C;DV;F;N;P;UDV
[1]
[2]  ⍝ APPLY CURE COMPENSATION TO VERTICES OF A POLYGON
[3]  ⍝ PROPRIETARY INFORMATION OF 3D SYSTEMS INC.
[4]  ⍝ AUTHOR: DAVE REMBA   FEB. 1988
[5]
[6]  ⍝ A     INPUT POLYGON MATRIX, ROWS ARE VERTICES, COLS ARE X Y COORS.
[7]  ⍝ R     OUTPUT POLYGON MATRIX AFTER CURE COMPENSATION
[8]
[9]  ⍝ INTERNAL VARIABLES:
[10] ⍝ P     PREVIOUS VECTOR TO EACH VERTEX
[11] ⍝ N     NEXT VECTOR FROM EACH VERTEX
[12] ⍝ UDV   UNIT DISPLACEMENT VECTOR FOR EACH VECTOR
[13]
[14] ⍝ FUNCTIONS CALLED:
[15] ⍝
[16] ⍝ A DOT B            RETURNS THE DOT PRODUCT OF VECTORS A AND B
[17] ⍝ SQRT(A)            RETURNS THE SQUARE ROOT OF A
[18] ⍝ UNIT(A)            RETURNS VECTOR A NORMALIZED (WITH UNIT LENGTH)
[19] ⍝ A CP B             RETURNS THE CROSS PRODUCT OF 2D VECTORS A AND B
[20]
[21] ⍝ DELETE COINCIDENT POINTS
[22]
[23]   P←(⁻1⊖A) ⍝        ROTATE POINTS FORWARD 1 VERTEX
[24]   A←(∨/A≠P)⌿A ⍝     REMOVE POINTS EQUAL TO NEXT POINT
[25]
[26] ⍝ PREPARATION: COMPUTE P AND N
[27]
[28]   P←(⁻1⊖A) ⍝        ROTATE POINTS FORWARD 1 VERTEX
[29]   N←(1⊖A) ⍝         ROTATE POINTS BACKWARD 1 VERTEX
[30]   P←P-A ⍝           CONVERT TO VECTOR
[31]   N←N-A ⍝           CONVERT TO VECTOR
[32]   P←UNIT(P) ⍝       NORMALIZE PREVIOUS VECTORS (SAVE FOR DOT)
[33]   N←UNIT(N) ⍝       NORMALIZE NEXT VECTORS (SAVE FOR DOT)
[34]
[35] ⍝ COMPUTE DISPLACEMENT VECTOR
[36]
[37]   DV←P+N ⍝          ADD PREVIOUS VECTORS TO NEXT VECTORS
[38]
[39] ⍝ DELETE NULL DISPLACEMENT VECTORS AND ASSOCIATED DATA
[40]
[41]   F←0≠NORM DV ⍝     SET DISPLACEMENT FLAG TRUE IF VECTOR IS >0
[42]   DV←F⌿DV ⍝         DELETE ZERO VECTORS
[43]   P←F⌿P ⍝           DELETE PREVIOUS POINTS
[44]   N←F⌿N ⍝           DELETE NEXT POINTS
[45]   A←F⌿A ⍝           DELETE POLYGON POINTS
[46]
[47] ⍝ NORMALIZE THE DISPLACEMENT VECTOR
[48]
[49]   UDV←UNIT(DV)
[50]
[51] ⍝ COMPUTE INSIDE OR OUTSIDE BY CROSS PRODUCT METHOD
[52]
[53]   F←×N CP P ⍝       TAKE THE SIGN ONLY AS 1 OR -1 (× GIVES ONLY SIGN)
[54]
[55] ⍝ COMPUTE COMPENSATION FACTOR (VECTOR SCALING FACTOR)
[56]
[57]   C←F×BEAMRADIUS÷SQRT(0.5×1-P DOT N)  ⍝ ÷ IS DIVIDE
[58]
[59] ⍝ SCALE UDVs BY MULTIPLYING X AND Y COMPONENTS BY COMPENSATION FACTOR
[60]
[61]   C←C,[1.5]C ⍝      DUPLICATE SCALE FACTOR FOR X AND Y COMPONENTS OF UDVs
```

FIG. 35a.

```
[62] DV←UDVxC ∩   SCALE UDVs
[63]
[64] ∩ APPLY DISPLACEMENT VECTORS TO POLYGON VERTICES
[65]
[66] R←A+DV
[67]
[68] ∩ END
[69]
     ▽

▽ R←UNIT A;B
[1] ∩ NORMALIZE ROW VECTORS IN MATRIX A TO UNIT MAGNITUDE
[2]   B←NORM A
[3]   ⍎(0∊B)/'⎕SOUND 10 2⍴50 2000 100  ◊  ⎕ERROR "UNIT ZERO!"◊R←◆◊→'
[4]
[5]   R←A÷B,[I.5]B
[6]
     ▽

▽ R←A CP B
[1] ∩ CROSS PRODUCT (FOR 2D VECTORS IN XY PLANE)
[2]
[3] ∩ A      MATRIX OF ROW VECTORS
[4] ∩ B      MATRIX OF ROW VECTORS
[5]
[6]   R←(A[;1]xB[;2])-A[;2]xB[;1]
[7]
     ▽
```

FIG. 35b.

```
    ▽ R←A DOT B
[1] ∩ CALCULATE THE DOT PRODUCT BETWEEN VECTORS A AND B
[2]
[3] ∩ x1 x2 + y1 y2
[4]   R←(A[;1]xB[;1])+A[;2]xB[;2]
[5]
[6] ∩ | V1 | V2 |
[7]   A←(NORM A)xNORM B ∩   GENERAL FORM
[8]
[9] ∩ HANDLE 0 CASE
[10]  ⍎(0∊A)/'R←0 ◊ ⎕SOUND 440 100 ◊ ⎕ERROR "DOT ZERO!" ◊ →0'
[11]
[12]  R←R÷A
     ▽

▽ R←NORM A
[1] ∩ CALCULATE THE NORM OF A VECTOR
[2]
[3] ∩ ||v||=SQUARE-ROOT OF THE SUM OF SQUARES OF COMPONENTS
[4]
[5]   R←(+/A*2)*0.5
[6]
     ▽
```

CURE COMPENSATION

MATHEMATICAL DERIVATION:

GIVEN TWO VECTORS, $\vec{p}$ AND $\vec{n}$, SHARING ORIGIN POINT O, OBTAIN A VECTOR $\vec{t}$ WHICH DISPLACES POINT O TO O', i.e. $O' = \vec{t} + O$.

THIS PROCEDURE IS APPLIED TO EACH VERTEX OF A POLYGONAL BOUNDARY. HERE WE SHALL DERIVE AN EXPRESSION TO CALCULATE $\vec{t}$ IN TERMS OF $\vec{p}$ AND $\vec{n}$.

VECTOR $\vec{p} = P - O$ WHERE P IS THE PREVIOUS VERTEX.

VECTOR $\vec{n} = N - O$ WHERE N IS THE NEXT VERTEX.

VECTORS ARE NORMALIZED:
$$\vec{p} = \frac{\vec{p}}{\|\vec{p}\|} \qquad \vec{n} = \frac{\vec{n}}{\|\vec{n}\|}$$

DELETE ANY VECTORS $\vec{p} = 0$ AND $\vec{n} = 0$

COMPUTE THE DISPLACEMENT VECTOR $\vec{d} = \vec{p} + \vec{n}$

NORMALIZE THE DISPLACEMENT VECTOR $\vec{d} = \frac{\vec{d}}{\|\vec{d}\|}$

*FIG. 37a.*

CURE COMPENSATION

DETERMINE WHETHER ANGLE $\alpha$ BETWEEN $\vec{p}$ AND $\vec{n}$ IS GREATER THAN 180°.

$$\frac{f = \vec{p} \otimes \vec{n}}{\|\vec{p}\|\|\vec{n}\|} = \sin \alpha \qquad \text{CROSS PRODUCT}$$

$f' = 1$ IF $f > 0$ $\qquad$ $f' = -1$ IF $f < 0$ $c = f' \times \dfrac{b}{j}$ WHERE b IS THE LASER BEAM RADIUS AND j IS A COMPENSATION FACTOR.

DERIVATION OF j :

$$\cos \alpha = \frac{\vec{p} \cdot \vec{n}}{\|\vec{p}\|\|\vec{n}\|} \qquad \text{DOT PRODUCT}$$

$$j = \sin \frac{\alpha}{2} = \pm \sqrt{\frac{1 - \cos \alpha}{2}} \qquad \text{HALF ANGLE FORMULA}$$

SCALE THE NORMALIZED DISPLACEMENT VECTOR : $\vec{r} = c\vec{d}$

*FIG. 37b.*

CURE COMPENSATION COMPUTATIONS

CROSS PRODUCT: $\vec{A} \times \vec{B} = (a2 \ast b3 - a3 \ast b2)i + (a3 \ast b1 - a1 \ast b3)j + (a1 \ast b2 - a2 \ast b1)k$ DOT PRODUCT: $\vec{A} \cdot \vec{B} = a_1 b_1 + a_2 b_2 + a_3 b_3$

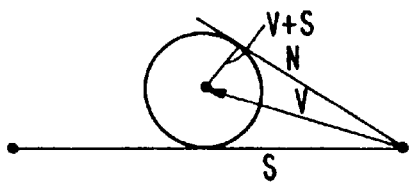

1. REMOVE POINT SEGS. (ALREADY DONE)
2. COMBINE "STRAIGHT" VECTORS (NOT NECESSARY BUT $\vec{S} \times \vec{N} = 0$ IF STRAIGHT)

> LET S = CURRENT SEGMENT AS VECTOR (DISPLACE TO ORIG.)) NORMALIZED
> LET N = NEXT SEGMENT AS VECTOR       "    "   "  NORMALIZED
> LET V = DISPLACEMENT VECTOR
> LET UV = UNIT DISPLACEMENT VECTOR

3. $\vec{UV} = - \left( \dfrac{\vec{S} + \vec{N}}{|\vec{S} + \vec{N}|} \right)$ $|\vec{V}| = \dfrac{\text{BEAM RADIUS}}{\sqrt{\dfrac{1 - (\vec{S} \cdot \vec{N})}{2}}}$     IF $\vec{S} \cdot \vec{N} = 1$ THEN $|\vec{V}| \to \infty$ $\boxed{\vec{V} = |\vec{V}| \vec{UV}}$     IF $|\vec{V}|$ "TOO BIG" NEED TO DECIDE WHAT TO DO.
(COMPARE $|\vec{S}|$ OR $|\vec{N}|$, SET TO BEAM RADIUS, ETC.

NOTE: BEAM RADIUS IS CAD UNITS x RESOLUTION

*FIG. 37c.*

```
SOLID ASCII
   FACET NORMAL  0.000000e+00  1.000000e+00  0.000000e+00
      OUTER LOOP
         VERTEX  2.500001e-01  1.040000e+00  8.750000e+00
         VERTEX  8.750000e+00  1.040000e+00  8.750000e+00
         VERTEX  8.750000e+00  1.040000e+00  2.500001e-01
      ENDLOOP
   ENDFACET
   FACET NORMAL  0.000000e+00  1.000000e+00  0.000000e+00
      OUTER LOOP
         VERTEX  8.750000e+00  1.040000e+00  2.500001e-01
         VERTEX  2.500001e-01  1.040000e+00  2.500001e-01
         VERTEX  2.500001e-01  1.040000e+00  8.750000e+00
      ENDLOOP
   ENDFACET
   FACET NORMAL  0.000000e+00  0.000000e+00  1.000000e+00
      OUTER LOOP
         VERTEX  8.750000e+00  1.040000e+00  8.750000e+00
         VERTEX  2.500001e-01  1.040000e+00  8.750000e+00
         VERTEX  2.500001e-01  7.400000e-01  8.750000e+00
      ENDLOOP
   ENDFACET
   FACET NORMAL  0.000000e+00  0.000000e+00  1.000000e+00
      OUTER LOOP
         VERTEX  2.500001e-01  7.400000e-01  8.750000e+00
         VERTEX  8.750000e+00  7.400000e-01  8.750000e+00
         VERTEX  8.750000e+00  1.040000e+00  8.750000e+00
      ENDLOOP
   ENDFACET
   FACET NORMAL  1.000000e+00  0.000000e+00  0.000000e+00
      OUTER LOOP
         VERTEX  8.750000e+00  7.400000e-01  8.750000e+00
         VERTEX  8.750000e+00  7.400000e-01  2.500001e-01
         VERTEX  8.750000e+00  1.040000e+00  2.500001e-01
      ENDLOOP
   ENDFACET
   FACET NORMAL  1.000000e+00  0.000000e+00  0.000000e+00
      OUTER LOOP
         VERTEX  8.750000e+00  1.040000e+00  2.500001e-01
         VERTEX  8.750000e+00  1.040000e+00  8.750000e+00
         VERTEX  8.750000e+00  7.400000e-01  8.750000e+00
      ENDLOOP
   ENDFACET
   FACET NORMAL  0.000000e+00  0.000000e+00  -1.000000e+00
      OUTER LOOP
         VERTEX  2.500001e-01  7.400000e-01  2.500001e-01
         VERTEX  2.500001e-01  1.040000e+00  2.500001e-01
         VERTEX  8.750000e+00  1.040000e+00  2.500001e-01
      ENDLOOP
   ENDFACET
   FACET NORMAL  0.000000e+00  0.000000e+00  -1.000000e+00
      OUTER LOOP
         VERTEX  8.750000e+00  1.040000e+00  2.500001e-01
         VERTEX  8.750000e+00  7.400000e-01  2.500001e-01
         VERTEX  2.500001e-01  7.400000e-01  2.500001e-01
      ENDLOOP
   ENDFACET
   FACET NORMAL  -1.000000e+00  0.000000e+00  0.000000e+00
      OUTER LOOP
         VERTEX  2.500001e-01  1.040000e+00  2.500001e-01
         VERTEX  2.500001e-01  7.400000e-01  2.500001e-01
         VERTEX  2.500001e-01  7.400000e-01  8.750000e+00
      ENDLOOP
   ENDFACET
```

FIG. 39.

——SLICE USER INTERFACE——

CURRENT OBJECT: BASE0412  VERSION 3.11

| OPTION | DESCRIPTION | CAD UNITS | | SLICE UNITS |
|---|---|---|---|---|
| (1) | DATABASE FILE NAME | BASE0412.STL (BINARY) | | |
| (2) | RESOLUTION | 1000.000 | | |
| (3) | LAYER THICKNESS | 0.020 | FIXED | 20 |
| (4) | X HATCH SPACING | 0.400 | | 400 |
| (5) | Y HATCH SPACING | 0.400 | | 400 |
| (6) | 60/120 DEGREE HATCH SPACING | 0.000 | | 0 |
| (7) | X SKIN FILL SPACING | 0.000 | | 0 |
| (8) | Y SKIN FILL SPACING | 0.000 | | 0 |
| (9) | MINIMUM SURFACE ANGLE FOR SCANNED FACETS | 0 | | |
| (10) | MINIMUM HATCH INTERSPECT ANGLE | 0 | | |
| (11) | SEGMENT OUTPUT FILE NAME | BASE412a.SLI | | |
| (Q) | QUIT, RETURN TO MAIN MENU | | | |

RANGE - CALC SP
PREPARE V3.05
WORKING ON FILE PATENT2.R

FIG. 50a.

LASER POWER READING: 16.2 mW
USING WORKING CURVE DATA FROM MATERIAL FILE: 9-16HC07.MAT

DDDDDDDyDDDDDDDDDyDDDDDDDyDDDDDDDDDyDDDDDDDyDDDDDDDDyDDDDDDDyDDDDDDD

| RANGE | Z-START | Z-END | Z-SPACE | DEPTH | EST SP | W MIN | W MAX |
|---|---|---|---|---|---|---|---|
| 1 | 740 | 760 | 20 | 20 | 25 | 0.0 | 0.0 |
| 2 | 780 | 1020 | 20 | 20 | 25 | 0.0 | 0.0 |

DDDDDDDyDDDDDDDDDyDDDDDDDyDDDDDDDDDyDDDDDDDyDDDDDDDDyDDDDDDDyDDDDDDD

PRESS:
- R—READ MATERIAL DATA     S—SAVE NEW RANGE COMMANDS
- P—CHANGE POWER RATING    E—EDIT CURE DEPTH/STEP PERIOD
- V—VIEW MATERIAL DATA     Q—QUIT PROGRAM
- X—EXIT

DATA FROM MATERIAL FILE: 9-16HC07.MAT

FIG. 50b.

MATERIAL TEST LASER POWER READING: 15.20

5 MATERIAL DATA PAIRS:

| | | | | | | | | | |
|---|---|---|---|---|---|---|---|---|---|
| 1 | SP = | 160.00 | LH = | 32.00 | WMIN = | 0.00 | WMAX = | 0.00 |
| 2 | SP = | 80.00 | LH = | 28.00 | WMIN = | 0.00 | WMAX = | 0.00 |
| 3 | SP = | 40.00 | LH = | 23.50 | WMIN = | 0.00 | WMAX = | 0.00 |
| 4 | SP = | 20.00 | LH = | 18.50 | WMIN = | 0.00 | WMAX = | 0.00 |
| 5 | SP = | 10.00 | LH = | 12.50 | WMIN = | 0.00 | WMAX = | 0.00 |

| | | | | | |
|---|---|---|---|---|---|
| LH: | SLOPE = | 16.11 | Y-INTERCEPT = | -2.92 | R-VALUE = 1.00 |
| WMIN: | SLOPE = | 0.00 | Y-INTERCEPT = | 0.00 | R-VALUE = 0.00 |
| WMAX: | SLOPE = | 0.00 | Y-INTERCEPT = | 0.00 | R-VALUE = 0.00 |

PREPARE REPORT FOR PATENT2.L                                    10-14-1988    16:35:05

| RANGE | Z-START | Z-END | Z-SPACE | | CAD-START | CAD-END | CAD-SPACE | COUNT |
|-------|---------|-------|---------|--|-----------|---------|-----------|-------|
| 1 | 740 | 760 | 20 | | 0.740 | 0.760 | 0.020 | 2 |
| | BLOCK 1 | TYPE #TOP | | | | | | |
| | BLOCK 2 | TYPE LI | | COMMANDS: | "SP 212; SS 2" | | | |
| | BLOCK 3 | TYPE LBI | | COMMANDS: | "SP 212; SS 2" | | | |
| | BLOCK 4 | TYPE LHI | | | | | | |
| | BLOCK 5 | TYPE #BTM | | | | | | |
| 2 | 780 | 1020 | 20 | | 0.780 | 1.020 | 0.020 | 13 |
| | BLOCK 1 | TYPE #TOP | | | | | | |
| | BLOCK 2 | TYPE LI | | COMMANDS: | "SP 58; SS 2" | | | |
| | BLOCK 3 | TYPE LBI | | COMMANDS: | "SP 58; SS 2" | | | |
| | BLOCK 4 | TYPE LHI | | | | | | |
| | BLOCK 5 | TYPE #BTM | | | | | | |

*FIG. 50c.*

```
! MERGE: -FILES BASE412A
! MERGE: -STARTLAYER 740   -ENDLAYER 1020  -NUMLAYERS 15
! MERGE: -MIN X      250   -MAX X    8750
! MERGE: -MIN Y      250   -MAX Y    8750
! 3DSYS  SLA-I SLICE FILE
! SLICE= -VER 3.11 -RES 1000.000000 -HX 400 -HY 400 -HFX 0 -HFY 0 -HA 0 -MSA 0 -M
IA 0 -ZS 20 -Y -B
X 1000.000,20.000,0.508
740,#TOP
740,LI
740,LBI
740,LHI
740,#BTM
760,#TOP
760,LI
760,LBI
760,LHI
760,#BTM
780,#TOP
780,LI
780,LBI
780,LHI
780,#BTM
800,#TOP
800,LI
800,LBI
800,LHI
800,#BTM
820,#TOP
820,LI
820,LBI
820,LHI
820,#BTM
840,#TOP
840,LI
840,LBI
840,LHI
840,#BTM
860,#TOP
860,LI
860,LBI                    900,#BTM
860,LHI                    920,#TOP
860,#BTM                   920,LI
880,#TOP                   920,LBI
880,LI                     920,LHI
880,LBI                    920,#BTM
880,LHI                    940,#TOP
880,#BTM                   940,LI
900,#TOP                   940,LBI
900,LI                     940,LHI
900,LBI                    940,#BTM
900,LHI                    960,#TOP
```

```
! BUILD PARAMETER FILE
! VERSION 3.00
!
! LAST ALTERED:  4/26/88
!
! DEFAULT SUPER OPTIONS
!
! PLACE OPTIONS TOGETHER INSIDE OF QUOTES; USE " " IF NO OPTIONS
!
" "

!
! GENERAL PARAMETERS
!
800     ELEVATOR BOARD BASE ADDRESS
100     ELEVATOR PITCH PARM
3.5559  XY-ONLY SCALE FACTOR; USE 3.556 FOR INCHES AND SLICE RES=1000
10000 !27000    X-COORDINATE OFFSETS
2000  !27000    Y-COORDINATE OFFSETS
5000    MAX NUMBER OF BYTES PER BLOCK IN LASER QUEUE
16384,16384 MINIMUM X AND Y OF VAT AREA (FOR GRAPHICS VIEWPORT)
49152,49152 MAXIMUM X AND Y OF VAT AREA
!
!   - BLOCK DEFAULTS -
!
! EACH TIME THE BUILD PROGRAM STARTS A BLOCK, THE RESPECTIVE DEFAULT STRING BELOW IS SENT
! TO THE STEREO DRIVER. LB, NFDB, ... ARE THE BLOCK TYPES (LAYER BORDER, NEAR-FLAT DOWN
! BORDER, ETC.) AND THEY ARE FOLLOWED BY THE MERGE INPUT FILE NUMBER (E.G. 1 MAY BE FOR
! POST VECTORS AND 2 FOR OBJECT VECTORS). ALTHOUGH ONLY DEFAULTS FOR 2 FILES ARE SET
! FOR HERE, UP TO 10 FILES ARE SUPPORTED.
!
#TOP,"DC+"                  !FORCE DRIFT CORRECTION ON
!
! FILE #1
!
LB1,"RD 1;RS 300;RC 1;       !REDRAW DELAY, SIZE, COUNT
     SP 176;                 !STEP PERIOD
     JD 0;                   !JUMP DELAY
     SS 1"                   !STEP SIZE
NFDB1,"RD 1;RS 300;RC 1;SP 176; JD 0;SS 1"
NFUB1,"RC 1;SP 100;SS 2;JD 0"
LH1, "RC 1; SP 176;JD 0; SS 2;
     VC 5;                   !RIVET COUNT
     VR 99;                  !RIVET REDUCTION AMOUNT
     VP 11,12,13,14,15"      !RIVET STEP PERIODS
NFDH1,"RC 1;SP 176;JD 0;SS 2;VC 5;VR 99;VP 11,12,13,14,15"
FDF1,"RC 1;SP 25;JD 0;SS 16"
NFDF1,"RC 1;SP 25;JD 0;SS 16"
NFUF1,"RC 1;SP 25;JD 0;SS 16"
FUF1,"RC 1;SP 25;JD 0;SS 16"
!
! FILE #2
!
LB2,"RD 1;RS 300;RC 1;SP 352;JD 0;SS 2"
NFDB2,"RD 1;RS 300;RC 1;SP 352;JD 0;SS 2"
NFUB2,"RD 1;RS 300;RC 1;SP 100;JD 0;SS 2"
LH2,"RC 1;SP 352;JD 0;SS 2;VC 5;VR 99;VP 11,12,13,14,15"
NFDH2,"RC 1;SP 352;JD 0;SS 2;VC 5;VR 99;VP 11,12,13,14,15"
FDF2,"RC 1;SP 100;JD 0;SS 16"
NFDF2,"RC 1;SP 100;JD 0;SS 16"
NFUF2,"RC 1;SP 100;JD 0;SS 16"
FUF2,"RC 1;SP 100;JD 0;SS 16"

#BTM,"ZW 5;                  ! Z-AXIS WAIT TIME IN SECONDS
     ZD 8;                   ! Z-AXIS DIP DEPTH IN mm
     ZV 0.5;                 ! Z-AXIS VELOCITY PARAMETER
     ZA 0.5"                 ! Z-AXIS ACCELERATION PARAMETER
```

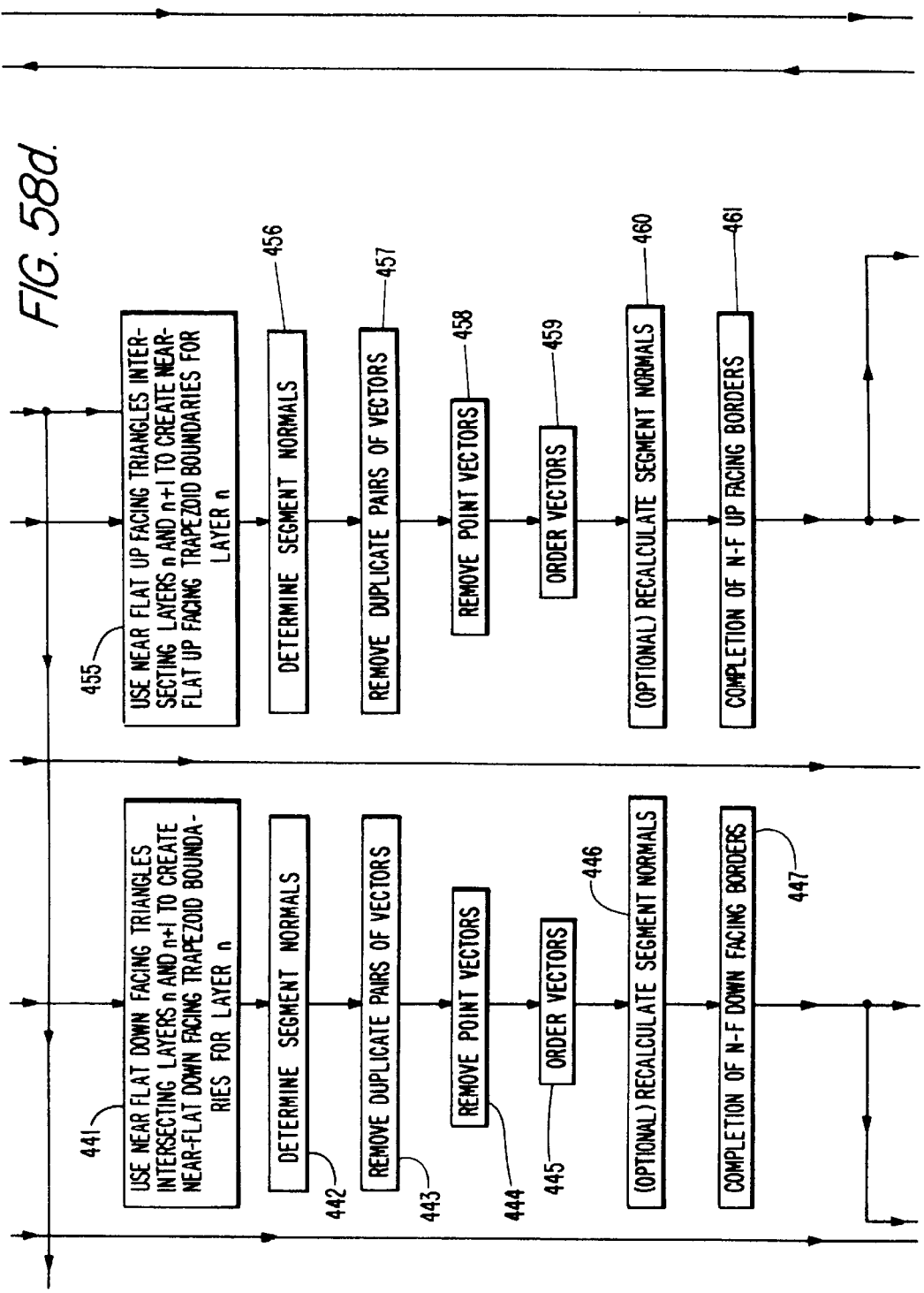

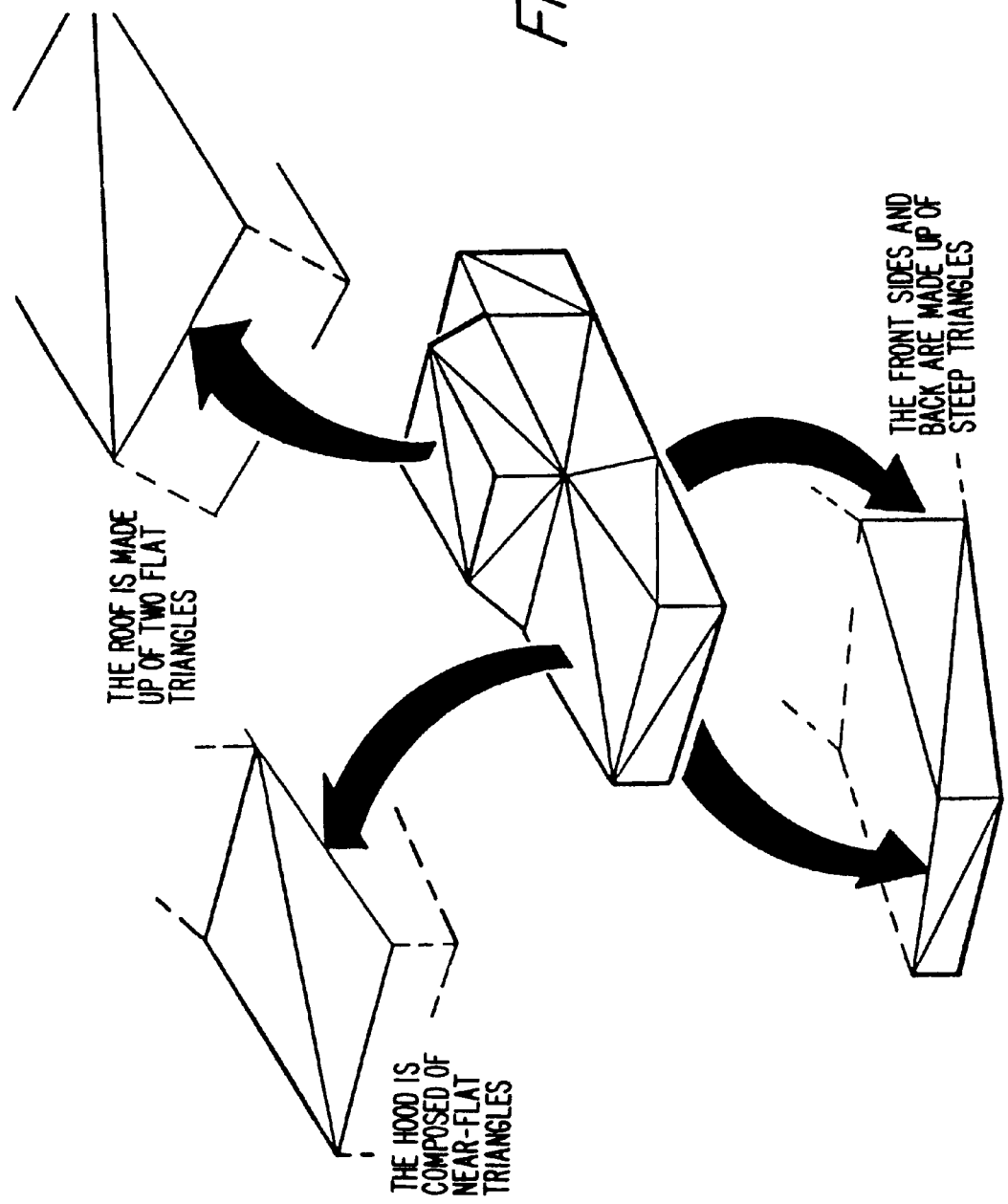

4 BOUNDARY VECTORS REQUIRED OTHER 2 DERIVED FROM CONNECTING END POINTS OF FIRST TWO

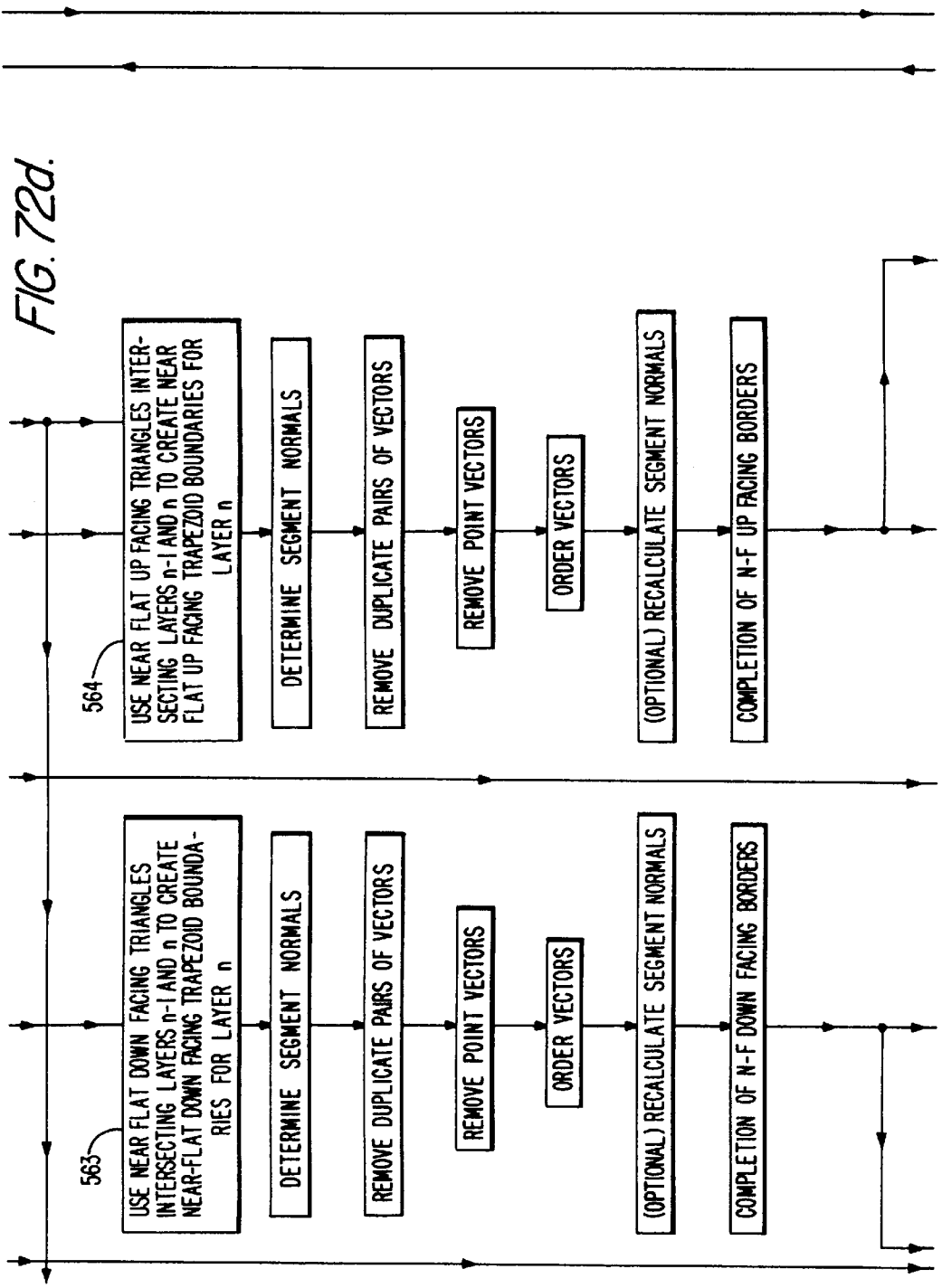

THERMAL STEREOLITHOGRAPHY USING SLICE TECHNIQUES

1. CROSS-REFERENCE TO RELATED APPLICATIONS

This application is a continuation of U.S. application Ser. No. 08/795,166 filed Feb. 10, 1997; which is a continuation of U.S. application Ser. No. 08/299,887, filed Sep. 1, 1994, U.S. Pat. No. 5,776,409, which is a continuation-in-part of U.S. application Ser. No. 08/148,544 filed Nov. 8, 1993, now U.S. Pat. No. 5,501,824, which is a continuation of U.S. application Ser. No. 07/900,001 filed Jun. 17, 1992 and now abandoned, which is a continuation of U.S. application Ser. No. 07/592,559 filed Oct. 4, 1990 and now U.S. Pat. No. 5,141,680; this application is also a continuation-in-part of U.S. application Ser. No. 07/861,210 filed Mar. 31, 1992 now U.S. Pat. No. 5,345,391, which is a continuation of U.S. application Ser. No. 07/331,644 filed Mar. 31, 1989 and now U.S. Pat. No. 5,184,307, which is a continuation-in-part of U.S. application Ser. No. 07/269,801 filed Nov. 8, 1988 and abandoned, which is a continuation-in-part of U.S. application Ser. No. 07/182,830 filed Apr. 18, 1988 and now U.S. Pat. No. 5,059,359. These parent applications are fully incorporated herein by reference, including any appendices attached thereto as if fully set forth herein.

U.S. application Ser. Nos. 07/182,830 and 07/331,644 were incorporated by reference into U.S. application Ser. No. 07/592,559.

U.S. Patent applications related to U.S. Ser. No. 07/182,830 and which were also filed concurrently on Apr. 18, 1988 are U.S. application Ser. No. 182,823, now abandoned; U.S. application Ser. No. 183,015, now U.S. Pat. No. 5,015,424; U.S. application Ser. No. 182,801, now U.S. Pat. No. 4,999,143; U.S. application Ser. No. 183,016, now U.S. Pat. No. 4,996,010; U.S. application Ser. Nos. 183,014; and 183,012, all of which are hereby incorporated by reference as though set forth in full herein. Continuations-in-part of U.S. application Ser. Nos. 182,830; 183,016; 183,014; and 183,012, were concurrently filed on Nov. 8, 1988, all of which are hereby incorporated by reference as though set forth in full herein. The U.S. patent application Ser. Nos. for the aforementioned continuations-in-part are U.S. patent application Ser. No. 268,816, now U.S. Pat. No. 5,058,988; U.S. application Ser. Nos. 268,837; 268,907, now U.S. Pat. No. 5,059,021; U.S. application Ser. No. 269,801, now abandoned (all for Ser. No. 182,830); and U.S. application Ser. No. 268,429, now U.S. Pat. No. 5,076,974 (for Ser. No. 183,016).

2. FIELD OF THE INVENTION

This invention relates generally to improvements in methods and apparatus for forming three-dimensional objects. More particularly, this invention relates to improvements in methods and apparatus involving the formation of such objects using materials including those which are normally solid but which are made flowable.

3. BACKGROUND OF THE INVENTION

Several model building techniques have recently become available for building three-dimensional objects in layers. One such technique is stereolithography, which is described in U.S. Pat. Nos. 4,575,330 and 4,929,402 hereinafter the '330 and the '402 patents), the disclosures of which are hereby fully incorporated by reference herein as though set forth in full. According to the principles of stereolithography, a three-dimensional object is formed layer by layer in a stepwise fashion out of a material capable of physical transformation upon exposure to synergistic stimulation. In one embodiment of stereolithography, layers of untransformed material such as liquid photopolymer or the like are successively formed at the working surface of a volume of the liquid photopolymer contained in a container. The untransformed layers are successively formed over previously-transformed material. The process of forming these untransformed layers is known as a recoating step, and is described in detail in U.S. application Ser. No. 515,479.

Upon formation, the untransformed layers are selectively exposed to synergistic stimulation such as UV radiation, or the like, whereupon they form object layers. Moreover, upon transformation into the object layers, the untransformed layers typically adhere to the previously-formed layers through the natural adhesive properties of the photopolymer upon solidification. Additional details about stereolithography are available in the following co-pending patent applications, all of which, including appendices, are hereby fully incorporated by reference herein as though set forth in full:

| U.S. patent application Ser. No. | Filing Date | Status |
|---|---|---|
| 07/182,830 | 4/18/88 | U.S. Pat. No. 5,059,359 |
| 07/183,016 | 4/18/88 | U.S. Pat. No. 4,996,010 |
| 07/182,801 | 4/18/88 | U.S. Pat. No. 4,999,143 |
| 07/183,015 | 4/18/88 | U.S. Pat. No. 5,015,424 |
| 07/268,429 | 11/8/88 | U.S. Pat. No. 5,076,974 |
| 07/268,837 | 11/8/88 | U.S. Pat. No. 5,123,734 |
| 07/268,816 | 11/8/88 | U.S. Pat. No. 5,058,988 |
| 07/268,907 | 11/8/88 | U.S. Pat. No. 5,059,021 |
| 07/331,644 | 3/31/89 | U.S. Pat. No. 5,184,307 |
| 07/339,246 | 4/7/89 | U.S. Pat. No. 5,104,592 |
| 07/429,435 | 10/30/89 | U.S. Pat. No. 5,130,064 |
| 07/365,444 | 6/12/89 | U.S. Pat. No. 5,143,663 |
| 07/427,885 | 10/27/89 | U.S. Pat. No. 5,133,987 |
| 07/429,911 | 10/27/89 | U.S. Pat. No. 5,182,056 |

In conventional embodiments of a stereolithographic apparatus, the material used is normally flowable so that it can be disposed onto a working surface in preparation for exposure to the synergistic stimulation. Conventional materials which are typically used are photopolymers which solidify upon exposure to UV radiation from a UV laser or the like.

The use of these conventional materials is sometimes problematic, since they can be toxic when placed in contact with the skin, and are also difficult to dispose of easily. The use of UV radiation from UV lasers is also sometimes problematic because of the potential injury to the human eye. As a result, the use of this radiation must be controlled, and precautions taken, to minimize the risk of eye injury. Moreover, the time required for the photopolymers to solidify upon exposure to the UV radiation can be prohibitively long. Finally, these materials are typically very viscous, so that the time required to form a fresh layer of material over the working surface in anticipation of the formation of the next object cross-section can be prohibitively long.

Another problem with conventional stereolithographic apparatus is the difficulty of rapidly substituting materials throughout the part-building process, which would enable different portions of the same part to be formed out of different materials having different properties such as color, conductivity, and the like. Rapid material substitution is difficult in a conventional stereolithography apparatus, since the material used to build the part is typically contained in a container, and it is difficult or time-consuming to be able to substitute different containers throughout part building.

Rapid material substitution, however, would be beneficial. When building part supports, such as web supports described in U.S. Pat. No. 4,999,143, for example, the ability to use a different material for the supports compared with the part would be desirable, because the supports could then be constructed out of a material which could more easily be removed from the part after the part has been built, without damage to the part. At present, in conventional stereolithographic apparatus, the same material is used to build the supports, causing them to adhere strongly to the part. As a result, the subsequent removal of the supports can lead to ripping or tearing of the part.

Consequently, it is an object of the subject invention to provide an apparatus of and method for providing three-dimensional objects through the principles of stereolithography, but which employ the use of normally solid materials which are made flowable upon the application of thermal radiation such as heat. It is a further object to provide such an apparatus which can be coupled to a conventional stereolithographic apparatus. It is a further object to provide a stereolithographic apparatus which enables rapid substitution of materials throughout part building. It is a further object to provide a stereolithographic apparatus for and method of forming three-dimensional objects which enable the use of a different support material from the material used to build the part, which support material is chosen so that it is easily removable from the part.

Additional objects and advantages will be set forth in the description which follows or will be apparent to those of ordinary skill in the art who practice the invention.

4. SUMMARY OF THE INVENTION

To achieve the foregoing objects, and in accordance with the purpose of the invention as broadly described herein, there is provided apparatus for and related methods of forming a three dimensional object, comprising: a frame; a container of a material which is normally in a solid state, and which is flowable when subjected to synergistic stimulation; first means for applying said synergistic stimulation to the material in the container whereupon the material in the container is caused to be flowable; a nozzle coupled to the container for dispensing the flowable material from the container through an outlet in the nozzle; second means responsive to control signals for controlling the flow of flowable material dispensed by the nozzle; a movable platform; translation means responsive to control signals fixed to the frame for translating the nozzle to a predetermined position relative to the movable platform; and at least one control computer for sending control signals to the second means, and the translation means, to apply the synergistic stimulation to the material to obtain flowable material and to selectively dispense the flowable material to form said three-dimensional object substantially layer-by-layer.

5. BRIEF DESCRIPTION OF THE DRAWINGS

FIG. 15 shows typical slicing of a CAD object;

FIGS. 16, 17 and 18 show slice (layer) data forming the object;

FIG. 20b shows a faceted CAD designed object after rounding of triangles—Scale 2—Scale 4—Scale 10;

FIG. 21a illustrates a faceted CAD designed object after rounding of triangles based on scale factor;

FIG. 21b shows a faceted CAD designed object after rounding of triangles in the vertical to slicing layers—layer thickness 20 nils;

FIG. 21c shows a faceted CAD designed object after rounding of triangles in the vertical to slicing layers—layer thickness 5 mils;

FIG. 25h is a top view of flat triangles forming a single double surface before flipping, after flipping, with segment normals, after cancellation of duplicate pairs, after splitting of vectors, and after loop determination (two);

FIG. 27e is a top view of boundary and hatch showing an order of drawing of hatch;

FIG. 28a is a side view of a CAD designed object;

FIG. 28b is a side view of the same CAD designed object built using slicing STYLE 1 or 2, with the perimeter of the CAD object drawn around it;

FIG. 28c is a side view of the same CAD designed object built using slicing STYLE 3 or 4, with the perimeter of the CAD object drawn around it;

FIG. 31m is a side view of a CAD designed object showing positions where down-facing, near-flat boundaries are obtained;

FIG. 31n is a side view of a CAD designed object showing down-facing, near-flat boundaries after they are moved to the layers on which they will be built (up two layers);

FIGS. 34d through 34l are further schematic diagrams illustrating vector order;

FIGS. 35a and 35b are APL programs for such a model;

FIGS. 37a, 37b and 37c illustrate the mathematical basis and derivations for cure compensation.

FIG. 39 is the format of the Object.STL file;

FIG. 44(A) illustrates the input parameters which can be keyed in at the SLICE user interface;

FIG. 44(B) illustrates the format of the Object.SLI file;

FIG. 45 illustrates the format of the Object.V file;

FIG. 50(A) illustrates a screen format for the PREPARE program;

FIG. 50(B) illustrates the format of MATERIAL.MAT;

FIG. 50(C) is a report from PREPARE interpreting the contents of the Object.R file;

FIG. 50(D) illustrates the format of the Object.L file;

FIG. 51 illustrates the format of the BUILD.PRM file;

FIG. 59(A) illustrates the difference between steep, near-flat, and flat triangles;

6. DESCRIPTION OF THE PREFERRED EMBODIMENT

Figure 86:
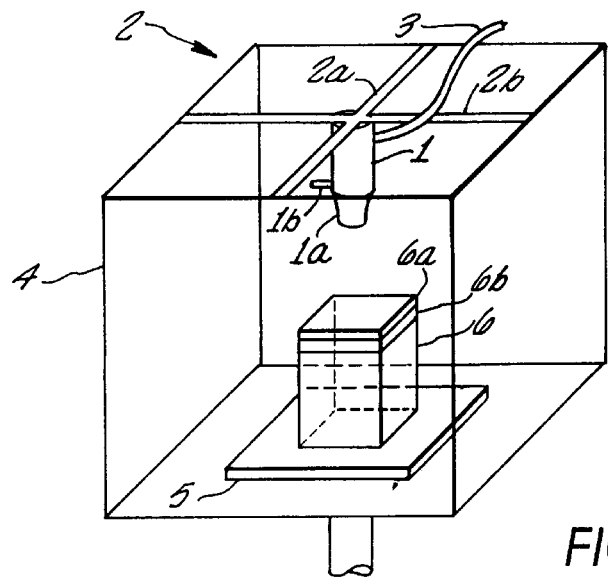
FIG. 86 illustrates one embodiment of an apparatus of the subject invention wherein a part is built from a normally solid material which is made flowable upon being heated.

An embodiment of the apparatus of the subject invention is illustrated in FIG. 86. As illustrated, the apparatus comprises dispensing nozzle 1, x-y translation means 2, flexible tube 3, frame 4, and movable platform 5. The dispensing nozzle is coupled to the x-y translation means, which, in turn, is coupled to the frame. The x-y translation means is capable of moving the nozzle to any x, y position within a plane, as shown. An example of a translation table is that available from Daedal, Inc., Harrison City, Pa. The nozzle is advantageously coupled to a source of material (not shown) by means of flexible tube 5, which provides material from the source to the dispensing nozzle. The platform 5 is advantageously coupled to a z-stage elevator (not shown), which is coupled to the frame, and is capable of moving the platform in the z-dimension relative to the frame. The x, y, and z dimensions are indicated in the figure. The z-stage elevator and the x-y translation means are advantageously coupled to a control computer, which, in turn, is advantageously coupled to a CAD system or the like. The translation means is capable of moving the nozzle to any x, y position within a plane in response to control signals, and the z-stage elevator, also in response to control signals, is capable of moving the platform to any position in the z dimension along a path substantially perpendicular to the plane. Together, the translation means and the z-stage elevator provide a capability to selectively dispense material to any selected position on the platform, as well as to positions on a partially-formed part above the platform in the course of building up the part.

The dispensing nozzle is advantageously fitted with removable tip 1a having an outlet of a particular size. The size of the outlet can be determined based on the particular application, and a tip with the appropriate size outlet can then be fitted to the nozzle. The size of the outlet determines the resolution of the final part. For parts where high resolution is not required, a tip with a relatively large outlet can be used, while for other arts, where high resolution is important, a tip with a small outlet can be used. Alternatively, different tips can be used throughout the building of a single part. For example, a tip with a small outlet could be used to form the boundaries of a part, where high resolution might be required, while a tip with a larger outlet could be used to rapidly fill in the areas within the boundaries.

As shown, the nozzle is advantageously coupled to a source of material by means of flexible tube 3. Preferably, the material is a material which is normally solid at room temperature, but which is rendered flowable when heated above its melting point. Possible materials include thermoplastics, hot-melt glue, wax, and cerro alloys (which typically have melting temperatures ranging from 150 to 340 degrees Fahrenheit). After it is dispensed, the material should be viscous enough to stay in place until it solidifies. In addition, it must be thin enough to be dispensed through the outlet.

The material is advantageously heated above its melting temperature at the source to render it flowable by means of a heater or the like (not shown). The material, once melted, will flow from the source to the nozzle by means of flexible tube 3. Alternatively, the source (and the heater) could be integrated with the nozzle, and the tube could then be eliminated. In this instance, both the integrated source and nozzle would be coupled to and movable by the x-y translation means.

When the material is relatively viscous, or the outlet of the nozzle relatively small, the material can be dispensed through the nozzle upon the application of pressure from a source (not shown). Air pressure is preferable, but an alternative form includes mechanical pressure as developed with a piston-type plunger. When the material is less viscous, or the outlet of the nozzle is larger, the material can be dispensed through the force of gravity.

The flow of material can be stopped by means of slidable valve 1b, in response to control signals, to physically block the flow. Alternatively, in those instances where flow has been initiated by pressure, the flow can be stopped by lessening, ceasing, or reversing the pressure. During part-building, it may be advantageous to periodically block the flow of material after a cross-section has been formed to give the material making up that cross-section tire to solidify. Then, the flow could be allowed to continue, and the material disposed to form the next cross-section.

In operation, the apparatus can be used to build a part as follows. First, a representation of the part is optionally provided to the control computer from a CAD system or the like. The control computer then slices the object representation into a plurality of layer representations collectively known as a building representation. The control computer then simultaneously directs the x-y movement of the nozzle and the z-movement of the platform in accordance with the building representation to selectively dispense material at the appropriate areas to form the part. First, material will be directly dispensed onto the platform. Then, as part building continues, the material from a cross-section will be dispensed onto a previous cross-section.

In practice, as described in U.S. Pat. No. 5,184,307, the control computer can comprise several computers, including a SLICE computer for slicing the object representation into a building representation, and a PROCESS computer for sending control signals to and directing movement of the x-y translation means and z-stage elevator, and for controlling the flow of material through the nozzle.

In FIG. 8b, cross-section 6b is formed by moving the platform until the previous cross-section is situated an appropriate vertical distance below the nozzle. Then, in accordance with the building representation, an appropriate volume of material is dispensed from the nozzle in accordance with the layer thickness prescribed by the building representation, while the nozzle is moved to the appropriate x, y locations on the working surface (which may either be the platform or a previous cross-section) in accordance with the prescribed pattern for the cross-section specified by the building representation.

After the material for the cross-section has been dispensed, it will then cool and harden into the next cross-section, and simultaneously adhere to the working surface, advantageously through the natural adhesive properties of the material as it cools. Alternatively, a pressure or heat-sensitive adhesive could be applied to ensure even greater adhesion.

The flow of material is then blocked, the platform lowered, and the next cross-section 6a formed in the manner previously described. In this manner, the final part 6 is formed, cross-section by cross-section, according to the principles of stereolithography.

After the part has been formed, it can be removed from platform 5 by heating the platform, thereby melting the thin layer of material bonding the part to the platform. Alternatively, this bond can be broken by sawing or cutting.

An advantageous aspect of this embodiment is the ability to rapidly change materials which are dispensed through the nozzle. This can simply be accomplished by substituting one source of material for another by simply connecting the remote end of flexible tube 3 to a different source. Alternatively, many different sources can be coupled to the nozzle through their own respective tubes, the control of the flow of material from each source to the nozzle being controlled by a slidable valve for each tube, as previously described.

After a cross-section has been formed out of a first material, for example, it may be advantageous to fill the hollow areas on that cross-section with a second material in order to provide support for portions of the next cross-section. The second material can be chosen such that it can easily be removed from the final part after building is complete. One way to accomplish this is to employ a second material which has a lower melting point than the material used to built the part.

Figure 87:
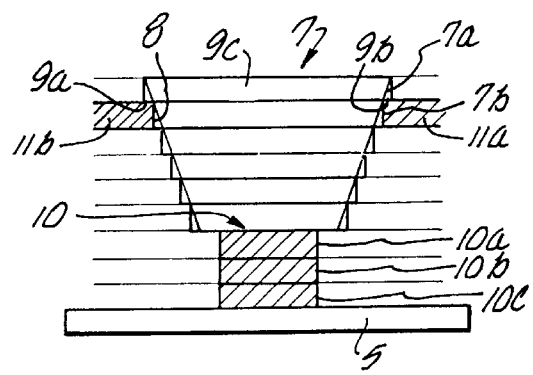
FIG. 87 illustrates the use of a second such material to provide support to otherwise unsupported portions of cross-sections.

In FIG. 87, for example, part 7 is illustrated. The object representation used to construct the part is identified with reference numeral 8, and the cross-sections of the built part are denoted by numerals 7a, 7b, etc. As indicated, in this example, the part is built in an oversized style relative to the object representation. As shown, each of the part layers will have some unsupported portions. The portions of cross-section 7a which are unsupported will be portions 9a and 9b.

These unsupported portions may be problematic, especially since the material may not harden immediately upon leaving nozzle 1, but instead may, for a time, remain flowable after it has been deposited. In this instance, especially if the unsupported sections are in the shape of a cantilevered beam or the like, the unsupported portions may collapse unless means are provided to support the unsupported portions, at least until the material making up these portions has solidified enough so that these portions will support themselves.

An advantageous way to provide support is by dispensing a second support material in the appropriate regions on the previous cross-section in order to support the unsupported portions of the next cross-section. In FIG. 87, for example, cross-hatched areas 11a and 11b might be filled with a support material in order to support portions 9a and 9b.

This support material, like the building material used to built the part, can have the properties of being normally solid, of being flowable upon being heated, and then solidifying after it is being dispensed from the nozzle. However, the support material should have the property of being easily separable from the part at a later stage of processing. As mentioned previously, one way to accomplish this by utilizing a support material which has a lower melting point than the building material.

The support material is preferably wax, a thermoplastic, hot melt glue (such as that dispensed from a hot melt glue gun), a metal having a lower melting point than the first material, a powder, or a liquid of higher density than the first material and which does not bond to it. Possible liquids include heavy water, a fluorocarbon, heavy ethylene glycol, or salt water. Advantageously, the support material should be a good thermal conductor. This property will speed up the time it takes for the building material to solidify after it has been dispensed, since it will facilitate the conduction of heat away from this material.

To provide support to the next cross-section, the hollow areas in a particular cross-section which are not to be solidified into the final part (hereinafter referenced to as the "void" or "hollow" areas) can be filled with the support material. As discussed previously, this can be accomplished simply by changing the source of the material coupled to the nozzle.

Also, as discussed previously, the building material is normally a solid at room temperature. Alternatively, if the part 6, while it is being formed, is kept below room temperature, a building material can be used which is a liquid at room temperature, as long as the part is kept below the freezing point of the material, so that the building material will solidify upon contacting the partially-formed part.

The speed with which this material, after it has been dispensed, will solidify, depends on the thermal conductivity of the immediate environment surrounding the material after it has been dispensed. This environment will typically include the previous cross-section, any support material from the previous cross-section, and the air. As a result, it will be advantageous to keep the already-formed cross-sections and support material substantially below the melting point of the building material in order to speed up the solidification process.

In the case where a thermally-flowable support material is used which solidifies after it is dispensed, it is advantageous to utilize a support material having a lower melting point than the building material. This property will enable the support material, after it has solidified, to simply be melted off of the part without damaging it. This separation can be accomplished after the next cross-section has been solidified, since this cross-section would then no longer need support. Alternatively, separation can be effectuated after the entire part has been built.

The support material, after it has been dispensed, should be maintained below its melting point, even after it is placed in contact with just-dispensed building material, which will typically still be hot. Otherwise, the support material will melt when it is placed in contract with the just-dispensed building material.

To accomplish this, a support material should be used which has a high enough thermal conductivity so that it does not melt when placed in contact with the building material. Alternatively, if the temperature of the support material is kept low enough, it nay not have to be a good thermal conductor providing it has a high enough heat capacity at the interface with the building material so that it does not melt.

In some cases, it may be desirable to use a support material having a higher melting temperature than the building material since this will facilitate the creation of hollow molds or the like, which can subsequently be used to produce the part on a production scale.

In FIG. 87, for example, the hollow areas in all the cross-sections can be filled in with such a support material. Then, after the part has been formed, the building material could be melted and drained off without damaging the solidified support material.

Additional elements could be added to cool the building material as it exits the nozzle. For example, a hose (not shown) can be situated near the nozzle outlet to divert a spray of air or water mist towards the material as it is being dispensed. Alternatively, a gas or a liquid having a lower density than the building material, and hence capable of absorbing heat from the building material, can be directed towards the nozzle.

Figure 2I:
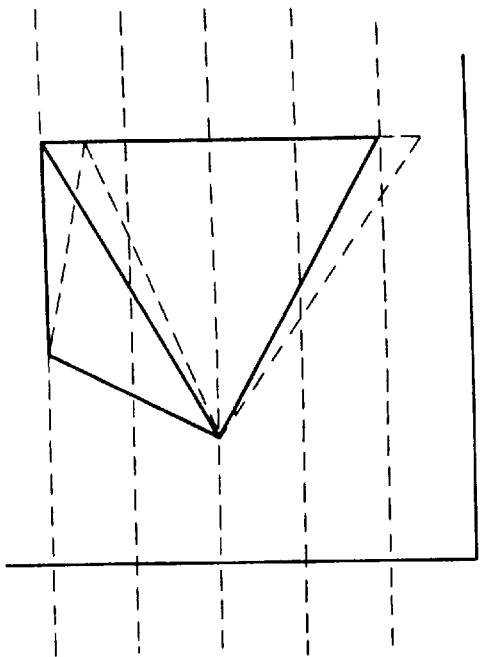
FIGS. 2 and 3 are flow charts illustrating the basic concepts employed in practicing the method of stereolithography of the present invention.
Figure 2I:
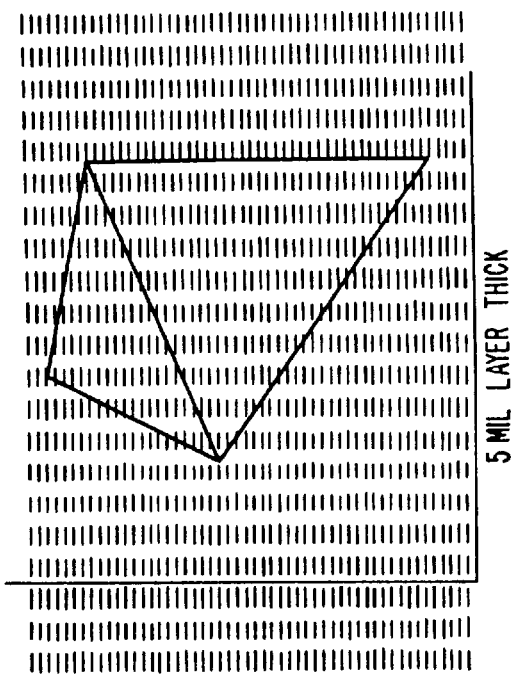
Figure 2I:
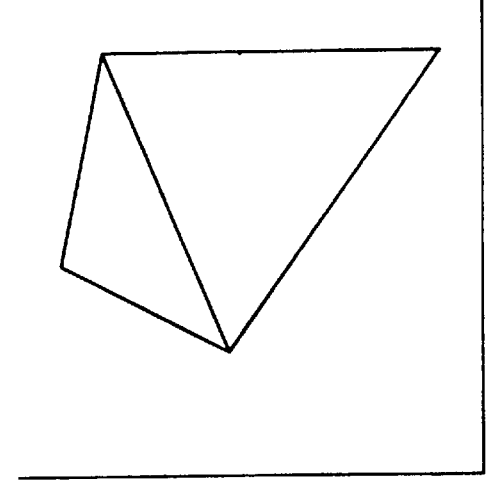

Alternative means of providing support other than the use of support material to fill hollow areas in object cross-sections can be utilized. One alternative approach comprises altering the order in which the building material on a cross-section is dispensed. Instead of simply dispensing the material from one side of the cross-section to the other, this approach comprises first dispensing the material to those portions of the cross-section which are supported, and then radially extending those cross-sections to include the unsupported portions. In FIG. 2, for example, for the building of cross-section 6b, building material might initially be dispensed at point 9c, and then be extended radially to include portions 9a and 9b. Provided that the unsupported portions 9a and 9b are not too large, support will be provided to then by the supported portion 9c.

A third approach to providing support is the use of a support material to actually build supports, such as web supports, as described in U.S. Pat. No. 4,999,143. Such a support material would have all the properties discussed previously, e.g., it would preferably have a lower melting point than the building material so that it could later be separated from the part without damaging the part. FIG. 87 illustrates web support 10 which spaces the part 7 from the platform 5, and which also supports the part from the bottom surface. As discussed in U.S. Pat. No. 4,999,143, web supports could also be used to support portions of a part other than the bottom surface, such as a cantilevered surface. These surfaces could be supported by a web support connecting the surface to the platform, or alternatively, to another part surface. The web support in FIG. 87 is comprised of three cross-sections, numbered 10*a*, 10*b*, and 10*c*, each of which could be formed using the support material in the manner described previously.

It is advantageous to be able to incorporate the teachings of the subject invention into a conventional stereolithography apparatus, i.e., one employing a container of a material capable of physical transformation upon selective exposure to synergistic stimulation such as a polymerizable resin which solidifies upon a UV laser beam, a recoating means such as a z-stage elevator, and means such as a doctor blade or the like to rapidly coat fresh layers of resin over previous cross-sections.

Figure 88:
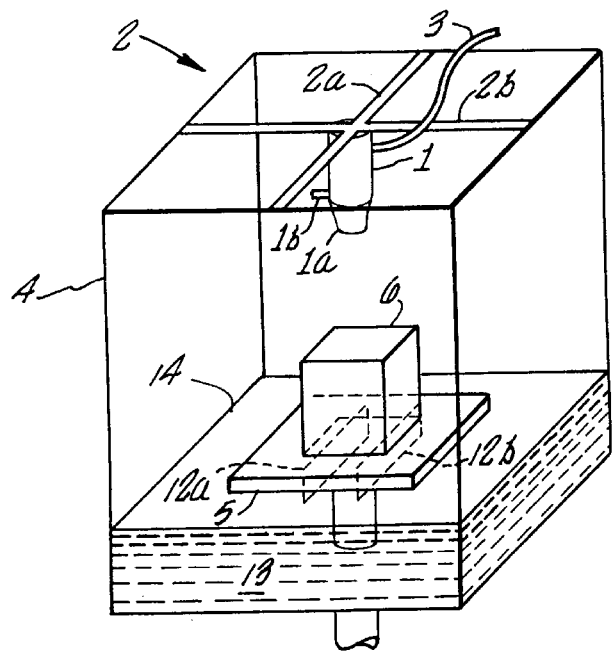
FIG. 88 illustrates a second embodiment of an apparatus of the subject invention comprising the apparatus of FIG. 86 coupled to a conventional stereolithographic apparatus.

An apparatus which incorporates these teachings is illustrated in FIG. 88, in which, compared to FIG. 86, like elements are referred to with like reference numerals. The additional elements in FIG. 88 not previously discussed are container 13 containing a material capable of physical transformation upon selective exposure to synergistic stimulation, such as a polymerizable resin which solidifies upon exposure to UV radiation, a doctor blade (not shown), a source of synergistic stimulation such as a UV laser (not shown) which emits a UV laser beam, and rotatable scanning mirrors (not shown) capable of directing the UV laser beam to a point on the material surface 14. Part 6 is shown as being formed, and spaced from platform 5, by already-formed web supports 12*a* and 12*b*. The platform, as before, is coupled to a z-stage elevator (not shown), which is capable of raising the platform into and out of the container of material, below the material surface if necessary, and also to a position proximate to nozzle 1.

Each cross-section of the supports 12*a* and 12*b*, and the part 6, can be formed from a material dispensed through the nozzle, or from material contained in the container. Material from the nozzle will be selectively dispensed in the manner previously described. Fresh material from the container will not be selectively dispensed, but instead will be recoated over the platform or previous cross-section in the conventional manner, i.e., by overdipping the platform or previous cross-section below the material surface, whereupon a fresh layer of material flows over the platform or previous cross-section, and then up-dipping the upper surface of the fresh layer of material above the material surface, whereupon excess resin is swept away by the doctor blade. After recoating, the fresh layer of material is then typically selectively exposed to the synergistic stimulation.

Many building methods are possible with this apparatus. For example, web supports could be formed out of normally solid, thermally-flowable material dispensed from the nozzle, and the part could be formed out of a material capable of selective physical transformation upon exposure to synergistic stimulation, which is contained in a container. Moreover, the hollow areas of the cross-sections could be filled in with the normally-sold, thermally-flowable material dispensed from the nozzle to provide even additional support.

In this instance, part formation would proceed as follows. First, support material on the nozzle would be selectively dispensed onto the platform or previous cross-section in those areas which will not be part of the final part, and then allowed to solidify. In FIG. 87, for example, this material would be dispensed in areas 11*a* and 11*b* of cross-section 7*b*. This material would not be dispensed into the areas on the cross-section which are to solidify into the final part. After this support material has solidified, a mold in the shape of the part cross-section will be formed. Then, the platform and the upper surface of this solidified support material could be down-dipped deeply below material surface 14, causing fresh building material from the container to flow into those areas on the cross-section which are to be solidified into the final part. In FIG. 87, for example, deep down-dipping will cause area 9*c* to fill with the building material from the container. The platform could then be up-dipped and the doctor blade or the like utilized to sweep away any excess material. Next, this building material would be selectively exposed to the synergistic stimulation in the conventional manner, i.e., by rotating the mirrors to trace the beam along the surface of this material in a prescribed pattern. Alternatively, this material could be flood-exposed to the synergistic stimulation. Flood exposure rather than selective exposure is possible since any excess material has already been removed which could conceivably be improperly solidified. This has been accomplished by the action of the doctor blade, but also by the previous step of dispensing the normally solid, thermally-flowable support material to effectively form a mold of the part cross-section. This latter step ensures that little or no excess material from the container will be present in these areas which could be improperly solidified.

Then, this process could continue for the formation of the next cross-section. The support material could then be removed in the manner previously described.

Note that by dispensing the support material before recoating with the building material ensures that excess support material will not solidify over those portions of the solidified building material which will be adhered to adjacent part cross-sections. As a result, a machining step whereby any such excess support material would need to be machined off in order to ensure adherence is eliminated.

Alternatively, it may be advantageous to add a machining step before recoating with the building material in order to smooth the solidified support material. This might facilitate the flow of building material over the solidified support material, and may even facilitate sweeping with the doctor blade or the like, during the recoating step. To avoid any damage to the solidified material during the recoating step, it may be advantageous to perform sweeping with a squeegee rather than a doctor blade.

In the above description, the support material is the normally-solid thermally-flowable material selectively dispensed from the nozzle, and the building material is the material in the container capable of selective physical transformation upon exposure to the synergistic stimulation. Alternatively, one of ordinary skill may appreciate that the support structure, whether web supports or layer-by-layer support, could be formed out of the material in the container, and the part could be formed out of the material dispensed from the nozzle.

While embodiments and applications of this invention have been shown and described, it should be apparent to those skilled in the art that many more modifications are possible without departing from the inventive concepts herein. Specifically, the invention is intended to encompass stereolithographic part building employing any material which is normally in a solid state and which is flowable when subjected to any form of synergistic stimulation. Included are materials made flowable upon conduction of heat, through application of a probe or the like, or through ion or particle bombardment or the like. Also included are materials made flowable upon application of radiation of heat from a $CO_2$ or infrared laser, or the like. The invention is further intended to encompass materials which are made flowable upon the application of heat through a chemical reaction, such as where heat is released when a first material is placed in contact with a second material, causing the first material to be made flowable, or where the first and second materials are placed in contact with a third material, causing the third material to be made flowable.

The remainder of this specification comprises text from copending Ser. No. 07/861,210 which as stated above was a continuation of U.S. Pat. No. 5,184,307. U.S. Pat. No. 5,184,307 was incorporated by reference into Ser. No. 07/592,559 which is related to this current application as stated in the cross-reference to related applications section. The following text is directed to slicing techniques as used in connection with the building of three-dimensional objects, and by the incorporation by reference as described above, these techniques are related to the foregoing description of object building.

Figure 1:
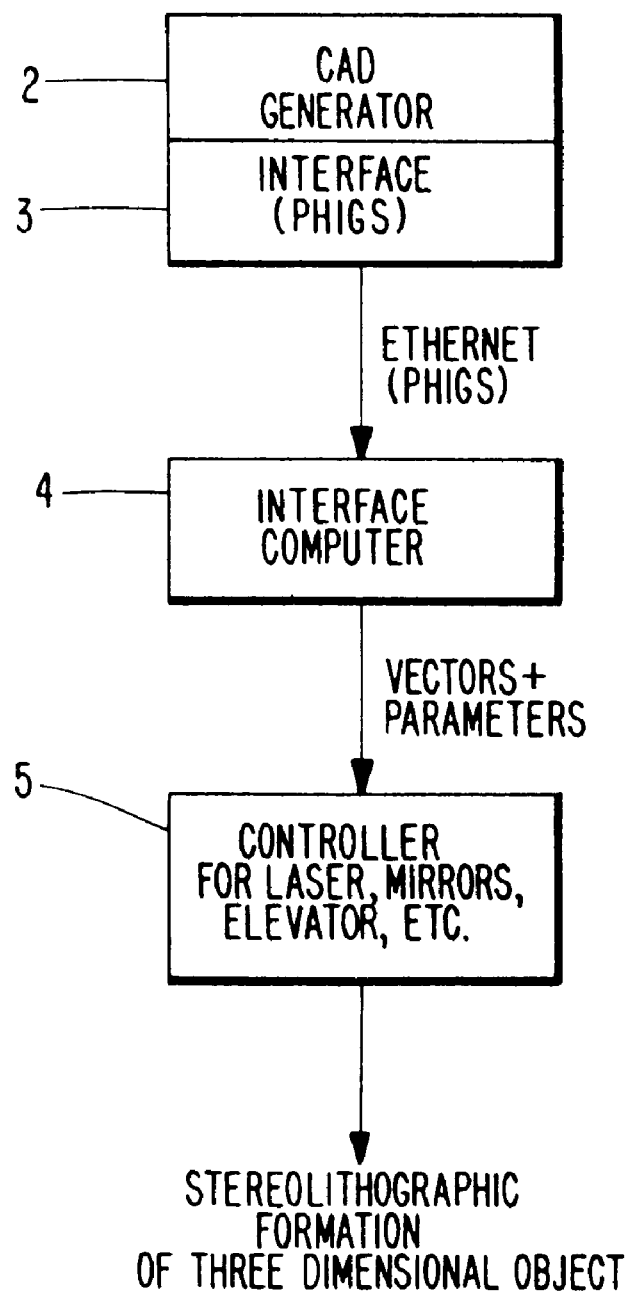
FIG. 1 is an overall block diagram of a stereolithography system for the practice of the present invention.

Referring now to the drawings, and particularly to FIG. 1 thereof, there is shown a block diagram of an overall stereolithography system suitable for practicing the present invention. A CAD generator 2 and appropriate interface 3 provide a data description of the object to be formed, typically in PHIGS format, via network communication such as ETHERNET or the like to an interface computer 4 where the object data is manipulated to optimize the data and provide output vectors which reduce stress, curl and distortion, and increase resolution, strength, accuracy, speed and economy of reproduction, even for rather difficult and complex object shapes. The interface computer 4 generates layer data by slicing, varying layer thickness, rounding polygon vertices, filling, generating flat skins, near-flat skins, up-facing and down-facing skins, scaling, cross-hatching, offsetting vectors and ordering of vectors.

The vector data and parameters from the computer 4 are directed to a controller subsystem 5 for operating the system stereolithography laser, mirrors, elevator and the like.

Figure 3L:
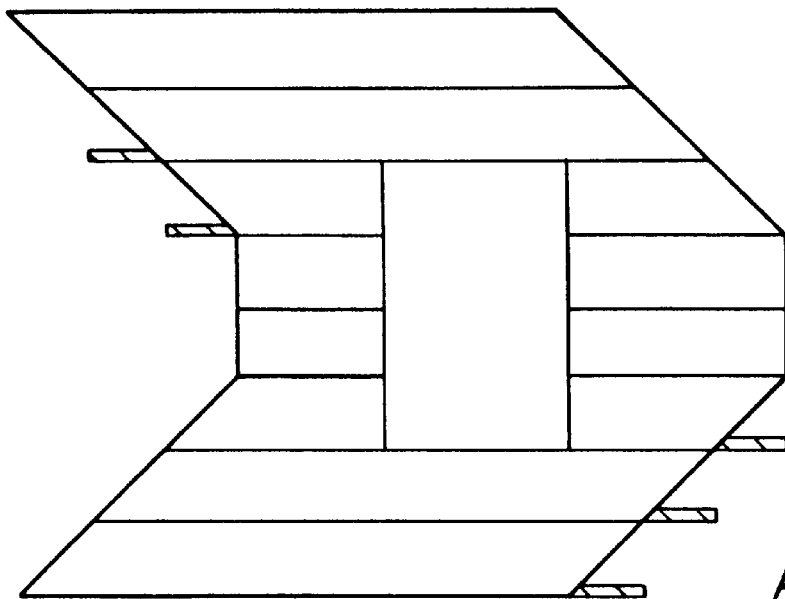
Figure 3L:
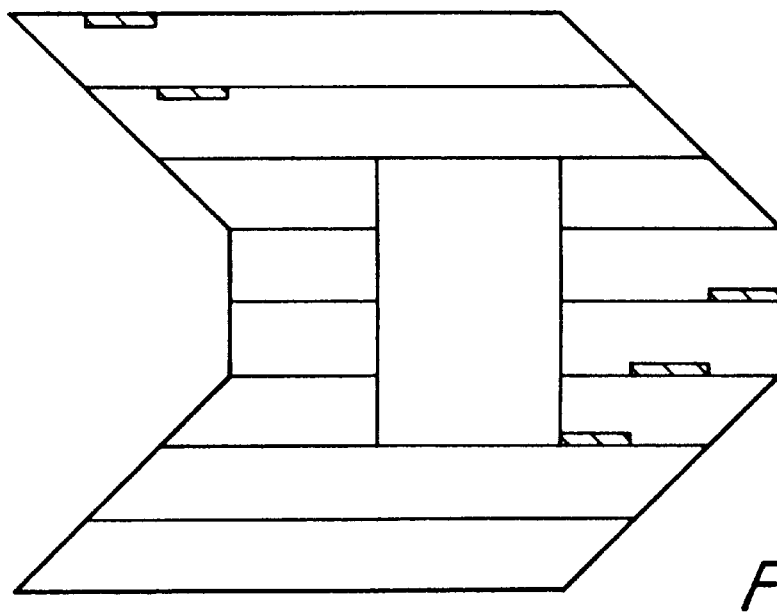

FIGS. 2 and 3 are flow charts illustrating the basic system of the present invention for generating three-dimensional objects by means of stereolithography.

Many liquid state chemicals are known which can be induced to change to solid state polymer plastic by irradiation with ultraviolet light (UV) or other forms of synergistic stimulation such as electron beams, visible or invisible light, reactive chemicals applied by ink jet or via a suitable mask., UV curable chemicals are currently used as ink for high speed printing, in processes of coating or paper and other materials, as adhesives, and in other specialty areas.

Lithography is the art of reproducing graphic objects, using various techniques. Modern examples include photographic reproduction, xerography, and microlithography, as is used in the production of microelectronics. Computer generated graphics displayed on a plotter or a cathode ray tube are also forms of lithography, where the image is a picture of a computer coded object.

Computer aided design (CAD) and computer aided manufacturing (CAM) are techniques that apply the abilities of computers to the processes of designing and manufacturing. A typical example of CAD is in the area of electronic printed circuit design, where a computer and plotter draw the design of a printed circuit board, given the design parameters as computer data input. A typical example of CAM is a numerically controlled milling machine, where a computer and a milling machine produce metal parts, given the proper programming instructions. Both CAD and CAM are important and are rapidly growing technologies.

A prime object of the present invention is to harness the principles of computer generated graphics, combined with UV curable plastic and the like, to simultaneously execute CAD and CAM, and to produce three-dimensional objects directly from computer instructions. This invention, referred to as stereolithography, can be used to sculpture models and prototypes in a design phase of product development, or as a manufacturing device, or even as an art form. The present invention enhances the developments in stereolithography set forth in U.S. Pat. No. 4,575,330, issued Mar. 11, 1986, to Charles W. Hull, one of the inventors herein.

Referring now more specifically to FIG. 2 of the drawing, the stereolithographic method is broadly outlined. Step 8 calls for generation of CAD or other data, typically in digital form, representing a three-dimensional object to be formed by the system. This CAD data usually defines surfaces in polygon format, triangles and normals perpendicular to the planes of those triangles, e.g., for slope indications, being presently preferred, and in a presently preferred embodiment of the invention conforms to the Programmer's Hierarchial Interactive Graphics System (PHIGS) now adapted as an ANSI standard. This standard is described, by way of example in the publication "Understanding PHIGS", published by Template, Megatek Corp., San Diego, Calif.

In Step 9, the PHIGS data or its equivalent is converted, in accordance with the invention, by a unique conversion system to a modified data base for driving the stereolithography output system in forming three-dimensional objects. In this regard, information defining the object is specially processed to reduce stress, curl and distortion, and increase resolution, strength and accuracy of reproduction.

Step 10 in FIG. 2 calls for the generation of individual solid laminae representing cross-sections of a three-dimensional object to be formed. Step 11 combines the successively formed adjacent laminae to form the desired three-dimensional object which has been programmed into the system for selective curing.

Hence, the stereolithographic system of the present invention generates three-dimensional objects by creating a cross-sectional pattern of the object to be formed at a selected surface of a fluid medium, e.g., a UV curable liquid or the like, capable of altering its physical state in response to appropriate synergistic stimulation such as impinging radiation, electron beam or other particle bombardment, or applied chemicals (as by ink jet or spraying over a mask adjacent the fluid surface), successive adjacent laminae, representing corresponding successive adjacent cross-sections of the object, being automatically formed and integrated together to provide a step-wise laminar or thin layer buildup of the object, whereby a three-dimensional object is formed and drawn from a substantially planar or sheet-like surface of the fluid medium during the forming process.

The aforedescribed technique illustrated in FIG. 2 is more specifically outlined in the flowchart of FIG. 3, where again Step 8 calls for generation of CAD or other data, typically in digital form, representing a three-dimensional object to be ,formed by the system. Again, in Step 9, the PHIGS data is converted by a unique conversion system to a modified data base for driving the stereolithography output system in forming three-dimensional objects. Step 12 calls for containing a fluid medium capable of solidification in response to prescribed reactive stimulation. Step 13 calls for application of that stimulation as a graphic pattern, in response to data output from the computer 4 in FIG. 1, at a designated fluid surface to form thin, solid, individual layers at that surface, each layer representing an adjacent cross-section of a three-dimensional object to be produced. In the practical application of the invention, each lamina will be a thin lamina, but thick enough to be adequately cohesive in forming the cross-section and adhering to the adjacent laminae defining other cross-sections of the object being formed.

Step 14 in FIG. 3 calls for superimposing successive adjacent layers or laminae on each other as they are formed, to integrate the various layers and define the desired three-dimensional object. In the normal practice for the invention, as the fluid medium cures and solid material forms to define one lamina, that lamina is moved away from the working surface of the fluid medium and the next lamina is formed in the new liquid which replaces the previously formed lamina, so that each successive lamina is superimposed and integral with (by virtue of the natural adhesive properties of the cured fluid medium) all of the other cross-sectional laminae. Of course, as previously indicated, the present invention also deals with the problems posed in transitioning between vertical and horizontal.

The process of producing such cross-sectional laminae is repeated over and over again until the entire three-dimensional object has been formed. The object is then removed and the system is ready to produce another object which may be identical to the previous object or may be an entirely new object formed by changing the program controlling the stereolithographic system.

Figure 4:
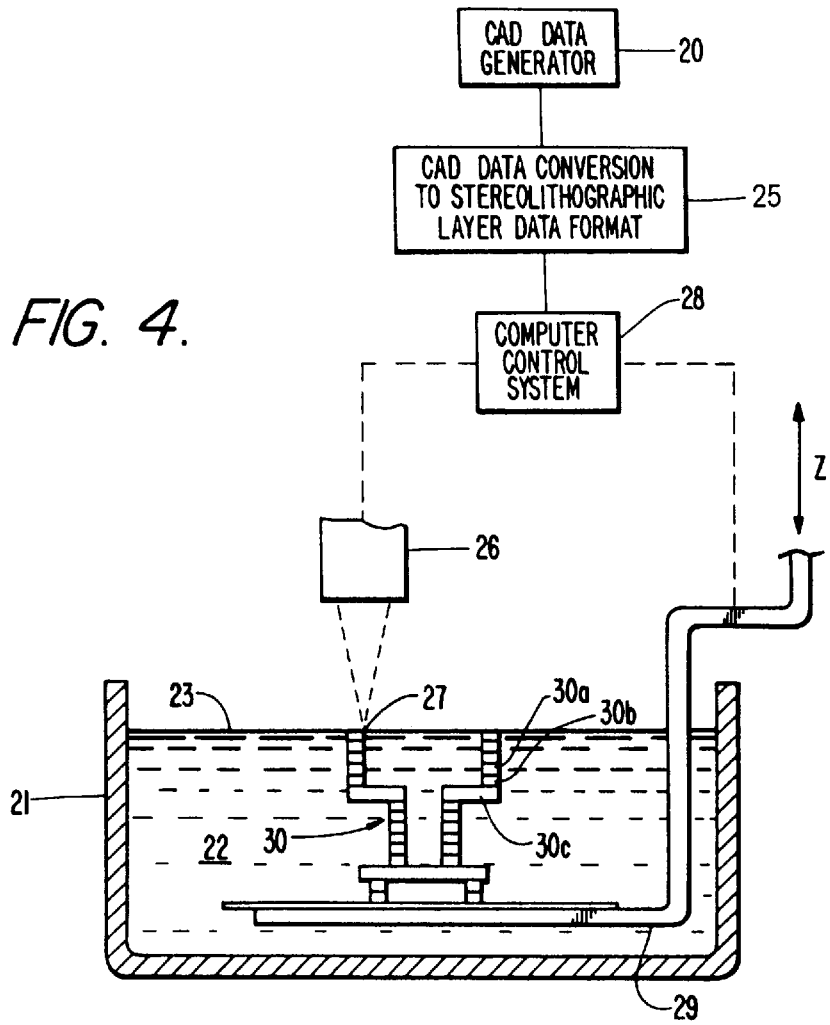
FIG. 4 is a combined block diagram, schematic and elevational sectional view of a system suitable for practicing the invention.
Figure 5:
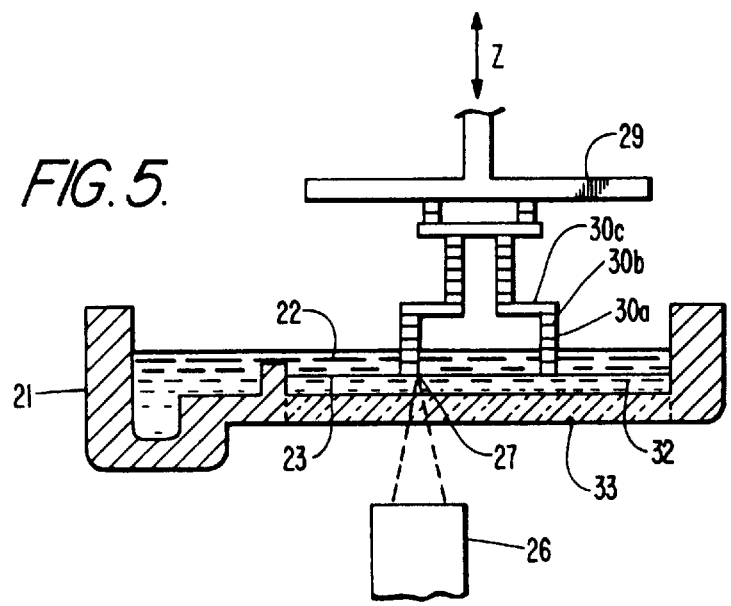
FIG. 5 is an elevational sectional view of a second embodiment of a stereolithography system for the practice of the invention.

FIGS. 4–5 of the drawings illustrate various apparatus suitable for implementing the stereolithographic methods illustrated and described by the systems and flow charts of FIGS. 1–3.

As previously indicated, "Stereolithography" is a method and apparatus for making solid objects by successively "printing" thin layers of a curable material, e.g., a UV curable material, one on top of the other. A programmable movable spot beam of UV light shining on a surface or layer of UV curable liquid is used to form a solid cross-section of the object at the surface of the liquid. The object is then moved, in a programmed manner, away from the liquid surface by the thickness of one layer and the next cross-section is then formed and adhered to the immediately preceding layer defining the object. This process is continued until the entire object is formed.

Essentially all types of object forms can be created with the technique of the present invention. Complex forms are more easily created by using the functions of a computer to help generate the programmed commands and to then send the program signals to the stereolithographic object forming subsystem.

The data base of a CAD system can take several forms. One form, as previously indicated, consists of representing the surface of an object as a mesh of triangles (PHIGS). These triangles completely form the inner and outer surfaces of the object. This CAD representation also includes a unit length normal vector for each triangle. The normal points away from the solid which the triangle is bounding. This invention provides a means of processing such CAD data into the layer-by-layer vector data that is necessary for forming objects through stereolithography.

For stereolithography to successfully work, there must be good adhesion from one layer to the next. Hence, plastic from one layer must overlay plastic that was formed when the previous layer was built. In building models that are made of vertical segments, plastic that is formed on one layer will fall exactly on previously formed plastic from the preceding layer, and thereby provide good adhesion. As one starts to make a transition from vertical to horizontal features, using finite jumps in layer thickness, a point will eventually be reached where the plastic formed on one layer does not make contact with the plastic formed on the previous layer, and this causes severe adhesion problems. Horizontal surfaces themselves do not present adhesion problems because by being horizontal the whole section is built on one layer with side-to-side adhesion maintaining structural integrity. This invention provides a general means of insuring adhesion between layers when making transitions from vertical to horizontal or horizontal to vertical sections, as well as providing a way to completely bound a surface, and ways to reduce or eliminate stress and strain in formed parts.

A presently preferred embodiment of a new and improved stereolithographic system is shown in elevational cross-section in FIG. 4. A container 21 is filled with a UV curable liquid 22 or the like, to provide a designated working surface 23. A programmable source of ultraviolet light 26 or the like produces a spot of ultraviolet light 27 in the plane of surface 23. The spot 27 is movable across the surface 23 by the motion of mirrors or other optical or mechanical elements (not shown in FIG. 4) used with the light source 26. The position of the spot 27 on surface 23 is controlled by a computer control system 28. As previously indicated, the system 28 may be under control of CAD data produced by a generator 20 in a CAD design system or the like and directed in PHIGS format or its equivalent to a computerized conversion system 25 where information defining the object is specially processed to reduce stress, curl and distortion, and increase resolution, strength and accuracy of reproduction.

A movable elevator platform 29 inside container 21 can be moved up and down selectively, the position of the platform being controlled by the system 28. As the device operates, it produces a three-dimensional object 30 by step-wise buildup of integrated laminae such as 30a, 30b, 30c.

The surface of the UV curable liquid 22 is maintained at a constant level in the container 21, and the spot of UV light 27, or other suitable form of reactive stimulation, of sufficient intensity to cure the liquid and convert it to a solid material is moved across the working surface 23 in a programmed manner. As the liquid 22 cures and solid material forms, the elevator platform 29 that was initially just below surface 23 is moved down from the surface in a programmed manner by any suitable actuator. In this way, the solid material that was initially formed is taken below surface 23 and new liquid 22 flows across the surface 23. A portion of this new liquid is, in turn, converted to solid material by the programmed UV light spot 27, and the new material adhesively connects to the material below it. This process is continued until the entire three-dimensional object 30 is formed. The object 30 is then removed from the container 21, and the apparatus is ready to produce another object. Another object can then be produced, or some new object can be made by changing the program in the computer 28.

The curable liquid 22, e.g., UV curable liquid, must have several important properties: (A) It must cure fast enough with the available UV light source to allow practical object formation times. (B) It must be adhesive, so that successive layers will adhere to each other. (C) Its viscosity must be low enough so that fresh liquid material will quickly flow across the surface when the elevator moves the object. (D) It should absorb UV so that the film formed will be reasonably thin. (E) It must be reasonably insoluble in a solvent in the solid state, so that the object can be washed free of the UV cure liquid and partially cured liquid after the object has been formed. (F) It should be as non-toxic and non-irritating as possible.

The cured material must also have desirable properties once it is in the solid state. These properties depend on the application involved, as in the conventional use of other plastic materials. Such parameters as color, texture, strength, electrical properties, flammability, and flexibility are among the properties to be considered. In addition, the cost of the material will be important in many cases.

The UV curable material used in the presently preferred embodiment of a working stereolithograph (e.g., FIG. 3) is DeSoto SLR 800 stereolithography resin, made by DeSoto, Inc. of Des Plains, Ill.

The light source 26 produces the spot 27 of UV light small enough to allow the desired object detail to be formed, and intense enough to cure the UV curable liquid being used quickly enough to be practical. The source 26 is arranged so it can be programmed to be turned off and on, and to move, such that the focused spot 27 moves across the surface 23 of the liquid 22. Thus, as the spot 27 moves, it cures the liquid 22 into a solid, and "draws" a solid pattern on the surface in much the same way a chart recorder or plotter uses a pen to draw a pattern on paper.

The light source 26 for the presently preferred embodiment of a stereolithography is typically a helium-cadmium ultraviolet laser such as the Model 424 ON He Dc Multimode Laser, made by Liconix of Sunnyvale, Calif.

In the system of FIG. 4, means may be provided to keep the surface 23 at a constant level and to replenish this material after an object has been removed, so that the focus spot 27 will remain sharply in focus on a fixed focus plane, thus insuring maximum resolution in forming a thin layer along the working surface. In this regard, it is desired to shape the focal point to provide a region of high intensity right at the working surface 23, rapidly diverging to low intensity and thereby limiting the depth of the curing process to provide the thinnest appropriate cross-sectional laminae for the object being formed.

The elevator platform 29 is used to support and hold the object 30 being formed, and to move it up and down as required. Typically, after a layer is formed, the object 30 is moved beyond the level of the next layer to allow the liquid 22 to flow into the momentary void at surface 23 left where the solid was formed, and then it is moved back to the correct level for the next layer. The requirements for the elevator platform 29 are that it can be moved in a programmed fashion at appropriate speeds, with adequate precision, and that it is powerful enough to handle the weight of the object 30 being formed. In addition, a manual fine adjustment of the elevator platform position is useful during the set-up phase and when the object is being removed.

The elevator platform 29 can be mechanical, pneumatic, hydraulic, or electrical and may also be optical or electronic feedback to precisely control its position. The elevator platform 29 is typically fabricated of either glass or aluminum, but any material to which the cured plastic material will adhere is suitable.

A computer controlled pump (not shown) may be used to maintain a constant level of the liquid 22 at the working surface 23. Appropriate level detection system and feedback networks, well known in the art, can be used to drive a fluid pump or a liquid displacement device, such as a solid rod (not shown) which is moved out of the fluid medium as the elevator platform is moved further into the fluid medium, to offset changes in fluid volume and maintain constant fluid level at the surface 23. Alternatively, the source 26 can be moved relative to the sensed level 23 and automatically maintain sharp focus at the working surface 23. All of these alternatives can be readily achieved by appropriate data operating in conjunction with the computer control system 28.

As an overview, the portion of our processing referred to as "SLICE" takes in the object that you want to build, together with any scaffolding or supports that are necessary to make it more buildable. These supports are typically generated by the user's CAD. The first thing SLICE does is to find the outlines of the object and its supports.

SLICE defines each microsection or layer one at a time under certain specified controlling and styles. SLICE produces a boundary to the solid portion of the object. If, for instance, the object is hollow, there will be an outside surface and an inside one which surfaces comprises an outline of the object. The SLICE program then takes that outline or series of outlines and recognizes that the object would collapse due to the outside and inside skins not joining together because there is liquid between them. SLICE then turns this into a contiguous product, a real part by putting in cross-hatching between the surfaces and solidifying everything in between or adding skins. Adding skins is advantageous where too gentle a slope exists between successive layers such that one layer will not join together with the successive layer as exemplified by past history or by the slopes of triangles depicted in the PHIGS format. SLICE does all those things and uses lookup tables pertaining to the chemical characteristics of the photopolymer, how powerful the laser is, and related parameters to indicate how long to expose each of the output vectors used to operate the system. That output consists of identifiable groups. one group consists of the boundaries or outlines. Another group consists of cross-hatches. A third group consists of skins of which there are subgroups, upward facing skins and downward facing skins which have to be treated slightly differently. These subgroups are all tracked differently because they may get slightly different treatment. The output data is then appropriately Managed to form the desired object and supports.

After the three-dimensional object 30 has been formed, the elevator platform 29 is raised and the object is removed from the platform for post processing.

In addition, there may be several containers 21 used in the Practice of the invention, each container having a different type of curable material that can be automatically selected by the stereolithographic system. In this regard, the various materials might provide plastics of different colors, or have both insulating and conducting material available for the various layers of electronic products.

Referring now more particularly to the remaining drawings, in connection with various alternative embodiments of the invention, like reference numerals throughout the various figures of the drawings denote like or corresponding parts as those previously discussed in connection with the preferred embodiment of the invention shown in FIG. 4.

As will be apparent from FIG. 5 of the drawings, there is shown an alternate configuration of a stereolithograph wherein the UV curable liquid 22 or the like floats on a heavier UV transparent liquid 32 which is non-miscible and non-wetting with the curable liquid 22. By way of example, ethylene glycol or heavy water are suitable for the intermediate liquid layer 32. In the system of FIG. 5, the three-dimensional object 30 is pulled up from the liquid 22, rather than down and further into the liquid medium, as shown in the system of FIG. 4.

The UV light source 26 in FIG. 5 focuses the spot 27 at the interface between the liquid 22 and the non-miscible intermediate liquid layer 32, the UV radiation passing through a suitable UV transparent window 33, of quartz or the like, supported at the bottom of the container 21. The curable liquid 22 is provided in a very thin layer over the non-miscible layer 32 and thereby has the advantage of limiting layer thickness directly rather than relying solely upon absorption and the like to limit the depth of curing since ideally an-Ultrathin lamina is to be provided. Hence, the region of formation will be more sharply defined and some surfaces will be formed smoother with the system of FIG. 5 than with that of FIG. 4. In addition a smaller volume of UV curable liquid 22 is required, and the substitution of one curable material for another is easier.

A commercial stereolithography system will have additional components and subsystems besides those previously shown in connection with the schematically depicted systems of FIGS. 1–5. For example, the commercial system would also have a frame and housing, and a control panel. It should have means to shield the operator from excess UV and visible light, and it may also have means to allow viewing of the object 30 while it is being formed. Commercial units will provide safety means for controlling ozone and noxious fumes, as well as conventional high voltage safety protection and interlocks. Such commercial units will also have means to effectively shield the sensitive electronics from electronic noise sources.

As previously mentioned, a number of other possible apparatus may be utilized to practice the stereolithographic method. For example, an electron source, a visible light source, or an x-ray source or other radiation source could be substituted for the UV light source 26, along with appropriate fluid media which are cured in response to these particular forms of reactive stimulation. For example, alpha-octadecylacrylic acid that has been slightly prepolymerized with UV light can be polymerized with an electron beam. Similarly, poly (2,3-dichloro-1-propyl acrylate) can be polymerized with an x-ray beam.

Figure 6:
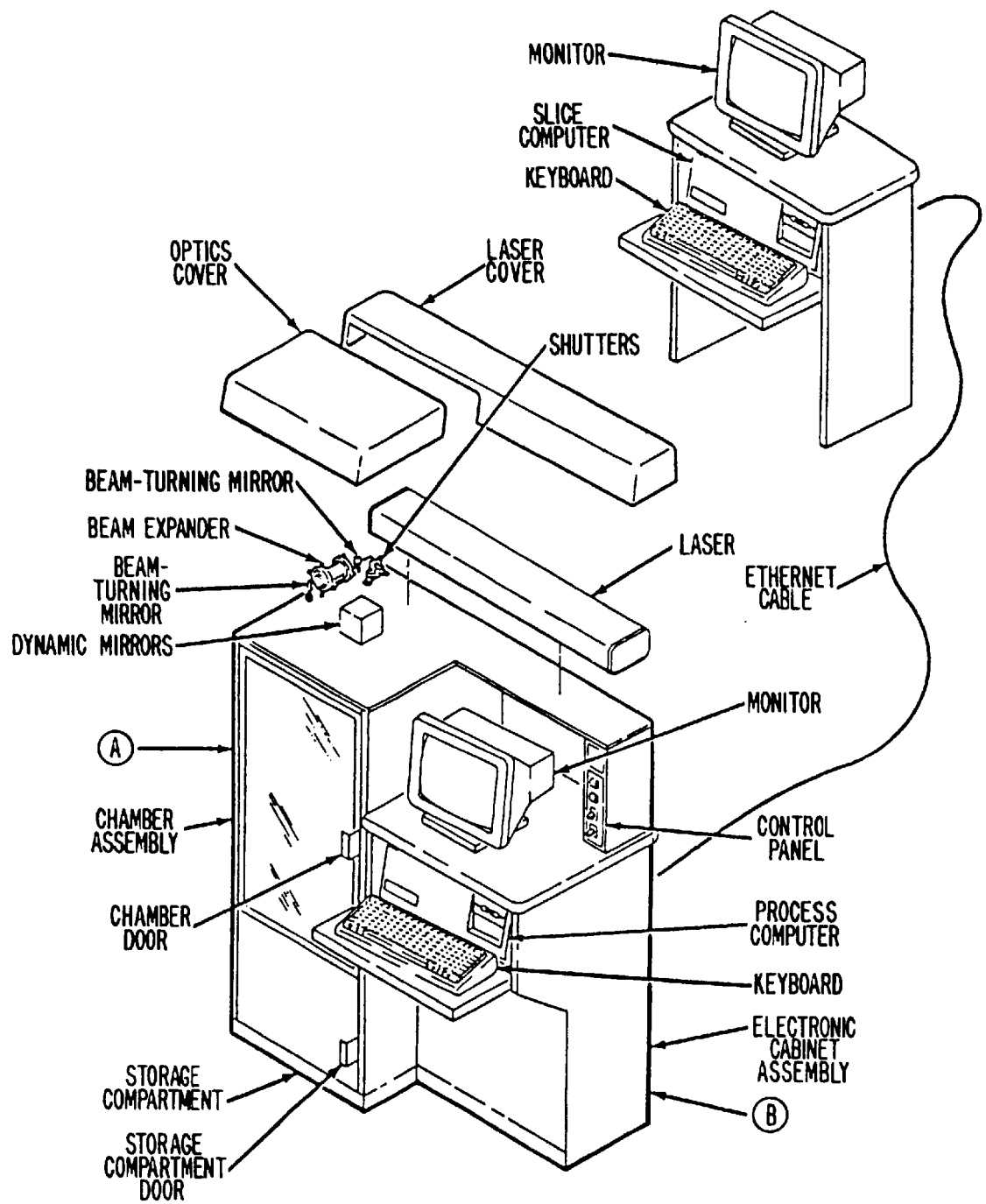
FIGS. 6 and 7 are exploded, perspective views of the major component groups in a suitable stereolithography system.
Figure 7:
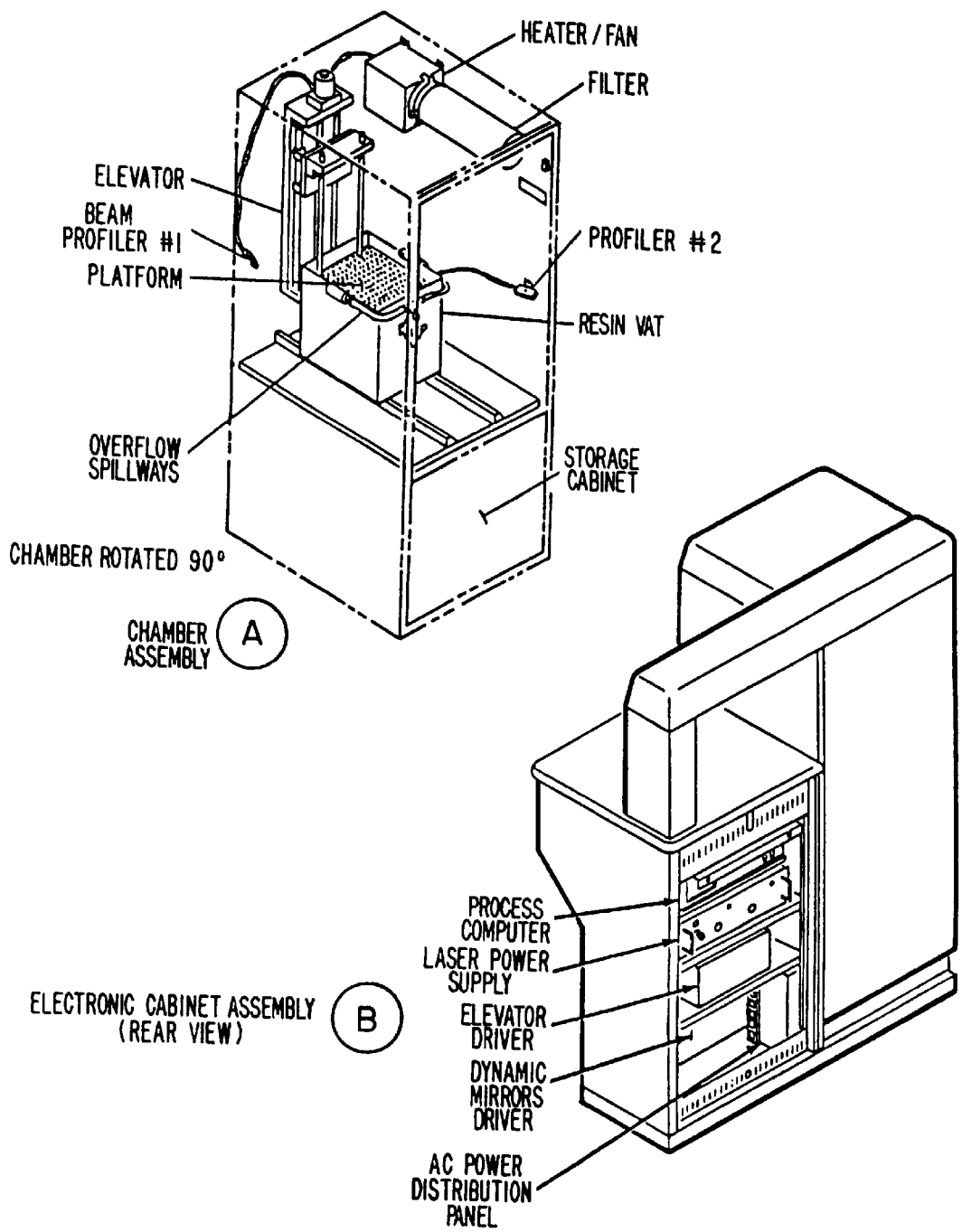
Figure 8:
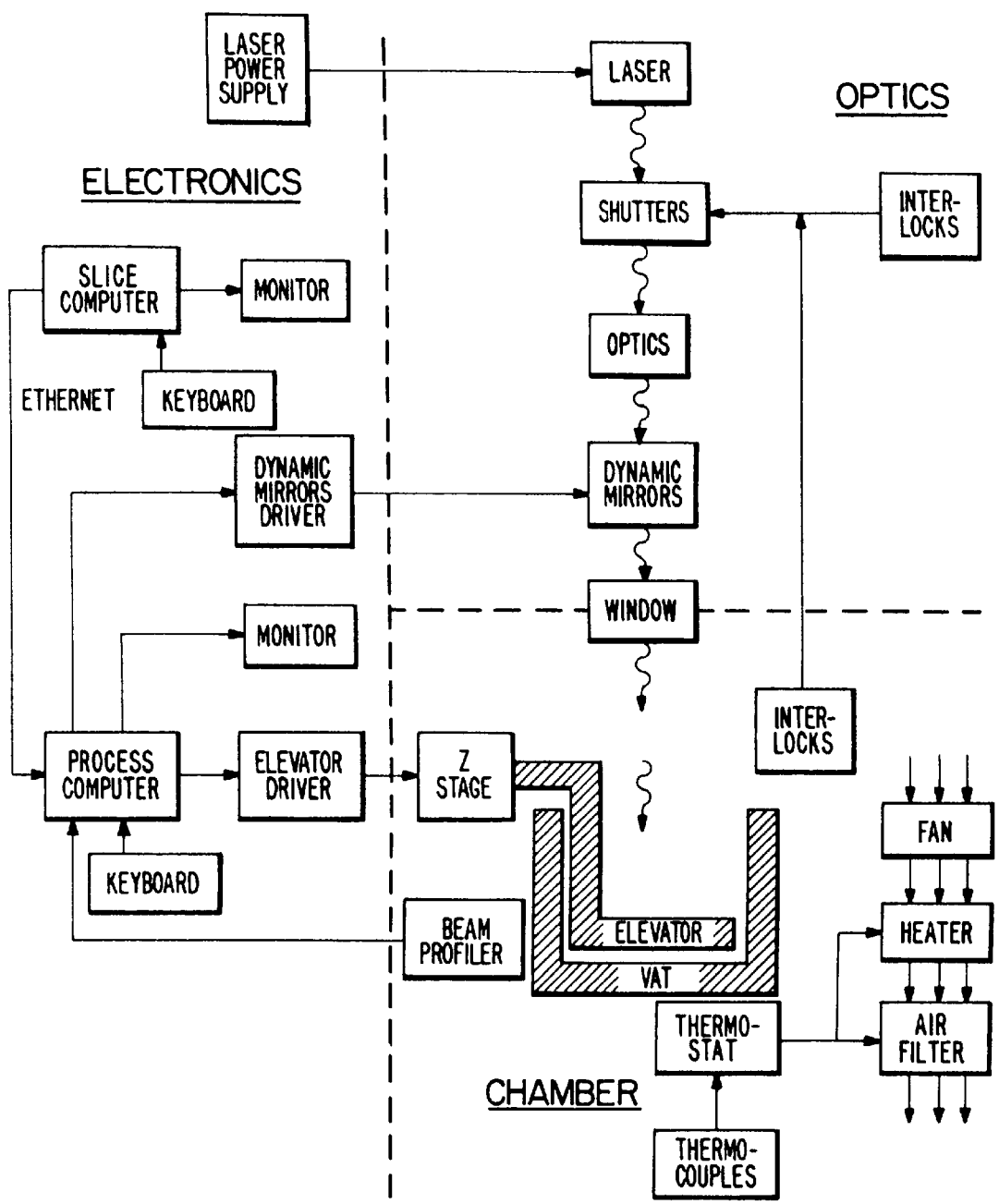
FIG. 8 is a block diagram of a suitable stereolithography system.

The commercialized SLA is a self-contained system that interfaces directly with the user's CAD system. The SLA, as shown in FIGS. 6 and 7, consists of four major component groups: the slice computer terminal, the electronic cabinet assembly, the optics assembly, and the chamber assembly. A block diagram of the SLA is shown in FIG. 8.

The electronic cabinet assembly includes the process computer (disc drive), keyboard, monitor, power supplies, ac power distribution panel and control panel. The computer assembly includes plug-in circuit boards for control of the terminal, high-speed scanner mirrors, and vertical (Z-stage) elevator. Power supplies for the laser, dynamic mirrors, and elevator motor are mounted in the lower portion of the cabinet.

The control panel includes a power on switch/indicator, a chamber light switch/indicator,, a laser on indicator, and a shutter open indicator.

Operation and maintenance parameters, including fault diagnostics and laser performance information, are also typically displayed on the monitor. Operation is controlled by keyboard entries. Work surfaces around the key-board and disc drive are covered with formica or the like for easy cleaning and long wear.

The helium cadmium (HeCd) laser and optical components are mounted on top of the electronic cabinet and chamber assembly. The laser and optics plate may be accessed for service by removing separate covers. For safety reasons, a special tool is required to unlock the cover fasteners and interlock switches are activated when the covers are removed. The interlocks activate a solenoid-controlled shutter to block the laser beam when either cover is removed.

Figure 9:
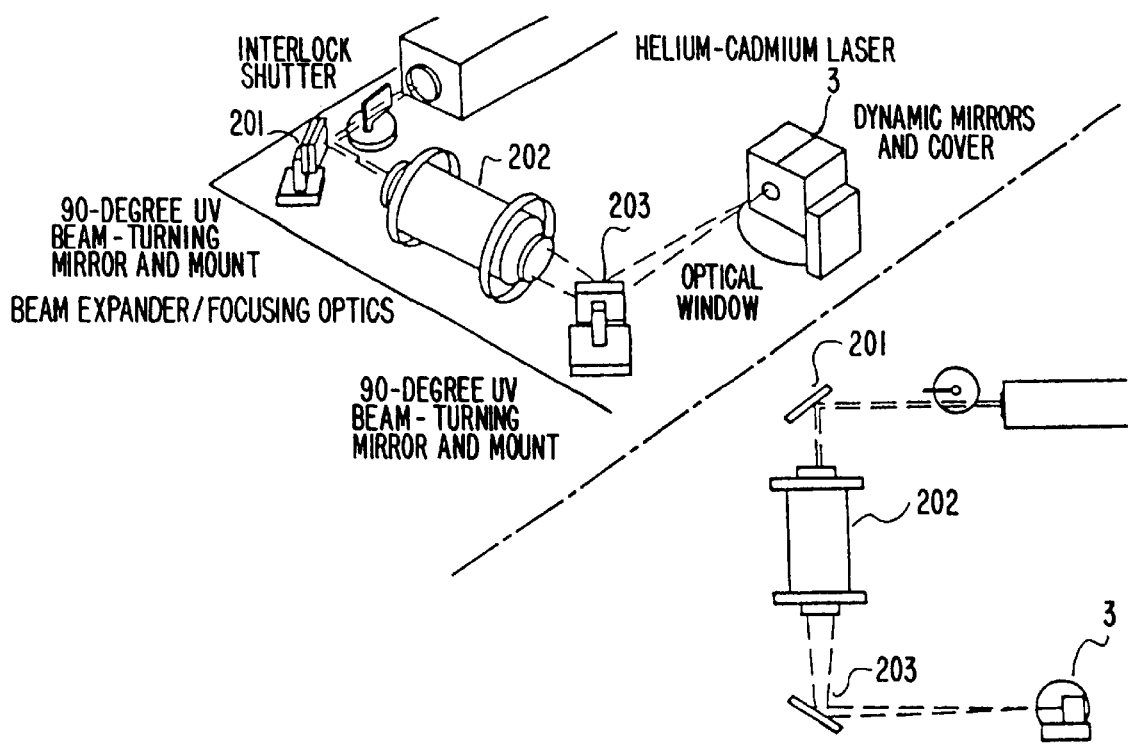
FIG. 9 is a perspective view of the laser and optical system in a stereolithography system which may utilize the present invention.

As shown in FIG. 9, the shutter assembly, two ninety degree beam-turning mirrors, a beam expander, an X-Y scanning mirror assembly, and precision optical window are mounted on the optics plate. The rotary solenoid-actuated shutters are installed at the laser output and rotate to block the beam when a safety interlock is opened. The ninety degree beam-turning mirrors reflect the laser beam to the next optical component. The beam expander enlarges and focuses the laser beam on the liquid surface. The high speed scanning mirrors direct the laser beam to trace vectors on the resin surface. A quartz window between the optics enclosure and reaction chamber allows the laser beam to pass into the reaction chamber, but otherwise isolates the two regions.

The chamber assembly contains an environmentally-controlled chamber, which houses a platform, reaction vat, elevator, and beam profiler.

The chamber in which the object is formed is designed for operator safety and to ensure uniform operating conditions. The chamber may be heated to approximately 400 C (1040 F) and the air is circulated and filtered. An overhead light illuminates the reaction vat and work surfaces. An interlock on the glass access door activates a shutter to block the laser beam when opened.

The reaction vat is designed to minimize handling of the resin. It is typically installed in the chamber on guides which align it with the elevator and platform.

The object is formed on a platform attached to the vertical axis elevator, or Z-stage. The platform is immersed in the resin vat and it is adjusted incrementally downward while the object is being formed. To remove the formed part, it is raised to a position above the vat. The platform is then disconnected from the elevator and removed from the chamber for post processing. Handling trays are usually provided to catch dripping resin.

The beam profilers are mounted at the sides of the reaction vat at the focal length of the laser. The scanning mirror is periodically commanded to direct the laser beam onto the beam profiler, which measures the beam intensity profile. The data may be displayed on the terminal, either as a profile with intensity contour lines or as a single number representing the overall (integrated) beam intensity. This information is used to determine whether the mirrors should be cleaned and aligned, whether the laser should be serviced, and what parameter values will yield vectors of the desired thickness and width.

Figure 10:
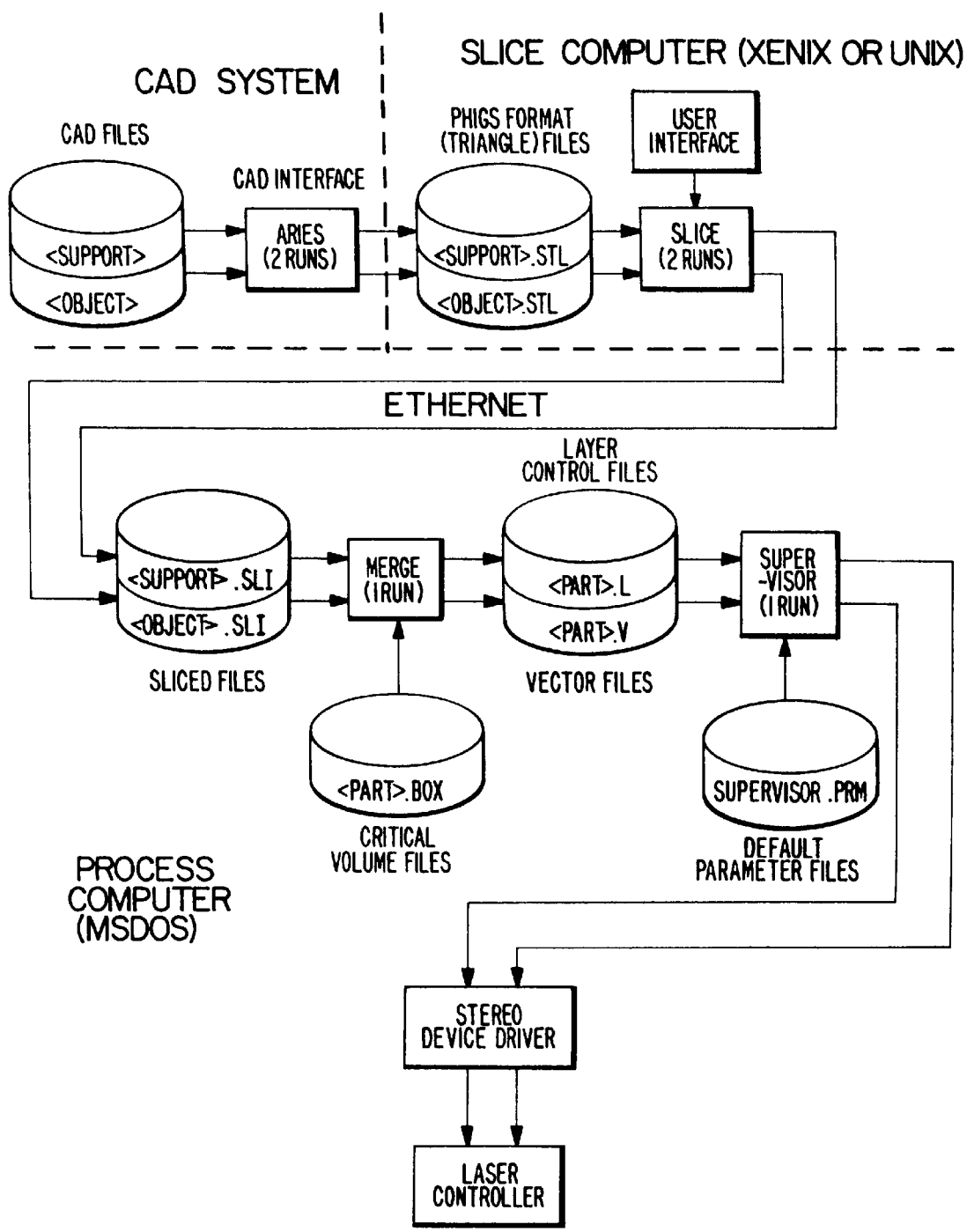
FIG. 10 is an overall block diagram of the software in a suitable stereolithography system.

A software diagram of the SLA is shown in FIG. 10. There are three computers needed to control the stereolithographic apparatus, a CAD system, a slice computer, and a process computer. Any CAD system can be used to design a part in three-dimensional space. This is identified as the object file. In order to generate the part, supports must be added to prevent distortion. This is accomplished by adding the necessary supports to the CAD part design and creating a CAD support file. The resultant two or more CAD generated files are then physically inserted into the slice computer through ETHERNET.

The stereolithography apparatus builds the part one layer at a time starting with the bottom layer. The slice computer breaks down the CAD part into individual horizontal slices. The slice computer also calculates where hatch vectors will be created. This is done to achieve maximum strength as each layer is constructed. The slice computer May be a separate computer with its own keyboard and monitor. However, the slice computer may share a common keyboard and monitor with the process computer. The operator can vary the thickness of each slice and change other parameters of each slice with the User Interface program. The slice computer may use the XENIX or UNIX machine language and is connected to the SLA process computer by an ETHERNET network data bus or the like.

The sliced files are then transferred to the process computer through ETHERNET. The process computer merges the sliced object and support files into a layer control file and a vector file. The operator then inserts the necessary controls needed to drive the stereolithography apparatus in the layer and parameter file. The vector file is not usually edited. The operator can strengthen a particular volume of the part by inserting rivets. This is accomplished by inserting the necessary parameters to the critical volume file prior to merging of the sliced files. The merge program integrates the object, support, and critical volume files and inserts the resultant data in the layer control file. The operator can edit the layer control file and change the default parameter file. The default parameter file contains the controls needed to operate the stereolithography apparatus to build the part. The process computer uses the MS-DOS operating system and is directly connected to the stereolithography apparatus.

Figure 11:
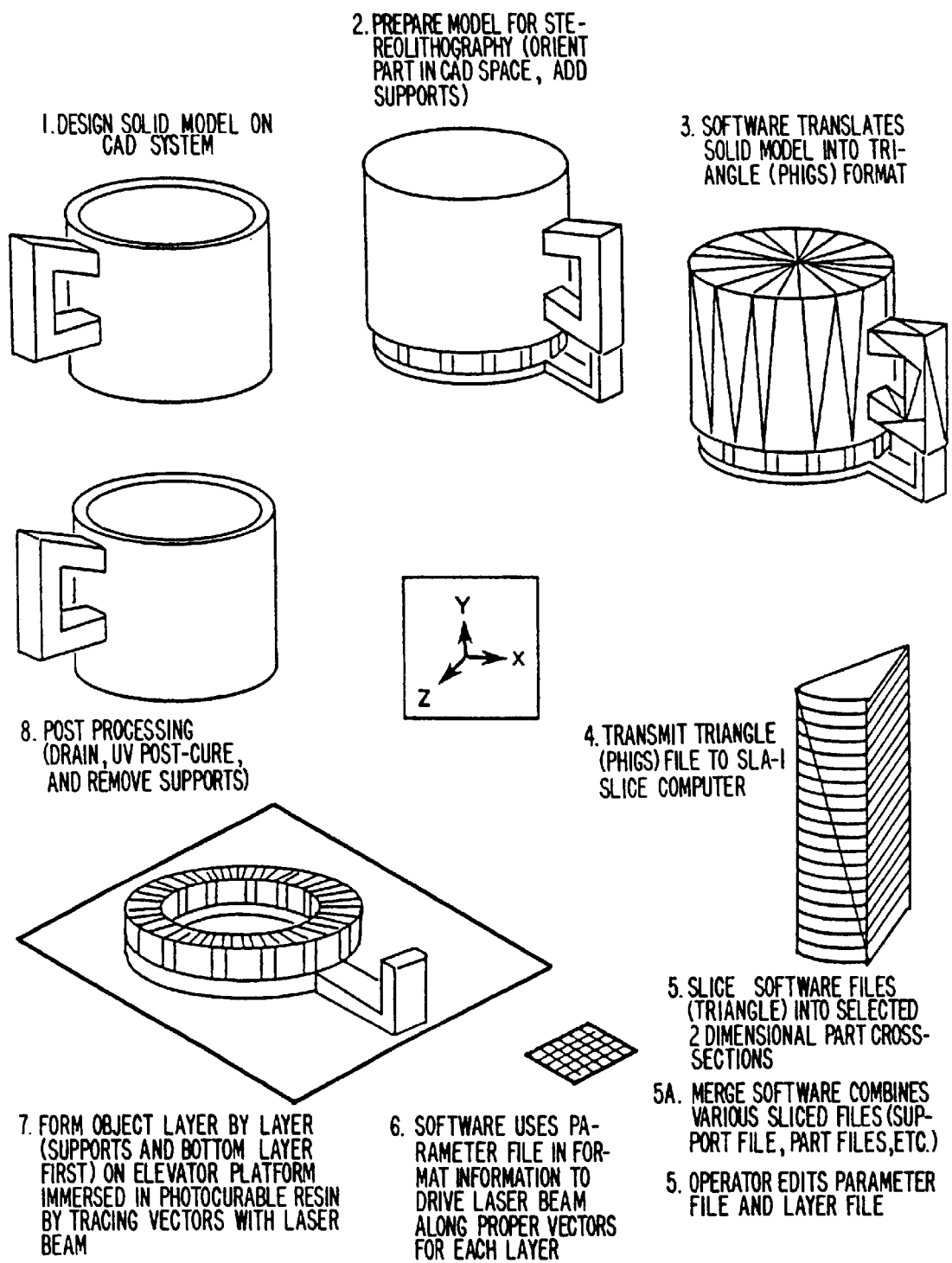
FIGS. 11 and 12 are symbolic flow charts of a suitable stereolithographic process.
Figure 12:
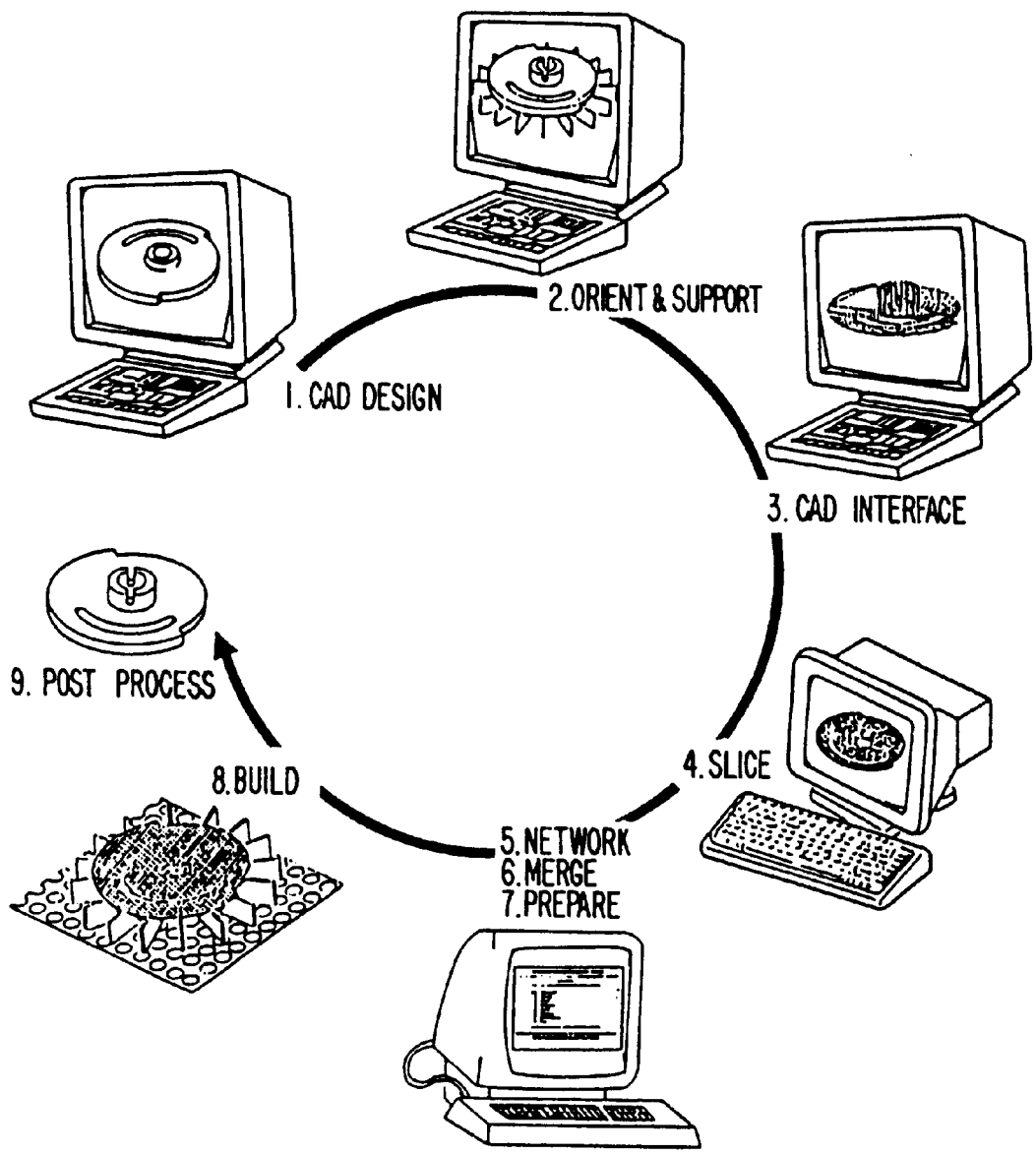

The stereolithographic process is broadly illustrated by the symbolic flowcharts of FIGS. 11 and 12.

Stereolithography is a three-dimensional printing process which uses a moving laser beam to build parts by solidifying successive layers of liquid plastic. This method enables a designer to create a design on a CAD system and build an accurate plastic model in a few hours. In a presently preferred embodiment, by way of example and not necessarily by way of limitation, the stereolithographic process may comprise of the following steps.

First, the solid model is designed in the normal way on the CAD system, without specific reference to the stereolithographic process.

Model preparation for stereolithography involves selecting the optimum orientation, adding supports, and selecting the operating parameters of the stereolithography system. The optimum orientation will (1) enable the object to drain, (2) have the least number of unsupported surfaces, (3) optimize important surfaces, and (4) enable the object to fit in the resin vat. Supports must be added to secure unattached sections and for other purposes; a CAD library of supports can be prepared for this purpose. The stereolithography operating parameters include selection of the model scale and layer (slice) thickness.

The surface of the solid model is then divided into triangles, typically "PHIGS". A triangle is the least complex polygon for vector calculations. The more triangles formed, the better the surface resolution and hence the more accurate the formed object with respect to the CAD design.

Data points representing the triangle coordinates are then transmitted to the stereolithographic system via appropriate network communications. The software of the stereolithographic system then slices the triangular sections horizontally (X-Y plane) at the selected layer thickness.

The stereolithographic apparatus (SLA) next calculates the section boundary, hatch, and horizontal surface (skin) vectors. Hatch vectors consist of cross-hatching between the boundary vectors. Several slicing styles are available. Skin vectors, which are traced at high speed and with a large overlap, form the outside horizontal surfaces of the object. Interior horizontal areas, those within top and bottom skins, are not filled in other than by cross-hatch vectors.

The SLA then forms the object one horizontal layer at a time by moving the ultraviolet beam of a helium-cadmium laser across the surface of a photocurable resin and solidifying the liquid where it strikes. Absorption in the resin prevents the laser light from penetrating deeply and allows a thin layer to be formed. Each layer is comprised of vectors which are drawn in the following order: border, hatch, and surface.

The first layer that is drawn by the SLA adheres to a horizontal platform located just below the liquid surface. This platform is attached to an elevator which then lowers its vertically under computer control. After drawing a layer, the platform dips several millimeters into the liquid to coat the previous cured layer with fresh liquid, then rises up a smaller distance leaving a thin film of liquid from which the second layer will be formed. After a pause to allow the liquid surface to flatten out, the next layer is drawn. Since the resin has adhesive properties, the second layer becomes firmly attached to the first. This process is repeated until all the layers have been drawn and the entire three-dimensional object is formed. Normally, the bottom 0.25 inch or so of the object is a support structure on which the desired part-is built. Resin that has not been exposed to light remains in the vat to be used for the next part. There is very little waste of material.

Post processing involves draining the formed object to remove excess resin, ultraviolet or heat curing to complete polymerization, and removing supports. Additional processing, including sanding and assembly into working models, may also be performed.

The stereolithographic method and apparatus has many advantages over currently used methods for producing plastic objects. The method avoids the need of producing design layouts and drawings, and of producing tooling drawings and tooling. The designer can work directly with the computer and a stereolithographic device, and when he is satisfied with the design as displayed on the output screen of the computer, he can fabricate a part for direct examination. If the design has to be modified, it can be easily done through the computer, and then another part can be made to verify that the change was correct. If the design calls for several parts with interacting design parameters, the method becomes even more useful because all of the part designs can be quickly changed and made again so that the total assembly can be made and examined, repeatedly if necessary.

After the design is complete, part production can begin immediately, so that the weeks and months between design and production are avoided. Ultimate production rates and parts costs should be similar to current injection molding costs for short run production, with even lower labor costs than those associated with injection molding. Injection molding is economical only when large numbers of identical parts are required. Stereolithography is useful for short run production because the need for tooling is eliminated and production set-up time is minimal. Likewise, design changes and custom parts are easily provided using the technique. Because of the ease of making parts, stereolithography can allow plastic parts to be used in many places where metal or other material parts are now used. Moreover, it allows plastic models of objects to be quickly and economically provided, prior to the decision to make more expensive metal or other material parts.

Figure 14:
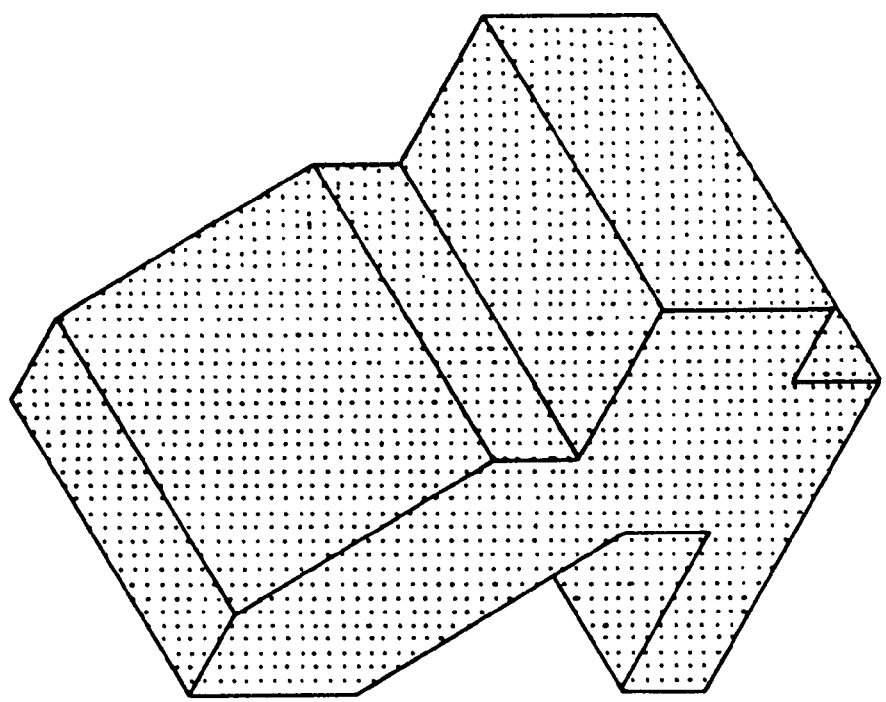
FIGS. 13 and 14 illustrate a sample CAD designed object.
Figure 13:
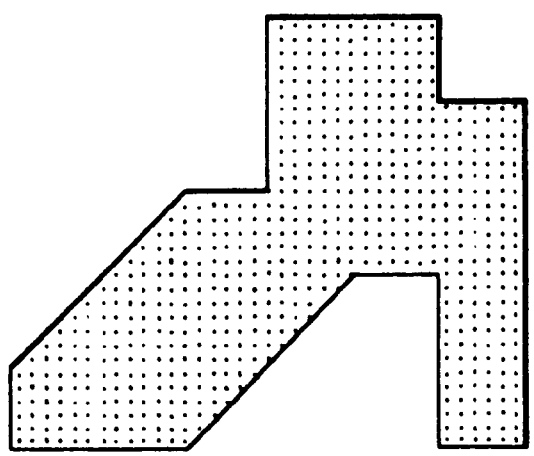

Stereolithography embodies the concept of taking three-dimensional computer data describing an object and creating a three-dimensional plastic replica of the object. Construction of an object is based on converting the three-dimensional computer data into two-dimensional data representing horizontal layers and building the object layer by layer. The software that takes us from the three-dimensional data defining the object to vector data is called "SLICE". FIGS. 13 and 14 illustrate a sample CAD designed object. FIG. 15 shows typical slicing of CAD object. FIGS. 16, 17 and 18 show slice (layer) data forming the object.

CAD data files are referred to as STL files. These STL files divide the surface area of an object into triangular facets. The simpler the object the fewer the triangles needed to describe it, and the more complex the object or the more accuracy Used to represent its curvatures the more triangles required to describe it. These triangles encompass both inner and outer surfaces.

In this representation all triangles are required to have their vertices intersect the vortices of other triangles; therefore, no triangle may have a vertex coincide with the edge (between vertices) of another. This insures that when triangle vertices are rounded (at a later stage) that no holes in the surface (represented by the triangles) are inadvertently created.

Figure 33:
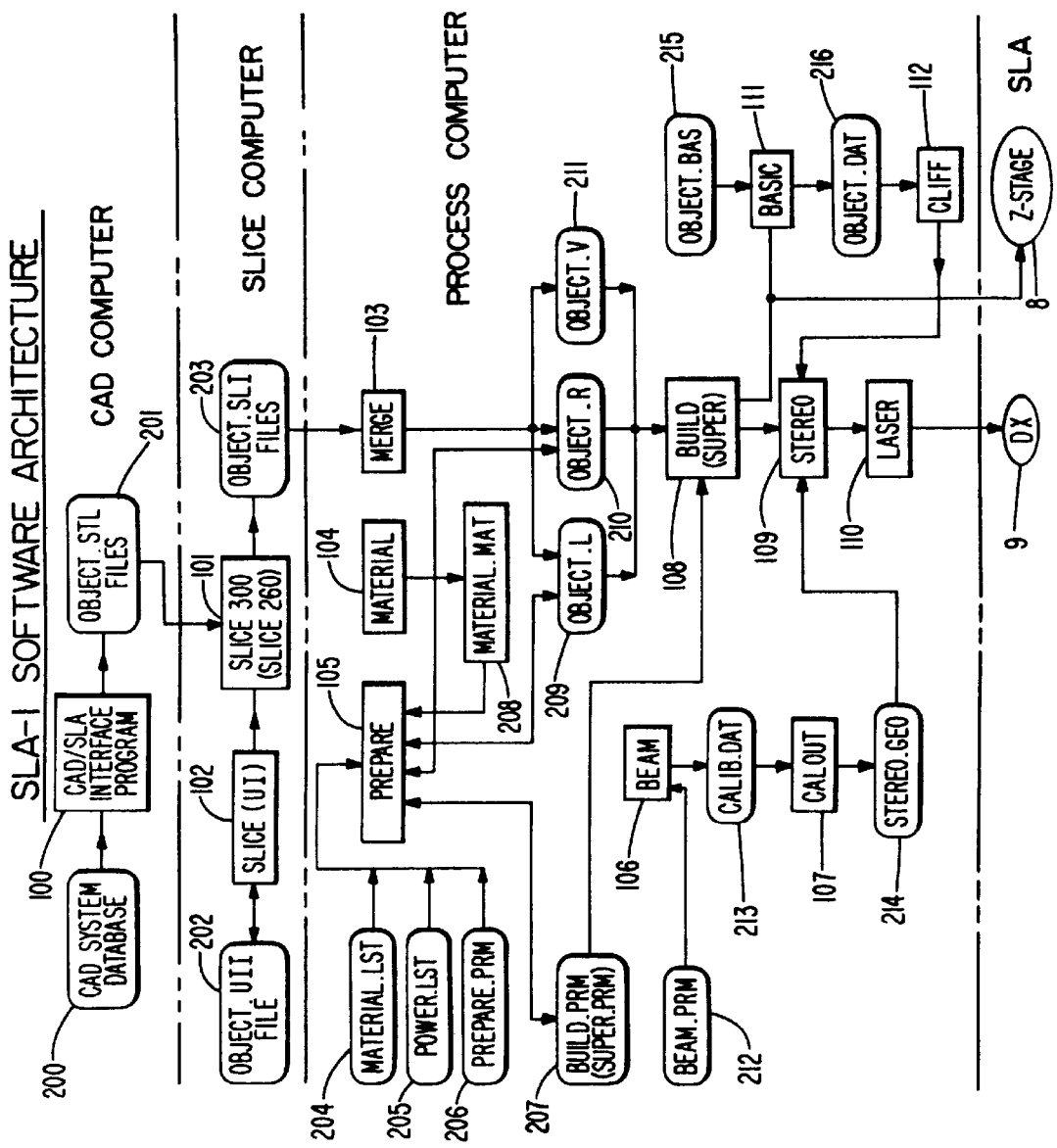
FIG. 33 is a software architecture flow chart depicting in greater detail the overall data flow, data manipulation and data management in a stereolithography system incorporating the features of the invention.

FIG. 33 is a software architecture flowchart depicting in greater detail the overall data flow, data manipulation and data management in a stereolithography system incorporating the features of the invention.

In the CAD data file, triangles are represented by four sets of three numbers each. Each of the first three sets of numbers represents a vertex of the triangle in three-dimensional space. The fourth set represents the coordinates of the normal vector perpendicular to the plane of the triangle. This normal is considered to start at the origin and point to the coordinates specified in the STL file. By convention this normal vector is also of unit length (i.e., one CAD unit). The normal vector can point in either of two direction, but by convention, the direction we have chosen points from solid to hollow (away from the solid interior of the object that the triangle is bounding). Also associated with each triangle is an attribute designation.

Figure 19C:
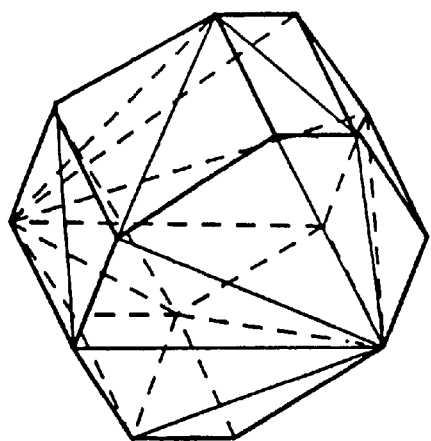
FIG. 19c shows a faceted sketch of a solid octagonally shaped cylinder.
Figure 19B:
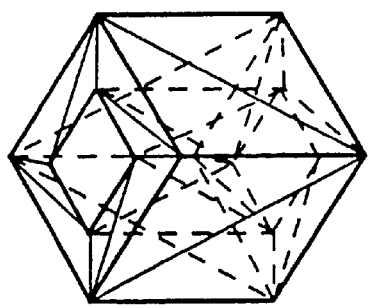
FIG. 19b shows a faceted sketch of a hollow cube.
Figure 19A:
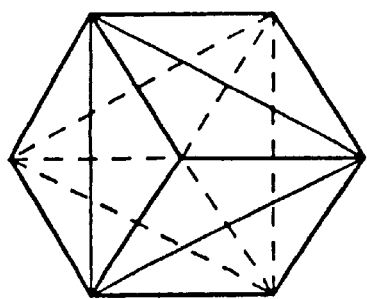
FIG. 19a shows a faceted sketch of a solid cube.

FIG. 19a shows a faceted sketch of a solid cube. FIG. 19b shows a faceted sketch of a hollow cube. FIG. 19c shows a faceted sketch of a solid octagon shaped cylinder.

Scaling of an STL file involves a slicing program that converts the three-dimensional data into two-dimensional vectors and is based on processing integers. The CAD units in which an object is dimensioned, and therefore the STL file, are arbitrary. A scale factor is used to divide the CAD units into bits, so that slicing can be done based on bits instead of on the units of design. This gives us the ability to maximize the resolution with which an object will be built regardless of what the original design units were. For example, a part designed in inches has the maximum resolution of one inch but if we multiple it by a scale factor of 1000 or maybe 10000 we increase our resolution to 0.001 inches (mils) or to 0.0001 inches (1/10th of a mil).

All vertices of triangles are rounded to the nearest bit in all three dimensions; therefore, the object's dimensions are quantized. This means a part designed in inches with a scale factor of 1000 will have its triangle vertices rounded to the nearest mil.

If there are triangles surfacing the object that collapse to a single point or a line because their dimensions and orientation are such that the vertices are not resolved as individual bits, they are ignored in subsequent processing. Collapsed triangles can not produce discontinuities (i.e. holes) in the triangle faceted surface of the object, and they do not cause overlapping of any triangles that are distorted when filling in the area of a collapsed triangle. Rounding of triangle vertices which does not produce collapsed triangles cannot produce discontinuities (holes) in the surface of the object, but can cause overlapping of sections of triangles and can cause triangle normals to change their directions to new quadrants (up to 180 degree changes in direction). This does not necessarily cause a problem, but does need to be considered in later processing, in particular when creating boundary and cross-hatch vectors. Overlapping of triangles can also occur if wall thickness or hollows are thinner than 1 bit. These problems can be prevented by either using an arbitrarily small bit size or by requiring that all triangles exceed certain minimum dimensions.

Figure 20A:
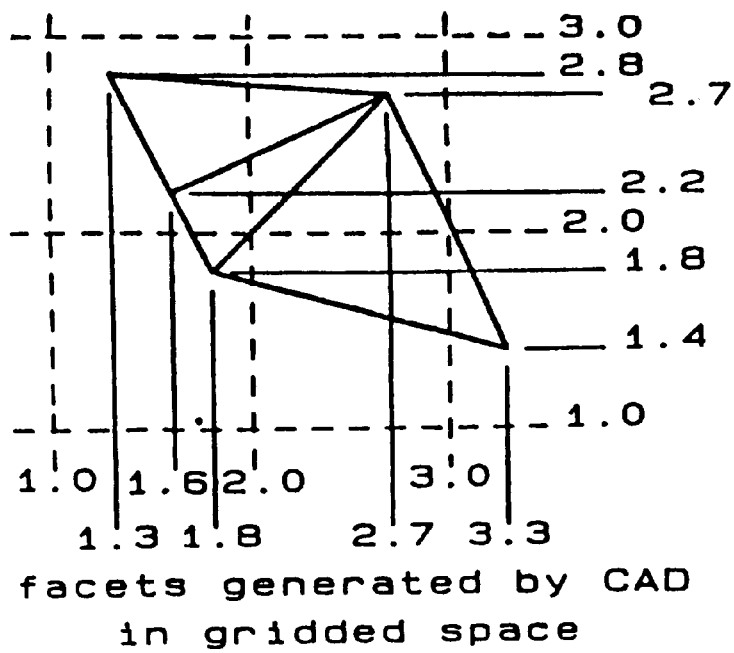
FIG. 20a shows a faceted CAD designed object in gridded space.
Figure 20C:
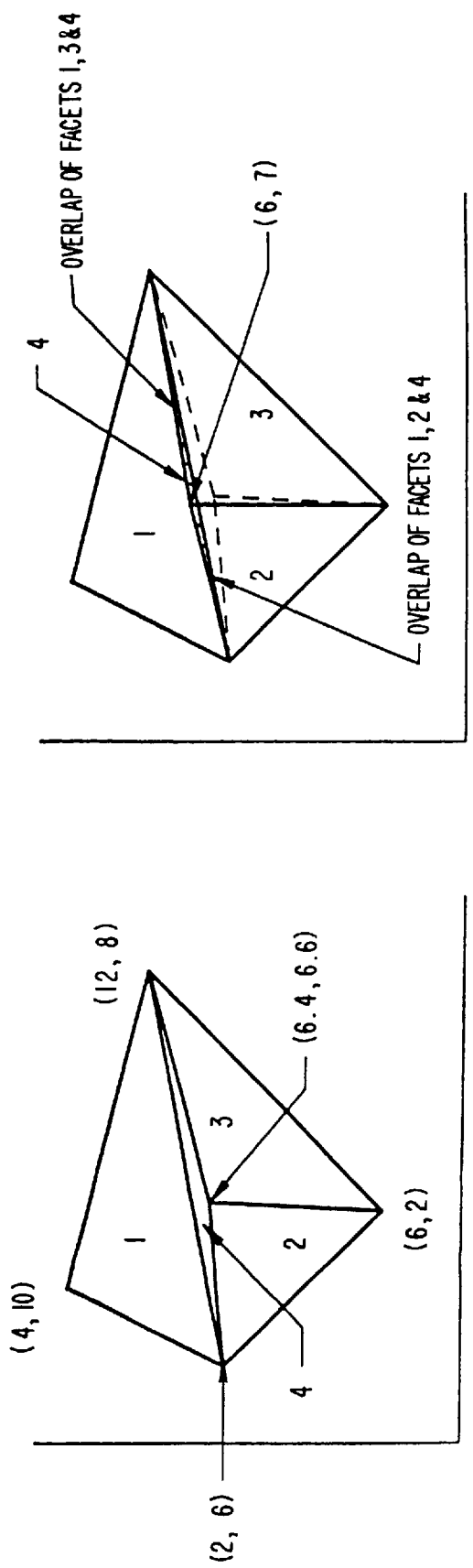
FIG. 20c shows a faceted CAD designed object after rounding of triangles in which triangle overlap occurs.

FIG. 20a shows a faceted CAD designed object in gridded space (two-dimensional). FIG. 20b shows a faceted CAD designed object after rounding of triangles—Scale 1–Scale 4 Scale 10. FIG. 20c shows a faceted CAD designed object after rounding of triangles in which triangle overlap occurs.

There is a second rounding of triangle vertices which occurs, involving rounding the triangle vertices in the vertical direction to the nearest slicing layer. This rounding process causes a vertical distortion in the part and may cause the collapse or expansion of small features. This may not necessarily be serious since the maximum resolution in the vertical dimensions is one layer thickness. Regions containing critical features can be sliced into thinner layers to minimize distortion.

Rounding of triangle vertices provides several advantages over allowing them to remain at the locations that they were originally at in the STL file. If vertices are rounded then all horizontal triangles are moved to slicing layers. Thus, when flat skin is created (derived from horizontal triangles) the skin will have excellent fit within the boundaries at a particular layer. In addition, the cross-hatching between the walls of objects will have more accurate placement. Our hatching is based on hatch paths intersecting boundaries and then determining whether to turn hatching on and off. If a hatch path should strike a vertex point it would be difficult to make an accurate decision whether to turn hatch on or off. By rounding of vertices we know exactly where they are (in the vertical dimension) and we therefore can avoid them when we create boundaries (which are used in the process of generating hatch).

Rounding of vertices to slicing layer is more likely to cause overlap of triangles than is rounding to the nearest scale bit. In addition, styles require 1 bit off so that the part comes out with the best vertical dimension. Unlike the rounding due to slicing scale, the problems associated with rounding of vertices to slicing layers cannot be solved by using arbitrarily small slicing layers or by limiting the minimum size of triangles. One possible way of minimizing the problem is to put a limit on the maximum dimension of triangles to slightly over one layer thickness. This could be used to reduce the number of overlapping surfaces. The proposed hatching algorithm will enable us to handle regions of overlapping triangles in a consistent and reliable manner.

FIG. 21a illustrates a faceted CAD designed object after rounding of triangles based on scale factor. FIG. 21b shows a faceted CAD designed object after rounding of triangles in the vertical to slicing layers—layer thickness 20 mils. FIG. 21c shows a faceted CAD designed object after rounding of triangles in the vertical to slicing layers—layer thickness 5 mils.

When an object is sliced into layers the vertical distance between layers can be varied depending on the vertical resolution needed in different areas. The selection of layer thickness is based on three distinct considerations: 1) desired resolution, 2) structural strength required of the layer, and 3) time allowed for building the object. Each of these factors is affected by layer thickness.

Item 1, resolution, is the most obvious item that is affected. The resolution of vertical features is inversely proportional to layer thickness. Item 2, structural strength, is proportional to cure thickness, and cure thickness is generally based on layer thickness plus a constant or a percentage of layer thickness.

As layers get thinner a problem with structural strength of layers may develop even though layer-to-layer adhesion is satisfactory. An approach to solving this strength problem is based on giving layers more cure depth than required for good adhesion, this works well in many cases but a few cases, still exist where these thicker cure depths may cause undesired structural differences between the part as designed and the part as actually built.

Another way of minimizing problem 2 is to design parts as separate objects that can be sliced separately using different layer thicknesses. Thus item 2 is sometimes a problem with regard to decreasing layer thickness but not necessarily.

Item 3 may or may not represent a problem when layer thickness is decreased. The time required to build a given part @is based on three tasks: laser scanning time, liquid settling. time, and number of layers per given thickness. As the layer thickness decreases the liquid settling time increases, number of layers per unit thickness increases, and the drawing time decreases. on the other hand, with increasing layer thickness the settling time decreases, number of layers per unit thickness decreases and the drawing time increases.

These three tasks balance each other to give long part building times for thick layers, long part building times for thin layers, and shorter part building time for intermediate layer thickness.

Figure 22A:
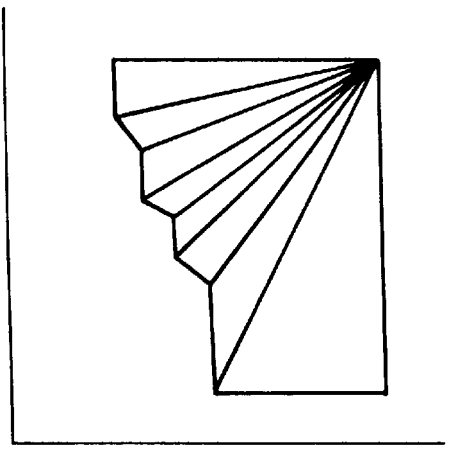
FIG. 22a shows a faceted CAD designed object to be sliced.
Figure 22B:
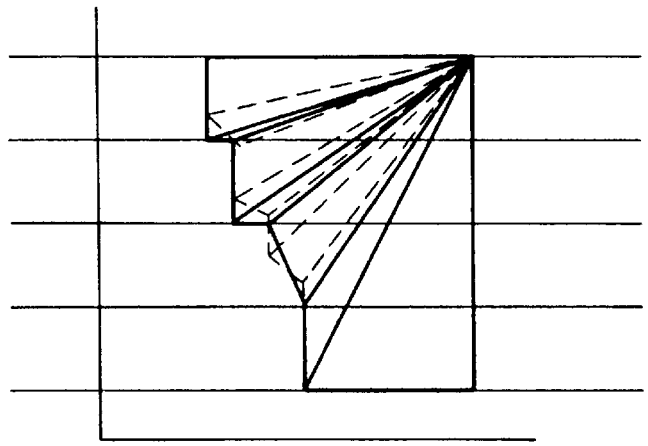
FIG. 22b shows a faceted CAD designed object sliced at 20 mil layers.
Figure 22C:
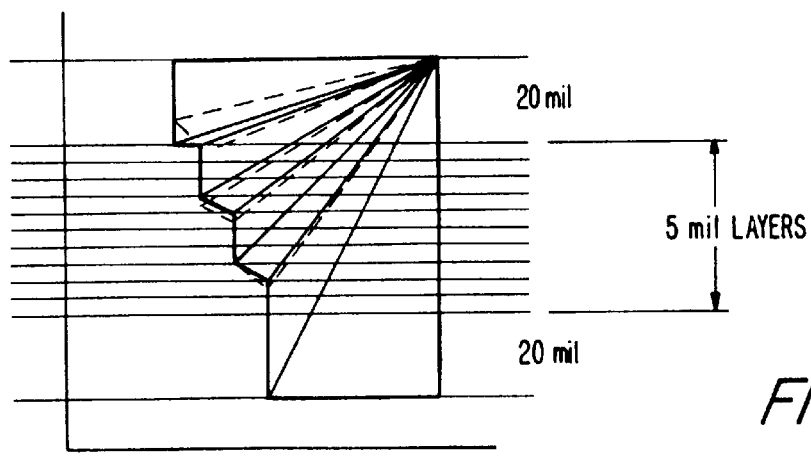
FIG. 22c illustrates a faceted CAD designed object sliced at variable layer thickness of 5 mil and 20 mil.

FIG. 22a shows a faceted CAD designed object to be sliced. FIG. 22b shows a faceted CAD designed object sliced at 20 mil layers. FIG. 22c illustrates a faceted CAD designed object sliced at variable layer thickness of 5 mil and 20 mil.

There are several types of boundaries that can be used to form the edges of layers and features when building parts. These boundaries include the layer boundary, down facing flat skin boundary, up facing flat skin boundary, down facing near-flat skin boundary, and up facing near-flat skin boundary. At this point in the description of the invention, we will concern ourselves with only the creation of layer boundaries, leaving the other boundary types for subsequent discussion.

Triangles are categorized into three main groups after they are rounded to both scale bits and to layers: scan triangles, near-flat triangles, and flat triangles. Flat triangles are those which have all three vertices all lying on the same layer. Near-flat triangles are those having normal vectors within some minimum angle from the vertical. All remaining triangles are scan triangles, i.e., those having normals outside the minimum angle from the vertical.

Layer boundaries are created at the line of intersection of scan and near-flat triangles with a horizontal plane intersecting the object at a vertical level slightly offset from the slicing layer. Each scan and near-flat triangle that is present at this slight vertical offset from a given layer will be used to create one vector that will form part of the layer boundary. Each triangle will have two points that cross a given layer and one of these points will be used as a-starting point for a vector and the other point will be used as the ending point of the vector. Since triangles form complete surfaces around the object to be formed, both inside and outside, there will be vectors formed that will make a complete boundary around the layer.

After creation of layer boundary vectors, all degenerate vectors should be removed. These point vectors were not created from intersecting triangle vertices, since vertices are right on the slicing layer. But these point vectors can be created from triangles that are relatively narrow at the vertical level at which the vectors were derived, so narrow that the beginning and endpoints of the vector rounded to the same point. It should be noted that in some circumstances, vectors can overlap at more than their endpoints. This may present problems in later processing if not handled properly.

Figure 23A:
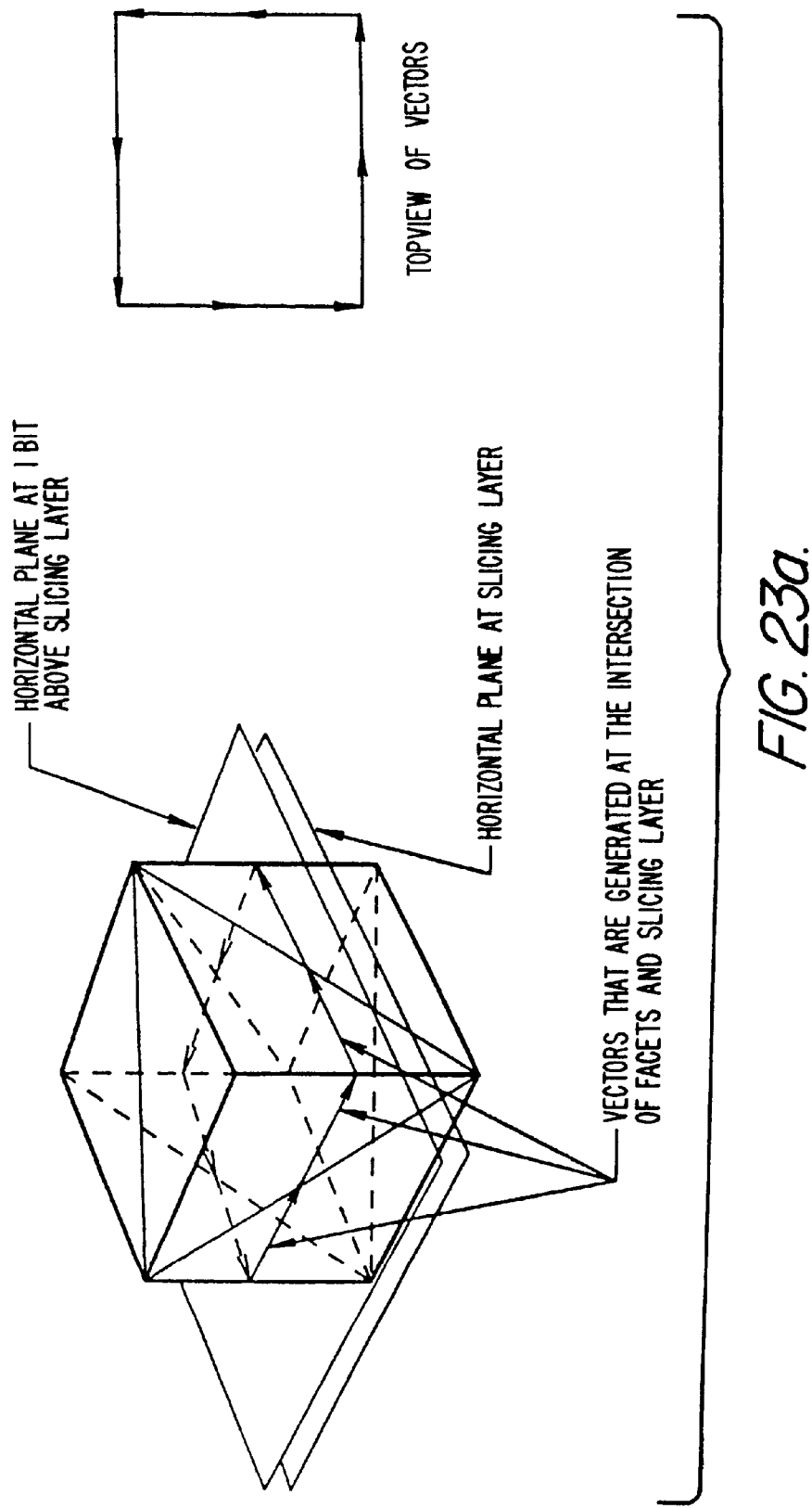
FIG. 23a shows a side view of the intersection of triangles with a layer and vectors that are created at this intersection.
Figure 23B:
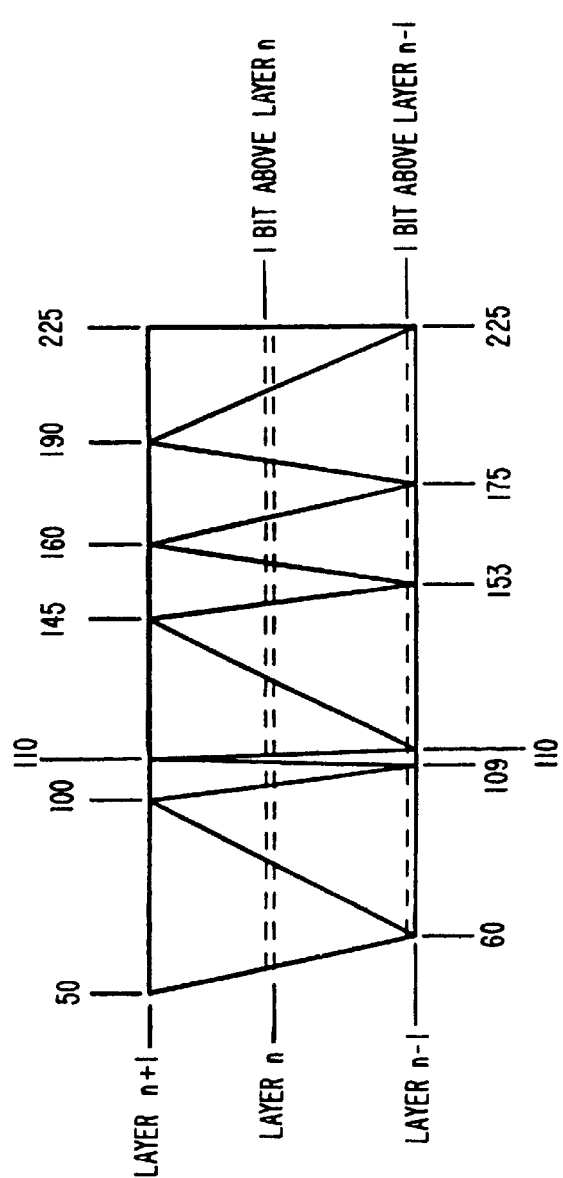
FIG. 23b shows a side view of a faceted section of an object, the slicing layer, the offset, the vectors created, including a point vector.

FIG. 23a shows a side view of intersection of triangles with a layer, and vectors that are created at this intersection. FIG. 23b shows a side view of a faceted section of an object, the slicing layer, the offset, and the vectors created including a point vector.

It may seem that boundary vectors should be created right at the intersection of the triangles with the slicing layer but this creates several problems that can be readily solved by creating the boundary vectors from the intersection of triangles with a horizontal plane that is just slightly above or below the slicing layer. This concept of creating boundary vectors which are slightly offset from the slicing layer introduces some minor problems but they can be made negligible by making the offset arbitrarily small. This offset that we have chosen is one scale bit off the actual layer level. For discussion's sake we will consider an offset one bit above the slicing layer (STYLE 1). The table below is illustrative.

Part design units: inches

Slice scale factor: 1000

Layer spacing: 20

Vertical location of part in CAD space: 1.000 to 1.100 inches

Location of layers in scaled units: 1000, 1020, 1040, 1060, 1080, 1100

Locations of intersecting plane for determining boundary vectors in scaled units: 1001, 1021, 1041, 1061, 1081, 1101

Layer designations associated with boundary vectors: 1000, 1020, 1040 1060, 1080

Note: The original object was 100 mils tall. If we would have obtained boundary vectors right at the slicing layer we would have had six layers (to be built at 20 mils each) forming a 120 mil object, but since we sliced 1 bit above the slicing layer we end up with only five layers (to be built at 20 mils each) forming a 100 mil object.

The vertical offset for obtaining boundary vectors creates one potential problem: If the part has a near horizontal boundary at a particular layer then if we obtain the boundary vectors from one bit above the layer they may be considerably different from the vectors that would have been formed if the boundaries were obtained from the exact slicing level. This problem can be minimized by making the one bit offset extremely small compared to the part dimensions.

The offset described above avoids several potential difficulties: The first is that the object's vertical dimensions would be otherwise distorted. These distortions can take several forms: the overall height of the part would be one layer too tall, the bottom of all vertical openings would be placed one layer too high relative to the bottom of the part, and all these openings would be one layer shorter than desired. All of these distortions can be summarized by stating that all up facing features will be one layer too high relative to all down facing features.

The second problem deals with misplaced cross-hatch vectors (while using one of our hatching algorithms). This is manifested in two ways, one is lack of consistency in generating cross-hatch for supporting up facing flat skin, the second way is the drawing of stray cross-hatch vectors running through hollow places within the object and/or cross-hatching missing from within the walls of the object.

Figure 23C:
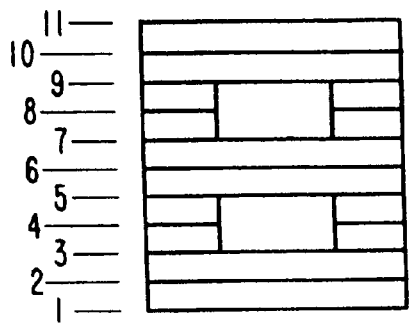
FIG. 23c illustrates a side view of a CAD designed object with internal features (windows) after rounding has occurred.
Figure 23D:
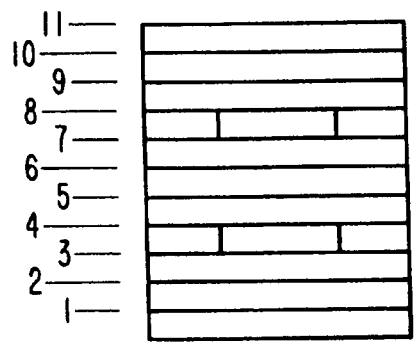
FIG. 23d shows a side view of the same object after being built from obtaining boundary vectors at the slicing layer.
Figure 23E:
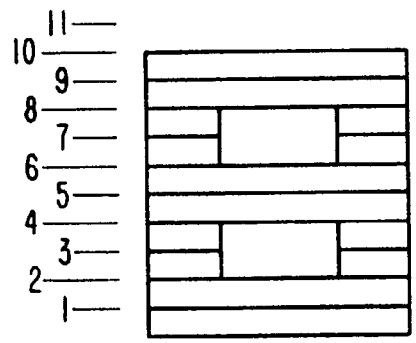
FIG. 23e is a side view of the same object after being built from obtaining boundary vectors at one bit above the slicing layer.

FIG. 23c illustrates side view of a CAD designed object with internal features (windows) after rounding has occurred. FIG. 23d shows a side view of the same object after being built from obtaining boundary vectors at the slicing layer. FIG. 23e is a side view of the same object after being built from obtaining boundary vectors at one bit above the slicing layer.

Two data manipulation process algorithms for generation of cross-hatch have proven particularly useful in the practice of the present invention. The first algorithm is based on an on-off switching of cross-hatch as layer border vectors are encountered. The second algorithm is based on knowing where the solid portion of the object is and, therefore, where cross-hatching should be placed based an the direction that normal vectors point.

At this point, we define three types of cross-hatch along with two options of implementing them. The types of hatch are 1) hatch that runs parallel to the X-axis, 2) hatch that runs parallel to the Y-axis, and 3) hatch that runs at 60 degrees and 120 degrees to the X-axis.

Given a slice scale factor the spacing between the hatch vectors is based on the number of bits specified in the slice command line for the parameters -Hx, -Hy, -Ha defined below.

Spacing between hatch vectors that run parallel to the "XI' axis—option=-Hx (number).

Spacing between hatch vectors that run parallel to the "Y" axis—option=-Hy (number).

Spacing between hatch vectors that run parallel to lines 60 degrees to the "XI' axis, and vectors that run parallel to lines 120 degrees to the "XI' axis—option—-Ha (number).

Allowed minimum intersect angle between cross-hatch and any boundary vectors that it would contact—option=— MIA (number).

The methods of implementing the hatch vectors are 1) implement all generated hatch or 2) implement only those hatch vectors that intersect both boundaries at angles greater than that specified with the slice command—MIA. Using the MIA option allows one to generate near-radial (nearly perpendicular to the boundaries) cross-hatch which can be an advantage in the case of objects that are prone to curl.

The locations of hatch paths are fixed in scaled CAD space. For this to be true, one hatch path for each orientation must be fixed with the other hatch paths being separated from the first by the number of bits specified in the "HI' options. These fixed hatch paths are the paths parallel to the hatch directions that goes through the origin. This implies that all hatch vectors lay over hatch paths from previous layers; therefore, it does not matter where a part is designed in CAD space, hatch will be built above hatch. This is especially important for near-radial cross-hatch. By definition, near-radial cross-hatch is lacking a considerable amount of perpendicular hatch that could otherwise be used as support for hatch on upper layers.

The aforedescribed process works well, but may encounter difficulty in deciding where to put hatching when the hatch path intersects a boundary at the junction of two vectors. This problem manifests itself by sometimes not hatching in areas where it should (causing weakening of the part) and by sometimes hatching in areas of hollow where there should be none (known as stray vectors). In order to minimize the misplacement of hatch a possible feature to add to the algorithm would allow only the drawing of hatch when an even number of boundary intersection points are encountered on a hatching path: whereas now, the algorithm just ignores the last intersection point if it is odd (hatch will not turn on and run until it runs out of space). Another feature added to the algorithm to minimize misplacement or non-placement of hatch vectors involves a determination of the slope (in the XY plane) of each of the boundary vectors that was used in the determination of an intersection point. If an intersection point is listed more than once the slopes associated with it are used to determine how to interpret the point. If a point is derived from two vectors with the same sign (+ or −) of slope the point is considered a boundary. If the slopes have the opposite sign the point is ignored.

The second process is based on using the normal vectors supplied with each triangle in the STL file. When layer borders are created each vector created is derived from a triangle that intersects a horizontal plane one bit above the slicing layer.

Each boundary vector is stored as a beginning point (x,y) and an ending point (x,y) and associated with each vector are six attributes. These attributes describe the orientation of the normal vector that is associated with the triangle from which the vector was obtained. These six attributes are 1) did the normal point along the positive +x axis? (true or false), 2) did the normal point along the −x axis?, 3) did the normal vector point along the +y axis?, 4) did the normal vector point along the −y axis?, 5) did the normal vector point along the +z axis?, 6) did the normal vector point along the −z axis. When we determine where to place hatch vectors we still use intersection of a hatch path with boundary vectors to trigger our need to make a decision, but now we base whether or not we turn on or off the hatching based on whether the normals indicate we are going into or out of solid. What actually happens is that we determine the point that each boundary vector intersects the hatching line and we put this point in a list along with its normal information. This is done with each boundary vector for each hatch path. Each point is evaluated as to whether it indicates that hatch should be turned on or off or continued in the same state. The present utilization of this algorithm is based on original normals supplied by the STL file and not on normals recalculated after rounding of triangles to scale bits and slicing layers has occurred.

Of course, during rounding, some triangle normals may change quadrants even to the extreme of flipping 180 degrees. Therefore, an improved algorithm will involve a recalculation of normals after rounding. Actually, cross-hatch uses only the X and Y components of the normal, so for the sake of proper placement of cross-hatch we need only recalculate the horizontal components, and not the vertical components of the normal vectors. Recalculation of the vertical components must be based on how the recalculation will affect the vector types that use it. Also the present algorithm involves turning on the hatch if a boundary is intersected that contains a normal indicating that the hatching line is intersecting solid, whether or not other normals at the same point indicate that one is entering hollow. After hatching is on, it stays on until a boundary point is intersected that contains only normals that indicate the entering of hollow. So the present algorithm favors hatch staying on when a boundary that contains conflicting information is intersected. This algorithm can be improved by the recalculation of normal vectors after rounding, as mentioned earlier, and by taking the algebraic sum of the signs of the directions indicated by the normals when a point is listed more than once. If the sum is less than zero the hatching turns on or continues on, if the sum is greater than zero the hatching turns off or continues off, and if the sum is zero the hatching continues on the same state whether on or off. It must be remembered that evaluation of points for hatching occurs starting with the smallest point and working toward the larger points along a given hatch path.

The second algorithm, as well as its proposed alternative, can cause the misplacement or non-placement of hatch vectors if separate objects that overlap in space are STL'd together. Since these situations represent physically impossible objects, the CAD designer should be able to avoid them when creating STL files. If, for design convenience, an overlapping of objects would be convenient, the objects should be STL'd into separate files and sliced separately. The present as well as the proposed algorithm can cause the misplacement of vectors if dimensions of features or hollows in CAD space cause them to collapse in some manner (due to chosen scale or layer thickness), thereby forming a double skin in some regions of an object. The formation of misplaced hatch vectors has a different source for these two algorithms.

The present algorithm can misplace hatch the entire distance along the collapsed region except at the starting and ending points of boundary vectors, at these points it will make the right decision some of the time. However, the alternative algorithm will make the proper decision at every point along the collapsed region except at the starting and ending points of boundary vectors, at these points it will make the right decision a portion of the time. Therefore, it is not advisable to design parts that have regions where collapse can occur, but if this is not possible the alternative algorithm will at least reduce the likelihood of stray vectors (from the above mentioned source). The present algorithm can misplace hatch vectors when a hatch line intersects a boundary at a junction point where two or more boundary vectors meet. However, the improved algorithm will not misplace vectors in this situation.

All three algorithms implement cross-hatch along the X-axis only. To derive hatch parallel to the Y-axis the part is rotated 90 degrees, hatched along the new X-axis and then rotated back. To derive 60 and 120 degrees hatch the object is rotated 60 and 120 degrees, respectively, hatched along the new X-axis, then rotated back into place.

Figure 24:
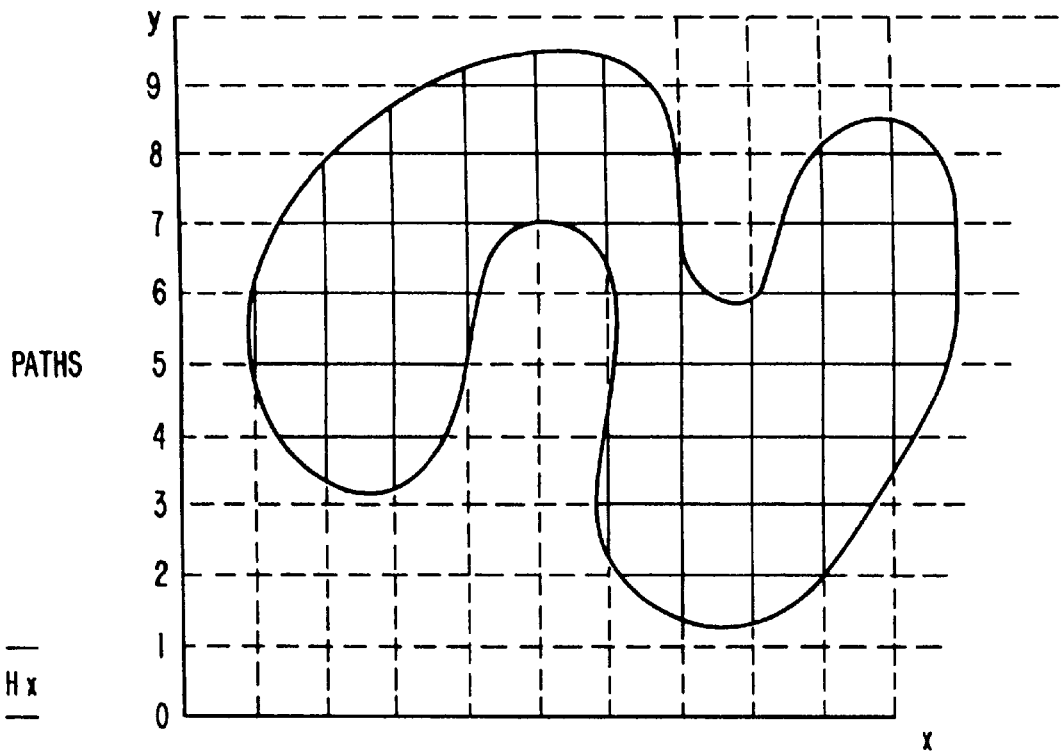
FIG. 24 is a top view of a cross-section of an object showing how hatch paths are determined.
Figure 24A:
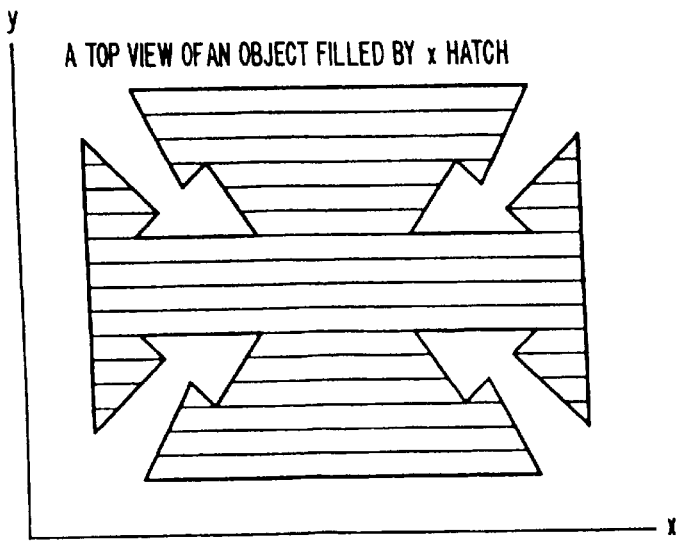
FIG. 24a is a top view of an object filled by X hatch.
Figure 24B:
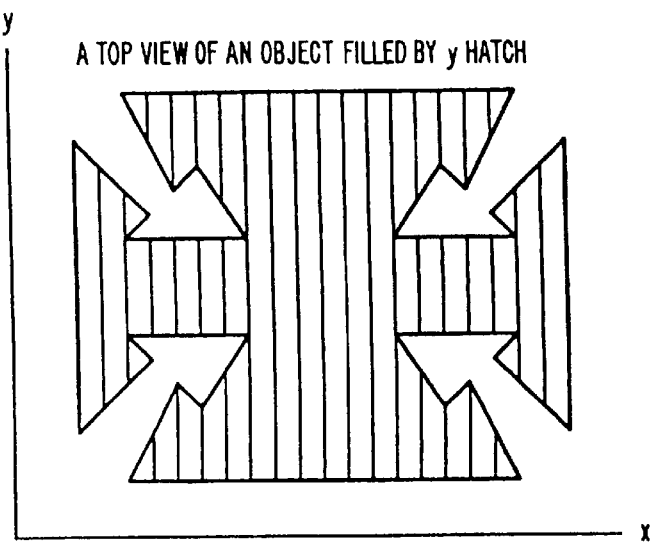
FIG. 24b is a top view of an object filled by Y hatch.
Figure 24C:
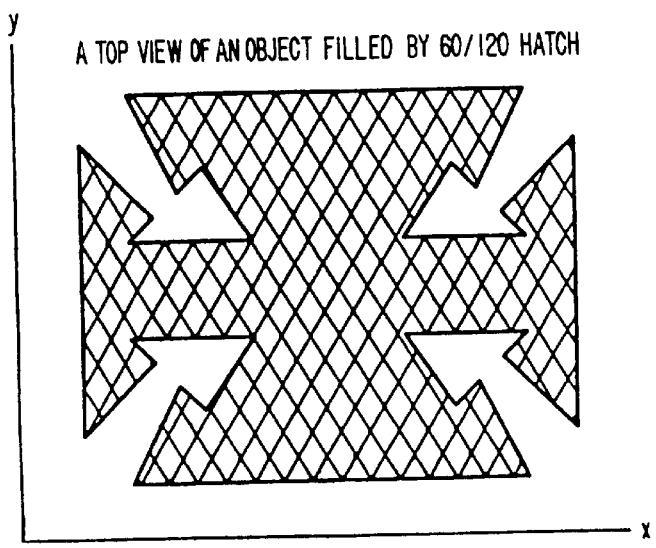
FIG. 24c is a top view of an object filled by 60/120 hatch.

FIG. 24 is a top view of a cross-section of an object showing how hatch paths are determined. FIG. 24a is a top view of an object filled by X hatch. FIG. 24b is a top view of an object filled by Y hatch. FIG. 24c is a top view of an object filled by 60/120 hatch. FIG. 24d is a top view of a layer of an object completely filled in its solid regions.

Figure 24E:
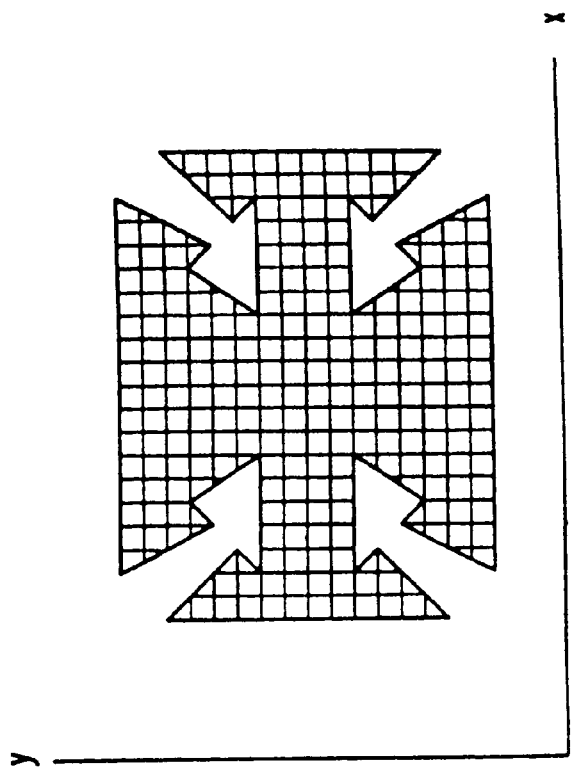
FIG. 24e is a top view of a layer of an object properly filled in by cross-hatch (X & Y)
Figure 24D:
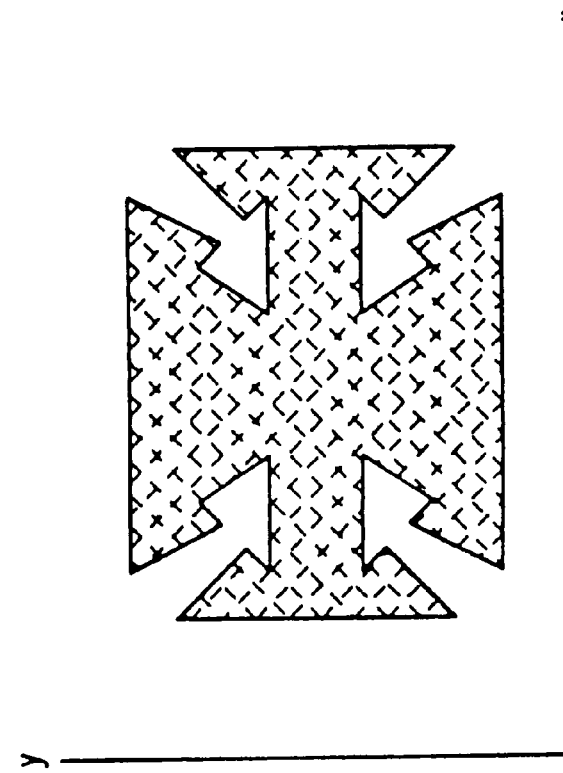
FIG. 24d is a top view of a layer of an object completely filled in its solid regions.
Figure 24F:
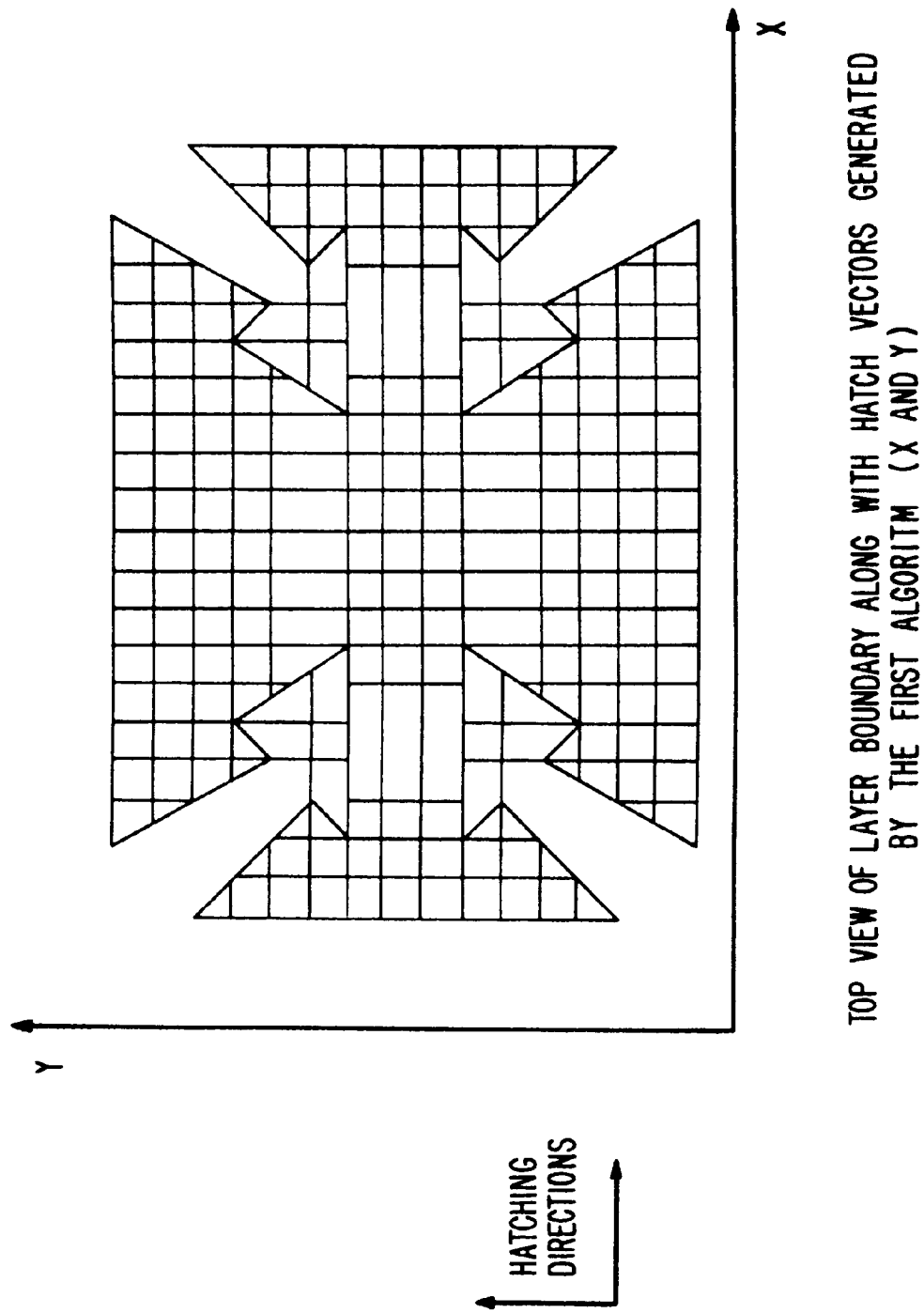
FIG. 24f is a top view of a layer of boundary vectors along with hatch vectors generated by a first algorithm (X & Y)
Figure 24G:
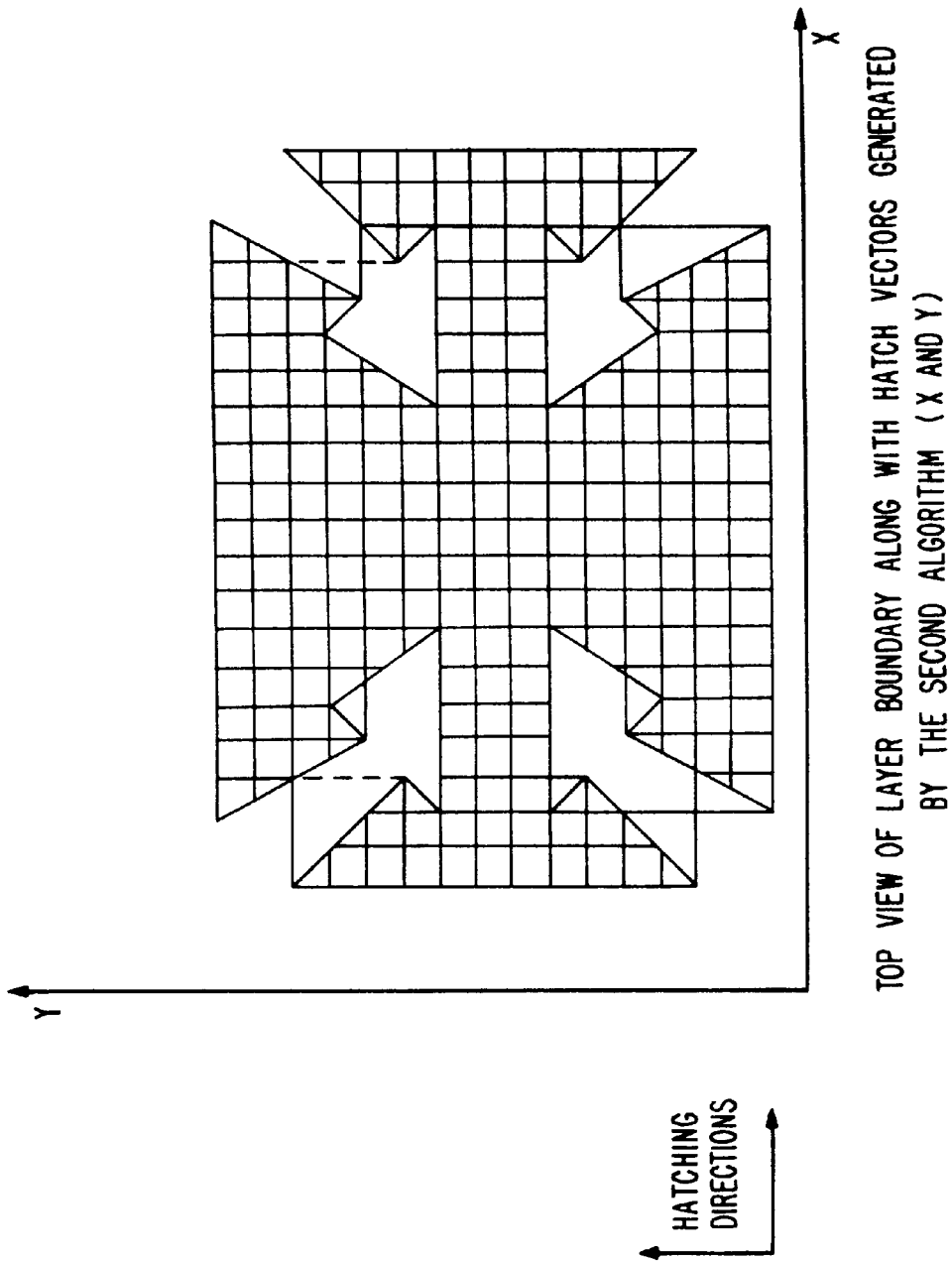
FIG. 24g is a top view of boundary vectors along with hatch vectors generated by a second algorithm (X & Y)
Figure 24H:
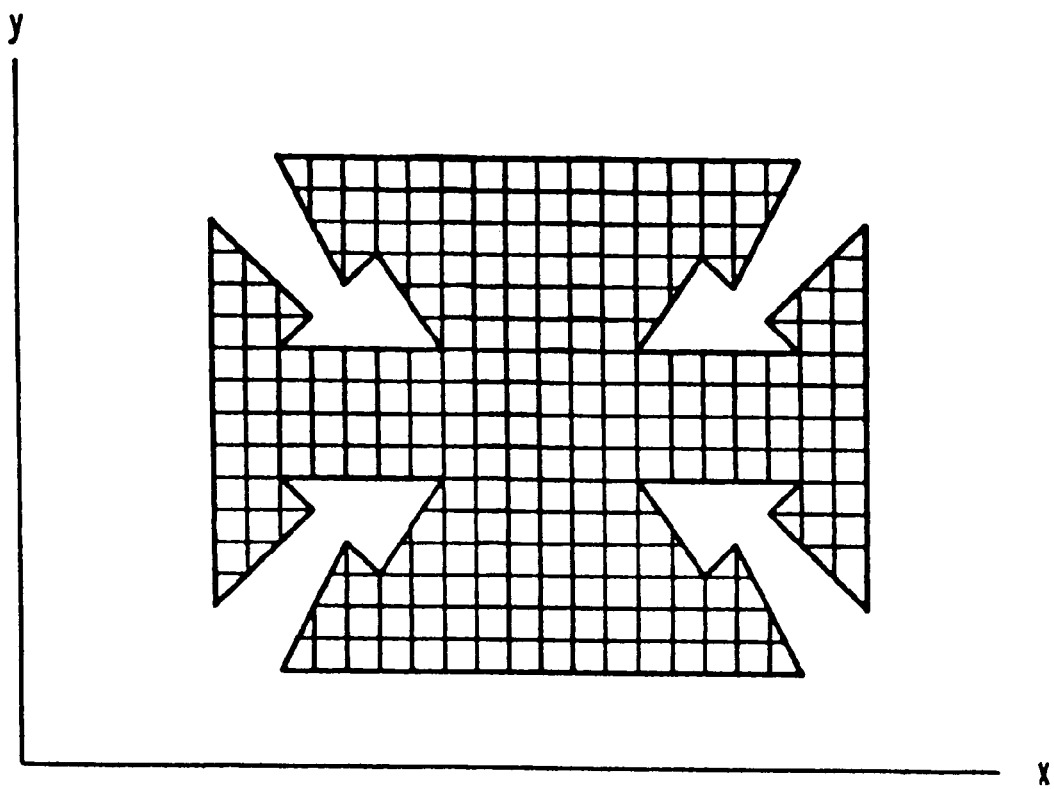
FIG. 24h is a top view of a layer of boundary vectors along with hatch vectors generated by still another algorithm (X Y)
Figure 24I:
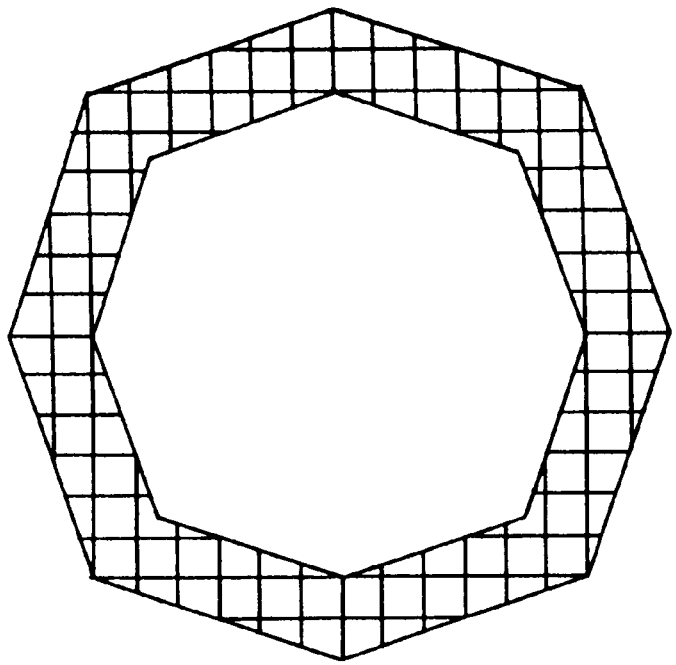
FIGS. 24i and 24j are top views of cross-sections of an object hatched using various MIAs.
Figure 24J:
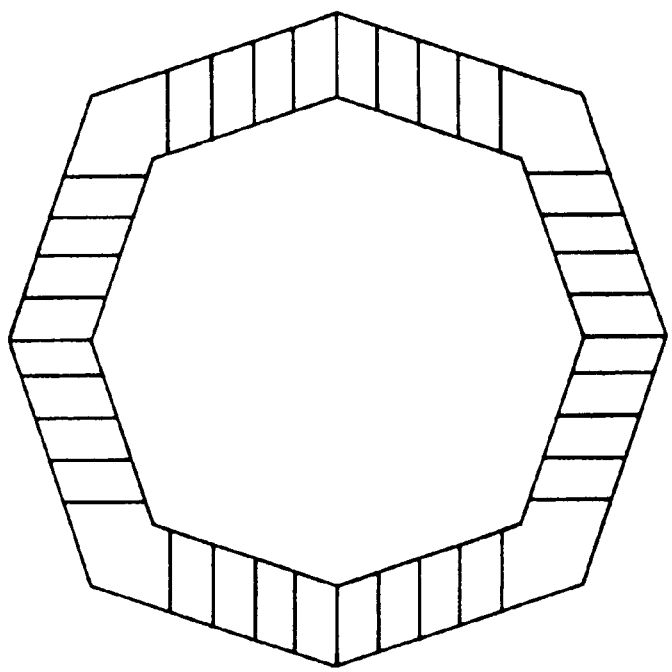
Figure 24K:
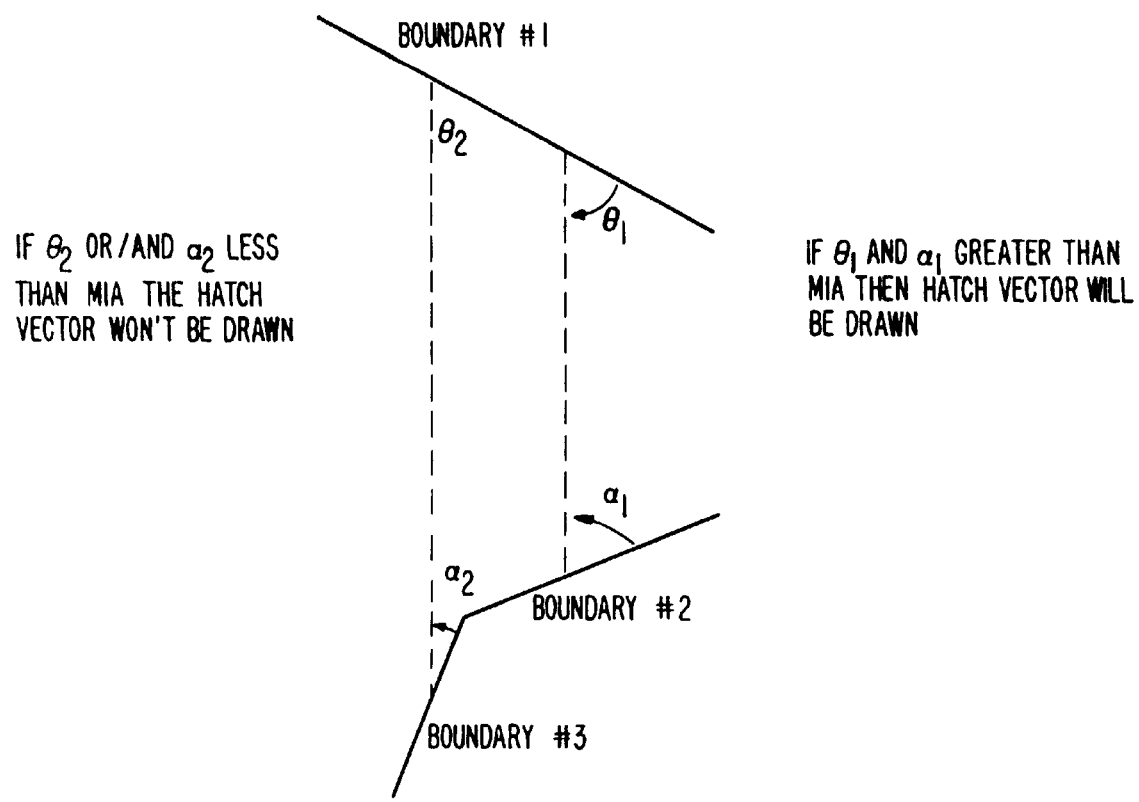
FIG. 24k is a schematic boundary diagram.

FIG. 24e is a top view of a layer of an object properly filled in by cross-hatch (X & Y). FIG. 24f is a top view of a layer of boundary vectors along with hatch vectors generated by the first algorithm (X & Y). FIG. 24g is a top view of boundary vectors along with hatch vectors generated by the second algorithm (X & Y). FIG. 24h is a top view of a layer of boundary vectors along with hatch vectors generated by the proposed algorithm (X & Y). FIGS. 24i and 24J are top views of cross-sections of an object hatched using various MIAS. FIG. 24k is a schematic boundary diagram.

There has been some consideration of using a special normal vector to indicate that a boundary should not be considered when determining cross-hatch. This might be a normal vector of zero length (0,0,0). This normal would indicate that a particular triangle has no preferred orientation with regard to one side bounding solid and the other bounding empty space. This could be useful in building many objects, but we must spend a little time considering how to and when to implement it. Problems to be considered include: 1) how to specify in CAD or otherwise which triangles are regular and which are not, 2) how to insure triangles that form closed loops are of one type only, 3) how would tangent following be implemented (vector offsetting to account for line width), 4) would hatch associated with near-flat and flat boundaries still be used, etc.

Flat skin is generated from completely horizontal triangles. A horizontal triangle is one which has all three vertices at the same layer. Rounding of triangle vertices may produce flat triangles from triangles that were not originally horizontal. The first step in forming flat skins is to separate them into two groups, one consisting of up-facing triangles (up-pointing normals) and the other consisting of down-facing triangles. The triangles in each group are then ordered according to the layers which they belong to. Next, the edges of each triangle which belong to a particular layer are interpreted as boundary vectors for flat up or down-facing skin. These boundary vectors continue to tessellate an area of skin into a group of triangles. We next remove all pairs of duplicate boundary vectors. This leaves us with flat skin boundaries that form a closed loop around an area of skin. These boundary vectors are then filled with a very finely spaced cross-hatch (fill) vectors being separated perpendicularly by the number of bits specified by the -hfx or -hfy options of slice. This procedure of creating boundaries and fill for flat skins is repeated for both up-facing and down-facing horizontal triangles for each layer of the object.

The filling of the flat skin boundaries is based on the same algorithms as mentioned for cross-hatching above. Therefore, the intersection of a fill line with a boundary triggers the need for a decision to be made as to whether to turn on fill, turn off fill, or continue as is. The decision on what to do is again based on either an odd-even turn on/turn off condition or on the consideration of the direction normal vectors associated with each boundary segment (vector). For layer hatching the normal associated with each vector is derived from the triangle it was obtained from, whereas the normal associated with each flat triangle points only in the vertical direction and therefore cannot be used to determine any characteristics designating the inside or outside of the triangle. The technique used to determine the segment 2-D normals for a flat skin boundary is based on the analysis of the three vectors that make up the boundary of a triangle as a group. The technique is to compare the coordinates of the vertices making up a vector to those of the third point of the triangle to determine which way is outside the triangle (relative to the vector). This information along with the slope of the boundary vector is sufficient to determine the proper 2-D normal direction. This same procedure is done for each of the segments that form the boundaries of a triangle. The normal is then reduced to designate which quadrant it points in and that information is saved with the boundary segment data (beginning and endpoints). This procedure is repeated for all flat triangles. Then all pairs of duplicate boundary vectors are removed for a given skin type on a given layer. The fill vectors can then be calculated using the same algorithm previously described for hatch vectors.

Skin fill always runs parallel to the X or Y axis so it sufficient to know what quadrant a normal points to determine whether it indicates the entering of hollow or solid. This argument is true for hatch as well, since the algorithms are the same. But when we consider 60/120 hatch knowing the quadrant in which a normal points is not sufficient to determine accurately whether one is entering or leaving solid. When hatching is done along the 60 and 120 degrees lines, we can consider the part to be rotated counterclockwise 60 to 120 degrees we can consider the axis to be rotated clockwise 60 or 120 degrees so that we can still use X and Y normal indicators to determine whether or not solid or hollow is being entered. But, in doing this rotation, we must not forget to recalculate the new quadrants in which the normals point.

Just as fill is determined for flat-skin we could determine cross-hatch if needed.

Figure 25B:
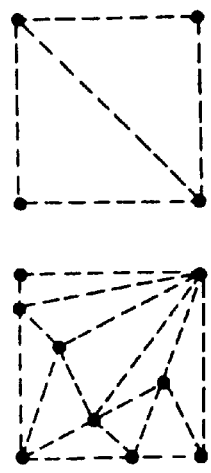
FIG. 25b shows a flat boundary derived from flat triangle.
Figure 25D:
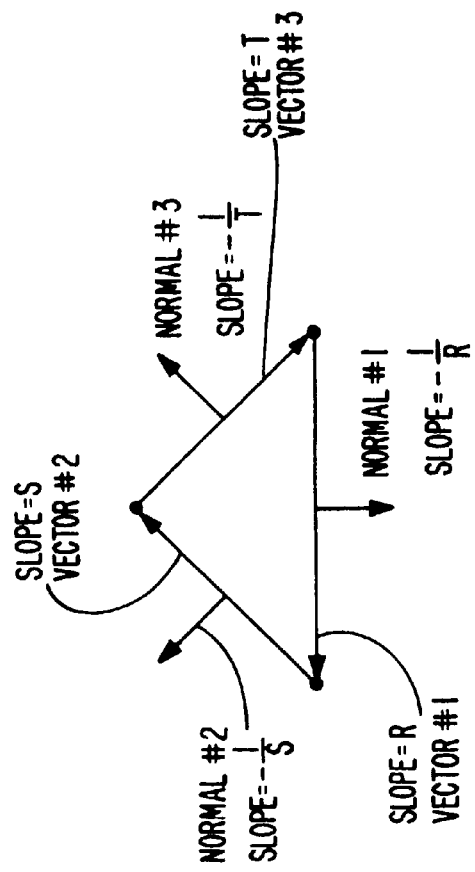
FIG. 25d shows a flat triangle with boundary vectors and two-dimensional normals.
Figure 25A:
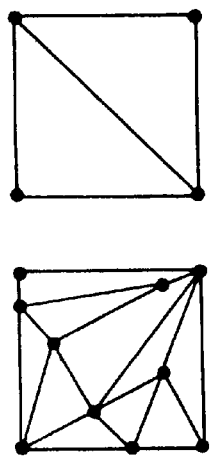
FIG. 25a illustrates vertices of a flat triangle.
Figure 25C:
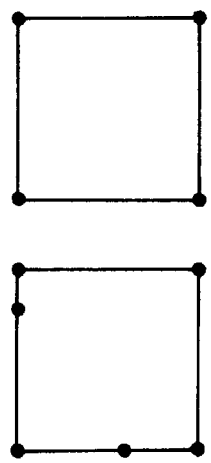
FIG. 25c illustrates flat boundaries with pairs of duplicate vectors removed.
Figure 25E:
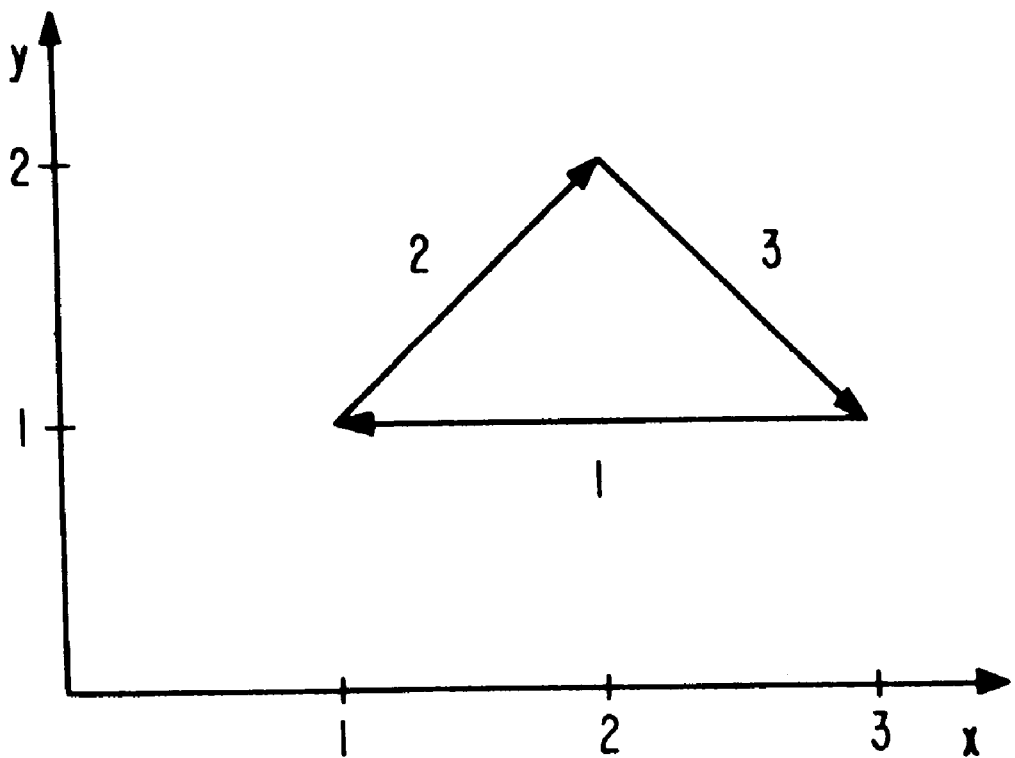
FIG. 25e shows a flat triangle with vector list.

FIG. 25a is vertices of a flat triangles. FIG. 25b is a flat boundary derived from flat triangles. FIG. 25c is a flat boundaries with pairs of duplicate vectors removed. FIG. 25d is a flat triangle with boundary vectors and two-dimensional normals. FIG. 25e is a flat triangle with vector list.

A further improved technique of generating skins is based on the original direction of the vertical component of the triangle normals as supplied in the STL file. Problems may occur when flat triangles on the edge of a flat surface flip over after rounding to vertices. These problems might occur because the segment normals associated with skin boundary vectors (from flipped triangles) may end up pointing toward the area requiring skin instead of away from it. This, in turn, can cause the misplacement of hatch or fill vectors.

Figure 25F:
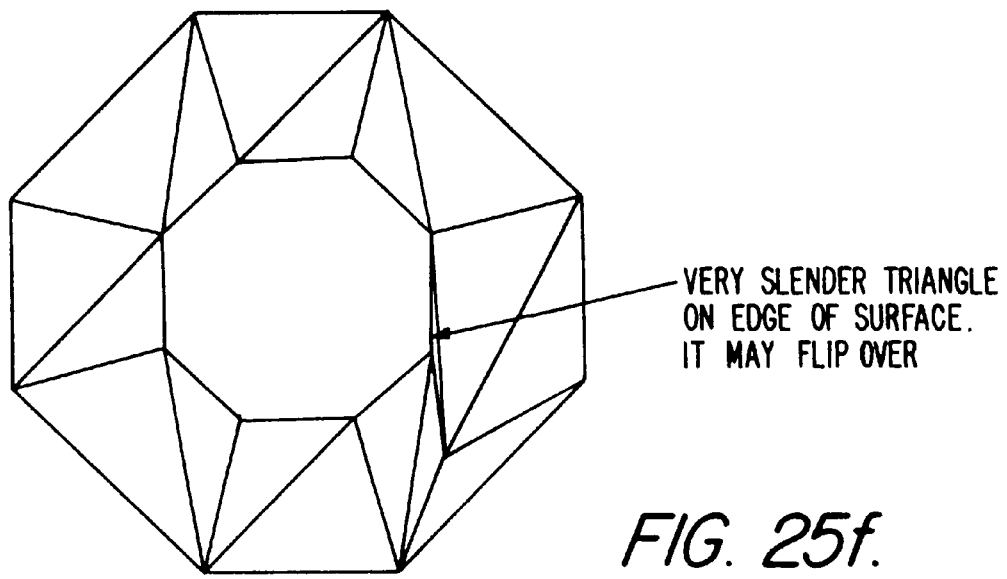
FIG. 25f is a top view of a flat skin surface and the triangles forming the surface.
Figure 25G:
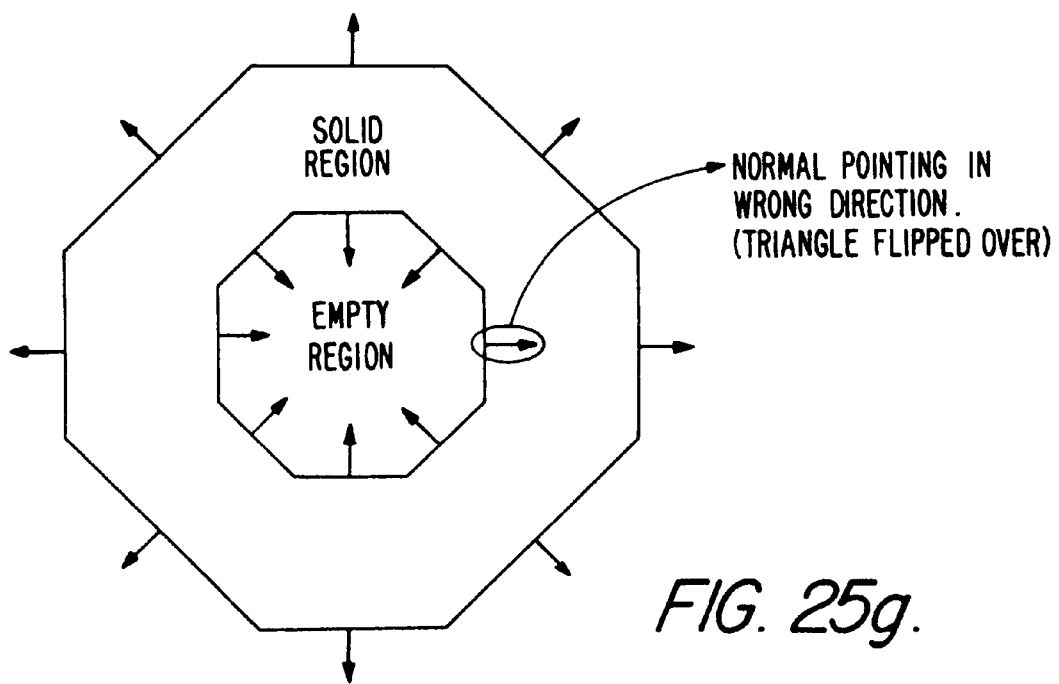
FIG. 25g is a top view of the flat skin surface with duplicate pairs of vectors removed, along with one edge triangle flipping over, and how its normal points in the opposite direction to the other segment normals forming the boundary.

FIG. 25f is a top view of a flat skin surface and the triangles forming the surface. FIG. 25g is a top view of the flat skin surface with duplicate pairs of vectors removed, along with one edge triangle flipping over, and how its normal points in the opposite direction to the other segment normals forming the boundary.

Two known possible solutions to this problem exist. The first solution is based on considerations similar to those used to develop the normal-sign summation hatching process. Six situations can develop when flat triangles flip over: 1) the flipped triangle forms a single flat surface, 2) the flipped triangle forms a single and a double flat surface, 3) the flipped triangle forms a double surface only, 4) the flipped triangle forms a double and a triple surface, 5) the flipped triangle forms a triple surface only, and 6) other situations that can develop between flat triangles involve features collapsing to single layers, yielding flat up and down-facing triangles covering the same area on a single layer. These situations are very similar to those used to develop the normal-sign summation hatching process. The only difference is that overlapping boundaries are one dimensional whereas the areas covered by overlapping triangles are two dimensional. In essence, the summation technique used for layer hatching computes the net boundary at the intersection of boundaries with hatch paths. Whereas, the technique for skinning is based on determining net normals for areas based on addition of areas with like normals and subtraction of areas with opposite normals (up-facing, and down-facing). Then the determination as to whether an area receives up-facing skin, down-facing skin, or no skin is based on whether the net normal of the areas points up, down, or does not exist. For this to work, the directions of the normals must be determined after distortion of the triangles.

This process yields skin boundaries and fill perfectly matched to features (distorted) requiring particular types of skin (up or down). This process is based on the assumption that no area on a single layer (layer of creation not layer of drawing) can require both up and down skin. This implies that a feature that is originally less than one layer in thickness might be lost.

The second solution process is based on computer segment normals a second time after duplicate pairs of boundary vectors are removed. This recomputation would be based on the consideration that the majority of the segment normals on any closed boundary loop were correct the first time they were created (from their triangles) but that a minority of them are wrong. Or better yet, on the assumption that the segment normal form a non-flipped triangle is correct and all other segment normals can be made to match it. This method of recomputation is based on the vector ordering procedure described subsequently herein in greater detail. Once the vectors are ordered, the cross product of all boundary vectors (forming a given loop) with their segment normals should be consistently up or down for a given closed loop. With this knowledge, a comparison between cross products is made, and then any unusual segment normals reversed.

Some of the above assumptions might be inapplicable if boundaries are not closed, or two closed boundaries join. A list of possible skin configurations is shown below with a statement as to how this algorithm will form that skin: double surface area properly skinned, single surface—area skinned properly, single/double—possibly one or both areas improperly skinned along with the possibility of miss skinning other areas also, triple surface—area skinned properly, and double/triple—area skinned properly. Therefore, this second technique has only one problem: single/double surfaces. The possibility of forming a single/double—surface is very small, because the formation of a double/single surface implies that only two triangles are involved in the situation and that the one that did not flip is narrower than the one that did.

There is an algorithmic process for reducing the remaining problem further. The problem with single/double surfaces is that after elimination of duplicates we have only two crossed triangular shaped single surfaces left, but those single surfaces share two vectors and two vectors need one normal for one triangle and the opposite normal for the other. Whenever boundary vectors cross we need one segment normal on one side of the cross and the opposite normal on the other side. The solution is based on the detection of crossing boundaries, then dividing the vectors that cross into vectors that end at the intersection point, and then reordering the new vectors. In this reordering special care must be taken in order to insure that boundary lines are not crossed and therefore insuring that the new loops are traversed properly. This is also true for two boundary loops that touch at a vertex point. Intersection and touching can be determined by the same algorithmic process. Then loops can be formed by requiring that at the intersection point the loop not be formed by crossing boundaries but by proceeding to the boundary vector that forms the smallest angle with last vector, and breaking off loops when they are completed. FIG. 25h is a top view of flat triangles forming single/double surface before flipping, after flipping, with segment normals, after cancellation of duplicate pairs, after splitting of vectors, and after loop determination (two).

In building objects we generally consider the objects to have solid portions and hollow portions. Walls wider than two cure widths are created by boundary vectors forming side surfaces and filing in between the boundaries with cross-hatch. If the vertical slope of a wall is over one cure width wide for each layer thickness then a gap will be formed between the boundary vectors on the two layers. This gap can cause the drainage of liquid from between wall surfaces. The problems of gaps between boundaries is solved by the concept of near-flat skin. Near-flat skin also solves the problem of making the transition from vertical to horizontal features.

This method of filling in the area between the boundaries of consecutive layers can be implemented in several ways. One of the simpler ways of generating fill vectors is based on the realization that areas that require near horizontal skin will be represented by triangles whose normals are within a certain angle of the vertical. This angle (MSA—minimum surface angle) is presently defined by the operator and is based on the angle at which two boundary vectors drawn on consecutive layers would no longer overlap. This is further based on the cure width of the segments forming the boundaries and the layer thickness.

Figure 26A:
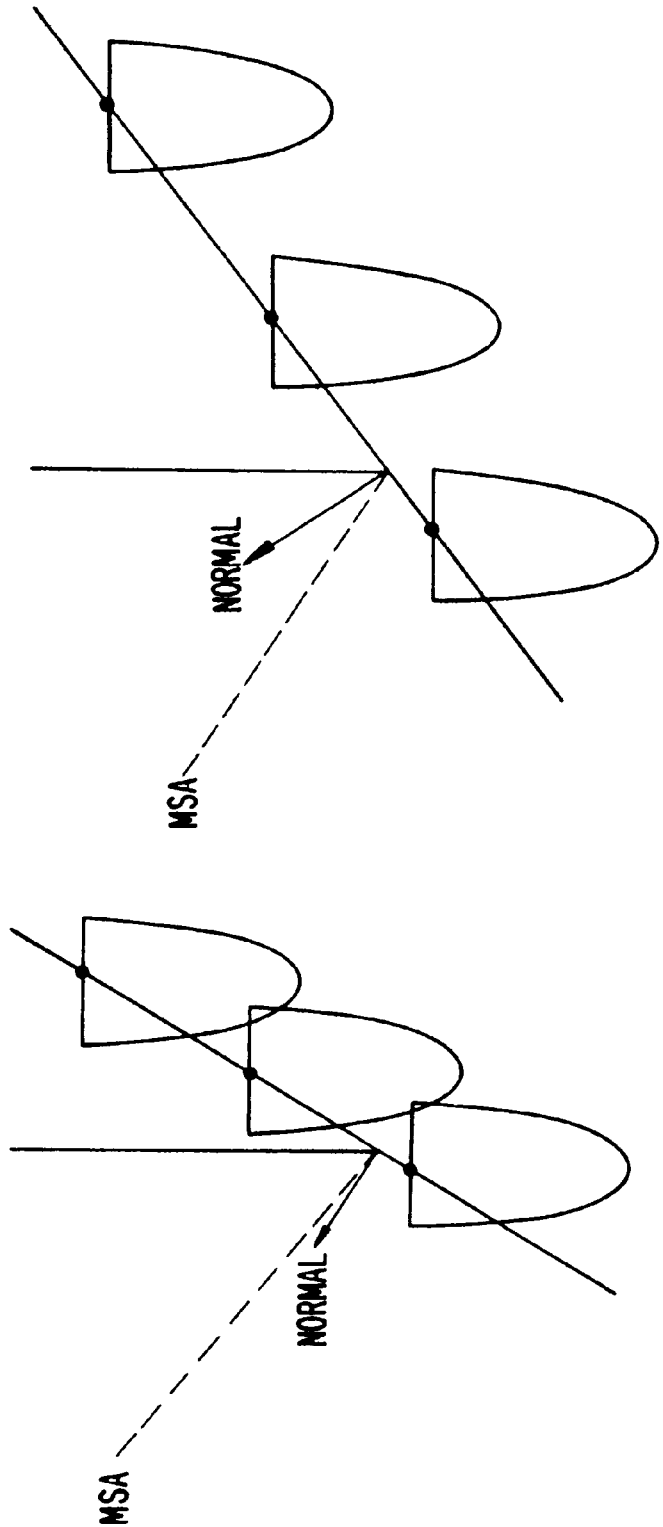
FIGS. 26a and 26b are side views illustrating boundaries on two consecutive layers and the associated variables for determination of the MSA.
Figure 26B:
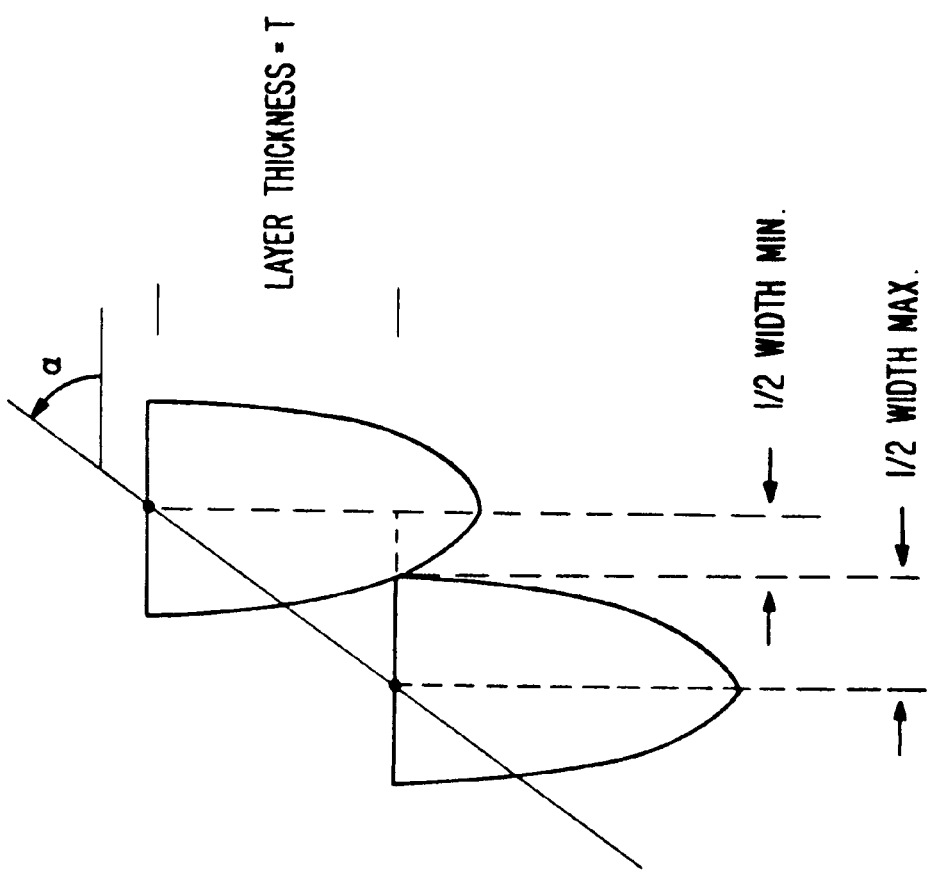
Figure 26C:
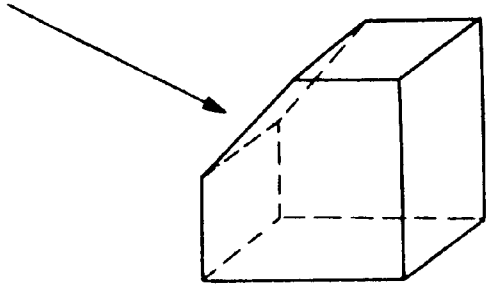
FIG. 26c shows a part requiring near-flat skin.

FIGS. 26a and 26b are side views of boundaries on two consecutive layers and the associated variables for determination of the MSA. FIG. 26c is a part requiring near-flat skin (the test box).

Since individual triangles can be analyzed to determine the need for near-flat skin we can process these specific triangles to yield boundary vectors for this skin. It would be difficult to base the development of near-flat skin on differences between layer borders from one layer to the next. Also, to consistently determine the proper near-flat fill, this fill must be generated from the intersection of near-flat triangles right at the slicing layers not one bit up or down. As with all fill and hatch vectors we must first determine the boundaries between which we want to fill. once these boundaries are determined, the fill will be based on the same algorithms on which layer hatch and flat skin fill are based.

By having the triangle vertices land on slicing layers, we are insured that if a triangle affects the fill between two layers it will have components that either land on each layer or at least intersect each layer. A situation cannot develop in which a triangle will affect the region between two layers and only cross one of them. Since a triangle crosses both layers, we can generate two vectors from the intersection of the triangle with the two layers these two vectors form two opposing sides of a trapezoid, or of a degenerate trapezoid (triangle).

Figure 26D:
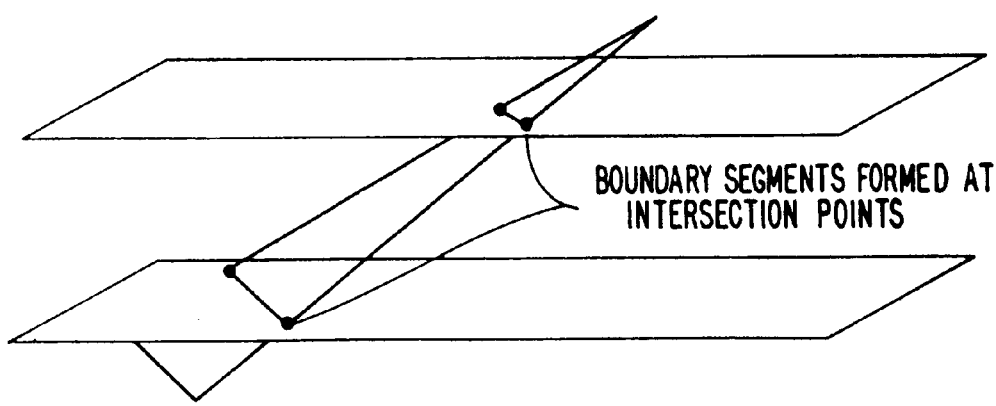
FIG. 26d shows near-flat triangles intersecting two layers and the first two boundary vectors being formed (three cases)

FIG. 26d is a near-flat triangle intersecting two layers and first two boundary vectors being formed.

The remaining two sides of the trapezoid are formed by producing straight non-intersecting lines from the endpoints of the first segment to the endpoints of the second segment. Now we have formed a two-dimensional boundary (in a plane) from a particular near-flat triangle that can be filled with skin and/or hatch. The next step is to determine the segment normal vectors associated with each of these boundary vectors to clarify what is inside and what is outside of the trapezoid. This determination is very similar to that which was done for flat skin boundaries.

First, the vertical component of the normal of the near-flat triangle, which generated the trapezoid, is used to determine whether the trapezoid belongs to up-facing or down-facing near-flat skin. The segment normals for each trapezoid boundary are calculated by noting that the slope of the segment normal vector is the negative reciprocal of the segment slope and its direction is away from the remaining two points of the trapezoid. Remember that the information for the segment normal is only stored (after calculation) 6 bits indicating whether it has components along the positive or negative directions of the three axes. Normals are determined for each of the sides of the trapezoid. This procedure is then repeated for each of the layers that each near-flat triangle intersect.

At this time all degenerate boundary vectors (the point vectors that turned some trapezoids into triangles) are removed. Following this, all pairs of duplicate boundary vectors of each type of each layer are removed. After removal of duplicate vectors we are left with complete boundaries of near-flat skin with associated segment normals indicating inside and outside of the boundaries. These boundaries can now be filled using either of the hatching algorithms. Near-flat hatch vectors generated will have the same characteristics as those of layer hatch and the near-flat skin fill vectors will have the same characteristics of flat skin fill. The concept of where to place near-flat skin after it has been created will be discussed in the next section.

Figure 26F:
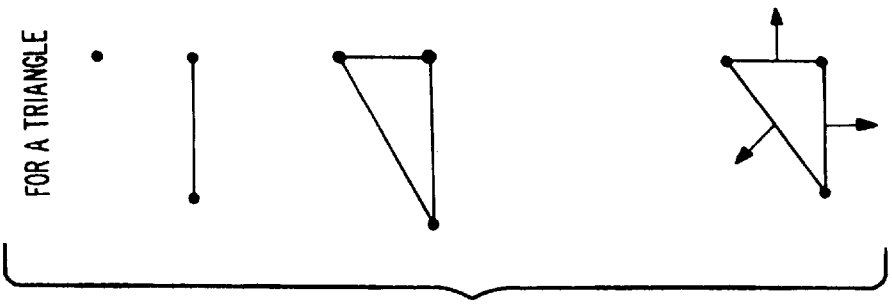
FIG. 26f is a top view of a trapezoid showing relationships between segment normals, boundaries, and inner and outer portions of the trapezoid.
Figure 26E:
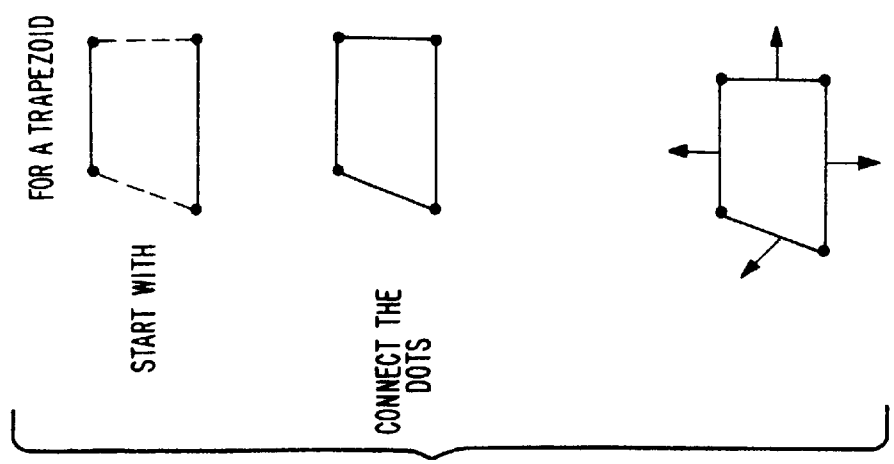
FIG. 26e is a top view of near-flat boundary vectors for a trapezoid and a triangle being completed.
Figure 26G:
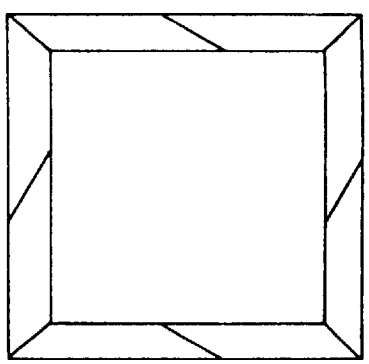
FIG. 26g is a top view of near-flat skin triangle boundaries before removal of pairs of duplicate vectors.
Figure 26H:
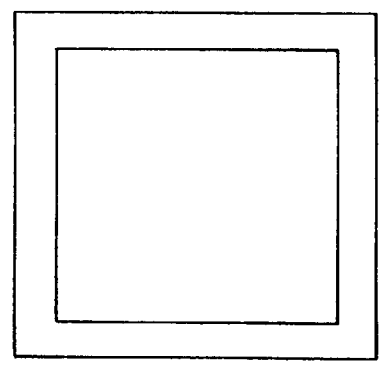
FIG. 26h is a top view of a near-flat skin boundary after removal of duplicate vectors.

FIG. 26e is a top view of near-flat boundary vectors for a trapezoid and a triangle being completed. FIG. 26f is a top view of the trapezoid showing relationships between segment normals, boundaries, and inner and outer portions of the trapezoid. FIG. 26g is a top view of near-flat skin trapezoid boundaries before removal of pairs of duplicate vectors. FIG. 26h is a top view of near-flat skin boundary after removal of duplicate vectors.

The same comments made regarding recalculating flat-skin boundary segment normals apply to near-flat boundary segment normals as well.

However, as with flat skin, there are situations in which near-flat skin fill and hatch can be misplaced. These situations come about from the same circumstances described in the comments relating to flat skin previously described. The solutions described in connection with flat skin also can be applied here. However, it should be noted that near-flat skin is much less likely to have problems than flat skin because it is much less likely to have flipped over triangles overlapping other triangles.

Boundary vectors are created from processing triangles that intersect a given layer. This processing of triangles can occur in any order and can therefore produce boundary vectors in any order. When objects are built, the movement of the laser across the liquid surface takes a finite time. During this finite time two things happen: 1) slight curing of the liquid occurs even if it does not produce measurable solid material, and 2) by the time the laser beam has reached a point which it is supposed to cure it may have already received commands to move to a new point, or at minimum it will not sit at this first point for the proper length of time to give it proper cure. Taking these two points into consideration we do not want the laser beam to be jumping any more than it has to. When jumping cannot be avoided it is better to jump over a region of solid than a region of hollow.

It must be remembered that the boundaries form closed loops of vectors; therefore, the location of the head of one vector will always correspond to the tail of another. If we consider boundary vectors to be drawn from tail to head. We can minimize the jumps when drawing boundaries by ordering the vectors so that the first vector is followed by a second vector whose tail is at the same point as the head of the first, and the tail of the third vector is at the same point as the head of the second. This is continued for a given closed loop. The only time the beam needs to jump is when it begins drawing the boundary, when it starts drawing a new loop, and when it finishes the boundary. These statements apply to the ordering used for all types of boundaries.

Figure 27A:
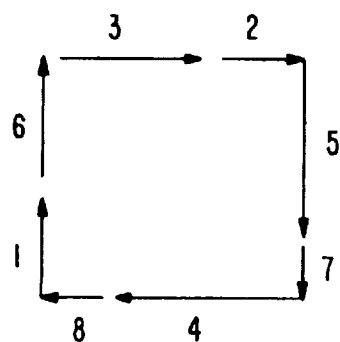
FIG. 27a is a top view of one order for drawing boundary vectors when they are not ordered.
Figure 27B:
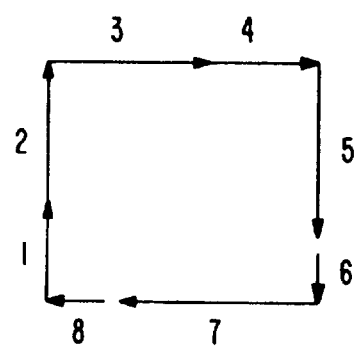
FIG. 27b is a top view of an order of drawing boundary vectors after they have been ordered.

FIG. 27a is a top view of possible order to drawing boundary vectors when they are not ordered. FIG. 27b is a top view of order of drawing boundary vectors after they have been ordered.

Hatch and fill vectors are created from making decisions at the intersection points of hatch and fill paths with boundaries. After creation of hatch or fill vectors, they need to be ordered in a way to give optimum part building conditions (as with boundary vectors). When drawing hatch vectors the number and lengths of the jumps of the laser beam should be minimized. Jumps over hollow areas need to be minimized, whereas jumps over solid areas can be considered less critical. Also hatch types (X, Y, 60/120) should be drawn as groups to insure that stresses on a layer are developed in such a manner to minimize them on the layer as a whole, and to spread them uniformly over all areas so that there are no local area build ups. We need to consider ways of drawing blocks of hatch and fill vectors to minimize jumping. one method is based on a technique of minimizing jumping distance regardless of whether that distance is over solid or hollow. The steps for this method are as follows:

1) Start with any one hatch vector and define its tail and head and define it to be drawn from tail to head.
2) Search the remaining hatch vectors for the one that has a point closest to the head of the first vector.
3) Define this closest point as the tail of vector 2 (vector 2 to be drawn tail to head).
4) Search the remaining vectors for the one that has a point closest to the head of vector 2.
5) Define this closest point as the tail of vector 3.
6) Continue this process until all vectors are ordered.

This procedure will minimize the jumping distance (number of jumps is constant).

This is a reasonable method to minimize the jumping distance but is probably a relatively slow way of ordering the vectors. This algorithmic process does not distinguish between jumping over solid or hollow areas and will only minimize the jumps over hollow areas when the gap of the hollow is greater than the distance from the endpoint of one vector to the starting point of its neighboring vector (see Figure below).

Figure 27C:
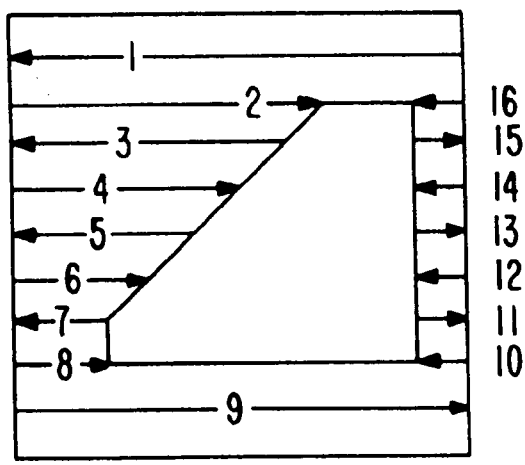
FIG. 27c is a top view of boundaries and hatch showing spacing so that the endpoint of one vector is closest to the beginning point of its neighboring vector.
Figure 27D:
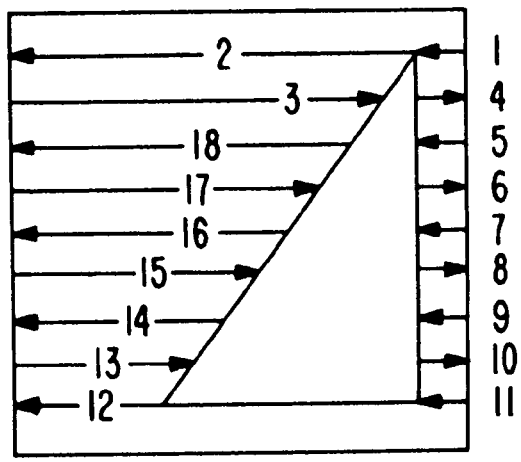
FIG. 27d is a top view of boundaries and hatch showing an endpoint of a vector closer to a beginning point on a vector across a hollow instead of to its neighbor.

FIG. 27c is a top view of boundaries and hatch showing spacing so that the endpoint of 1 vector is closest to the beginning point of its neighboring vector. FIG. 27d is a top view of boundaries and hatch showing endpoint of a vector is closer to a beginning point on a vector across a hollow instead of to its neighbor.

The way hatch and fill vectors are ordered in slice is based on a completely different algorithm than the one described. Our present algorithm is based on drawing the first vector derived from the first hatch or fill path followed by the first vector derived from the second hatch or fill path. This process continues until all the paths are covered then the algorithm is repeated this time looking for the second vector on each path, and then the third, until all vectors have been covered. Every other vector is drawn in reverse order so as to minimize the jumping distance. This algorithm keeps the jumps to a minimum and the jumps that do occur are generally over solid as opposed to hollow areas.

FIG. 27e is a top view of boundary and hatch showing order of drawing of hatch.

There are several other algorithms that could be used to order the hatch and fill, but I will only comment on one more. This last algorithm is very similar to the first, but it has one difference. It uses a very small hatch spacing for calculating the drawing order but actually only outputs a portion of the vectors. This portion would be based on the desired spacing and on skipping an even number of dummy vectors so that the drawing order will be proper.

We have analyzed four methods regarding placement of skins. These methods have been designated as STYLES 1 though 4. The first two styles (STYLE 1 and 2) have characteristics that allow the building of any general part; therefore, they have the characteristics or always having solid material on a previous layer which is available to attach to the solid material which is being formed on the following layer. STYLES 3 and 4, on the other hand, cannot be used to build general parts due to inconsistency in the availability of solid material from the previous layer on which to attach solid material from the present layer. This inconsistency disappears for parts that fit specific requirements, so STYLES 3 and 4 can be useful for some classes of parts.

STYLES 1 and 2 build parts whose solid areas are slightly oversized in the X and Y dimensions and whose hollow areas are slightly undersized in the X and Y dimensions. The amount to which these solid features are oversized is based on the vertical angles of the normals of the triangles that form the features. If a triangle's normal makes a large angle with the vertical it will cause the features to be only slightly oversized; whereas if a triangle's normal makes a small angle with the vertical it will produce a larger amount of oversizing.

STYLES 3 and 4, on the other hand, build parts whose solid features are slightly undersized in the X and Y dimensions and whose hollow features are slightly oversized in the X and Y dimensions. The amount to which these solid features are undersized is based on the vertical angles of the normals of the tri angles that form the features. If a triangle's normal makes a large angle with the vertical it will cause the features to be only slightly undersized; whereas if a triangle's normal makes a small angle with the vertical the features will be undersized by a larger amount. The amount of undersizing along with the horizontal separation of features will determine under what conditions STYLES 3 and 4 can no longer build real parts and; therefore, under what CAD design criteria STYLES 3 and 4 can effectively be used.

FIG. 28a is a side view of a CAD designed object. FIG. 28b is a side view of the same CAD designed object built using STYLE 1 or 2, with perimeter of CAD object drawn around it. FIG. 28c is a side view of the same CAD designed object built using STYLE 3 or 4, with perimeter of CAD object drawn around it.

Layer boundary vectors are obtained from the intersection of scan and near-flat triangles with a horizontal plane 1 scale bit above the slice layer. Normals for these vectors are obtained from the triangles they are derived from, if appropriate for later hatching between boundaries. This 1 bit up obtainment of vectors gives the right vertical displacement between down facing and up facing features. This also gives the ability to consistently deal with flat up-facing, flat down-facing, near-flat up-facing, and near-flat down-facing skin based solely on the type of skin not on geometrical relations of features.

Figure 29A:
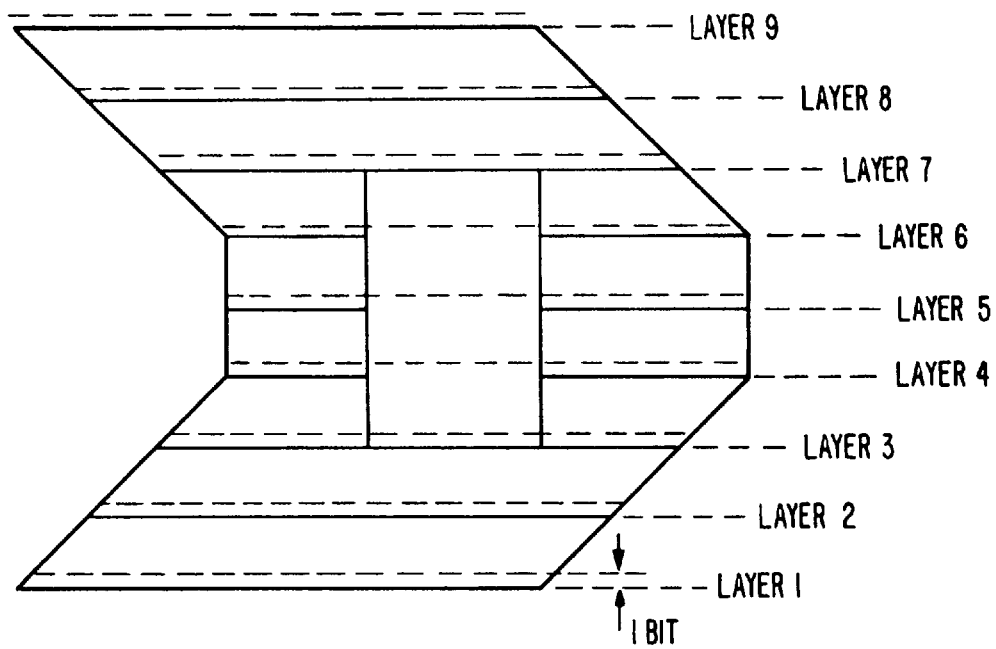
FIG. 29a is a side view of a CAD designed object showing slice layers and planes one bit above the layers where boundary vectors will be obtained.
Figure 29B:
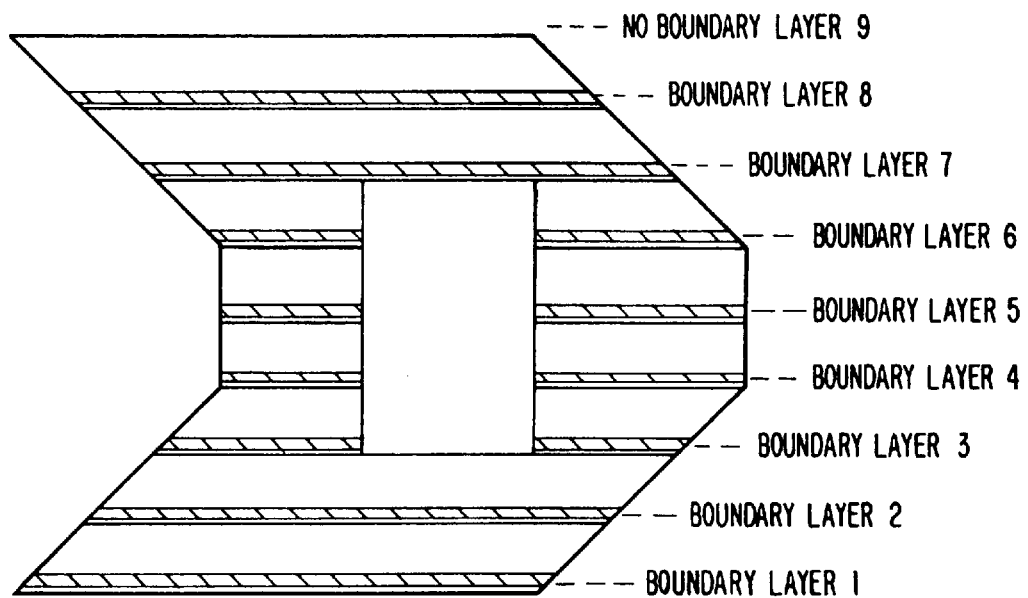
FIG. 29b is a side view of a CAD designed object showing boundary vectors.
Figure 29C:
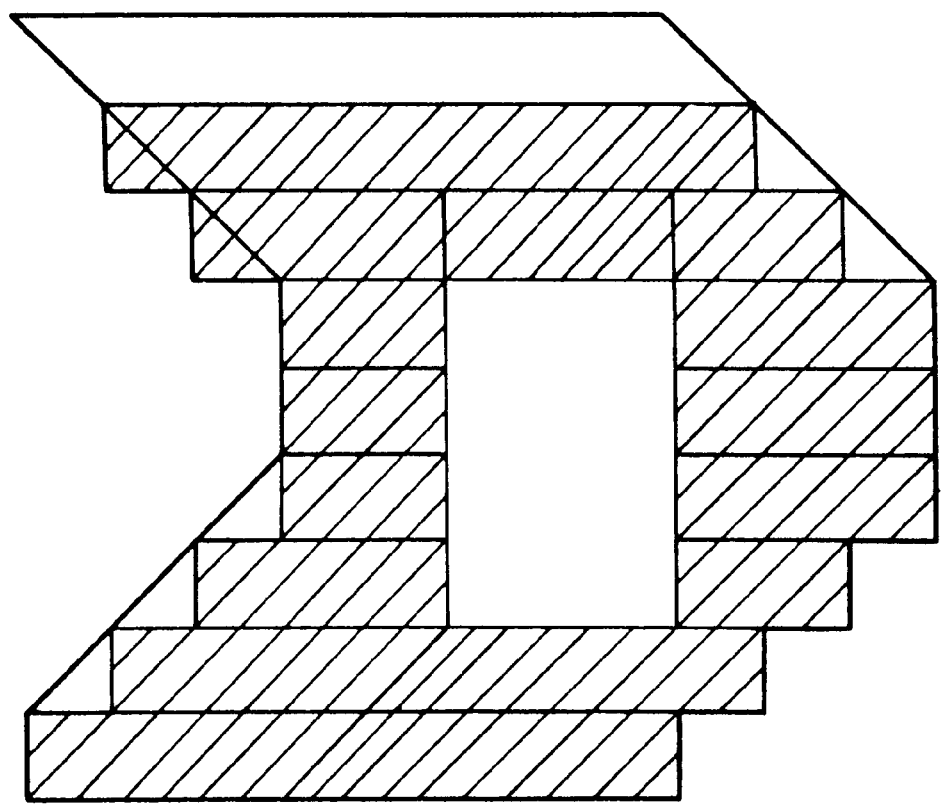
FIG. 29c is a side view of a CAD designed object showing boundary vectors after they have been given a full cure.

FIG. 29a is a side view of a CAD designed object showing slice layers and planes one bit above the layers where boundary vectors will be obtained. FIG. 29b is a side view of a CAD designed object showing boundary vectors. FIG. 29c is a side view of a CAD designed object showing boundary vectors after they have been given a full cure.

Layer hatch vectors are obtained from hatch lines intersecting layer boundaries.

Flat skin boundary vectors are separated into two categories: 1) up-facing, and 2) down-facing. Flat skin boundaries are obtained from the edges of horizontal triangles. Normal vectors to these boundary vectors are obtained by considering inside and outside areas of the triangles if appropriate for later filling or hatching. Duplicate boundary vectors are removed; therefore, boundaries are converted from triangle boundaries to boundaries enclosing skin fill areas.

Flat skin hatch vectors are obtained from hatch lines intersecting flat skin boundaries. Flat skin hatch is not currently being used because we find it basically redundant to layer hatch, after skins are put on the right layer, but it is available if we need it.

Flat skin fill vectors are obtained from fill lines intersecting flat skin boundaries.

Vectors associated with flat up-facing skin are moved down 1 layer from the layer on which they were derived. This is due to the layer boundary and hatch being obtained from one bit above the slicing layer causing there to be no layer boundary or hatch under these skins. Actually, this movement of skin is not due to the location of boundaries, but this movement of the skin is required for building parts with the right vertical dimensions, so we have picked the location at which to derive layer boundaries that would allow us to make this movement of skin in a consistent manner.

Figure 29D:
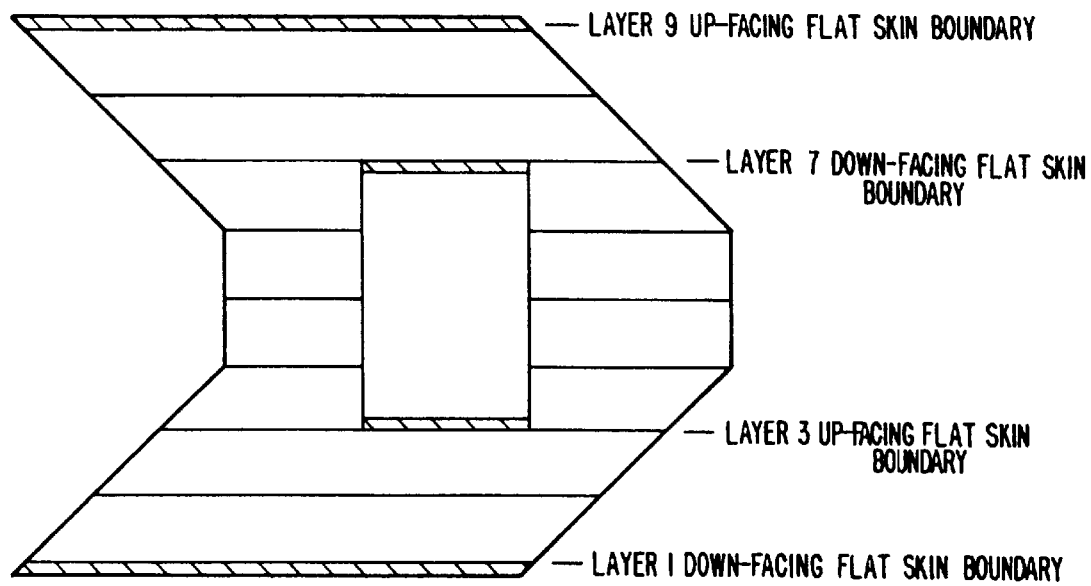
FIG. 29d is a side view of a CAD designed object depicting flat skin boundaries after they have been moved to the layers on which they will be built.

FIG. 29d is a side view of a CAD designed object depicting flat skin boundaries at the locations where they were created.

Figure 29E:
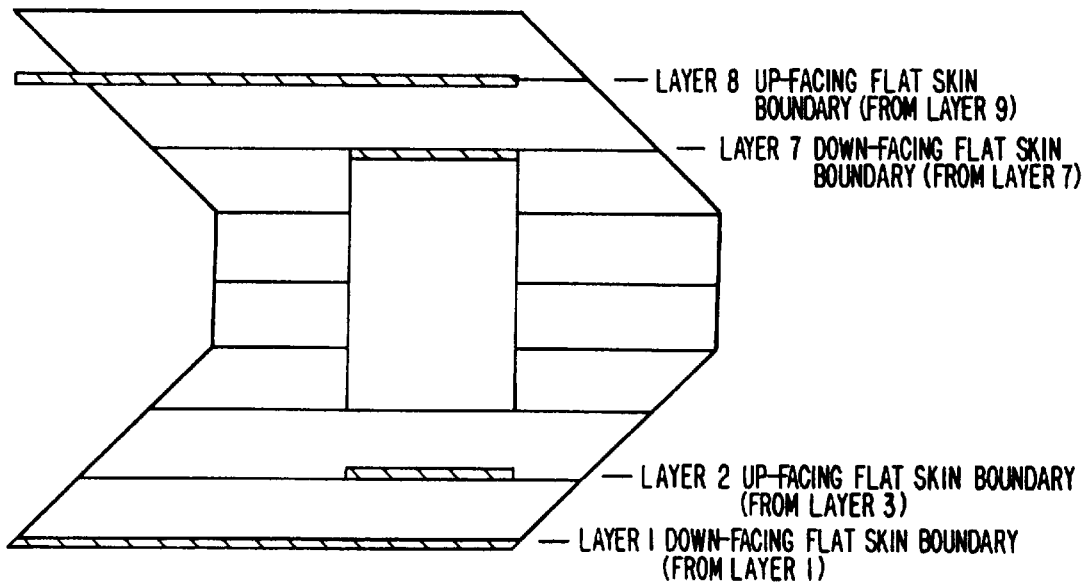
FIG. 29e is a side view of a CAD designed object showing near flat skin frames at the locations where they were created.

FIG. 29e is a side view of a CAD designed object depicting flat skin boundaries after they have been moved to the layers on which they will be built.

Near-flat skin boundaries are created from the intersection of near-flat triangles with horizontal planes at the slice layers. Near-flat triangles are those defined by their normals being at smaller angles to the vertical than some specified angle. This angle is based on the point at which boundaries generated from this triangle on consecutive layers would no longer overlap given a particular cure width of the boundary and a particular thickness between the layers. Because triangle vertices are rounded we are assured that if there is a requirement for near-flat skin between two layers that each triangle surfacing the object in that region will intersect a horizontal plane at each layer. These intersections are used to create boundary vector segments for near-flat skins. The additional two segments required are obtained by connecting the ends of these first two. Normals to each segment are generated if appropriate for later filling or hatching. These boundaries are divided into two types: 1) up facing, and 2) down facing. Duplicate near-flat boundary vectors are then removed along with point vectors.

Near-flat skin hatch vectors are obtained from hatch lines intersecting near-flat skin boundaries. Near-flat skin hatch is currently being used for down facing skin but not for up facing skin. We find up facing skin hatch basically redundant to layer hatch, while down facing skin hatch isn't redundant because it is used to create full layer thickness sections of an object.

Figure 29F:
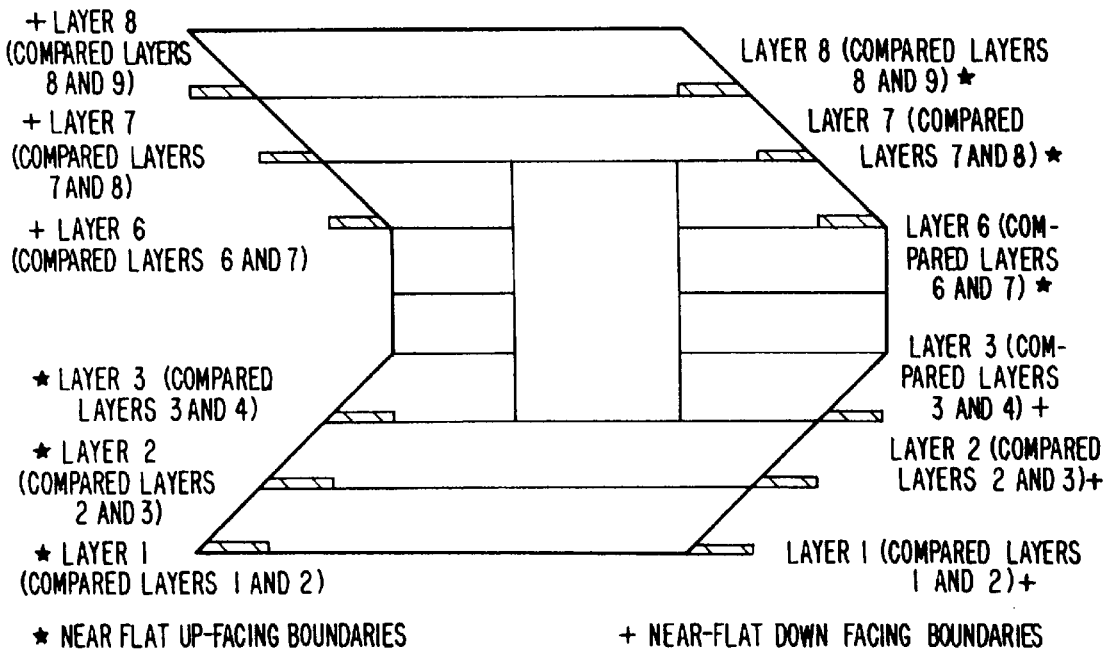
FIG. 29f is a side view of a CAD designed object showing near flat skin boundaries after they have been given full cure.

FIG. 29f is a side view of a CAD designed object showing near flat skin frames at the locations where they were created.

Near-flat skin fill vectors are obtained from fill paths intersecting near-flat skin boundaries.

When creating near-flat skin for a layer whether it be up-facing or down-facing we compare the current layer to the layer above. This means that near-flat, up-facing skin will always have hatch vectors and partial boundary vectors on which to be built, from layer boundary and hatch. But down-facing, near-flat skin will having nothing to build on so full down-facing, near-flat boundaries and hatch will be required to support the skin. Also more important, giving near-flat, down-facing skin boundaries and hatch a full layer cure will give the part a consistent, slightly oversize X and Y dimension (perfect for smoothing by sanding to yield the right sized part).

Figure 29G:
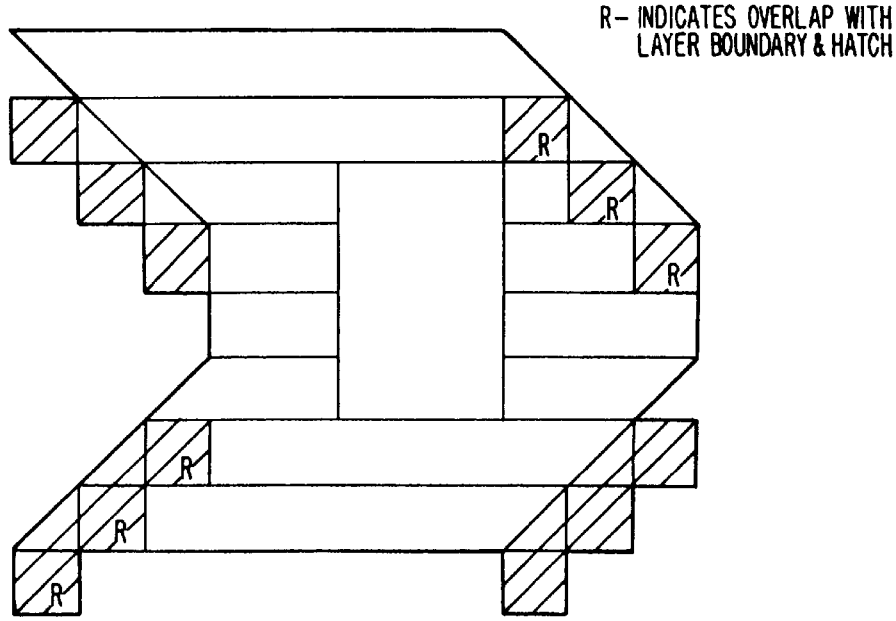
FIG. 29g is a side view of a CAD designed object showing superposition of layer boundaries and near-flat boundaries after being cured.
Figure 29H:
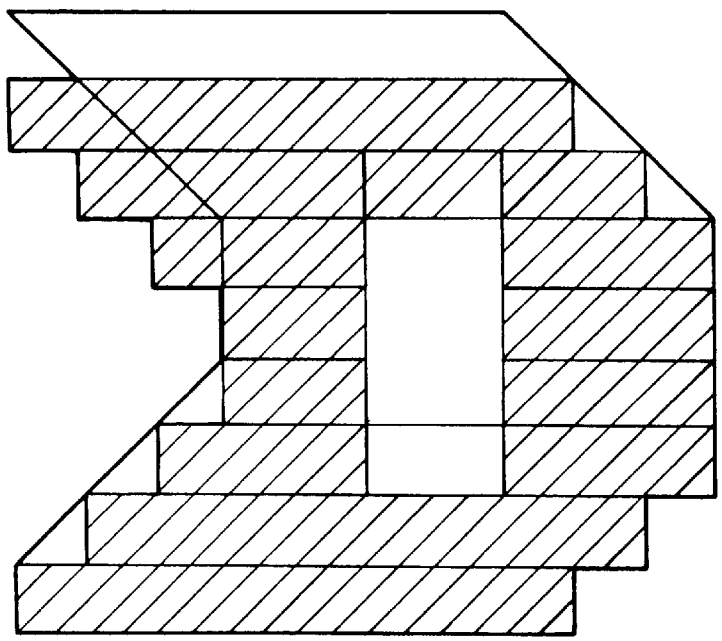
FIGS. 29h and 29i are side views of a CAD designed object along with superposition of all vectors.

FIG. 29g is a side view of a CAD designed object showing near flat skin boundaries after they have been given full cure. FIG. 29h is a side view of a CAD designed object showing superposition of layer boundaries and near-flat boundaries after being cured.

The technique we are using for generation and placement of near-flat skins gives us a means of making a gradual transition from vertical to horizontal structures while always insuring that we will have solid material on a previous layer to attach our current layer to.

Both down-facing flat and near-flat skin fill are to be drawn as relatively thin films at the top of their layers but eventually before drawing of down-facing skin fills there will probably be an up dip of the part in the liquid to allow the drawing of the fill to be at the bottom of the layer, instead of the top, thereby minimizing ripple between fill and hatch on down-facing features.

FIG. 29l is a side view of a CAD designed object along with superposition of all vectors.

STYLE 2 achieves the same end result as STYLE 1. The part is slightly oversized on its X and y dimensions, while maintaining a placement of vertical features (Z dimension) which yields the best duplication of the CAD designed object possible, while building-it with finite layer thickness. The approach of STYLE 2 starts opposite to that of STYLE 1. This causes differences in how vectors are being obtained and implemented to build the correct sized part.

Layer boundary vectors are obtained from the intersection of scan and near-flat triangles with a horizontal plane 1 scale bit below the slice layer. This implies that down-facing features (skin) will have no layer boundary or layer hatch to land on, while up-facing features (skin) will have both layer hatch and boundaries available to build upon. Normals for these boundary vectors are obtained from the triangles that give rise to the vectors, if appropriate for later hatching between the boundaries. Obtainment of boundaries 1 bit below the slice layers allows the correct vertical displacement between down-facing and up-facing features. It also permits us to deal with all 4 skin types in a consistent manner, based solely on type of skin and not on geometrical relations of features.

Layer hatch vectors are obtained from hatch lines intersecting layer boundaries.

Flat skin boundary vectors are separated into two categories: 1) up-facing, and 2) down-facing. Flat-skin boundaries are obtained from the edges of horizontal triangles. Normal vectors to the created boundary vectors are obtained by considering inside and outside areas of the triangles, if appropriate to later filling or hatching. Duplicate pairs of boundary vectors are removed, therefore converting from triangle boundaries to boundaries enclosing skin fill areas.

Flat skin hatch vectors are obtained from hatch lines intersecting flat skin boundaries. Flat skin hatch is currently considered unnecessary because it duplicates layer hatch which is available once skins are moved to the layers on which we want to build them, but it is available if needed.

Flat skin fill vectors are obtained from fill paths intersecting flat skin boundaries.

Vectors associated with flat, down-facing skin are moved up from the layer on which they were derived. This movement is due to the requirement of maintaining the best vertical duplication of the CAD designed object. Associated with this movement was the reason for obtaining layer boundaries 1 bit below the slice layer. In other words, by obtaining layer boundaries one bit below the slice layer we are insured that flat down-facing skins won't have any hatch under them, and therefore they could be moved up. This also insured us that up-facing, flat skins would always have hatch available to build on.

Near-flat skin boundaries are created in exactly the same way they are created for STYLE 1.

Near-flat skin hatch vectors are obtained from hatch lines intersecting near-flat skin boundaries. Near-flat skin hatch is required for up-facing skin, but not for down-facing skin. Down-facing hatch appears to duplicate layer hatch whereas up-facing hatch doesn't because it is used to create a full layer thickness of solid in a new area.

Figure 30A:
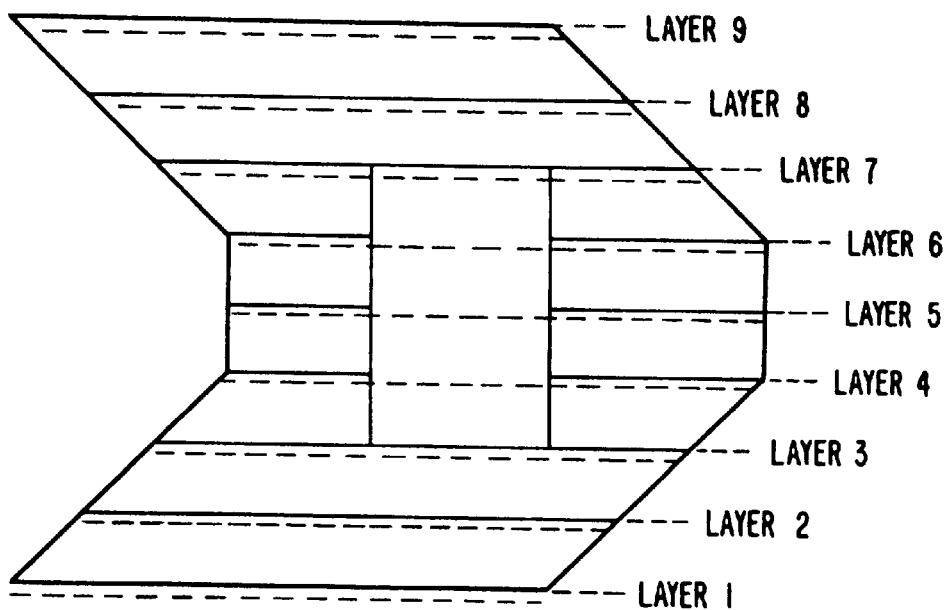
FIG. 30a is a side view of a CAD designed object showing positions of slice layers and planes one bit down for creation of layer boundary vectors.
Figure 30B:
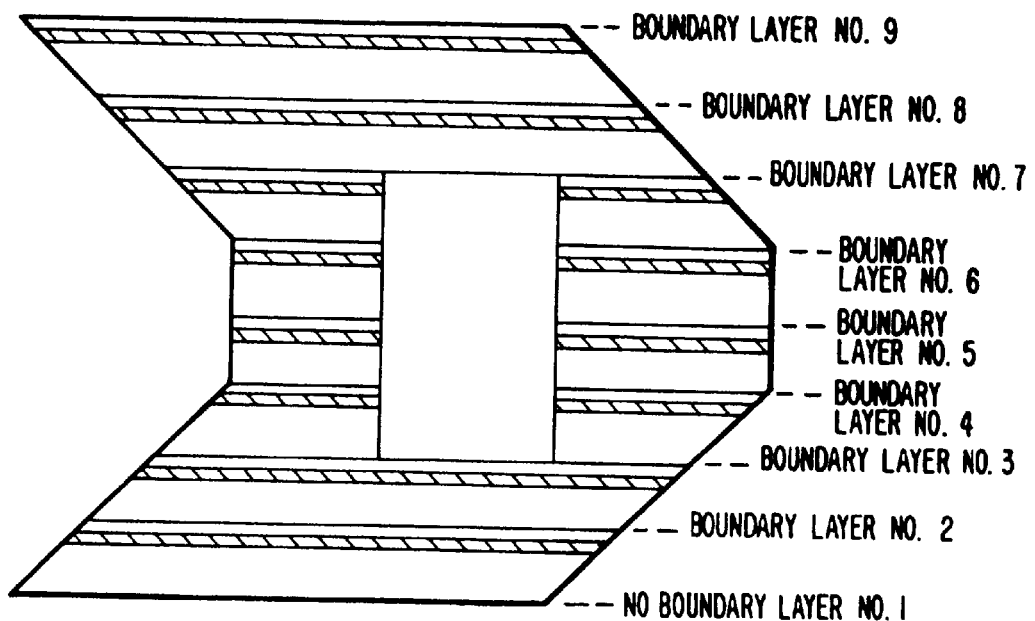
FIG. 30b is a side view of a CAD designed object showing the layer boundary vectors at the positions where they were created.
Figure 30C:
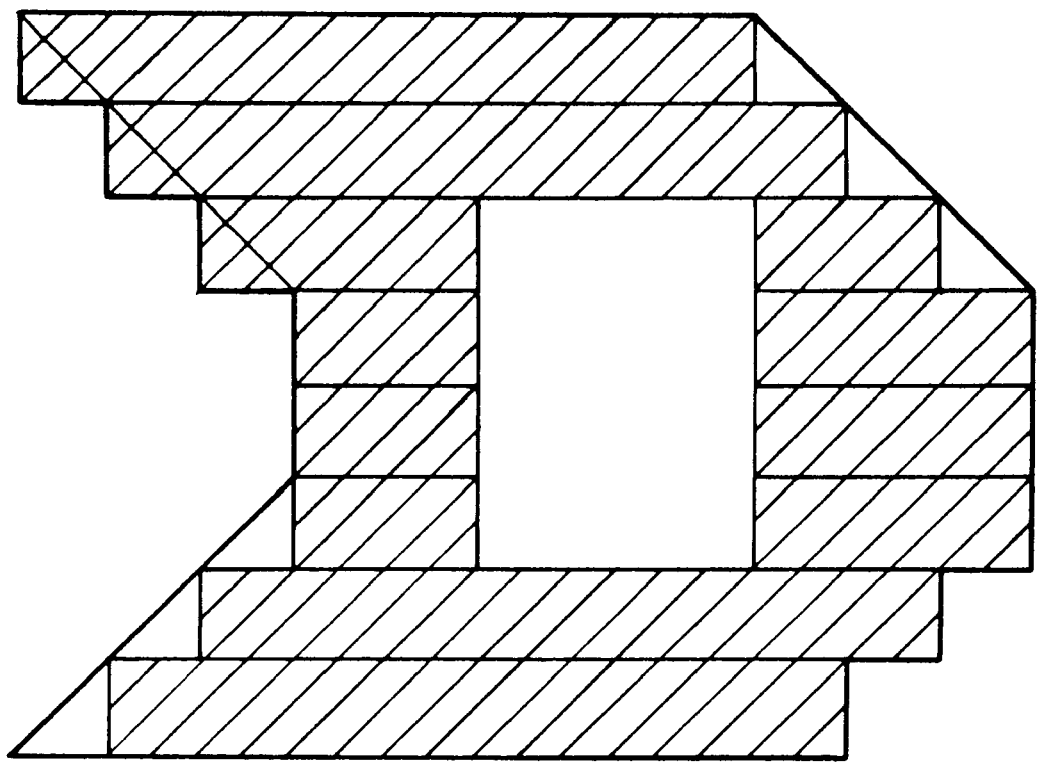
FIG. 30c is a side view of a CAD designed object along with fully cured layer boundaries.

FIG. 30a is a side view of a CAD designed object showing positions of slice layers and planes one bit down for creation of layer boundary vectors. FIG. 30b is a side view of a CAD designed object showing the layer boundary vectors at the positions where they were created. FIG. 30c is a side view of a CAD designed object along with fully cured layer boundaries.

Near-flat skin fill vectors are obtained from fill lines intersecting near-flat skin boundaries.

When creating near-flat skin for a layer whether it be up-facing or down-facing we compare the current layer to the layer above (as stated earlier this comparison is made exactly on the slice layers and not above or below). This means that near-flat, up-facing and near-flat, down-facing skin vectors have nothing to build on so they can be moved up or down to find, support, or they can be moved to or stay on layers that don't already contain support if we use near-flat boundaries and hatch to build full layer thickness of material (for support). The requirement of maintaining an object of consistent size and shape relative to the CAD design demands that near-flat up-facing skin vectors be moved up one layer and that the associated boundaries and hatch be given a full layer cure. Additionally, near-flat, down-facing vectors must be moved up a layer, therefore, making hatch unnecessary, because of the presence of layer hatch.

Figure 30D:
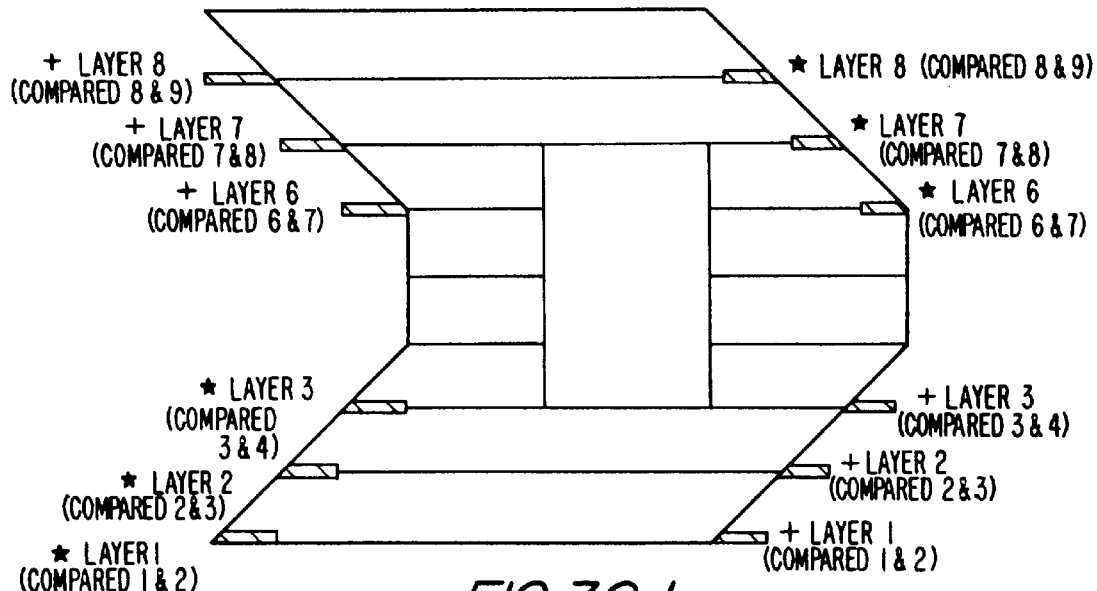
FIG. 30d is a side view of a CAD designed object along with near-flat skin boundaries.
Figure 30E:
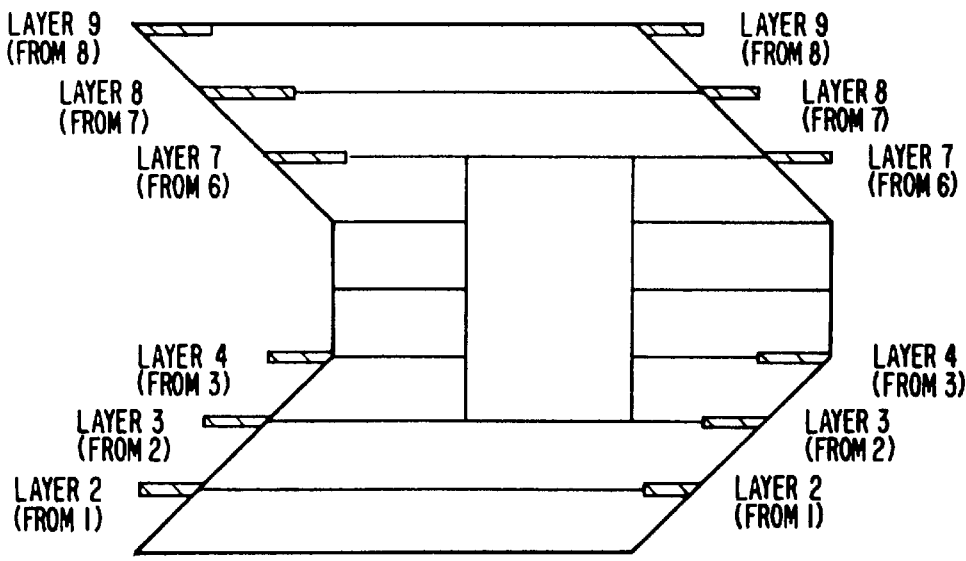
FIG. 30e is a side view of a CAD designed object along with near-flat skin boundaries after being moved to the layers on which they will be built.
Figure 30F:
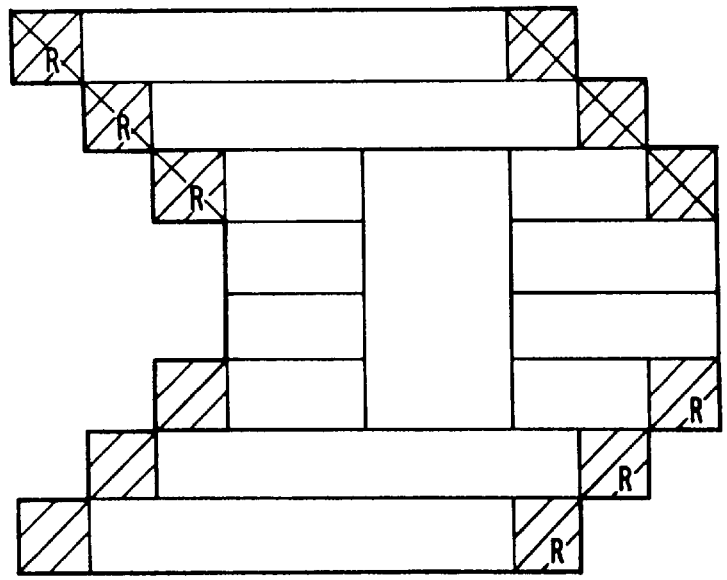
FIG. 30f is a side view of a CAD designed object along with near-flat skin boundaries being given a full cure and indicates where these boundaries overlap already cured layer boundaries.
Figure 30G:
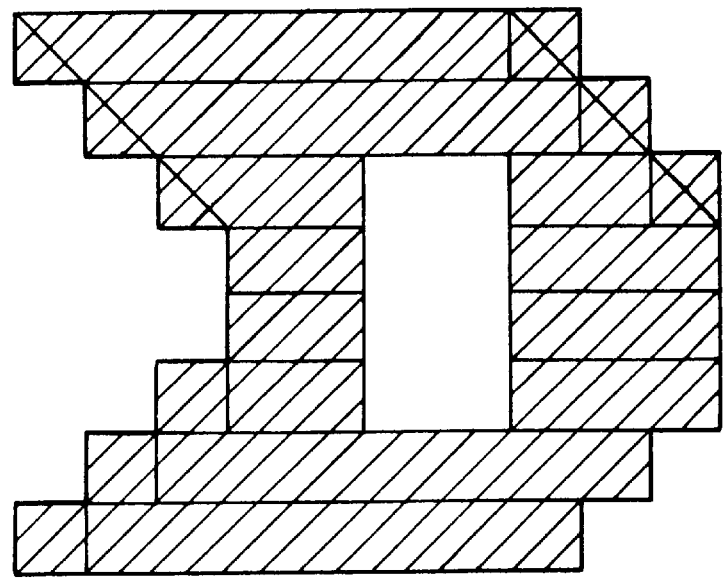
FIG. 30g is a side view of a CAD designed object showing superposition of layer boundaries and near-flat skin boundaries.

FIG. 30d is a side view of a CAD designed object along with near-flat skin boundaries. FIG. 30e is a side view of a CAD designed object along with near-flat skin boundaries after being moved to the layers that they will be built on. FIG. 30f is a side view of a CAD designed object along with near-flat skin boundaries being given a full cure. Also indications as to where these boundaries overlap already cured layer boundaries. FIG. 30g is a side view of a CAD designed object showing superposition of layer boundaries and near-flat skin boundaries.

The style 2 method of deriving vectors and their associated placement gives us the same important result that STYLE 1 did: We can make a gradual transition from vertical to horizontal structures while always insuring that we will have solid material below on previous layers to attach our current layer to.

All four types of skin fill are to be drawn as relatively thin films (i.e. shallow) at the top of the layers they are placed on but eventually before drawing down-facing skins we will probably lift the part out of the liquid slightly (less than 1 layer) thereby allowing the skin to fill the bottom of the layer to minimize ripple between fill and hatch.

Figure 30H:
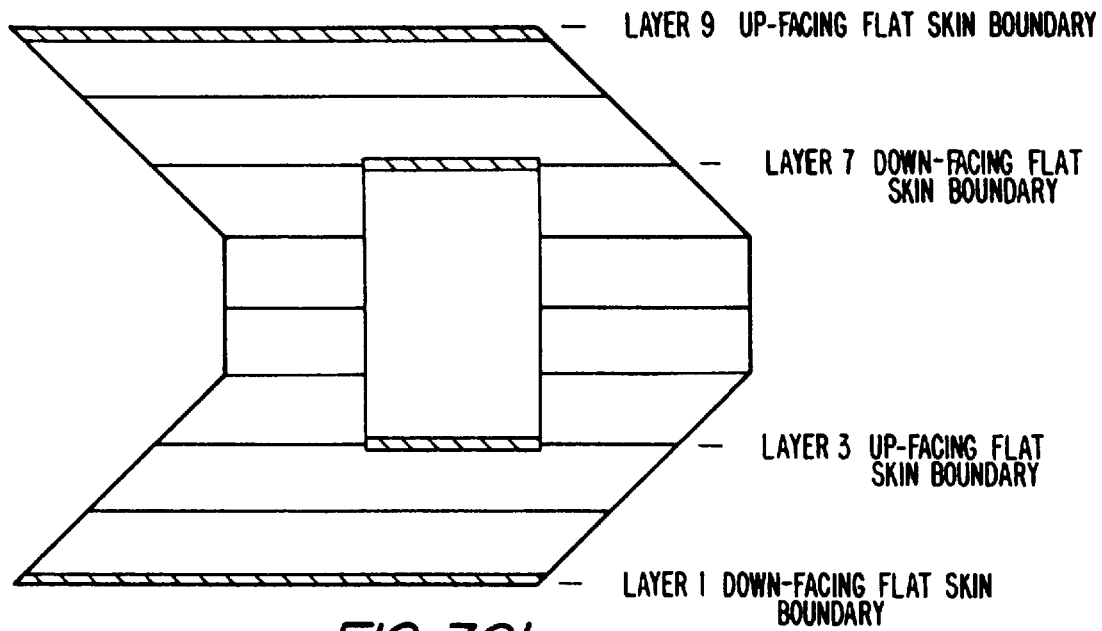
FIG. 30h is a side view of a CAD designed object along with flat skin boundaries.
Figure 30I:
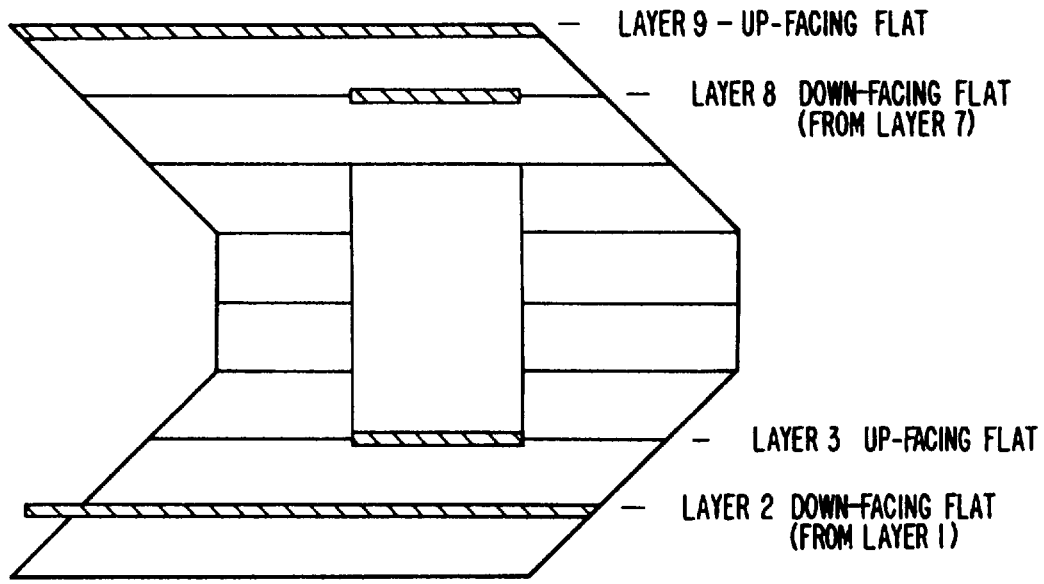
FIG. 30i is a side view of a CAD designed object along with flat skin boundaries being moved to the layers on which they will be built.
Figure 30J:
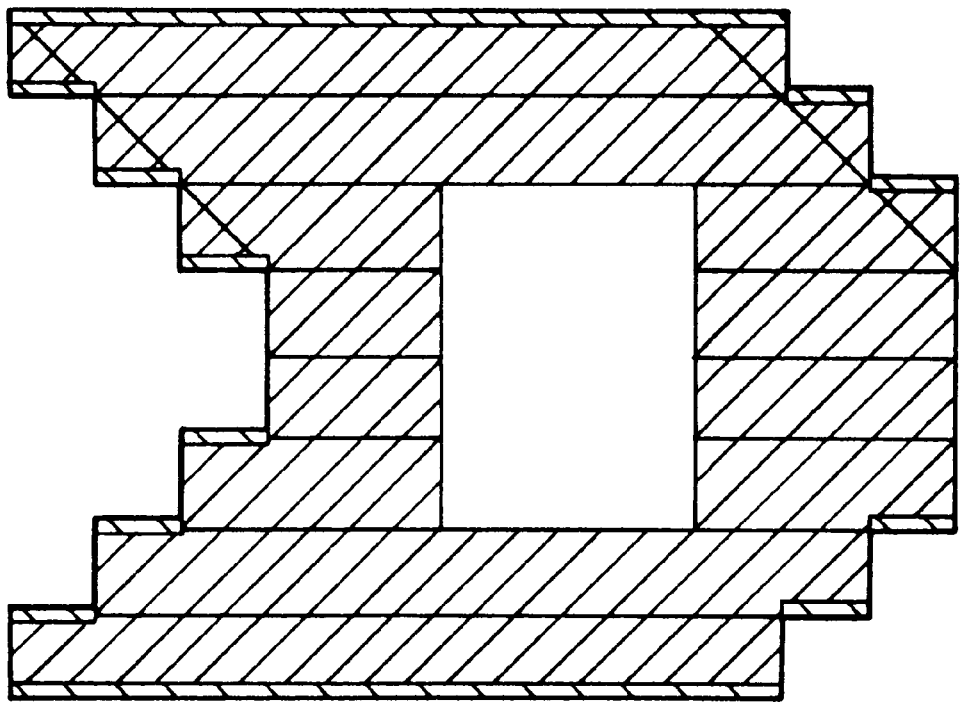
FIG. 30j is a side view of a CAD designed object showing superposition of all vectors, with down facing skins being drawn at the bottom of their layers.

FIG. 30h is a side view of a CAD designed object along with flat skin boundaries. FIG. 30i is a side view of a CAD designed object along with flat skin boundaries being moved to the layers they will be built on. FIG. 30J is a side view of a CAD designed object showing superposition of all vectors (with down facing skins being drawn at the bottom of their layers.

STYLE 3 and STYLE 4

STYLES 3 and 4 are very different from STYLES 1 and 2; STYLE 1 and 2 are used to build objects that are slightly oversized in the X and Y dimensions, whereas STYLES 3 and 4 are used to build objects that are slightly undersized in the X and Y dimensions. STYLES 1 and 2 can build any general object; whereas STYLES 3 and 4 can have problems when attempting to build parts that include thin walled sections at small angles to the horizontal. The circumstances under which problems can occur are based on relationships between layer thickness, layer levels, and geometric relationships between features. The conditions under which STYLES 3 and 4 can be used to successfully build objects will be discussed in more detail after discussing the methods of generating vectors. STYLES 3 and 4 derive their vectors from a combination of vector types used on STYLES 1 and 2, respectively. Note: The statements below that reference vector types from STYLES 1 and 2 refer to the layers from which those vector types were derived (they are not indicating the layer on which the vectors are moved to before they are drawn).

Layer boundaries for STYLE 3 (layer n) surround the areas enclosed by the layer boundaries of STYLE 1 (layer n) minus the intersection of areas enclosed by the layer boundaries from STYLE 1 (layer n) with the areas enclosed by up-facing, near-flat boundaries from STYLE 1 (layer n).

Figure 31A:
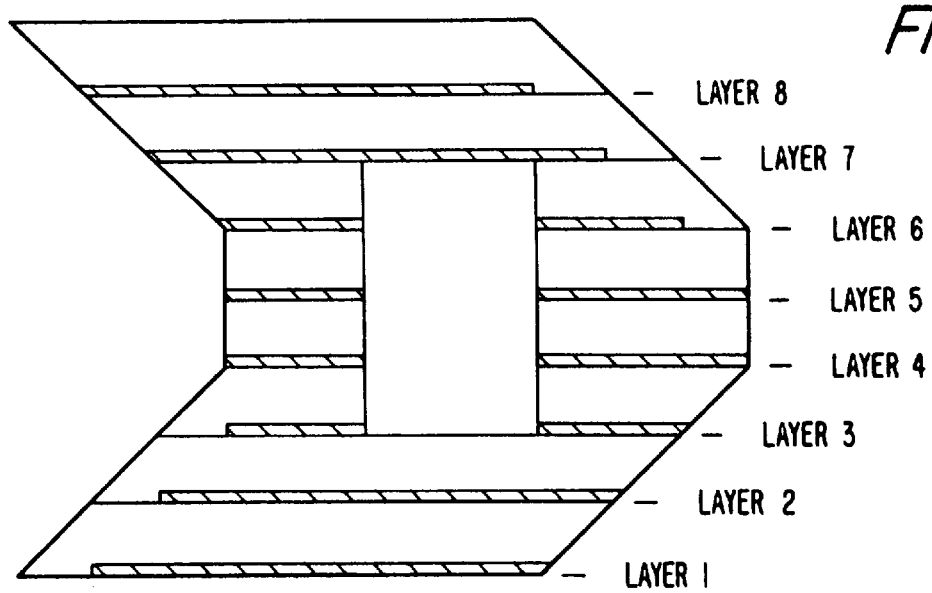
FIG. 31a is a side view of a CAD designed object showing positions of slice layers and location of layer boundaries.
Figure 31B:
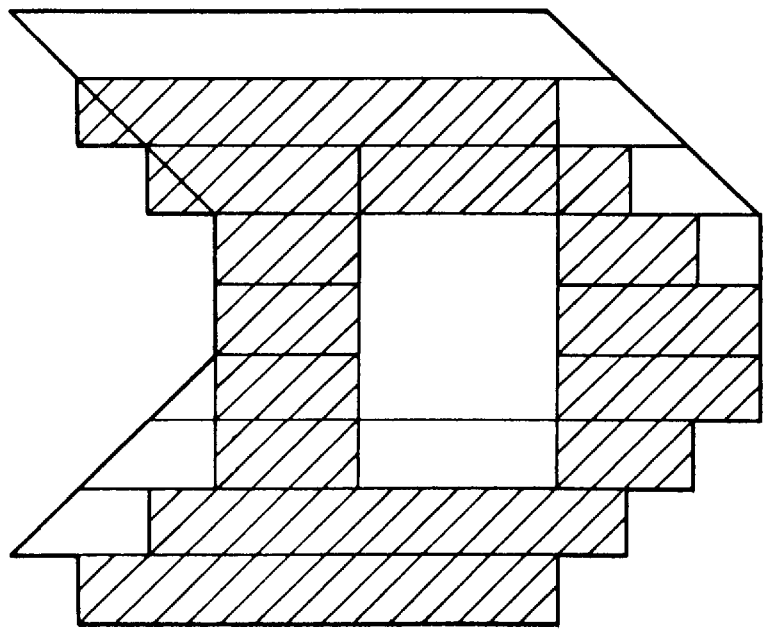
FIG. 31b is a side view of a CAD designed object with layer boundaries being given a full layer cure depth.

FIG. 31a is a side view of a CAD designed object showing positions of slice layers and obtainment of layer boundaries. FIG. 31b is a side view of a Cad designed object with layer boundaries being given a full layer cure depth.

Layer hatch vectors are obtained from hatch paths intersecting layer boundaries.

Near-flat, down-facing boundaries for STYLE 3 (layer n) surround areas enclosed by the intersection of areas enclosed by down-facing near-flat boundaries from STYLE 1 (layer n) with areas enclosed by the layer boundaries of STYLE 1 from (layer n+1).

Figure 31C:
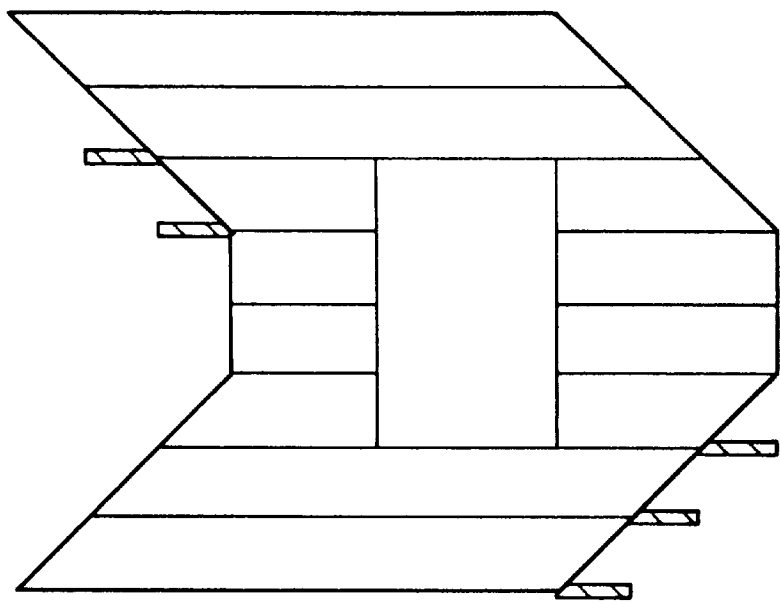
FIG. 31c is a side view of a CAD designed object showing positions where down-facing, near-flat boundaries are obtained.
Figure 31D:
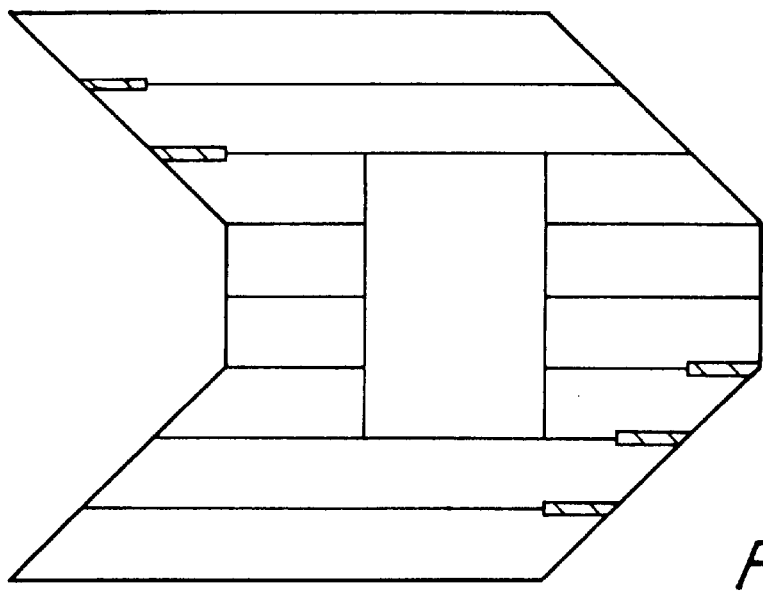
FIG. 31d is a side view of a CAD designed object showing down-facing near-flat boundaries on which they will be built (up on layer)

FIG. 31c is a side view of a CAD designed object showing positions where down-facing near-flat boundaries are obtained. FIG. 31d is a side view of a CAD designed object showing down-facing near-flat boundaries on which they will be built (up one layer).

Near-flat, down-facing hatch and fill are obtained from hatch and fill paths intersecting near-flat, down-facing boundaries. Near-flat, down-facing hatch duplicates layer hatch and is therefore not generally needed. Near-flat, down-facing vectors are moved up one layer to be built (layer n+1).

Up-facing, near-flat boundaries for STYLE 3 surround the areas enclosed by the intersection of areas enclosed by up-facing, near-flat boundaries from STYLE 1 (layer n) with the areas enclosed by layer boundaries of STYLE 1 (layer n−1).

Figure 31E:
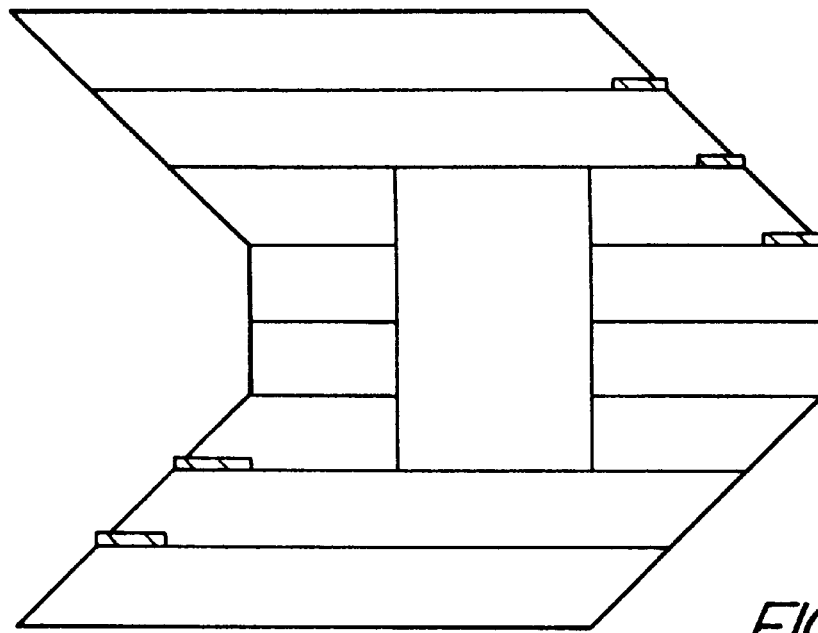
FIG. 31e is a side view of a CAD designed object showing positions where up-facing, near-flat boundaries are obtained.
Figure 31F:
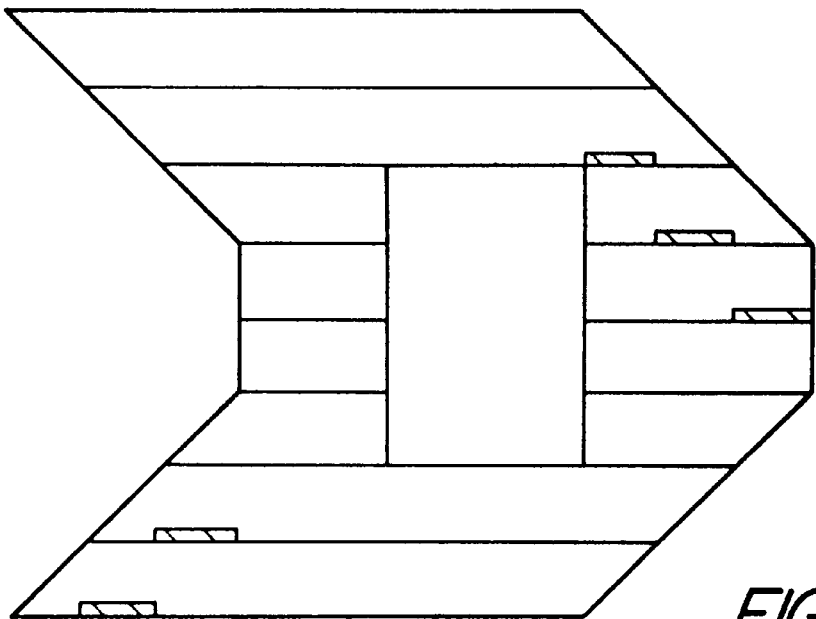
FIG. 31f is a side view of a CAD designed object showing up-facing near-flat boundaries after they are moved to the layers on which they will be built (down one layer)

FIG. 31e is a side view of a CAD designed object showing positions where up-facing near-flat boundaries are obtained. FIG. 31f is a side view of a CAD designed object showing up-facing near-flat boundaries after they are moved to the layers on which they will be built (down one layer).

Near-flat, up-facing hatch and fill are obtained from hatch and fill paths intersecting near-flat up-facing boundaries. Near-flat, up-facing hatch duplicates layer hatch and is therefore not generally needed. Near-flat, up-facing vectors are moved down to the previous layer (layer n−1).

Flat, up-facing skin boundaries for STYLE 3 surround the areas enclosed by flat-up facing skin boundaries from STYLE 1 (layer n) minus the intersection of areas enclosed by flat up-facing boundaries from STYLE 1 (layer n) with the areas enclosed by near-flat, down-facing boundaries from STYLE 1 (layer n−1).

Figure 31G:
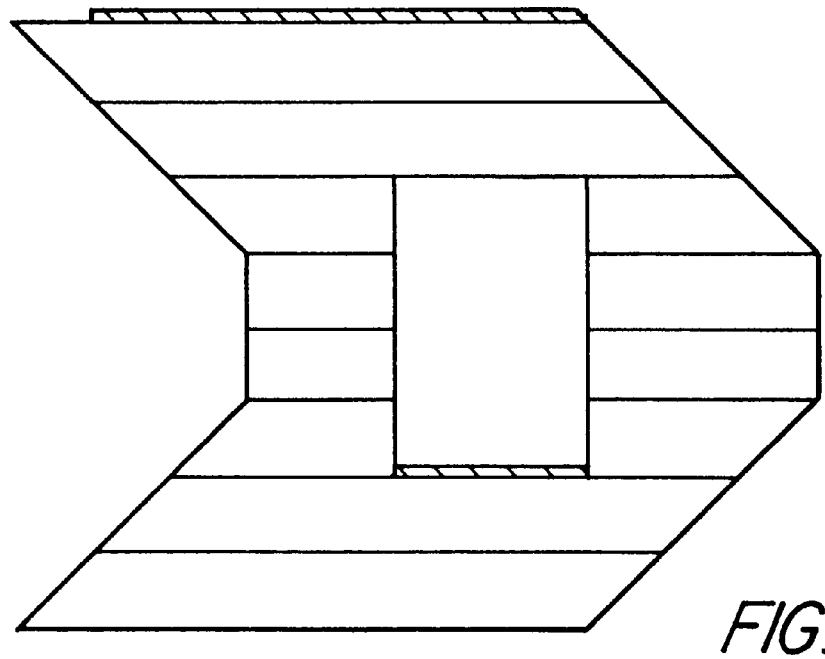
FIG. 31g is a side view of a CAD designed object showing the positions where up-facing flat skin boundaries are obtained.
Figure 31H:
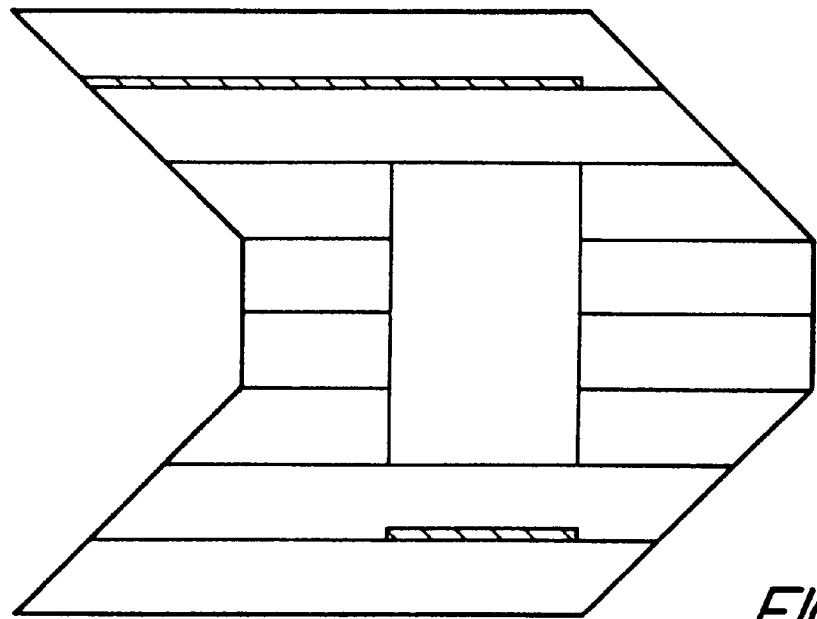
FIG. 31h is a side view of a CAD designed object showing up-facing flat boundaries after they are moved to the layers on which they will be built (down one layer)

FIG. 31g is a side view of a CAD designed object showing the positions where up-facing flat skin boundaries are obtained. FIG. 31h is a side view of a CAD designed object showing up-facing flat boundaries after they are moved to the layers on which they will be built (down one layer).

Flat, up-facing hatch and fill are generated from hatch and fill paths intersecting flat up-facing boundaries. Flat, up-facing hatch duplicates layer hatch and is, therefore, not generally needed. Vectors associated with flat, up-facing skin (layer n) are moved down to the previous layer to be built (layer n−1).

Flat, down-facing boundaries for STYLE 3 (layer n) surround the areas enclosed by flat down-facing boundaries from STYLE 1 (layer n) minus the intersection of areas enclosed by flat, down-facing boundaries from STYLE 1 (layer n) with the areas enclosed by near-flat, up-facing boundaries from STYLE 1 (layer n).

Figure 31I:
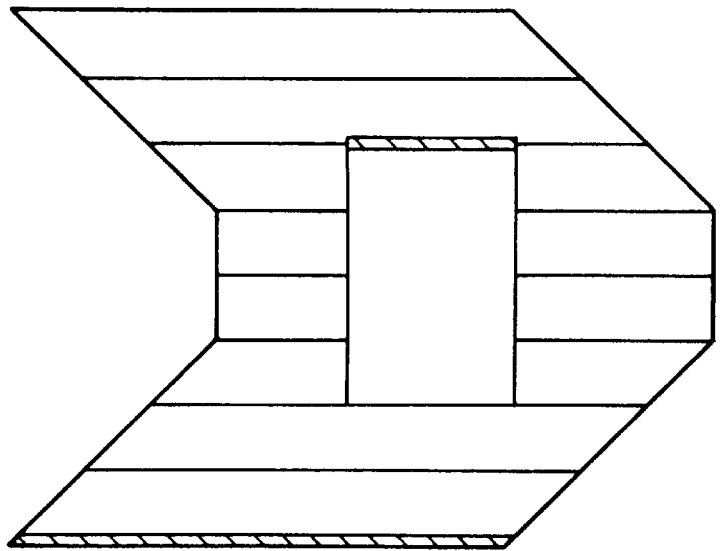
FIG. 31i is a side view a of a CAD designed object showing the positions where down-facing flat skin boundaries are obtained (built on same layer as obtained)

FIG. 31i is a side view of a CAD designed object showing the positions where down-facing flat skin boundaries are obtained (built on same layer as obtained).

Flat, down-facing hatch and fill are obtained from hatch and fill paths intersecting flat down-facing boundaries. Flat, down-facing hatch duplicates layer hatch and is therefore not generally needed. Flat, down-facing skin vectors stay on the same layer on which they were found (layer n).

Figure 31J:
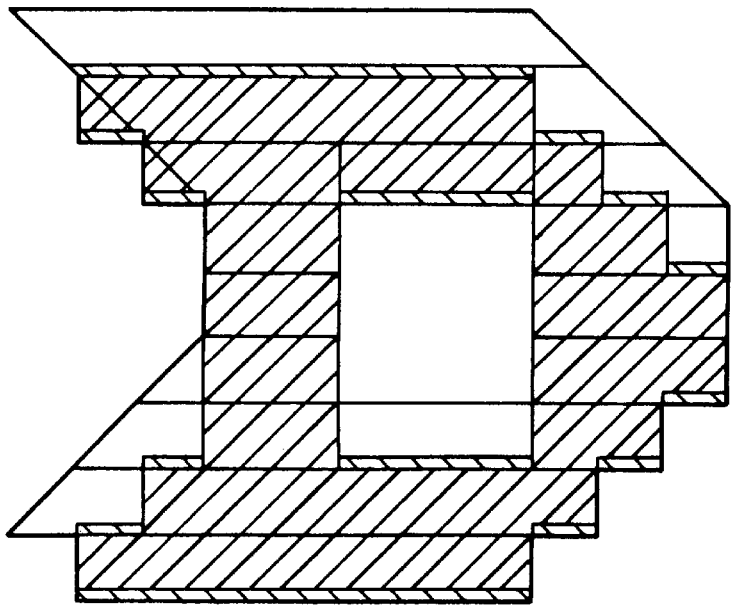
FIG. 31j is a side view of CAD designed object with all vectors superimposed and drawn to the proper cure depth.

FIG. 31j is a side view of CAD designed object with all vectors superimposed and drawn to the proper cure depth (remembering that hatch and fill always are created from boundaries).

STYLE 4

Layer boundaries for STYLE 4 (layer n) surround the areas enclosed by the layer boundaries of STYLE 2 (layer n) minus the intersection of the areas enclosed by layer boundaries from STYLE 2 (layer n) with the areas enclosed by down-facing, near-flat boundaries from STYLE 2 (layer n−1).

Figure 31K:
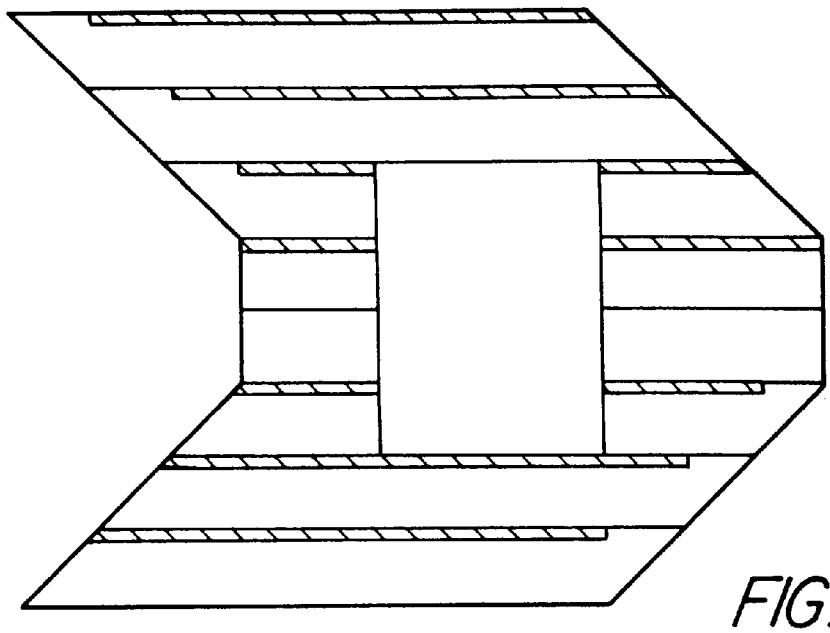
FIG. 31k is a side view of a CAD designed object showing positions of slice layers and location of layer boundaries.
Figure 31L:
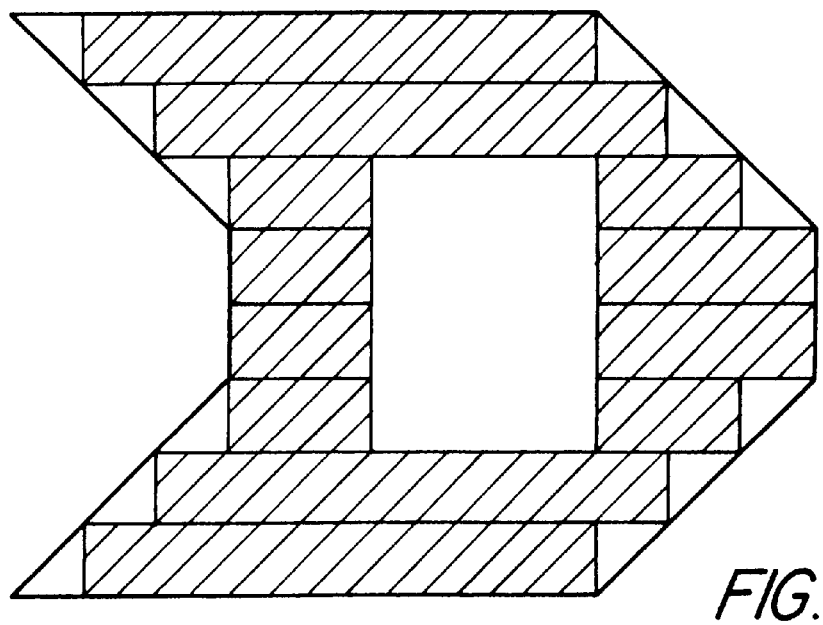
FIG. 31l is a side view of a CAD designed object with layer boundaries being given a full layer cure depth.

FIG. 31k is a side view of a CAD designed object showing positions of slice layers and obtainment of layer boundaries. FIG. 31l is a side view of a CAD designed object with layer boundaries being given a full layer cure depth.

Layer hatch vector are obtained from hatch paths intersecting layer boundaries.

Near-flat, down-facing boundaries for STYLE 4 surround areas enclosed by the intersection of the areas enclosed by down-facing near-flat boundaries from STYLE 2 (layer n) with the ares enclosed by layer boundaries from STYLE 2 (layer n+2).

Near-flat, down-facing hatch and fill are obtained from hatch and fill paths intersecting near-flat down-facing boundaries. Near-flat, down-facing hatch duplicates layer hatch and is therefore not generally needed. Near-flat, down-facing .vectors are moved up two layers to be built (layer n+2).

FIG. 31m is a side view of a CAD designed object showing positions where down-facing near-flat boundaries are obtained. FIG. 31n is a side view of a CAD designed object showing down-facing near-flat boundaries after they are moved to the layers on which they will be built (up two layers).

Near-flat, up-facing boundaries for STYLE 4 surround areas enclosed-by the intersection of the areas enclosed by near-flat, up-facing boundaries from STYLE 2 (layer n) with the areas surrounded by the layer boundaries from STYLE 2 (layer n).

Near-flat, up-facing hatch and fill are obtained from hatch and fill paths intersecting near-flat up-facing boundaries. Near-flat, up-facing hatch duplicates layer hatch and is, therefore, not generally needed. Near-flat, up-facing vectors are moved remain on the layer from which they were derived when they are built (layer n).

Flat, up-facing skin boundaries for STYLE 4 surround the areas enclosed by the flat, up-facing skin boundaries of STYLE 2 (layer n) minus the intersection of areas enclosed by flat, up-facing boundaries from STYLE 2 (layer n) with the areas enclosed by near-flat, down-facing boundaries from STYLE 2 (layer n−1).

Figure 31O:
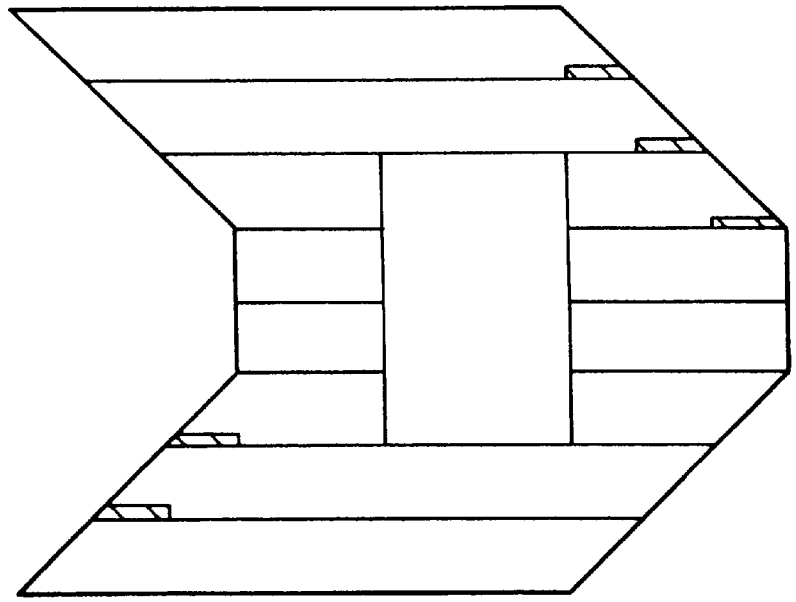
FIG. 31o is a side view of a CAD designed object showing positions where up-facing near-flat boundaries are obtained.
Figure 31P:
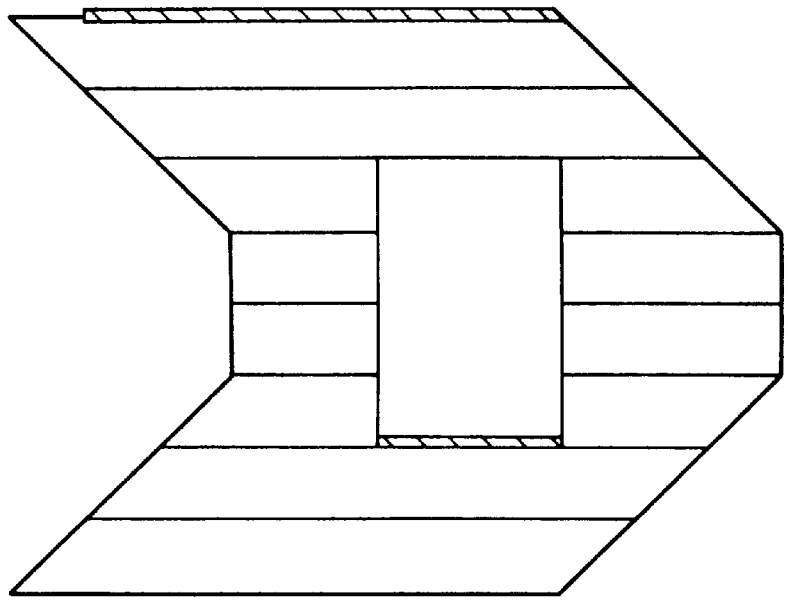
FIG. 31p is a side view of a CAD designed object showing the positions where up-facing flat skin boundaries are obtained (built on the same layer derived)

FIG. 31o is a side view of a CAD designed object showing positions where up-facing near-flat boundaries are obtained. FIG. 31p is a side view of a CAD designed object showing the positions where up-facing flat skin boundaries are obtained (built on the same layer derived).

Flat, up-facing hatch and fill are generated from hatch and fill paths intersecting flat, up-facing boundaries. Flat, up-facing hatch duplicates layer hatch and is, therefore, not generally needed. Vectors associated with flat, up-facing skin .(layer n) stay on the layer from which they were created when they are built.

Flat, down-facing boundaries for STYLE 4 (layer n) surround the areas enclosed by flat, down-facing boundaries from STYLE 2 (layer n) minus the intersection of areas enclosed by flat, down-facing boundaries from STYLE 2 (layer n) with areas enclosed by near-flat, up-facing boundaries from STYLE 2 (layer n).

Figure 31Q:
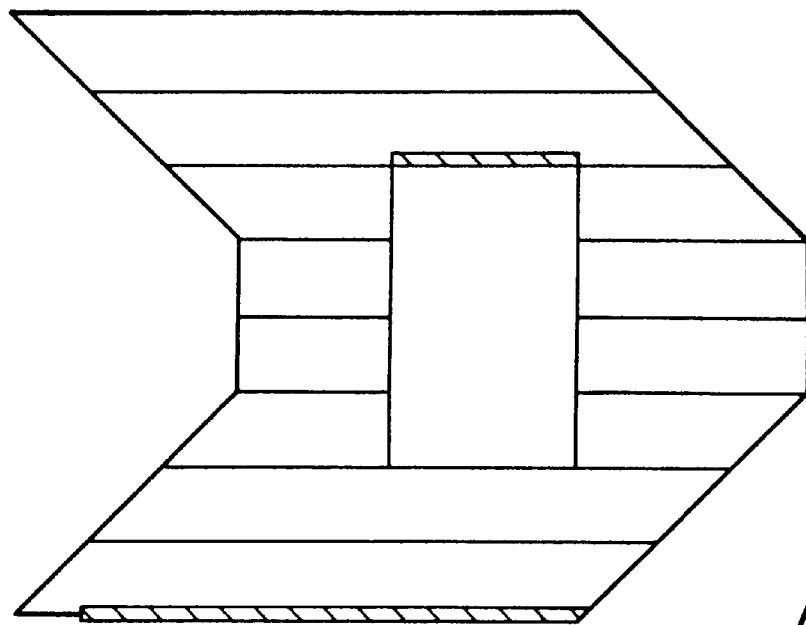
FIG. 31q is a side view of a CAD designed object showing the positions where down-facing, flat skin boundaries are obtained.
Figure 31R:
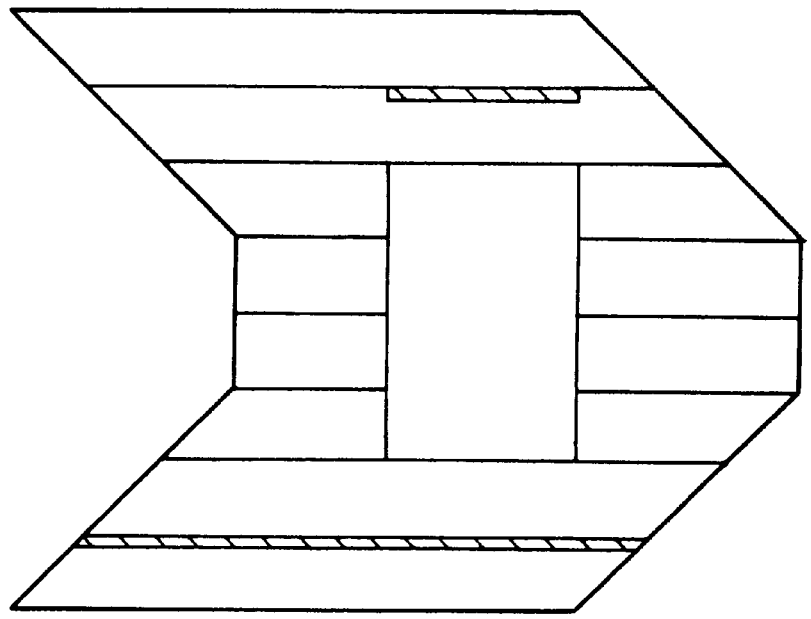
FIG. 31r is a side view of a CAD designed object showing down-facing, flat boundaries after they are moved to the layers on which they will be built (up one layer)

FIG. 31q is a side view of a CAD designed object showing the positions where down-facing flat skin boundaries are obtained. FIG. 31r is a side view of a CAD designed object showing down-facing flat boundaries after they are moved to the layers on which they will be built (up one layer).

Flat, down-facing hatch and fill are obtained from hatch and fill paths intersecting flat down-facing boundaries. Flat, down-facing hatch duplicates layer hatch and is, therefore, not generally needed. Flat, down-facing skin vectors move up one layer relative to where they were found (layer n+1).

Figure 31S:
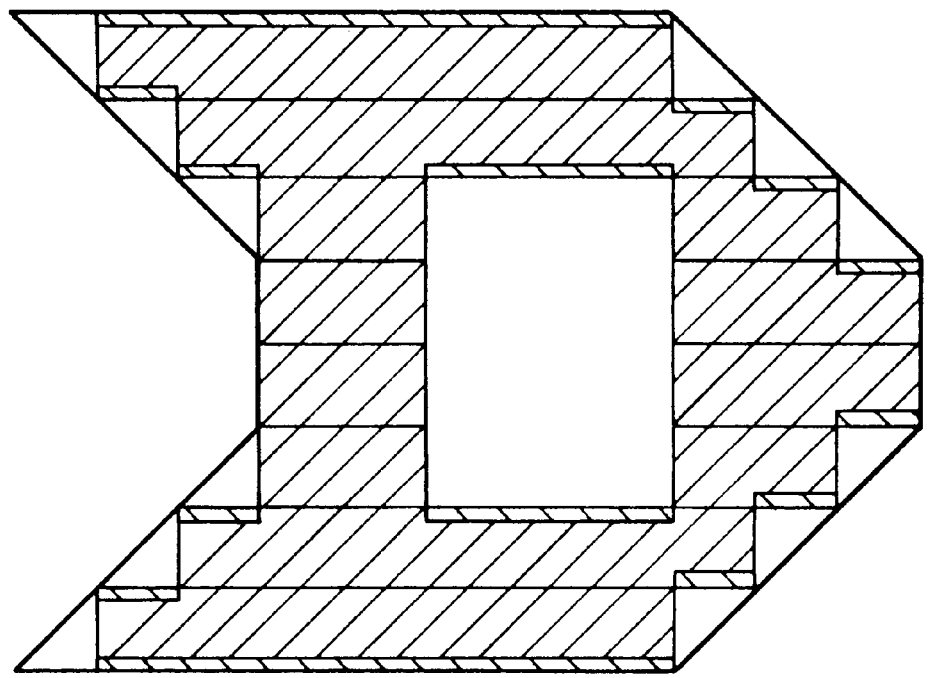
FIG. 31s is a side view of a CAD designed object with all vectors superimposed and drawn to the proper cure depth.

FIG. 31s is a side view of CAD designed object with all vectors superimposed and drawn to the proper cure depth (remembering that hatch and fill always are created from boundaries).

As stated earlier, STYLES 3 and 4 cannot be used to build general objects, but can be useful for building objects that meet particular requirements. To insure that STYLES 3 and 4 will build a particular object properly the object should be inspected using the following criteria: 1) using the appropriate layer thickness determine where each slice layer will be, 2) image the object being built completely within the envelope of its (rounded) CAD designed skin, 3) determine if there are any critical areas on each layer that will not adhere to the layer below, if such areas exist the object cannot be built using the chosen parameters (layer thickness and/or slice layer levels). If such areas do not exist the object can be built.

Figure 31T:
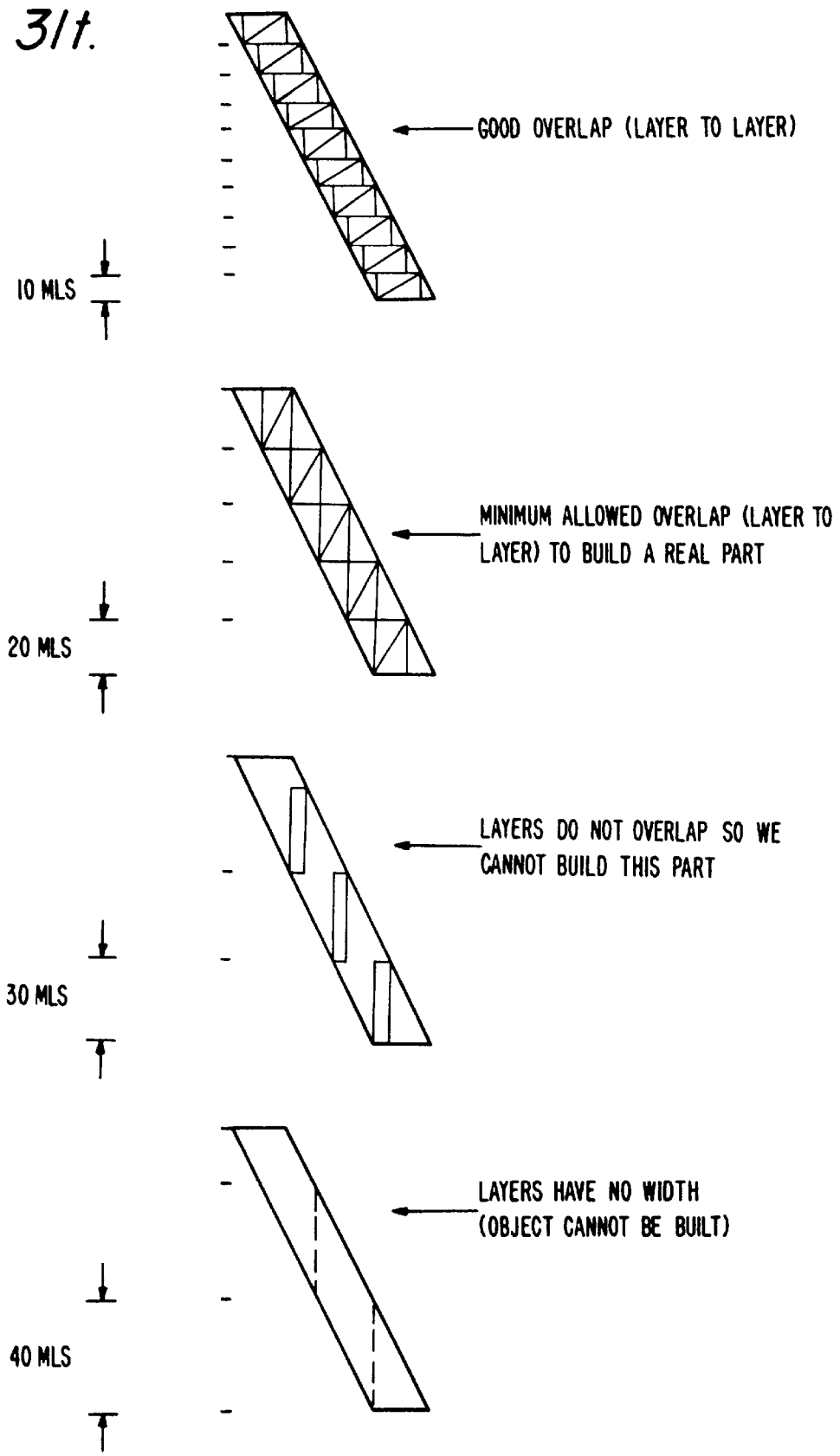
FIG. 31t are side views of straight but slanted beams showing that objects can be built with particular layer thickness but not with others.
Figure 31U:
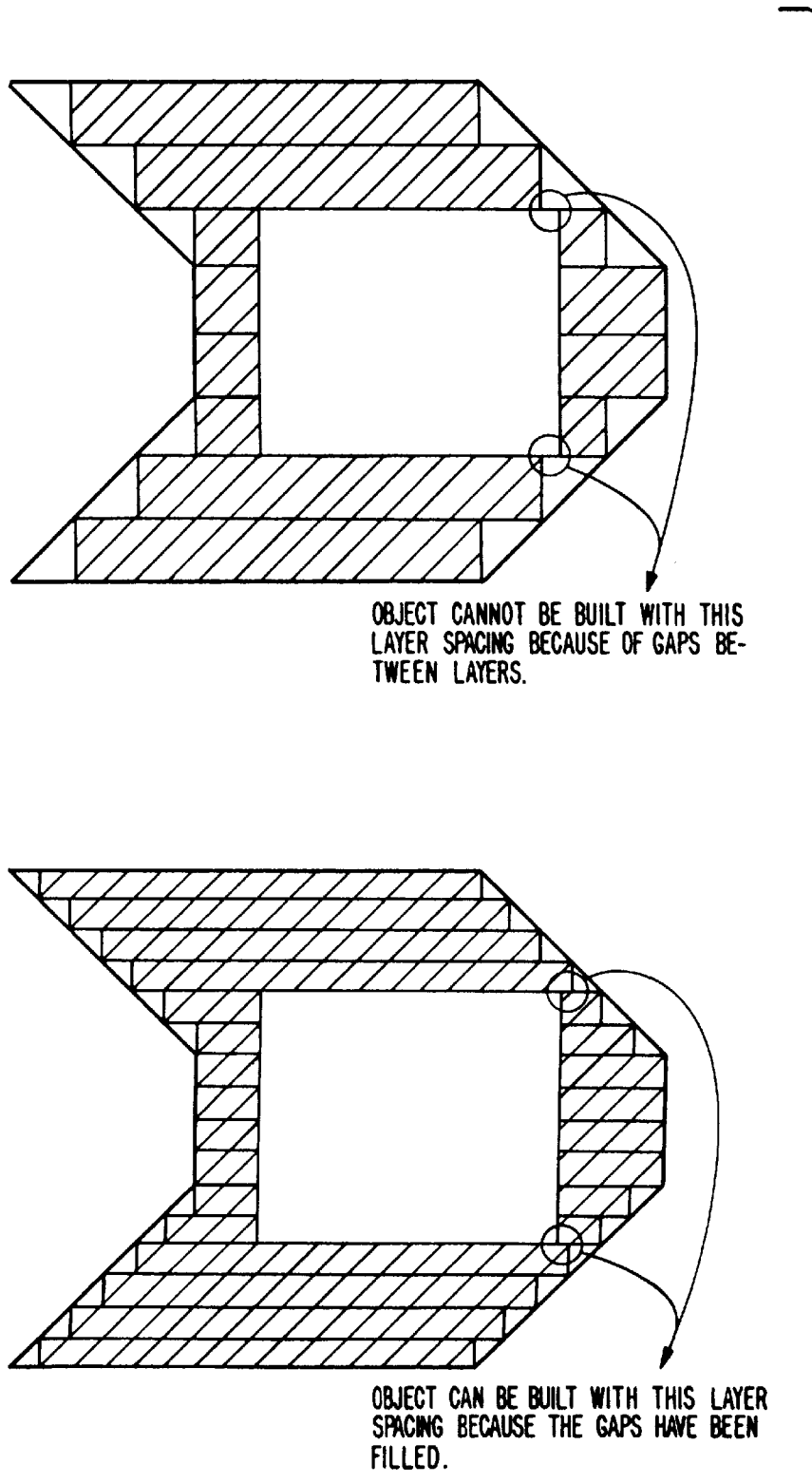
FIG. 31u are side views of an object similar to that used in describing STYLES 3 and 4 but with a wider window and varying layer thicknesses.

FIG. 31t are side views of straight but slanted beams showing that objects can be built with particular layer thickness but not with others. FIG. 31u are side, views of an object similar to that used in describing STYLES 3 and 4 but with a wider window and varying layer thicknesses.

Offsetting of vectors

When boundary vectors are drawn they cure a desired depth of material but they also cure a finite width of material. Since our boundary vectors are created at the exact edges of objects these edges are displaced by ½ of a cure width into the area that is supposed to be hollow. Since any object has two edges per feature this expansion will cause an increase of 1 cure width in cross-section of each feature. one cure width can range from 10 mils to 30 mils. This amount of over cure throws us way out of our desired tolerance of +/- 5 mils for any feature. The solution to this size problem can be implemented in the original CAD design or preferably by an offset of all boundary vectors ½ a cure width into the solid region of the object. The solution at the CAD design stage is functional but trivial, therefore, we will discuss an algorithmic process to implement boundary vector offsetting.

Figure 32A:
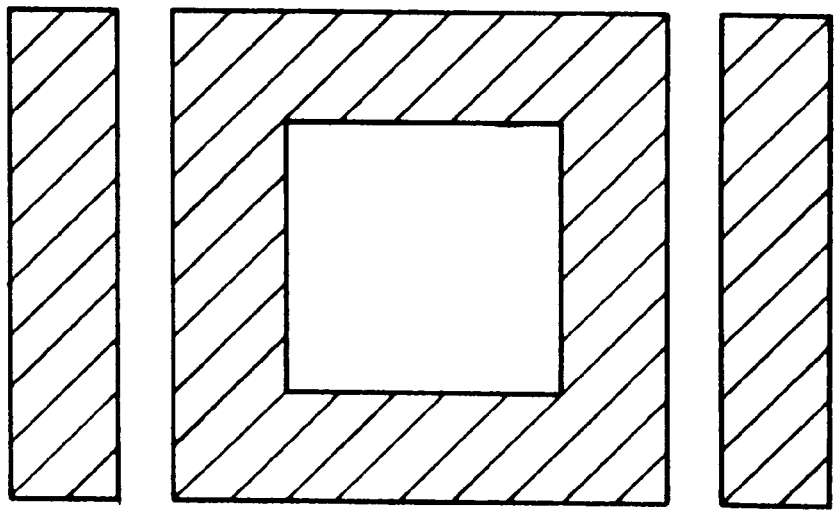
FIGS. 32a and 32b are top views of the cross-section of a CAD designed object depicting desired boundaries and boundaries after curing.
Figure 32B:
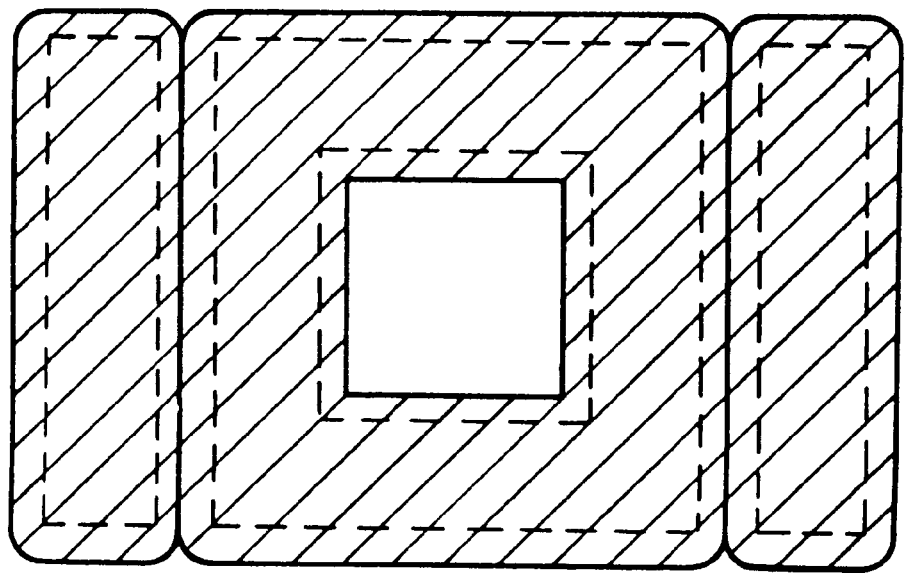

FIGS. 32a and 32b are top views of the cross-section of a CAD designed object depicting desired boundaries and boundaries after curing.

The major steps required in the offsetting procedure are as follows:

A) Produce boundary vectors. For each boundary vector store the starting point (Xs, Ys), the ending point (Xe, Ye), the complete unit length normal information (in the plane), and the equation for the vector. The equation of the line should be specified in the form aX+bY=c.

B) Group vectors with same equations (whether normals are opposite or not).

1) Determine whether any vectors with the same equation overlap in space.

2) If any do, divide the vectors into separate vectors, ones that completely overlap with other vectors and ones that do not overlap anywhere. This increases the number of vectors. Next process the vectors that overlap to determine whether any of them can be reduced to a single non-overlapping vector. Vectors that overlap are processed by determining the net normal for the area covered by the vectors. The determination of the net normal yields a net normal of 0, or a normal of unit length pointing in one of two possible directions. If a non-zero net normal is determined the overlapping vectors are to be considered as only one vector whose normal points in the direction of the net. This vector is to be placed in with the other non-overlapping vectors for further processing. If a zero net normal is determined, the overlapping vectors are to be considered as two vectors that have opposite pointing normals. These two vectors are to be removed from further processing. This leaves us with boundaries formed by non-overlapping vectors.

3) Using the vectors from step 2 maximize the lengths of the vectors by combining any that join end to end and have the same equation. This will minimize the number of vectors.

C) Order the resulting vectors from the previous step so that the head of one vector ends at the tail of the next, continue until a closed loop is formed. After this loop is closed take the next unused vector and continue to order the remaining vectors to form additional loops. If everything has been processed properly to this point we should only have closed loops formed, also these closed loops should have consistent normal directions.

D) The next step is to offset the boundary loops half a cure width into solid regions (opposite direction to boundary normals). The offsetting of vectors can be done by modifying the vector beginning and ending points by use of the following equations:

1) Variable definitions

Xbo=X coordinate beginning point after offsetting
Ybo=Y coordinate beginning point after offsetting
Xeo=X coordinate ending point after offsetting
Yeo=Y coordinate ending point after offsetting
Xb=X coordinate beginning point before offsetting
Yb=Y coordinate beginning point before offsetting
Xe=X coordinate ending point before offsetting
Ye=Y coordinate ending point before offsetting
Xn=X component of unit length boundary normal
Yn=Y component of unit length boundary normal Equations:
Xbo=Xb-Xn  Xeo=Xe-Xn
Ybo=Yb-Yn  Yeo=Ye-Yn E) The next step is to recalculate the intersection points between boundary vectors. Since we ordered vectors in an earlier step, we now know which vectors should meet (consecutive vectors meet head to tail). The line equations for each pair of vectors are used to determine the new intersection point of the two vectors (head of the first vector and tail of the second).

Mathematically it is simple to find the intersection of two lines but another check must be performed at the same time: Each of the vectors must be checked to see if it is still pointing in the same direction if it is we go on to the next pair. If not we remove the vector that changed direction (180 degree flip), along with the calculated intersection point and proceed to recalculate a new intersection point based on the good vector from the first pair and the next vector in the list. This procedure is continued until the new intersection points for all boundary vectors are obtained. Note this procedure is based on the assumption that no feature will collapse when the offset occurs.

The previous section described a method of implementing cure compensation based on determining a reliable vector ordering procedure, then offsetting all vectors ½ a line width in the direction opposite to the direction in which the normal pointed, and then finally recalculating the intersection points between consecutive vectors along with removal of vectors that changed directions. In this section we describe another method of implementing cure compensation based on determining another reliable vector ordering procedure and then offsetting vector beginning and endpoints. By offsetting beginning and endpoints we don't need to recalculate intersections of vectors after the compensation as we needed to do previously, but we still need to insure that vectors don't cross each other (change direction). There are subtle differences between these two approaches with each having some disadvantages and advantages compared to the other. Some appropriate mixing of the techniques will probably yield an even better cure compensation process.

Ordering of vectors as presently implemented, begins with picking any boundary vector and defining the tail to head orientation of the vector to keep its normal pointing towards the left as one proceeds from head to tail along the vector. Next one searches the remaining vectors for one that adjoins to the head of this first vector that will have its normal pointing in the proper direction when this adjoining point is defined as the tail of this second vector. This process is continued until a closed loop is formed, and then the loop is set aside and processing continues until all vectors are used. Note, cure compensation is done only to boundary vectors, hatch and fill are determined after compensation is completed.

Two difficulties can arise when ordering vectors: 1) Several vectors meet at one point, going along the wrong path can lead to inappropriate formation of loops, and 2)

Sometimes, due to flipping of triangle, normals can point in the wrong direction so formation of loops is not possible when requiring that vectors have the proper normal.

The first difficulty can be resolved by a technique of breaking off loops when they form. For example if 10 vectors are ordered and then another vector is ordered vectors 5 through 11 may form a closed loop. If this occurs set vectors 5 thru 11 aside and start with 4 again and look for an adjoining vector.

The second problem isn't really solved by this process. Closed boundary loops may not always be possible, so it doesn't require them, it just produces an output that warns that a hatching or filling problem might result because this situation has occurred. Note, a combination of the various ordering algorithms described can produce a more reliable ordering, especially by combining loop removal of the section with ordering previously described in the immediately prior section.

The actual method of compensating for cure width now that the vectors are ordered, is next described. Part of the process is used to minimize the possibility of the compensation causing crossovers of vectors. Crossovers can occur when vectors are short compared to the required compensation, along with a function of the angles between several consecutive vectors. The vector which offsets the vertex (offsetting vector) drops a line from its endpoint to each of the vectors that formed it. These lines are perpendicular to each of the forming vectors and their intersection points are required to be less than ½ the distance from the vertex to the end of each vector. If this is not the case, then the offsetting vector is shortened until the ½ point limit is not exceeded.

Figure 34A:
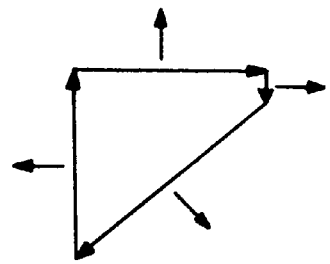
FIGS. 34a, 34b and 34c are top views of vectors that can crossover if not handled properly.
Figure 34B:
Figure 34C:
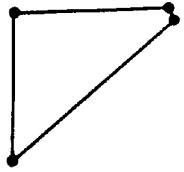
Figure 34D:
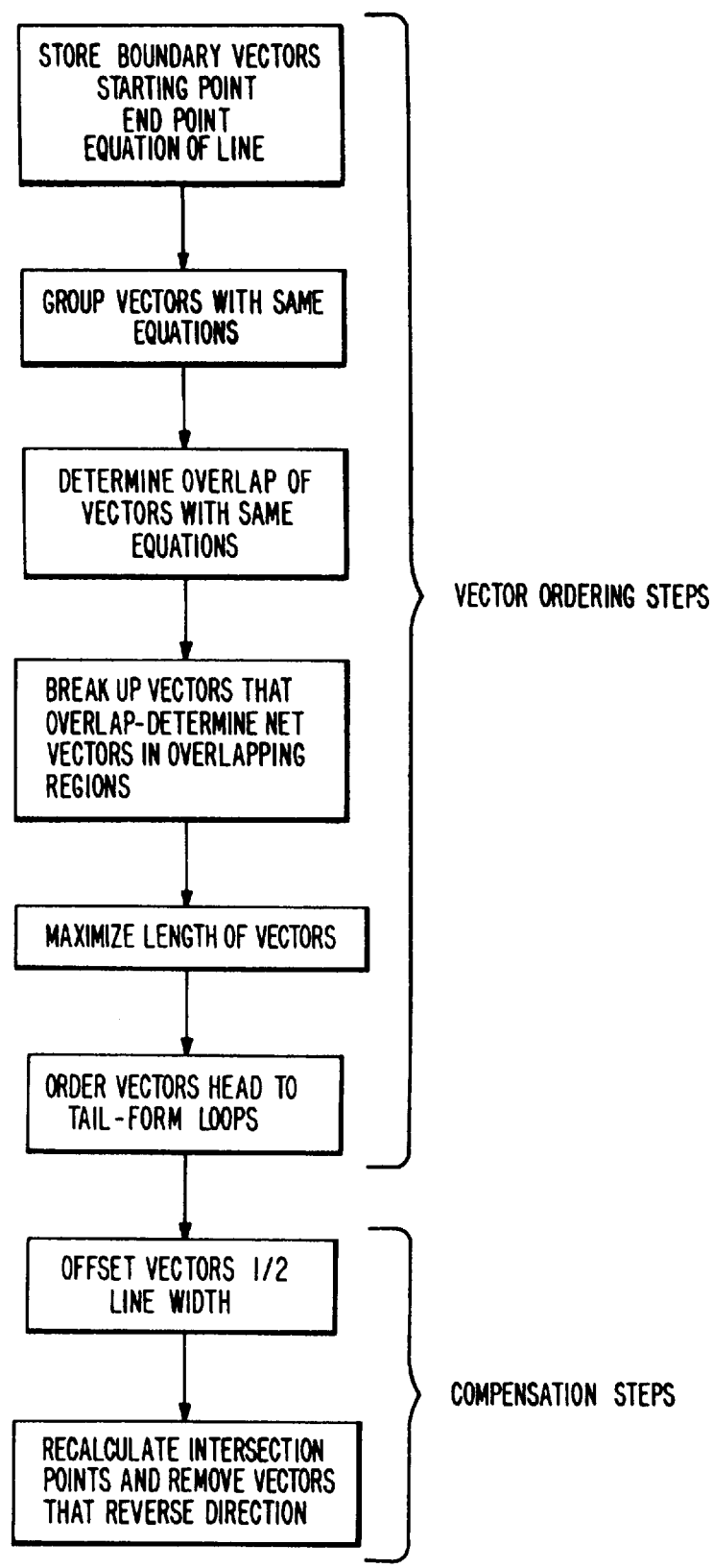

FIGS. 34a, b, and c are top views of vectors that can crossover if not handled properly. Another portion of the implemented process is that, on acute angles, the length of the offsetting vector is limited to a maximum of 2 laser beam widths so that complete loss of narrow features doesn't occur.

FIGS. 34d–k give a complete overview of the above described technique of cure compsensation.

FIG. 34l depicts the removal of vectors that change direction after being cure compensated.

The SLICE program accepts input data in the form of three dimensional triangles and creates output data consisting of line segments (vectors) to be beamed upon the surface of a photopolymerizing compound in a layer by layer manner. It is a goal of this process that it be accurate to within several thousandths of an inch (mils). Clearly, to achieve such accuracy to the true dimensions of the part being made, factors such as the radius of the laser beam must be taken into account.

Thus the purpose of cure compensation (previously termed "tangent following") is to correct for the radius of the laser beam when either inner or outer borders of a layer are traced. This problem is akin to those common in numerically controlled milling (NC), except that here the distances are much smaller. Note that while the original part is defined in three dimensions, we have reduced the problem to a two dimensional one. The corrections for the third dimension, the vertical or z direction, are taken into account by the processing logic in SLICE.

It originally appeared that a scaling operation might be the solution—we could simply shrink the outline (in the case of outer perimeter). But scaling will not be uniform on layers that do not have radial symmetry, and requires calculating a "center of inertia" for each outline. To many irregular outlines, scaling would induce a distortion that is much different than the desired cure compensation. Therefore an approach that adjusts each vertex would have to be taken.

For outer perimeters (borders) the compensation is essentially a path reduction by a factor related to the laser beam radius. For inner perimeters (holes, and inner surfaces of walls) the path the laser beam travels must be expanded.

The final algorithmic process we developed is based upon vector algebra and trigonometry. Realizing that each pair of line segments comprising the border can be thought of as two vectors (rays) emanating from a common point (local origin), a model was developed using APL under MS-DOS.

FIGS. 35a and 35b are APL programs for such a model. Some of the various compensation cases that can arise are shown in the attached graphs FIGS. 36a through 36m. Note that we assume that the conversation from input triangles to endpoint-sorted segments has already been performed satisfactorily.

In fact this conversion is not always straight forward. The endpoint sort algorithm process will subsequently discussed in greater detail. For an overview of the entire conversion process from input triangles to layered segments reference is made to the previous discussion and to FIG. 33.

The following discussion refers to FIGS. 36a–36l that illustrate specific cure compensation cases. Due to the pitch of the dot matrix printer the graphs are not in a 1 to 1 aspect ratio, though they do appear at 1 to 1 on the computer monitor. The figures are plotted in non-specific units. The origin is shown in the lower left of each graph, in which the x axis is horizontal, and the y axis is vertical.

In order to exaggerate the effects of cure compensation the laser beam radius (0.4) is quite large compared to the perimeters. One distortion that is clearly visible in all cases of the photopolymerization process is that sharp corners are rounded, because the laser beam spot is round itself.

In each graph the circles represent laser beam spots at the vertices of the compensated perimeter. The lines connecting the centers of the circles indicates the beam path of the laser.

Basic Cure Compensation

Figure 36A:
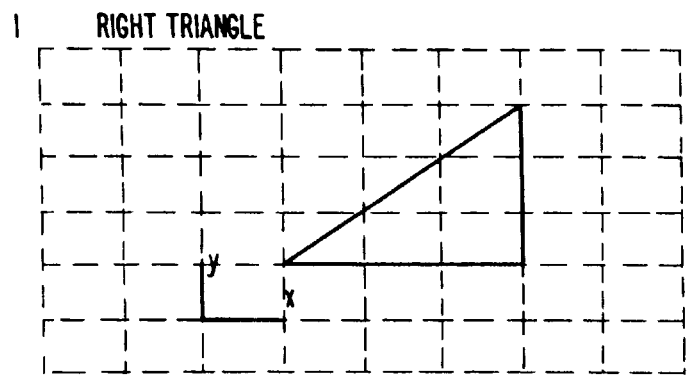
FIGS. 36a through 36l are graphs relevant to cure compensation.
Figure 36B:
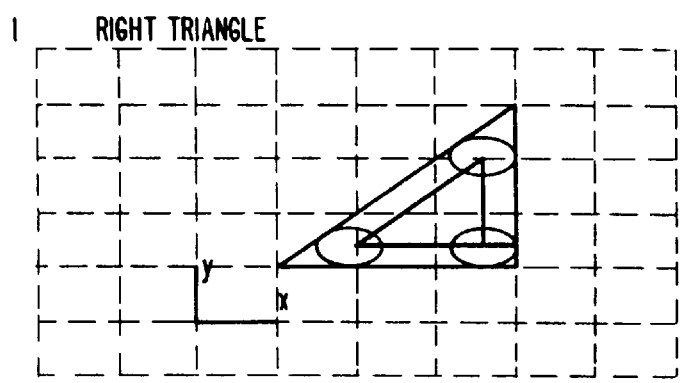

An outer perimeter in the shape of a right triangle is considered in FIG. 36a. Its coordinates are plotted and they are (1,1) (4,1) (4,4).

Cure compensation is applied to these coordinates and they are moved inward; i.e. the outer perimeter is reduced in size. The amount of reduction can be visualized geometrically by inscribing a circle (the laser beam) at each vertex of the perimeter. The centers of these circles thus gives us the new vertices of the compensated perimeter.

We can see that each such inscribed circle will be tangent to the two vectors sharing a common point; that point is the vertex to be compensated in the perimeter. Since the relationship is bitangential it will cause the compensation to vary as the angle between the two vectors varies.

Acute Angle Case

Figure 36C:
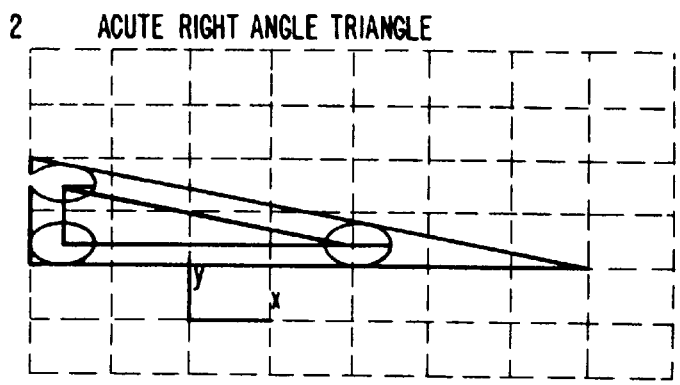

To illustrate this point, consider FIG. 36c in which we have an acute angle at vertex (5,1). Note the significant displacement of the circle that is required to maintain the required bitangential condition. Thus we see that for acute angles there will be considerable compensation resulting in a foreshortening distortion of the perimeter.

Figure 36D:
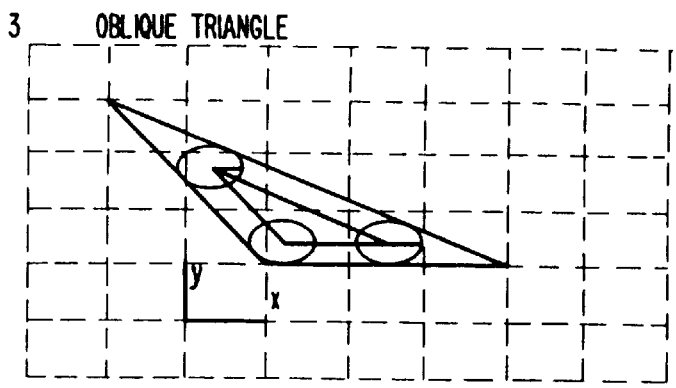
Figure 36E:
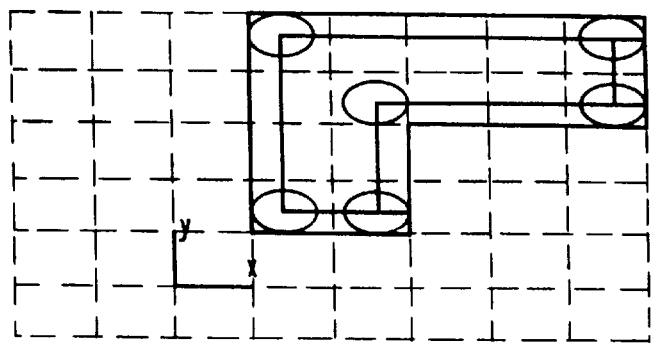
Figure 36F:
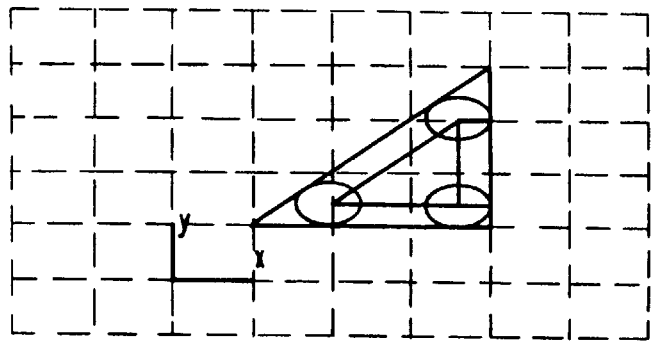

The acute angle distortion should not necessarily be regarded as undesirable because 1) the distortion is relative to laser beam radius which is quite small to begin with, and 2) the feature that would have existed without the compensation may have been structurally weak, or 3) the uncompensated feature itself would be a distortion of the outer perimeter. This distortion is an outcome of the bitangential effect of inscribing the laser beam wholly within the original outer perimeter, and could be ameliorated by relaxing this condition, i.e. allowing a portion of the laser beam to exceed the actual outer perimeter. Oblique Angle Case An oblique angle does not induce a significant distortion. An example of this case is shown in FIG. 36d at vertex (1,1,). Note that the inscribed circle near (1,1) does not touch point (1,1). Rather, it is tangent to the vectors sharing that vertex. Inside Angle Case The same effect of oblique angle compensation is even more pronounced in the case of the "inside angles", i.e. angles greater than 180 degrees. In this case the inscribed circle is tangent to the infinite projections of the two vectors. This angle is shown in FIG. 36e at vertex (3,3). Collinear Vertex Case A vertex is collinear when the angle between the vectors is 180 degrees. In this case the vertex is not a significant feature and can be dealt with by deleting it from the vertex list forming the perimeter. The collinear vertex is shown in FIG. 36f.

Coincident Point Case

Figure 36G:
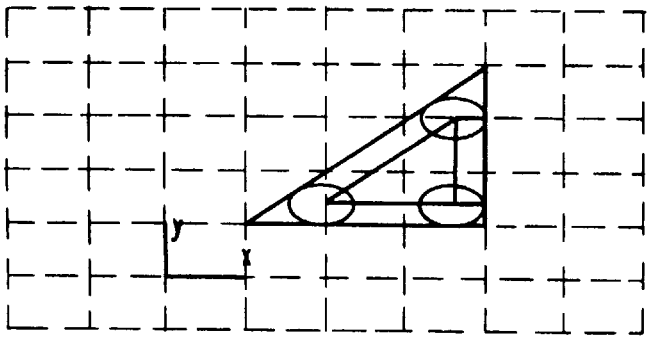
Figure 36H:
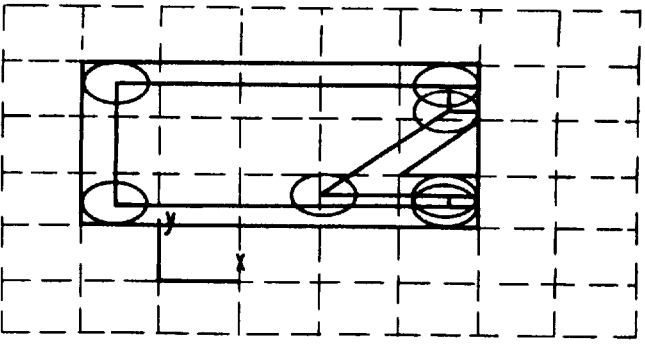
Figure 36I:
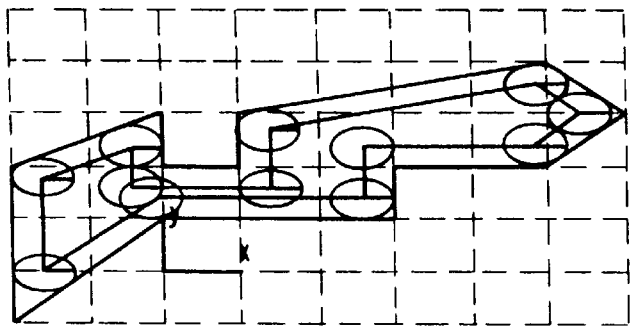

Two vertices that are coincident are also redundant. One of them is-deleted from the vertex list of the perimeter. The angle is indeterminate until there is only one vertex at that coordinate. The coincident point is shown in FIG. 36g at vertex (4,1).

Invasive Angle Case

When the angle is greater than 180 degrees it is an "inside angle" and the circle must be inscribed along the projections of the vectors. An angle that is additionally greater than 270 degrees is termed an "invasive angle" because it cuts into the perimeter.

There is no significant distortion induced by this feature, however the laser beam will overlap itself to an increasing degree as the angle approached 360 degrees. At the boundary case of 0 degrees, the laser beam will trace inward and outward, with no effect on the perimeter at all. The invasive vertex is shown on FIG. 36h vertex (4,2). Complex Polygon Case The complex perimeter will likely contain an assortment of the above enumerated cases. An additional possibility exists that cure compensation will move a perimeter segment to cross over an adjacent segment. Such is very nearly the case in FIG. 36i near vertex (1,1).

Figure 36J:
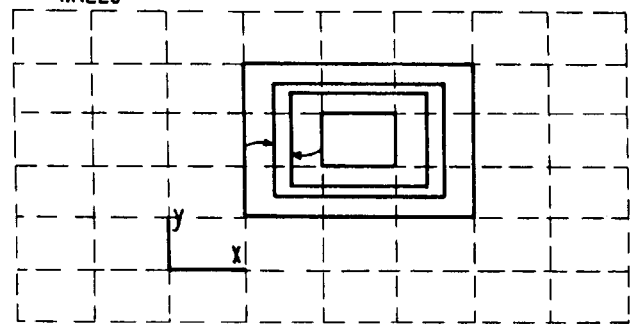

Such a case must be regarded as an ill defined part, but could be dealt with using more advanced techniques beyond the scope of the algorithm presented in this paper. Walls So far we have only considered outer perimeters which are reduced inner perimeters are encountered as the boundaries of holes, or as the insides of walls. Inner perimeters must be compensated by expansion, as shown in FIG. 36j.

The distinction between inner and outer perimeters can be made in several ways. In this particular model the convention is adopted that outer perimeters shall have their vertices ordered in a clockwise manner, and inner perimeters counter-clockwise. Another mathematically sound method is to use a negative beam radius for inner perimeters. The type of a perimeter can additionally be determined by comparing the vector normals to a known orientation at the start; this is the method used in SLICE cure compensation.

Adjoining outer Perimeters

Figure 36K:
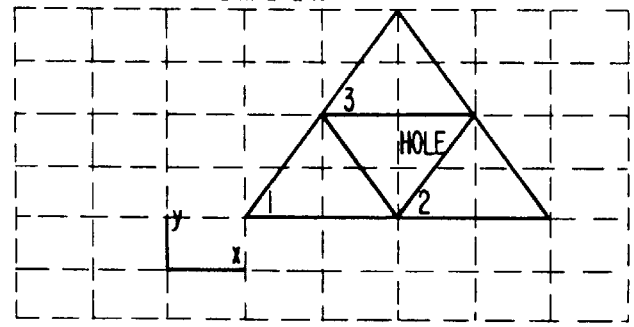
Figure 36L:
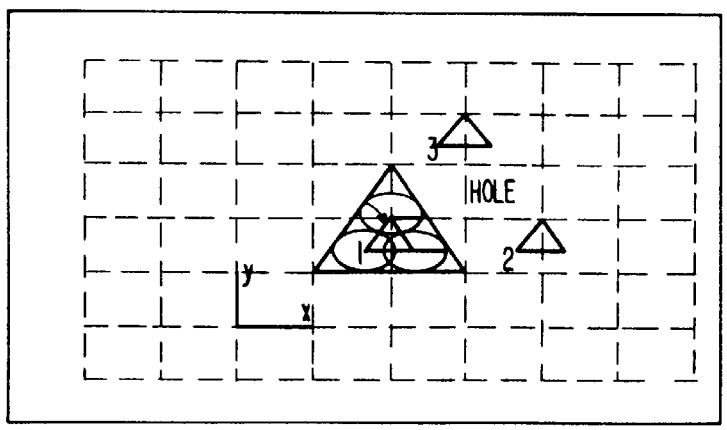

Cure compensation may have some structural effects on a part. Consider a layer in a part in which there are three adjacent triangles that form a hole in the center as shown in FIG. 36k and 36e. The key structural point is that the triangles abut each other. After cure compensation the triangles are reduced, since they are each outer perimeters, so that they no longer touch one another. This will affect the three dimensional structural qualities of the part.

It is not possible for a two-dimensional compensation algorithm such as that presented here to correct for these types of structural cases. This may be a topic for future research. Currently these types of cases will require user intervention.

FIGS. 37a and 37b illustrate the mathematical basis and derivations for cure compensation.

When parts are built using stereolithography, resin is cured by exposing its surface with a laser that traces the appropriate pattern by use of many straight variable length line segments (vectors). These vectors serve different purposes, some are used to create skin, some to create boundaries, some to create internal structure (cross-hatch), etc. We have divided the vectors that can occur on a particular layer into 14 types, called blocks. These fourteen blocks are significant for part building when using STYLE 1; if another style is used the number of blocks and their types will probably change. The fourteen types are:

| Type | Label | Full name | Styles used on |
|---|---|---|---|
| 1 | LB | Layer boundary | 1, 2, 3, 4 |
| 2 | LH | Layer cross-hatch | 1, 2, 3, 4 |
| 3 | NFDB | Near-flat down-facing skin boundary | 1, 2, 3, 4 |
| 4 | NFDH | Near-flat down-facing skin cross-hatch | 1 |
| 5 | NFDF | Near-flat down-facing skin fill | 1, 2, 3, 4 |
| 6 | NFUB | Near-flat up-facing skin boundary | 1, 2, 3, 4 |
| 7 | NFUH | Near-flat up-facing skin cross-hatch | 2 |
| 8 | NFUF | Near-flat up-facing skin fill | 1, 2, 3, 4 |
| 9 | FDB | Flat down-facing skin boundary | 1, 2, 3, 4 |
| 10 | FDH | Flat down-facing skin cross-hatch | 2 |
| 11 | FDF | Flat down-facing skin fill | 1, 2, 3, 4 |
| 12 | FUB | Flat up-facing skin boundary | 1, 2, 3, 4 |
| 13 | FUH | Flat up-facing skin cross-hatch | 2 |
| 14 | FUF | Flat up-facing skin fill | 1, 2, 3, 4 |

Each of the 5 boundaries could have corresponding hatch and fill vectors. The reason some of these hatch and fill blocks are not included in some styles are because we find them redundant or at least unnecessary when the above blocks are used. All these vector blocks, along with the ones that aren't included, are discussed in more detail in the disclosure sections that discuss part building styles.

To build good parts we not only require that the above vectors be drawn with certain curing requirements, but also that they be drawn in a particular order. The required drawing order is actually the order of the blocks in the list above. This drawing order is required to minimize curl, and/or to minimize birdnesting, and/or to insure that vectors that are drawn do not affect the curing of vectors that will be drawn afterwards, etc.

The easiest way to insure that vectors are drawn in the right order is to have slice output the blocks in the proper order. The above order is used for the slice output file with regard to each layer. The ordering of layers in the output file is done from lowest to highest. If a given object is not continuous in the vertical direction (the gaps will be filled in by other objects that will be built at the same time), slice will include layer header information for the missing layers in the output file. The layer header information is supplied for all layers. It is included as a fifteenth block which is labelled "L" followed by a number indicating the scale bit spacing in the vertical dimension from which the vector blocks were derived.

An example of one embodiment of a commercial system, provided by 3D Systems, Inc. of Velencia, Calif., embodying the present invention, is illustrated and described above.

A second working embodiment of a commercial stereolithography system provided by 3D Systems, Inc. will now be described. This embodiment is similar to the first embodiment described above.

The major feature of this embodiment is that the program used to convert the CAD/CAM data into vectors, which is known as SLICE, has been updated. in the first embodiment described above, the version of SLICE described is version 3.03. In the second commercial working embodiment, to be described in more detail below, the version of SLICE is version 3.20. Version 3.20 differs from version 3.03 primarily in the area of beam width compensation, which is a technique for making adjustments to the positioning of the vectors to account for the size of the beam width, which can range from 7–20 mils. If the width of the beam is not accounted for, the final cured part will be distorted from the original by as much as 1 full beam width, i.e. 7–20 mils. Version 3.03 does provide for beam width compensation, but version 3.20 provides several improvements in this area such as improvements in ordering vectors, recalculating segment normals, and combining overlapping vectors in such a way to improve the beam width compensation process.

Another feature, not present even in SLICE version 3.20, but to be added in future versions of SLICE is the ability to create border vectors directly on the slicing layers as opposed to 1 bit above as required by STYLE 1. This will have the benefit of simplifying the STYLE 3 and STYLE 4 algorithms (to make undersized parts). At present, these algorithms have not been implemented in SLICE version 3.20, but creating border vectors on the slicing layers will simplify the STYLE 3 and 4 algorithms to the extent that they can be much more easily implemented. This feature will be discussed in greater detail further on.

As discussed more fully in the body of this application, stereolithography is the process of creating a three-dimensional representation of an object by successively curing two-dimensional cross-sections (but with some finite thickness on the order of mils) on the surface of a liquid photopolymer, such that the cross-sections adhere to one another in a laminar buildup to reproduce the object.

A block diagram of the embodiment described herein is set forth in FIG. 8. As indicated in the figure, the major components of the system include laser 1 optics, 2, dynamic mirrors 3, Z-stage elevator 4, SLICE computer 5, PROCESS computer 6, vat 7, elevator driver 8, and dynamic mirror driver 9. As indicated in the figure, the SLICE computer is electrically coupled to the PROCESS computer, which in turn is electrically coupled to the Z-stage elevator and the dynamic mirror through the elevator driver and dynamic mirror driver, respectively. When the system is in operation, the laser is continuously on and emitting a laser light beam. As indicated, the laser beam is directed through the optics, which first expands and then focuses the beam, and also directs the beam to the dynamic mirrors, which in turn, direct the beam to a specific location on the surface of a liquid photopolymer resin placed in the vat.

The SLICE computer is electrically coupled to a CAD/CAM system (not shown). CAD/CAM data descriptive of a three-dimensional object is created on the CAD/CAM system, and then transferred to the SLICE computer. The SLICE computer converts the CAD/CAM data into a database of vectors, which are used to direct the movement of the laser beam on the surface of the photopolymer in the vat. A vector consists of 2 endpoints and a direction, and the directed laser beam will move from one endpoint to another on the surface of the photopolymer in the direction indicted by the vector.

The PROCESS computer is electrically coupled to the SLICE computer. After the SLICE computer has converted the CAD data into vectors, the SLICE computer transfers the vectors to the PROCESS computer, after which the PROCESS computer can manipulate the data and then begin the photopolymerization process.

The PROCESS computer is electrically coupled to the Z-stage elevator and to the dynamic mirrors, and controls the two simultaneously by means of the vector data. More specifically, for each two-dimensional cross-section, the PROCESS computer, by means of the dynamic mirrors, will direct the laser beam to move across the surface of the photopolymer according to the vectors associated with that two-dimensional cross-section. As a result, the surface of the photopolymer will cure to form a two-dimensional cross-section (of finite thickness relating to the layer thickness desired).

The laser beam will not move across the surface in a continuous fashion however. Instead, it will be directed to successively step a certain distance, and then wait a certain amount, which distance and amount are programmable, and hence controllable by a user. These values will be used by the PROCESS computer in controlling the dynamic mirrors. Specifically, the PROCESS computer will cause the dynamic mirrors to rotate by a particular angular increment so that the beam sweeps out the predetermined step size on the surface of the photopolymer. Then, the PROCESS computer will wait the predetermined amount before causing the dynamic mirrors to once again change position.

After a particular cross-section is created, the PROCESS computer directs the Z-stage elevator to dip a certain amount into the vat of photopolymer so that liquid photopolymer will spread over the surface of the cured cross-section in preparation for the curing of the next cross-section.

The thickness of a cured layer is controllable by the user, and in general, the PROCESS computer will direct the elevator to lower itself sufficiently in the vat so that enough liquid polymer to form a cured layer at the desired layer thickness will move over the already-cured layers.

However, because the photopolymers are, in general, of moderate viscosity, the elevator will initially generally dip the previously created layer below the surface of the photopolymer at greater than the layer thickness so that the polymer will flow over the part at a fast rate. Then, the part will be raised to the desired level so that the excess liquid polymer will flow off the part, and so that the remaining polymer will have the desired layer thickness.

A more detailed diagram of the optics 2 and dynamic mirrors 3 is shown in FIG. 9. As indicated, optics 2 comprises 90-degree mirrors 201 and 203' which direct the laser beam through beam expander 202, and to the dynamic mirrors 3. The beam expander first expands and then focuses the laser beam. The expanding step is necessary to enable the beam to be focused to a smaller diameter during the focusing step than would otherwise be the case if the beam were left unexpanded.

The dynamic mirrors comprise an X-mirror, and a separate Y-mirror. The X-mirror is rotatable about an axis for directing the laser beam to span the surface of the liquid polymer in the X-direction. The Y-mirror is rotatable about an orthogonal axis for directing the laser beam to span the surface of the liquid polymer in the Y-direction. The degree of rotation of these mirrors is controlled by the PROCESS computer.

As set forth in Appendix E, the laser is advantageously a Liconix (Sunnyvale, Calif.) Model 4240N, HeCd multimode laser coupled to a Model 4240PS power supply, which laser has an average power of 10 mW continuous wave, a beam diameter of 1–2 millimeters, a wavelength of 325 nm, and a power consumption of approximately 7 amps at 120 VAC. Alternatively, the laser is an Omnichrome (Chino, Calif.) Model 356XM HeCd laser coupled to a Model 100 power supply.

The dynamic mirrors are advantageously P/N EOO-Z2173 XY0507 scanning mirrors manufactured by General Scanning, Inc. (Watertown, Mass.) coupled to a P/N EOO-DX2005 controller for the XY0507 scanning mirrors. The mirror driver is advantageously an I/O board manufactured by Tarnz Technologies (Los Angeles, Calif.).

The Z-stage elevator advantageously comprises P/N 008-0324-3, a 14 inch linear table with 5 pitch, manufactured by Daedal (Harrison City, Pa.) and available through Pacific Technical Products (Sylmar, Calif.). The elevator driver also advantageously comprises P/N MC5000-20, a motor control and motor drive for the linear table, and a standard computer I/O board to interface between computer operated software and the motor control and drive.

The PROCESS computer is advantageously a Wyse 286, Model 2200, manufactured by Wyse Technology, San Jose, Calif., including a 40 MByte hard disc, and "AT" style keyboard, a monitor, graphics card, math co-processor, and an Ethernet card, which card is manufactured by Excelan or Micom. The Wyse 286 is similar to an IBM AT, and is a 16 bit, 10 MHZ computer on which the MS-DOS operating system, version 3.21 (or earlier versions) from Wyse Technology is run. For file management assistance, Q-DOS II, version 2.00 from Gazelle Systems, Provo, Utah, is used. Additional software which is advantageously available on the PROCESS computer includes FTP Software, FTP Software PC/TCP File Transfer Program Version 1.16, or FTP Software PC/TCP Telnet Version 1.16, both available from MICOM-Interlan, Inc., Boxborough, Mass. Additional software includes Ethernet Software from Exelan.

The SLICE computer is advantageously the NEC Powermate 386 computer, a 32 bit microprocessor, manufactured by NEC Information Systems, Inc., Boxborough, Mass., and available from Peripheral Systems, Inc., Van Nuys, Calif. The particular operating system is the 386/ix operating system, UNIX System V Release 1.0.4 80386. Additional software includes TCP Ethernet Support, Micom version. Both the UNIX operating system and the Ethernet support software are available from Interactive Systems Corporation, Santa Monica, Calif.. Advantageously, the SLICE computer also contains an 85 megabyte hard disk.

A diagram of the software architecture of the stereolithography system is shown in FIG. 33. The figure includes some of the components shown in FIG. 8, and the identifying numerals for these components have been kept the same. As illustrated, the software is distributed between the SLICE computer and the PROCESS computer. Additional software is resident on, and executed by, the z-stage elevator driver 8 (labelled as "z-stage" in FIG. 33), and by the mirror driver 9 (labelled as "DX", in FIG. 33). Also shown in the figure is software which is resident on and executed by the CAD/CAM system, which system is external to the stereolithography system. This software is only described here for the purpose of providing a complete software overview, and is the responsibility of the CAD/CAM system.

As indicated, the software architecture comprises the following software programs, which programs are listed below along with their identifying numerals, and the computer on which the software is resident:

| Program | Resident Computer |
| --- | --- |
| CAD/SLA Interface Program 100 | CAD Computer |
| SLICE 3.00 (3.20 in the second embodiment) 101 | SLICE Computer |
| SLICE (UI) 102 | SLICE Computer |
| MERGE 103 | PROCESS Computer |
| MATERIAL 104 | PROCESS Computer |
| PREPARE 105 | PROCESS Computer |
| BEAM 106 | PROCESS Computer |
| CALOUT 107 | PROCESS Computer |
| BUILD 108 | PROCESS Computer |
| STEREO 109 | PROCESS Computer |
| LASER 110 | PROCESS Computer |
| BASIC 111 | PROCESS Computer |
| CLIFF 112 | PROCESS Computer |

As indicated in the figure, each of the above programs executes in conjunction with one or more data bases or files. A summary of the functions performed by each of these programs will be provided below:

CAD/SLA Interface Program

This program is resident on a CAD/CAM computer. The CAD system database, embodies a CAD/CAM modelling capability, enabling a user to specify or define a three-dimensional object. Once the design of the object is completed, this program outputs the Object.STL data file, containing data descriptive of the surface of a three-dimensional object.

The Object.STL file must be placed in a certain format in order for it to conform to the requirements of the software of the stereolithography system resident on the SLICE and PROCESS computers. The responsibility of placing the Object.STL file in the correct format lies outside the stereolithography system, and is in fact, the responsibility of the CAD system.

Although other representations are possible, as illustrated in FIG. 11, the surface of any three-dimensional object can be divided up into a series of triangles. The stereolithography system requires that the surface be defined in terms of triangles which meet two requirements: 1) the triangles must completely and singly span the surface; and 2) that the vertex of a triangles only meet adjacent triangles at their vertices, and not at the line segments connecting the vertices. These requirements result in computational efficiency.

The resolution with which the triangular description of the surface matches the actual surface depends on the number of triangles used to define the surface. The greater the number of triangles used, the finer the resolution. At present, the system allows a surface to be defined with up to 14,000 triangles.

Figure 38:
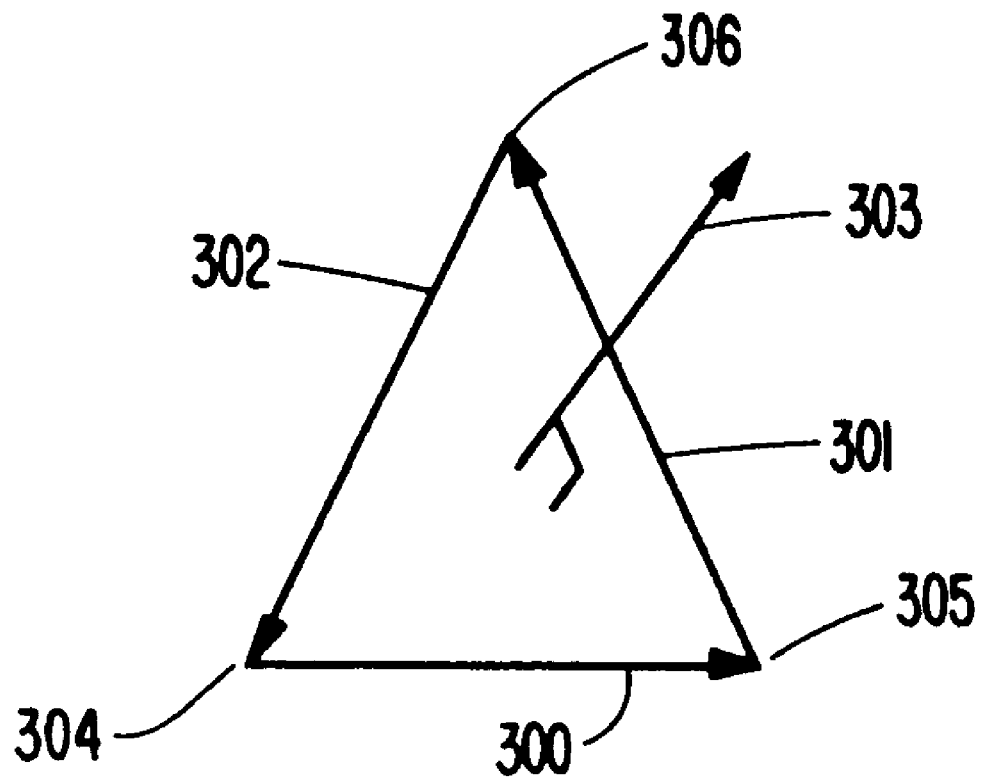
FIG. 38 is a diagram showing the right hand rule relationship between border vectors and the triangle normal.

In general, the triangle of a surface can be defined in terms of vectors. As discussed earlier in the application, a vector is a line segment having two endpoints and a direction. One endpoint is the tail, the other is the head, and the direction is from the tail endpoint to the head endpoint. As illustrated in FIG. 38, it requires three vectors to define the perimeter of a triangle. The three vectors required to define the triangle of FIG. 38 are denoted as vectors 300, 301, and 302, respectively. The tail points of vectors 300–302 are denoted as 304, 305, and 306 respectively, and the heads are denoted as 305, 306 and 304, respectively.

However, a surface triangle has a particular orientation with respect to the surface it is bounding, and a fourth vector known as the triangle normal vector is required to indicate this orientation. As illustrated in FIG. 38, the triangle normal is always directed away from the solid which the triangle bounds. The triangle normal of the triangle of FIG. 38 is denoted as 303.

A requirement of the object.STL file is that the vectors of the triangle obey a certain relationship with respect to each other known as the right hand rule. This rule requires that the three vectors making up the surface of the triangle, 301–302, be oriented so that the head of one vector ends at the tail of another. In addition, the rule requires that when the vectors are oriented to define a counter-clockwise loop, that the triangle normal be pointed in the direction which the thumb of the right hand would point if the fingers of the right hand were curled in the counter-clockwise direction. This relationship is satisfied by the triangle of FIG. 38.

In this embodiment of the subject invention, the particular format chosen for the Object.STL file is illustrated in FIG. 39. As illustrated, only the endpoints at the head of the four vectors are provided, first the endpoint of the triangle normal, followed by the endpoints of the vectors which span the perimeter. The endpoints of the heads are sufficient since the vectors are assumed to be lined up end to end, and the tail endpoints of one vector will be the head endpoint of another. In addition, the endpoints are assumed to be ordered according to the right hand rule previously described. Finally, only the endpoint of the triangle normal, which is assumed to have a unity length, is provided since it will alone contain enough information to define the orientation of the triangle with respect to the solid.

SLICE 3.03 (SLICE 3.20)

This program converts the Object.STL file into a series of vectors for directing the movement of the laser beam across the surface of the photopolymer. A raster-based sweep of the laser across the surface of the photopolymer is also possible, but a vector-based approach is preferable. This is because, in a raster-based approach, the laser beam is required to sweep the entire area of the surface of the polymer, causing in some instances partial curing of unwanted areas. A vector-based approach provides better control. A raster-based approach is possible but it requires a rapid ability to keep the beam from curing unwanted areas, and also requires the ability to provide a high enough intensity image at the liquid surface.

To execute SLICE, a user first executes the related program SLICE (UI), which is a user interface program, for obtaining values of certain parameters to use in executing SLICE. SLICE (UI) will interact with the user to obtain values for these parameters, and output the values to the file Object.UII, indicated as 202 in FIG. 33.

FIG. 44 lists the parameters which SLICE (UI) prompts the user for. As discussed in the body of this application, SLICE takes the Object.STL file, and uses it to create vectors for each two-dimensional cross-section of the object which will be formed at the surface of the photopolymer.

At present, for each layer, SLICE creates 11 different types of vectors to define that cross section. These 11 vector types along with their method of creation and placement define what is known as STYLE 1. STYLE 1 is a particular method of processing 3 dimensional triangle surface data into 2 dimensional vector data so that when a part is built it will approximate the original CAD design in a consistent and accurate manner regardless of the specific part geometry. STYLE 1 consistently oversizes the XY dimensions of a part in as accurate a manner as possible when layering of a finite thickness is used to construct a part. STYLE 1 is discussed more deeply at another point in this disclosure. These vector types are listed below:

| Type | Label | Full Name |
|---|---|---|
| 1 | LB | Layer boundary |
| 2 | LH | Layer crosshatch |
| 3 | NFDB | Near-flat down-facing skin boundary |
| 4 | NFDH | Near-flat down-facing skin crosshatch |
| 5 | NFUB | Near-flat up-facing skin boundary |
| 6 | FB | Flat down-facing skin boundary |
| 7 | FDF | Flat down-facing skin fill |
| 8 | NFDF | Near-flat down-facing skin fill |
| 9 | NFUF | Near-flat up-facing skin fill |
| 10 | FUB | Flat up-facing skin boundary |
| 11 | FUF | Flat up-facing skin fill |

As discussed in more detail in the body of this application, the boundary vectors define the exterior boundaries of the cross-section, while the skin or hatch vectors define the interior part of the cross-section.

Figure 40:
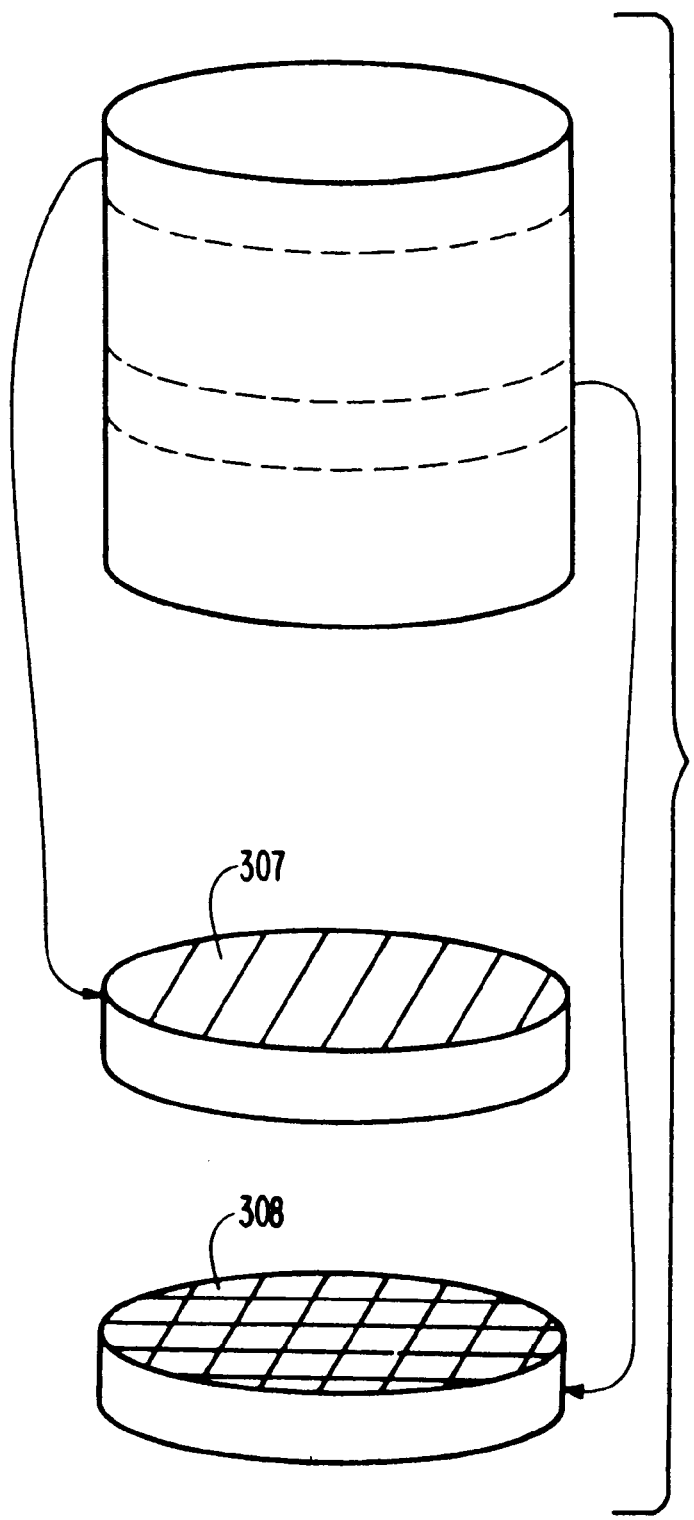
FIG. 40 is a diagram showing the difference between an interior cross-section and a top cross-section of an object.

At present, the interior portion of a cross-section can either be a skin or a cross-hatch or both. The interior portion will contain skin if the cross-section represents an outer surface of the three-dimensional object, and will only contain hatch if the cross-section represents only an interior section of the object. These principles are illustrated in FIG. 40, which illustrates a skinned cross-section representing the top of a cylinder (layers hatch and layers boundary also present but not shown), and a hatched cross-section representing an interior section of the cylinder.

As illustrated in the Figure, the interior of cross-section 307 representing the top of the cylinder is represented by a series of parallel lines. These are called skin vectors. The interior of cross-section 308 is represented by a series of crisscrossing parallel lines. These are called hatch vectors.

As discussed earlier, each vector has a direction and a length associated with it. Each vector represents the movement of the laser beam across the surface of the photopolymer which will cause curing of the photopolymer at the vector location. Skin vectors are spaced close to one another so that there will be no gaps between the cured lines which will result after the laser has traversed the vectors. Gaps between the lines represent uncured polymer, which would drain from a cured cross-section. As a result, if the vectors had large spaces between them, the cured cross-section would not be a good representation of the top of the cylinder. As a result, skin vectors are generally placed close to one another.

Cross-hatch vectors, on the other hand, can be spaced apart from one another. This is because these vectors are used to create interior cross-sections to a part, and it does not matter whether liquid polymer can drain through gaps in the cured lines, since it will be trapped by the skinned areas anyway. It is only necessary to have close enough spacing to provide structural support inside the object.

Note that liquid polymer will remain inside of an object after all the cross-sections have been formed if skin fill is chosen appropriately. This liquid resin will be cured during the post-curing steps described in continuation-in-part applications to U.S. patent application Ser. No. 183,016 (now U.S. Pat. No. 4,996,010), and U.S. patent application Ser. Nos. 183,014 and 183,012 (both abandoned) which were filed on Nov. 9, 1988. This cured resin will provide additional structural support for the object.

Figure 41:
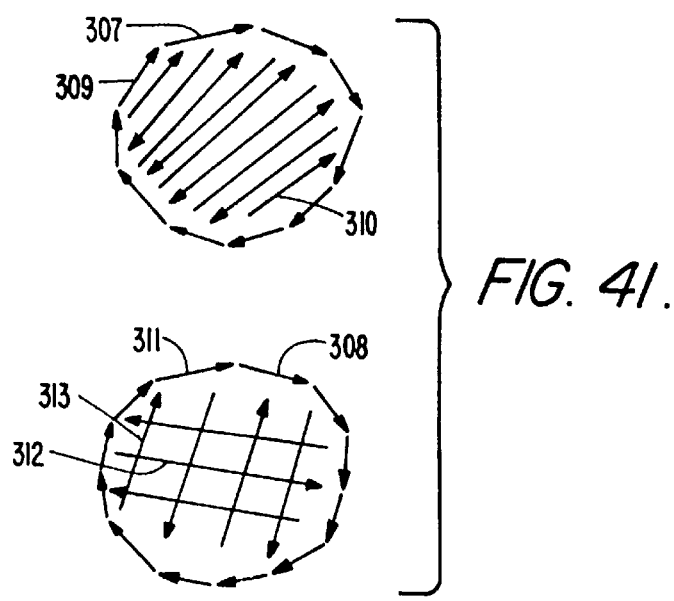
FIG. 41 is a diagram showing the boundary, skin, and hatch vectors for an interior cross-section and a top cross-section of an object.

Cross-sections 307 and 308 are shown in more detail in FIG. 41, which makes the vector directions more clear. Note that the boundaries of each of these cross-sections will be defined in terms of vectors also, and this as well is indicated in the Figure.

Cross-section 307, for example, is comprised of border vectors 309 and skin vectors 310. Cross-section 308, on the other hand, is comprised of border vectors 311, and cross-hatch vectors 312 and 313. Cross-hatch vectors 312 represent vectors which are parallel to the Y direction" while cross-hatch vectors 313 represent vectors which are parallel to the X direction. In the terminology of the 11 vector-types listed above, vectors 311 are layer boundary (LB) vectors, vectors 312 and 313 are layer crosshatch (LH) vectors, vectors 309 are flat up-facing skin boundary (FUB) vectors, and vectors 310 are flat up-facing skin fill (FUF) vectors. (Strictly speaking, cross-section 307 also contains LB and LH vectors to provide structural support, but those have been omitted for the sake of clarity in this discussion.) The rest of the vector types will be explained with reference to FIG. 42. As illustrated, cross-section 309 is the bottom section of the object that is illustrated in the Figure, while cross-section 310 is the top-most portion of the object.

Figure 43A:
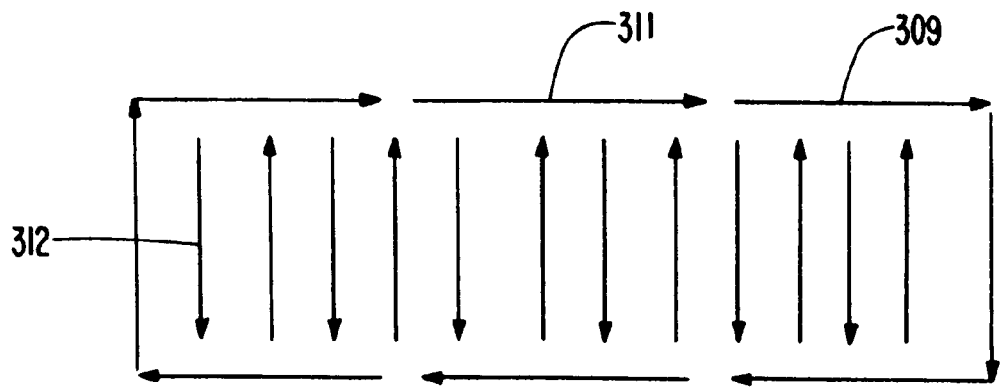
FIG. 43(A) illustrates the boundary and skin vectors for a flat down-facing skin area.

Cross-section 309 is illustrated in more detail in FIG. 43(A). In the terminology of the 11 vector types discussed above, the cross-section comprises flat down-facing skin boundary (FDB) vectors 311, and flat down-facing skin fill (FDF) vectors 312.

Figure 42:
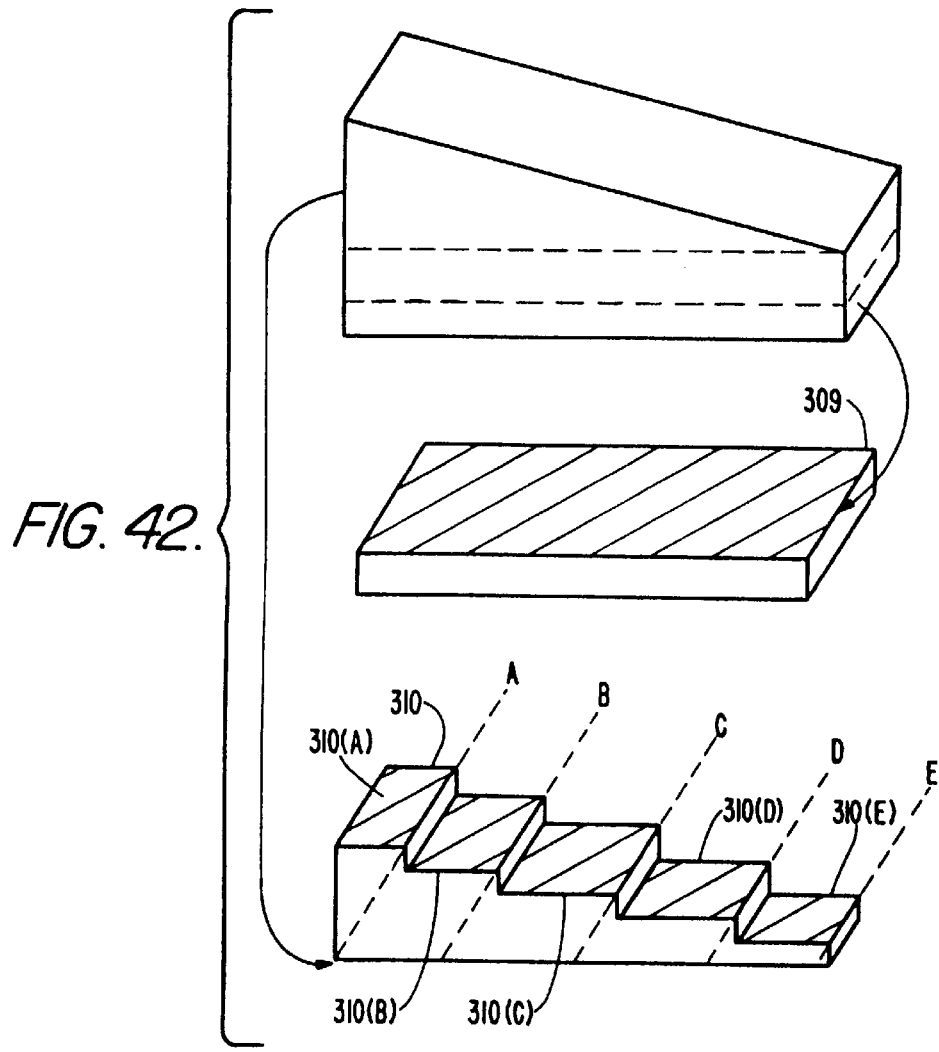
FIG. 42 illustrates an up-facing near-flat skin area and a down-facing flat skin area.
Figure 43B:
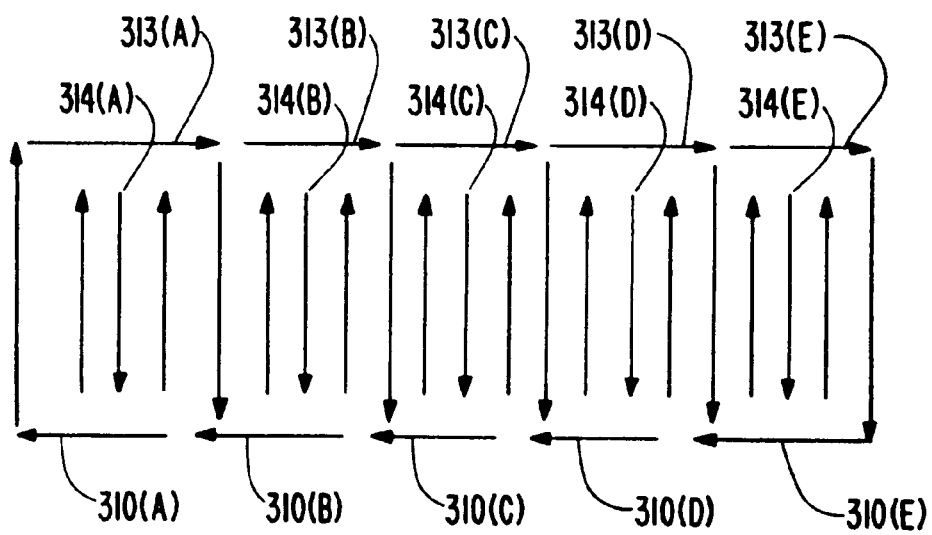
FIG. 43(B) illustrates the boundary and skin vectors for a near-flat up-facing skin area.

Cross-section 310 is illustrated in more detail in FIG. 43(B). Note that cross-section 310 represents a slanted portion of the object of FIG. 42. The problem with representing a slanted surface is that it cannot be represented by one cross-section, but must, instead, be represented by a series of cross-sections which stacked together approximate the slanted surface. This is illustrated in FIG. 42, which shows cross-section 310 as really being made up of cross-sections 310(A), 310(B), 310(C), 310(D), and 310(E).

The vector representation of these cross-sections is shown in FIG. 43(B). In the terminology of the 11 vector types, cross-section 310(A), for example, is comprised of near-flat up-facing skin boundary (NFUB) vectors 313(A), and near-flat up-facing skin fill (NFUF) vectors 314(A). The rest of the cross-sections 310(B), 310(C), 310(D), and 310(E),. are made up of the same vector types (the cross-sections also contain LB and LH vectors, but this is being de-emphasized for the purposes of explanation).

It should be emphasized that the vectors for each of the cross-sections 310(A)–310(E) will not be drawn at the same time. This is because these vectors will be associated with different cross-sections. Instead, the vectors will be drawn in the following order: 310(E), 310(D), 310(C), 310(B), and 310(A).

Near-flat down-facing skin boundary (NFDB) and near-flat down-facing skin fill (NFDF) vectors are analogous to NFUB and NFUF vectors, respectively, except that they pertain to down-facing areas instead of up-facing areas.

It turns out that skin vectors, besides their close spacing, have another difference with the hatch and boundary vectors. In the usual instance, the laser beam will expose the area of a hatch or boundary area sufficiently to create a cure depth of approximately 26 mil. This corresponds to dividing up an object into 20 mil cross-sections, and curing the layers so that they cure 6 mils into each other. The 6 mil curing results in the cross-sections being adhered to one another, and the vectors at which this adherence occurs are the hatch and boundary vectors from adjacent cross-sections.

The skin vectors, however, are in the usual instance, cured to a much lower depth, typically 5–20 mils. This is because the laser head is directed to move much faster over the areas represented by the skin vectors. As a result, there will be less cure depth. Different cure depths are possible because, cure depth is based on a quantity of light being absorbed and therefore the beam being attenuated as the light penetrates deeper into the resin. At some point the quantity of light becomes too low to initiate sufficient polymerization to convert the resin from its liquid state to a state of gelled plastic. This quantity of light is considered the critical exposure. Below the level of critical exposure, solid material is not formed thereby limiting the cure depth obtained from a given exposure of light. Exposure is proportional to the intensity of the beam and is inversely proportional to the velocity of travel of the beam. The reason skin vectors are given much lower exposure than hatch and boundary is because skin vectors (and therefore plastic created by them) are not required for adhering layers together.

Near-flat down-facing areas are represented by border vectors which surround skin vectors. Near-flat down-facing hatch vectors (NFDH) span near-flat down-facing skin boundaries analogous to LB and LH. Use of STYLE 1 requires creation of near-flat down-facing cross-hatch vectors, because near-flat down-facing fill is the only type that does not have any layer hatch to support it. Since skin is made relatively weak, it requires support to give it strength. NFDH is also required to give the near-flat down-facing skin area the proper depth (and uniformity) thereby securing proper dimensioning of the part.

The above completes the description of the various vector types in the current embodiment of the system. Other vectors types are, however, possible.

SLICE (UI) enables a user to specify the parameters indicated in FIG. 44(A). As indicated, the following parameters can be varied:

Resolution

Layer thickness

X hatch spacing

Y hatch spacing

60/120 degree hatch spacing

X skin fill spacing

Y skin fill spacing

Minimum surface angle (MSA)

Minimum intersect angle (MIA)

Other parameters can also be specified but are not shown in the interface menu. The most important of these parameters are 1) the specification of which axis is to be considered the SLICE axis, in other words the vertical axis for part building, -X, -Y, -Z are the options with Z being the default axis. The other two axes form the layers XY, XZ, YZ, and 2) the specification as to what the effective beam width is and therefore what the ½ beam width is for beam width compensation.

The resolution is used to translate between the units used by the user on the CAD computer, in which units the Object.STL file is defined, and the units used by the SLICE and PROCESS computers to create the vector data. In FIG. 40, for example, assuming the unit of measurement on the CAD system is inches, the specified resolution of 1000 indicates that 1000 SLICE units corresponds to one CAD unit. In other words, the SLICE unit is 1 mil.

The layer thickness is the thickness between successive cross-sections in the created part. This parameter is used to lower the elevator appropriately at successive stages of the curing process. Note that the cure depth need not correspond to the layer thickness. In fact, as indicated earlier, the cure depth can be 26 mils with a layer thickness of 20 mil, and a layer overlap of 6 mils. The layer thickness need not be the same for an entire part but can vary from layer to layer.

As indicated in the body of the application, hatch vectors can be oriented in the X-direction, the Y-direction, or both, and along lines at 60 degrees to the X-axis and along lines at 120 degrees to the X-axis (60/120 degree). The X hatch spacing, the Y hatch spacing, and the 60/120 degree hatch spacing specify the spacing between these vectors. In the example of FIG. 40, the X, Y, and 60/120 degree hatch spacing respectively is 40, 40 and 0 mils, indicating that X and Y hatching is turned on, while 60/120 degree hatching is turned off.

Note that SLICE first creates the border vectors for a particular cross-section, and then generates the hatch or skin vectors to define the interior of the cross-section. The border vectors are created from the surface triangles used to define the surface of the object and their intersection with the particular cross-section being analyzed by SLICE. The hatch vectors are then created, one row at a time, which rows begin and end at a border vector spanning a cross-section. The hatch spacing values are used by SLICE in the process of generating the hatch vectors to successively space one row of hatch vectors from an adjacent row.

Skin vectors can be created in either the X or the Y direction. Simultaneous X and Y skin vectors, and 60/120 degree skin vectors are not generally used because of the distortion which results. A major source of distortion is due to the shrink that occurs when a vector is being drawn (fresh plastic being formed) which at the same time is attaching to already partially polymerized plastic. This is an especially dominant mode of distortion when long vectors are created adjacent to or on top of already existing long lines of plastic. The amount of shrink is proportional to the amount of polymerization, so at this stage, the greater the amount of polymerization that occurs on a layer the greater the shrink and the greater the likelihood of distortion. Therefore, if an entire layer is skinned by one type of vector then passed over again a second time for additional curing, the entire second pass is bonding newly created plastic to previously created plastic which can result in a great deal of distortion. However, it should also be noted that proper application of multiple passes on a single level whose net result is the desired cure depth can lead to less distortion under appropriate circumstances. Additionally the second skin type is generally not needed because the first skin entirely surfaces the part anyway. The X and Y skin fill spacing defines the spacing between the X and Y vectors respectively. As with the hatch vectors, these parameters are used by SLICE to generate the skin vectors from the border vectors.

As described in the body of the application, the MSA parameter is read by SLICE to detect the presence of a near-flat area, and the MIA parameter is also used by SLICE to generate hatch vectors which are as close as possible to being perpendicular to the border vectors, a requirement in some cases for lower distortion.

The correct MSA depends on the layer thickness chosen. The correct MSA for different layer thicknesses is as follows:

| Layer thickness | MSA |
| --- | --- |
| 5 mils | 40 |
| 10 mils | 50 |
| 15 mils | 55 |
| 20 mils | 60 |

The MSA values versus layer thickness in the above table are only general recommendations. The above table is giving reasonable values for MSA based on the need to entirely surface the object as it is being created, along with assumptions about beam focus. In this sense the required MSA is machine dependent (being based on beam cure depth to cure width comparisons). There is an additional consideration in selecting MSA that is not considered in this table. Down-facing near-flat skin vectors are required to create not only good surfaces but also to form a portion of the part's superstructure. When this superstructure consideration is made, the MSA for all layer thicknesses approaches 90 degrees regardless of beam cure properties. The output of SLICE 3.20 is placed in the Object.SLI file. The Object.SLI file will consist of data describing the vectors associated with each cross-section. As indicated earlier, there are 11 different vector types, so that for each cross-section, there can in general be 11 different groups of data which correspond to the different vector types.

FIG. 44(B) illustrates the format of the Object.SLI file. As indicated, the file is organized by a value of "L", which value represents a particular cross section. For each cross section, and for each vector type, the file contains the endpoints of vectors of that vector type. An example from FIG. 44 is shown below:

| L | 740 | | | |
| --- | --- | --- | --- | --- |
| LB | 250 | 8750 | 8750 | 8750 |
| | 8750 | 8750 | 8750 | 250 |
| | 8750 | 250 | 250 | 250 |
| | 250 | 250 | 250 | 8750 |

This example indicates that for a cross section 740 mils above an origin, the laser beam will draw 4 layer border vectors having the following endpoints:

| (250, 8750) | (8750, 8750) |
| --- | --- |
| (8750, 8750) | (8750, 250) |
| (8750, 250) | (250, 250) |
| (250, 250) | (250, 8750) |

In other words, the laser beam will be directed to draw a box.

In summary, the output of SLICE is a file containing vectors for use in directing the laser beam to traverse the surface of a liquid polymer to cure a cross-section of an object, and the vectors in the output file are organized according to the cross-sections to which they pertain.

MERGE

The MERGE program merges Object.SLI files from one or more objects. This program enables different Object.STL files to be converted to vector data (i.e., "SLICED") independently of one another, and then merged before the laser is directed to traverse the vectors on the surface of the photopolymer. This enables the different STL files to be converted using different parameters for each. In addition, because of limitations in the CAD system, it may be necessary to divide up a single object into many different subsections, convert each independently, and then merge them to recreate the single part.

Finally, a user may wish to create STL files for objects that overlap in space, such as a teacup, and the handle of the teacup, which handle is partially embedded in the surface of the teacup. If the files were merged before SLICE, a fundamental requirement for STL files will be broken: this is the requirement that the triangle of an STL file completely surface an object. If this file were merged, some of the triangles would be inside the object.

MERGE creates the Object.V file, which contains the vectors from all the merged OBJECT.SLI files.

Object.V is first organized by cross-section, and within a cross-section, the file is organized by object, and within an object, the file is organized by vector type. For each cross-section, object, and vector type combination, the file lists the endpoints of all the vectors of that type.

The format of Object.V is illustrated in FIG. 45. This file only contains the vectors for a single object. As indicated, the format is identical as that in FIG. 44, except that the vector types have a "1" appended to them indicating they correspond to the first (and only) object. If other objects were involved, the file would contain a listing of all the vector types by cross-section associated with the second object, which vector types will be placed after all the vector types associated with the first object.

MERGE also creates the Object.L and Object.R files, which are used to control, for each cross section, the speed with which the vectors are drawn, and manner in which the elevator dips the cross-sections into the liquid photopolymer after it has been cured in preparation for curing the next cross-section. Either the Object.L file, or the Object.R file, but not both, can be used to control these parameters.

The Object.L file enables a user to specify different curing parameters for each object, cross-section, vector type combination on a cross-section by cross-section basis. In addition, a user can specify different dipping parameters for a particular cross-section. Therefore, by way of example, for a merged file of 4 objects, with 11 vector types, the object.L file enables a user to specify 44 different cure parameters for a given cross-section, and different dipping parameters for each cross-section. In other words, object.L provides layer by layer control of the curing process.

The Object.R file is designed for those applications where the flexibility allowed by Object.L is not needed. Object.R, instead of providing layer by layer control, provides control on a range by range basis, where a range is defined as any number of cross-sections. (A cross-section is the same as a layer.)

The primary dipping parameters which can be specified in the object.L file or (other parameters can exist for specialized equipment the Object.R file is as follows:

| Parameter | Interpretation |
|---|---|
| ZA | Acceleration |
| ZV | Maximum velocity |
| ZW | Wait |
| ZD | Distance |

These parameters are used to control the elevator after a particular cross-section is cured. ZA is the amount by which the PROCESS computer causes the elevator to accelerate, and ZV is the maximum velocity which the elevator will be allowed to achieve. It will maintain this velocity until the software determines that it is time to begin deceleration resulting in the elevator coming to rest at the desired position. ZA is specified in terms of rev/sec , and ZV is specified in terms of rev/sec. Since a 5 pitch elevator is used, and 5 revolutions=1 inch, these numbers can be converted to more traditional values of inch/sec$^2$ or inches/sec. These values are sent by the PROCESS computer to the stepper motor which controls the elevator.

ZD is specified in millimeters, and specifies the distance the elevator is caused to initially dip into the photopolymer. This value will be much greater than the layer thickness, which is typically specified in terms Of mils. After the initial dipping, the elevator will be directed to move back up so that the surface of the cured photopolymer on the elevator will be 1 layer thickness below the surface of the photopolymer.

The value ZW is specified in seconds, and is the amount by which the PROCESS computer waits (including the time required to dip down and up) before beginning the curing process for the layer. The value should be chosen to be sufficient to allow excess liquid photopolymer to run off through a process known as gravity leveling.

The most important curing parameters are as follows:

| Parameter | Interpretation |
|---|---|
| SP | Step period |
| SS | Step size |
| JD | Jump delay |

The value of SP will be defined in units of 10 microseconds, and is the amount of time the PROCESS computer causes the laser beam to wait after it has traversed a certain step size. The value of SS is in terms of angular movement of the dynamic mirrors, and represents the smallest increment of radial movement of the dynamic mirrors, and hence the smallest step increment of the laser beam on the surface of the photopolymer.

The unit of radial movement of the mirrors is defined in terms of bits, where 3556 bits represents movement of 1 inch. As a result, 1 bit represents approximately 0.3 mils of movement (near the center of the drawing field). In addition, the dynamic mirrors are each capable of movement up to 64K bits, so that together, the mirrors can cause the laser beam to traverse a two-dimensional area of 64K×64K bits, which corresponds to a 400 angular displacement along each axis.

The value of SP represents the time it takes for the laser to first traverse the step defined by SS, plus the time the beam is directed to wait after traversing the step. In general, the travel time is very small, and the wait time will dominate.

The value of JD represents the amount by which the laser beam is directed to remain at the tail of a vector it has just jumped to.

Object.L and Object.R will be discussed further following a description of the program PREPARE.

PREPARE

PREPARE is a user interface which helps a user specify the cure and dipping parameters for the Object.R file. To specify parameters in the object.L file, a standard word processor type line editor is used.

As indicated in FIG. 33, PREPARE takes as input the MATERIAL.LST, MATERIAL.MAT, POWER.LST, PREPARE.PRM, BUILD.PRM Object.L, and Object.R files.

A material file (indicated as MATERIAL.MAT in FIG. 33) is a file that, for a given photopolymer, contains sample data relating the laser power and cure depth (and cure width) to various Ss and SP values. It is a crucial file used in translating desired cure depth values into SP and SS values.

The MATERIAL.LST file specifies the last material file used. The material file, MATERIAL.MAT, contains data obtained from measurements of a cured polymer structure known as a banjotop. The banjotop is both machine and resin dependent. Eventually the material file will contain only information about a particular resin, whereas the machine dependent variable values will be obtained from beam profile measurements.

Figure 46:
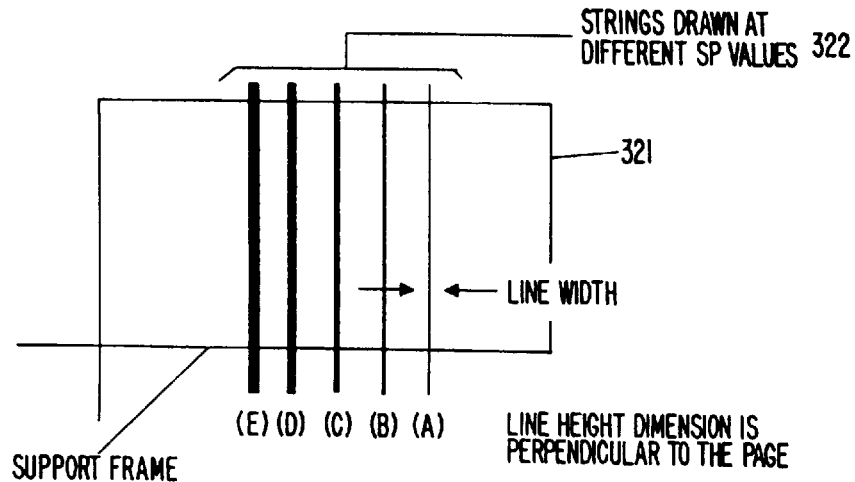
FIG. 46 illustrates a banjotop.

The banjotop is a 1 layer thick plastic part with 5 lines of different exposures running across a support frame, as illustrated in FIG. 46. As indicated in the figure, banjotop 321 has 5 lines, 322(A)–(E), running across its face. Each line represents cured polymer obtained by running the laser over the face of the banjotop at a given velocity (which is proportional to exposure). Moving from right to left, each line is given double the exposure of the previous line.

The purpose of the banjotop is to provide empirical measurements of the relationship between exposure and cure depth. Because the liquid photopolymer must absorb ultraviolet light during the curing process, cure depth will be logarithmical related to exposure. That is, if the exposure is multiplied by the factor X, the cure depth will increase by much less than a factor of X. Instead, the cure depth will increase logarithmical.

With the banjotop, each line is obtained by doubling the exposure given to the previous line. According to the logarithmic relationship, however, the cure depth should increase additionally by the same incremental value from layer to layer. In other words, the increment in cure depth from one successive line to the next should be the same.

In FIG. 46, for example, banjotop 321 has five strings 322 drawn across it at different exposures. The exposure applied to string 322(B) is twice that applied to string 322(A), the exposure applied to string 322(C) is twice that applied to string 322(B), the exposure applied to string 322(D) is twice that applied to string 322(C), and the exposure applied to string 322(E) is twice that applied to string 322(D).

It turns out, however, that the cure depth between strings 322 does not maintain the same relationship as the exposure between strings. Instead, the cure depth varies by approximately four to six mils from one string to-the next. In other words, the change in cure depth of string 322(B) compared to string 322(A), of string 322(C) compared to string 322 (B), of string 322(D) compared to 322(C), of string 322(E) compared with string 322(D) are all approximately four to six mils. As mentioned earlier, the relationship is logarithmic, and a plot of log (exposure) vs. cure depth should yield a straight line. This is illustrated by curve 323 in FIG. 47.

Figure 47:
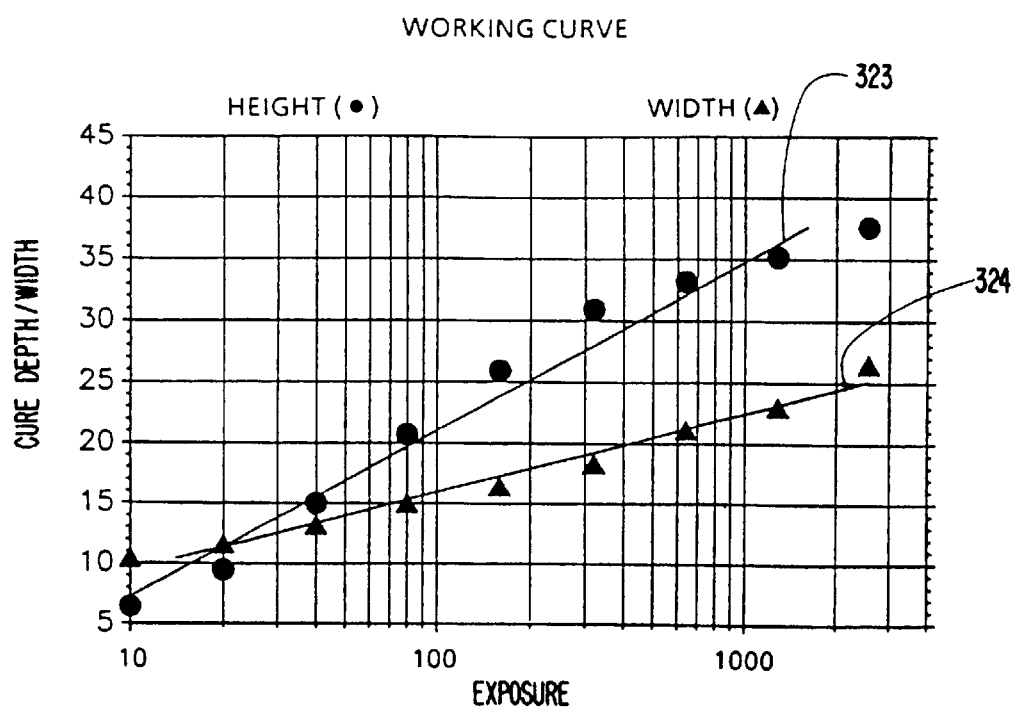
FIG. 47 illustrates a working curve.

For convenience in some circumstances, cure width can be plotted as a function of log (exposure) and a useful relationship observed, as illustrated by curve 324 in FIG. 47. However this relationship can be misleading since it is not based on exponential attenuation of the beam as is true with cure depth. Cure width is primarily based on beam profile.

The purpose of PREPARE is to enable a user to specify values of SS and SP that can be used in order to achieve a particular cure depth when building a part. Laser exposure is related to SS and SP as follows: for a given stereolithography machine and beam focus $$\frac{\text{laser Power (mW)} \times SP}{SS}$$

For a different machine or beam focus, the degree of proportionality may change.

Figure 48:
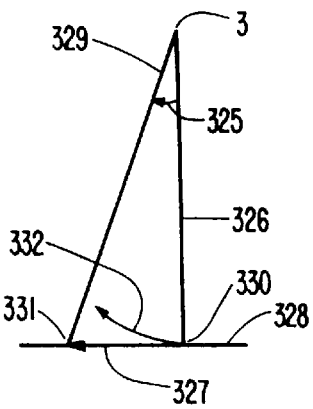
FIG. 48 illustrates the relationship between radial mirror movement and linear movement along a flat surface.

As indicated earlier, SS is an angular movement of the dynamic mirrors. The relationship between SS and the movement of the laser beam across the surface of the liquid photopolymer is illustrated in FIG. 48. As shown in the Figure, dynamic mirrors 3 direct laser beam 326 to move to the position indicated as 329. It is assumed that the laser beam at position 326 is perpendicular to the surface of the photopolymer. The radial movement of the mirrors, indicated at 325 in the figure, is measured in terms of bits, and is the SS referenced to above. The radial movement of the laser beam causes the location at which the beam strikes the surface of photopolymer 328 to change. In the Figure, the beam originally strikes location 330 on the surface of the photopolymer, and is caused to move to location 331 by the radial movement of the mirrors. The distance travelled by the laser beam, indicated as 327 in the figure is related to the radial distance 325 as follows: distance 327 is approximately equal to radial distance 325 (measured in radians) multiplied by distance 326. The relationship is however only approximate.

This is because distance 326 multiplied by angular distance 325 actually measures the angular distance 332 which is travelled by the laser beam, not the linear distance 327. It turns out, however, that the two distances will be approximately the same when the perpendicular distance 326 between the dynamic mirrors and the surface of the photopolymer is large. In the particular embodiment described herein, the value of distance 326 is 27 inches.

As mentioned earlier, the value of SS for either the X or the Y dynamic mirrors can range from 0 to 64K bits. This also represents an angular movement of 0 to 40 degrees. As mentioned earlier, the working curve provides the ability for a user to determine what value of laser exposure will achieve a given cure depth or width. The other purpose of PREPARE is to provide the ability for the user to translate between the value of laser exposure required to achieve a certain cure depth and values of SS and SP, which values will be placed into the Object.R file.

The working curve described above, and the relationship between laser exposure and Ss and SP is highly dependent on a particular machine, and beam focus. If either one of these changes, the relationship and working curve may change, and it may be necessary to obtain another working curve from a banjotop cured using the new machine or beam focus. In this instance, measurements from the new banjotop will be placed in another MATERIAL.MAT file, and the MATERIAL.LST file updated if appropriate with the name of the new MATERIAL.MAT file.

The working curve is also highly dependent on the particular beam focus, beam profile, and machine. The beam focus is determinative of the beam spot size, and depends on the optics 2 used (see FIG. 8).

In general, the optics focus the beam to a width of between 7–20 mil at $1/e^2$ power level. The beam profile is highly dependent on the particular modes produced by the laser 1. As is known, the TEMP mode is relatively gaussian, having no nodes or zeroes across its face, while other nodes, such as the $TEK_{10}$ mode, will have nodes or zeroes running across their face. Advantageously, the laser is multi-mode, since it will be too wasteful of input power to try to discriminate between modes. If the optics or the laser is changed, however, the working curve may have to be recalculated.

Finally, the working curve is highly dependent on the particular photopolymer used. If this changes, the working curve will have to be recalculated.

In the particular embodiment described herein, the value of SS for hatch and boundary vectors is advantageously 2, (approximately 0.6 mil) and for fill vectors, the value of SS is advantageously 16 (approximately 4.8 mil).

Figure 49:
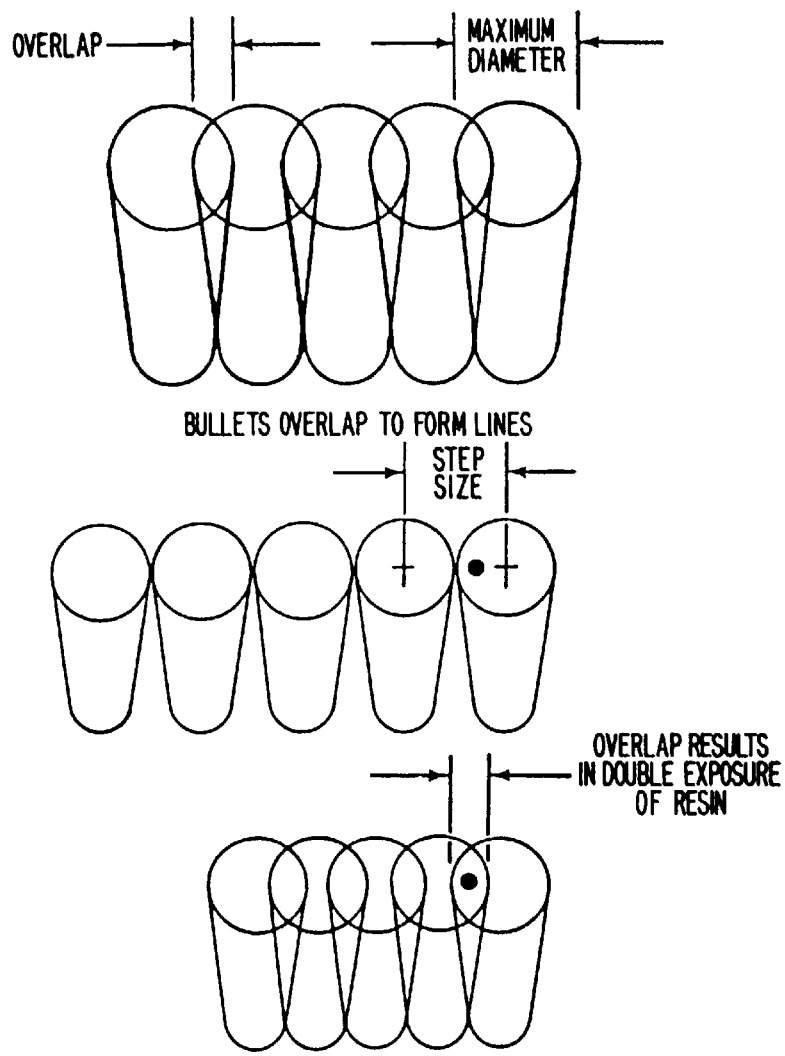
FIG. 49 illustrates the overlapping of bullets.

A value of 2 for SS corresponds to a step size of approximately 0.6 mil. As discussed earlier, the pattern of curing of the photopolymer will resemble a series of partially overlapping bullets. This is indicated in FIG. 49. Since the beam diameter is approximately 7–20 mils, there will be a substantial overlap in the bullets formed during the curing process. In general, the larger the value of SS, the less overlap, and the more lumpy a cured line will appear. If a less lumpy line is desired, a smaller value of SS should be chosen.

Therefore, with the value of SS determined primarily by the vector type, the working curve will be used to translate between the desired cure depth and the value of SP. The embodiment described herein allows a value of SP between 10 and approximately 4,000.

Since SP is the most important parameter to be determined by the working curve, it is advantageous to use the banjotop to create a working curve that directly translates between SP and cure depth. This is the approach adopted in the particular embodiment described herein. Two banjotops are created, each having an SS of 2, and each having 5 lines associated with different values of SP. One banjotop is typically made with values of SP of 2560, 1280, 640, 320, and 160, and the second with values of SP of 160, 80, 40, 20, and 10. After the banjotops are created, the cure depths are measured, and the resulting data placed into a MATERIAL.MAT file. If the beam focus or shape, or material, or laser power, or stereolithography machine is changed, new banjotops must be created, and new working curves defined.

PREPARE also makes use of the POWER.LST file, indicated as 205 in FIG. 33, which is used by PREPARE as the default laser power, since it was the last laser power used to recalibrate the working curves if a change in the laser output power associated with the stereolithography system is detected.

A HeCd laser is advantageously used in the embodiment described herein, which is specified as having an average 20 mW output power with a 2000 hours life. In practice, the output power may drop 1 mW per week, until after several months, the laser is at 10 mW, where it may remain for a time. After a time, the laser power will start to drop again. In many cases, the laser power can drop rapidly at first, i.e., from 25 to 20 mW in a couple of weeks.

The working curves will depend on the particular laser output power of the laser used to create the banjotops, and they must be recalibrated if the laser power changes. One way to recalibrate the working curves is to build a new banjotop every time a new part is to be made. This is inconvenient, and it has been found that it will be acceptable to simply measure the laser power every time a part is to be created, compare this with the laser power used to create the working curve, and then based on this comparison, recalibrate the working curve for any drop in laser power. This recalibration will be successful as long as the focus of the laser beam has not been changed. In practice, working curves are not recalibrated because they define legitimate relationships between cure depth and exposure, but the parameters to maintain a given exposure level are recalibrated due to a drop in laser power.

One problem that may occur is that the modes of the laser may change as it drops in power. In practice, however, it has been found that the recalibration based solely on laser power will still be reasonably successful as long as the laser power has been the only parameter changed. This will be the case even if the laser modes have changed. The POWER.LST file contains the last laser power value used. When a part is to be built, a new laser power is entered into PREPARE. This new laser power updates POWER.LST, and it is used along with a specific MATERIAL.MAT file to make determinations about required SPs for particular cure depths.

PREPARE.PRM and BUILD.PRM contain a number of default parameters. The main default parameters obtained a presently from PREPARE.PRM are the SS values for the hatch and boundary vectors on the one hand, and the SS values for the skin vectors on the other. PREPARE will obtain default values for various other parameters from the PREPARE.PRM file also.

BUILD-PRM contains a large number of default parameters used in the process of building parts. These parameters include a scaling factor to convert an object from SLICE units to mirror units that will allow the part to be produced with the desired size, offsetting parameters that will allow the object to be shifted from its original slice position to a mirror bit position, which will allow it to be built at a desired location on the elevator platform. BUILD.P.RM can conceptually be looked at as being made up of 2 parameter files for the latest versions of software (3.2 and newer). The first file is still called BUILD.PRM with the second file taking on the name of the object to built (OBJECT.PRM). The latest version of PREPARE (reads in the Object.PRM file if it exists), if not, it will read in the BUILD.PRM file, when changes are made they are made to the Object.PRM file. Older versions of prepare read and write to the BUILD.PRM file. PREPARE is capable of assisting the user in modifying the several parameters in BUILD.PRM mentioned above, along with a few others. Additional parameters in BUILD.PRM include laser control parameters for each vector block type and for each object along with a single set of dipping parameters for the part. But these values cannot be changed by PREPARE but instead by a standard word processor type or line type editor.

In summary, PREPARE enables a user to specify various cure and dipping parameters, will help compute the associated SS and SP values used to achieve a particular curing depth and width, range by range, will use new laser power A-D working curves to compute the new cure parameter and then write the curing parameters into appropriate parts of the object.R file, and also allows editing of the Object.R file to change defaults and dipping parameters.

FIG. 50(A) is a report produced by PREPARE showing the use of PREPARE to specify different curing parameters, i.e. cure depth or SP, etc. for each block type Wmin and Wmax on different cure sections. As indicated, two ranges are present. Range 1 consists of two 20 mil cross-sections, and Range 2 consists of thirteen 20 mil cross-sections. The curing parameters that can be specified for each range are cure depth or Sp. Wmin and Wmax as seen in the Figure are respectively the width at 6 mils from the bottom of the a string with the displayed cure depth and the width at the top of a string with the displayed cure depth. wmin and Wmax are shown for convenience only, specific editing capabilities for these parameters do not exist. It will be important for a user to specify values of Wmax and Wmin in those ranges or layers having near flat surfaces, since, as indicated in FIG. 26(*b*), the calculation of the MSA used to detect the presence of near-flat surfaces depends on Wmin and Wmax. PREPARE does not assist one in determining MSA other than acting as a display for Wmin and Wmax. It must be remembered that specification of MSA is done before slicing but the information in PREPARE can be useful for future slices.

Cure widths are also important to specify in ranges and layers having skinned surfaces. This is because the spacing between skin vectors is advantageously 1–4 mils (while the spacing between hatch vectors is advantageously 30–100 mils), and depending on the beam width, there will be a substantial bit of overlap between adjacent skin vectors, which will affect the cure depth. With a cure width of 8 mils, for example, and a spacing of 4 mils, the laser will cure a given area twice. In other words, cure depth will be dependent on cure width in areas of closely spaced skin vectors. The cure depths and related SPS displayed in PREPARE do not consider overlap of vectors or changes in SS but these things can be dealt with manually as long as access to the needed information is displayed by PREPARE.

FIG. 50(B) shows the contents of a MATERIAL.MAT file, as interpreted-and displayed by PREPARE. As indicated, the file contains 5 data pairs corresponding to the 5 strings on a banjotop, with each pair consisting of a value of SP, and a value of LH (which stands for line height, and which is the same as cure depth). Also indicated is SLOPE, Y-intercept (LH), and closeness of fit data derived from a least squares fit of the data to the equation.

$$LH=SLOPE*LOG_{10} (Exposure)+(Intercept)$$

where exposure=(SP)

FIG. 50(C) shows the contents of Object.R after it has been written into by PREPARE with various curing parameters. As indicated, all LB and LH vectors in the first range are to be drawn with an SS of 2. and an SP of 212. All LB and LH vectors in the second range are to be drawn with an SS of 2, and an SP of 58. The cure depth associated with these values of SP are respectively 35 mils and 26 mils, which can be determined by the use of the data specified in the displayed MATERIAL.MAT file, and the current laser power.

Finally, for the sake of completeness, FIG. 50(D) shows the format of a portion of the Object.L file. The Object-L file is similar to the Object.R file, but it provides layer by layer control instead of range by range control. For each layer, object, and vector type combination, Object.L enables a user to specify different curing parameters. Therefore, for each such combination, object.L provides for the entry of curing parameters for that combination.

BUILD

The function of BUILD is primarily to take the vectors and control file and to check to see if any additional parameters necessary to build a part are required to be added and then it sends out the commands at appropriate times in order to build a part. BUILD will add the necessary parameters from a default file of parameters.

As indicated in FIG. 33, BUILD combines data from the BUILD-PRM, Object.L or Object.R and Object.V files. For a given layer, object, and vector type combination, BUILD will check for necessary building parameters (such as curing parameters) in first the Object.R or Object.L files, and if not present, in the BUILD.PRM file. The last check will be in Object.PRM then BUILD.PRM if BUILD version 3.20 or above.

In general, BUILD.PRM enables a user to set default values for dipping parameters, part offset parameters, and part scaling-parameters, along with part cure parameters.

The dipping parameters, ZA, ZV, ZD, and ZW, have already been explained.

The scaling parameters are as follows. The vectors in Object.V are defined in SLICE units, which depend on the CAD units and the desired resolution. For a CAD unit of one inch, and a resolution of 1000 for example, a SLICE unit will be 0.001 inches or 1 mil.

BUILD must convert the vectors into radial units for use in directing the dynamic mirrors to rotate a particular radial distance. As indicated earlier, the radial units used to control the dynamic mirrors are bits, where 3556 bits represent one inch of linear movement. Therefore, to make the conversion, BUILD must scale (that is multiply) all vectors by the scaling factor 3556/1000=3.556. It should be noted that slight errors in the scale factor (for a particular mirror to liquid distance) are automatically compensated for by geometric correction if the same scale factor is specified when building parts as was used when the system was calibrated.

BUILD must also develop commands from the above-described files for use in controlling the Z-stage elevator.

The Z-stage elevator commands must be expressed in terms of revolutions of a pitch screw. This is because the elevator is caused to move up or down a certain amount by means of revolutions of the pitch screw. For a five-pitch elevator as used in the embodiment described herein, five revolutions of the pitch screw is equal to one inch of movement of the elevator in the z-direction. The elevator pitch parameter is simply a relationship between moving the elevator a particular distance along with the motor and the screw pitch characteristics.

BUILD also allows default exposure, i.e. SS and SP, values to be specified for each object and vector type combination.

BUILD also enables the user to specify certain offset values (defined in bits) which will be added to the X and Y coordinates of the endpoints of each vector. These offsets can be used to position the part center so it matches the center of the elevator platform, for example. In addition, BUILD contains default values for the area (defined in bits) within the scan range of the mirrors, which is the outline of the vat containing the photopolymer, which outline can be less than the mirror range. As indicated earlier, the mirrors may range from 0 to 64K in either the X or the Y direction, while the vat containing the photopolymer may extend only from 16,384 to 49,152 bits.

BUILD also enables the user to control riveting and, multiply pass capabilities. Riveting is a technique whereby layer to layer adhesion is not required of cross hatch and boundary vectors. Layer to layer adhesion is achieved by means of curing the boundary and hatch to slightly less than layer thickness, i.e. 18 or 19 mils for a 20 mil layer, then giving extra cure to portions of cross hatch allowing these portions to bond the layers together. These portions of the hatch that are cured to the point of bonding are called rivets. Several commands exist to affect how rivets will be made. Additionally BUILD has commands that allow drawing of vectors and adhesion to be made by multiple passes over the same vector with the laser. This enables up to 7 passes to be made in order to achieve adhesion and final cure depth. Therefore adhesion doesn't need to be made between layers until the 2nd, 3rd or even 7th pass of the laser. This allows a large percentage of polymerization to occur before attachment to the previous layer thereby reducing distortion. This technique is called redraw and allows different exposure parameters on each pass and variable length of drawing before Redraw starts the next pass.

The format of BUILD.PRM is shown in FIG. 51. As indicated, the file maintains default values for the elevator pitch parameter, for scaling between millimeters and revolutions, the scale factor for scaling between SLICE units and mirror bits, the location and dimensions of the vat area in bits, and variable for controlling the riveting process, variables for controlling the redraw process, and standard cure parameters on a block by block, object by object basis.

STEREO

STEREO performs a geometrical correction to the vector data in order to correct for an effect known as the pincushion. STEREO also makes corrections for other errors such as drift, mirrors not orthogonal, mirror rotation not at surface, etc.

The pincushion effect can be explained with reference to FIG. 48. In correcting between SLICE units and bits (radial units used to drive the mirrors), a linear relationship was assumed. In other words, assuming a SLICE unit equals one mil, and assuming 3556 bits/inch all vector data is multiplied by the scale factor 3.556 by BUILD.

However, with reference to FIG. 48, the relationship between the mirror's radial movement, indicated by 325 in the Figure, and linear beam movement, indicated as 327 in the Figure, will not be linear, and will in fact be more and more nonlinear the more the laser beam is directed away from its perpendicular-position indicated by 326 in the Figure.

Figure 52A:
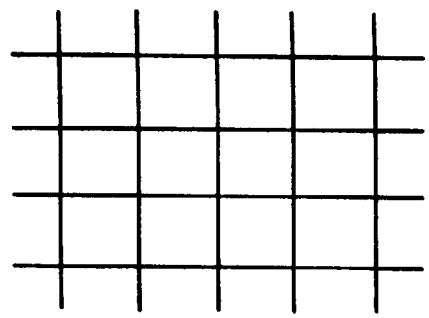
FIG. 52(A) illustrates an X-Y grid representing movement of the laser beam with no geometrical correction.
Figure 52B:
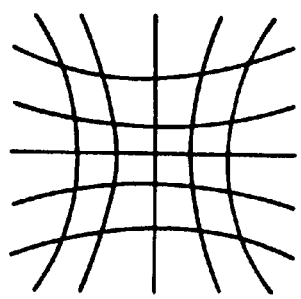
FIG. 52(B) illustrate the pincushion effect.

The assumed linear relationship will introduce a distortion into the curing of a cross-section called the pin cushion effect, which is illustrated in FIG. 52. If the mirrors are commanded to direct the laser beam to draw the pattern shown in FIG. 52(A), in reality, the laser beam, as it traverses the surface of the photopolymer, will traverse the pattern shown in FIG. 52(B).

STEREO provides a means for correcting for the pin cushion effect through the use of a calibration plate.

Figure 53:
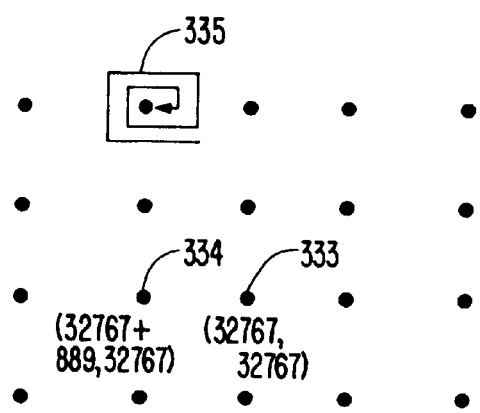
FIG. 53 illustrates a calibration plate.

The calibration plate is shown in FIG. 53. It consists of a metal plate with pinholes spread in a grid, which pinholes are spaced 1/4 11 from one another.

During a set up step, before a part is built, the calibration plate is placed below the laser beam at the exact location that the surface of the photopolymer would be at during curing. In addition, the beam is initially directed to shine straight down, and perpendicularly strike the surface of the calibration plate, and the calibration plate is placed so that the laser beam strikes and passes through the center pinhole on the surface of the calibration plate, indicated as 333 in FIG. 53. As indicated earlier, each mirror has a range of to 64K bits, so that the central location within the range for each mirror will be 32767 bits. Placed behind the calibration plate are sensing means for sensing the passage of laser light through a particular pinhole. The plate is also oriented so that the rows and columns of pinholes line up along the X and Y axes, as close as possible.

CALIBRATION operates as follows: After the passage of the laser light through pinhole 333 is detected, the beam is directed to move to the location indicated as 334 in FIG. 53.

Since this is 1/4 11 from location 333, which is 889 bits, the mirrors are directed to rotate 889 bits. However, as discussed earlier, the linear distance on the surface of the calibration plate will require less than 889 bits, of movement maybe 880 bits. Therefore, the laser light may not pass through the pinhole, and the calibration program causes the beam to move around in a spiral search pattern as indicated by 335 until the sensing means detects the passage of the laser light. The divergence between the expected and actual distance in bits at location 334 is then stored.

This process is then repeated for each of the pinholes on the calibration plate, to result in a table of divergences in both the X and Y directions associated with each of the pinholes. These values are then used by STEREO to make geometrical corrections to the vectors to correct for the pincushion effect. For example, a 1/4 11 vector pointing from 333 to 334 in FIG. 53 would be corrected by subtracting 19 bits from the X value associated with the endpoint at 334, thereby changing a 1/4 11 length from 889 bits to only 880 bits.

In general, to exactly correct for geometrical errors would require that every point besides just the endpoints on a vector be corrected. If only the endpoints on a vector are corrected, some geometrical distortion will remain.

Figure 54A:
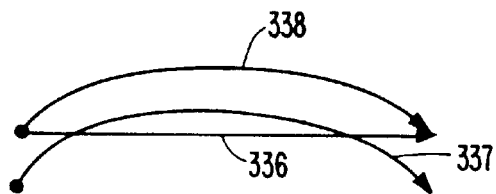
FIG. 54(A) illustrates that correcting only vector endpoints will not solve the pincushion effect.

This can be illustrated with respect to FIG. 54(A). As indicated in the Figure, when vector 336 is drawn by the system, it will actually be drawn as 337 on the surface of the polymer. If only the endpoints of the vector were corrected, the resulting vector would appear as 338. As indicated, this vector will still be distorted.

Figure 54B:
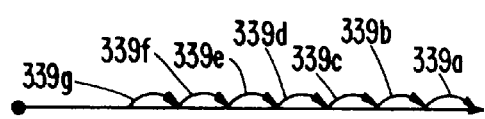
FIG. 54(B) illustrates breaking up and correcting the endpoints of microvectors.

However, to geometrically correct for every point in the interior of a vector would be time-consuming and probably unnecessary. It has been found, however, that a good compromise is to divide up each vector into small units called microvectors, and then geometrically correct the endpoints of each microvector. This is indicated in FIG. 54(B), which shows vector 336 divided up into microvectors indicated as 339(A)–339(G). The endpoints of each microvector are geometrically corrected, so that the placement of the corrected microvectors, as indicated in the Figure, will be a good approximation to the original vector. In the embodiment described herein, the microvectors are advantageously spaced at 512 bit increments (representing 256 steps of 2 mil increments) which represents spacing of approximately 1/8 inch.

Note that STEREO will incidentally correct for a number of other sources of distortion. These include distortion induced because the axis of rotation of the X and Y and mirrors are not directly at the surface of the mirrors, because the X and Y mirrors are not aligned exactly orthogonally to each other, and because of inherent absolute distortion in the mirrors. This last source of error can be explained with reference to FIG. 48. The error is that even though the mirrors are directed to move a certain radial distance, indicated by 325 in the figure, they will in reality move radically more or less than this amount. Other sources of error will be present and corrected by the data, obtained from calibration plate, an aspect of the calibration plate is that the source of the error is irrelevant.

LASER

LASER is the program that directly controls the dynamic mirrors by means of the mirror driver, indicated as DX in FIG. 33.

BASIC

In general, BASIC is a programming language. But here, we are concerned with running a BASIC program that generates vectors directly from equations describing the surface of an object, i.e. a cylinder, along with controlling the part building procedures as the BUILD program does. It creates a file called Object.DAT, which is a file of vectors that is sent out to be drawn.

CLIFF

CLIFF takes the Object.DAT file and puts it in the same format as BUILD puts the object.V file.

BEAM

BEAM is a program to measure the profile of the laser beam as it crosses a pinhole. In general, the pinhole is much smaller in diameter than the beam diameter, and BEAM causes the laser beam to sweep incrementally over the pinhole to build up the profile of the beam shape.

Figure 55:
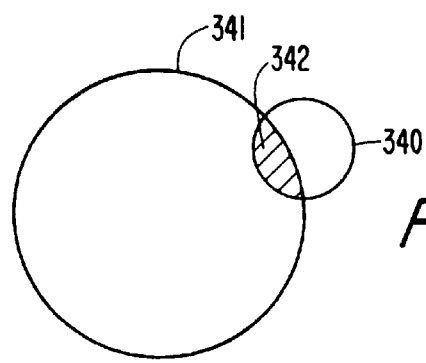
FIG. 55 illustrates sweeping a laser beam past a pinhole.
Figure 56:
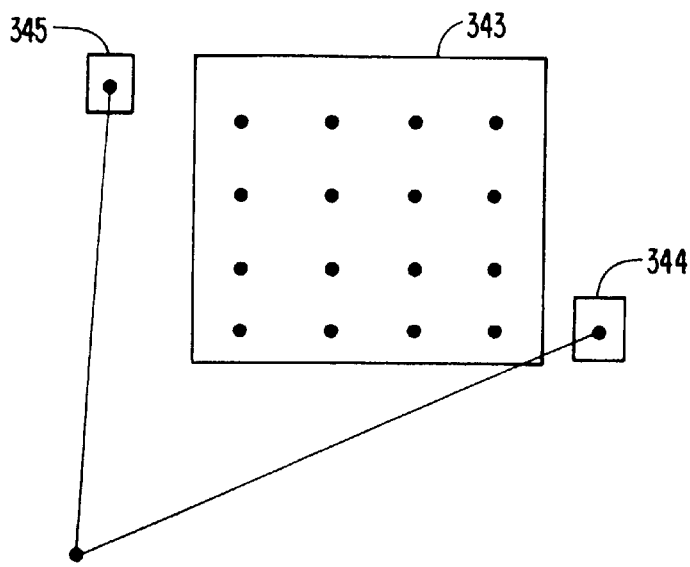
FIG. 56 illustrates the pinholes used for drift calibration.

As indicated in FIG. 55, beam 341 is caused to sweep over the pinhole 340 initially in the X-direction. At each increment, the intensity (power) of the beam is measured. After incrementing completely through the X-range the beam is stepped one increment in the Y-direction, and then re-incremented across the pinhole in the X-direction, and the intensity measured at each increment. This is repeated until the beam has been completely incremented in the Y-direction.

BEAM is an important program used to create the X-Y matrix used for geometrical correction by STEREO. There are two pinhole sensors located diagonally across the vat. BEAM will sweep the beam across the pinholes on either side of the vat to obtain an accurate location of pinholes this data consisting of Intensity values and associated X, Y coordinates. BEAM then takes the weighted average of the X and Y positions, weighted by the intensity numbers, to compute a weighted average beam location value, which precisely measures the location of the center of the beam.

This precise measurement is necessary to produce a precise X-Y table for drift correction.

Figure 57A:
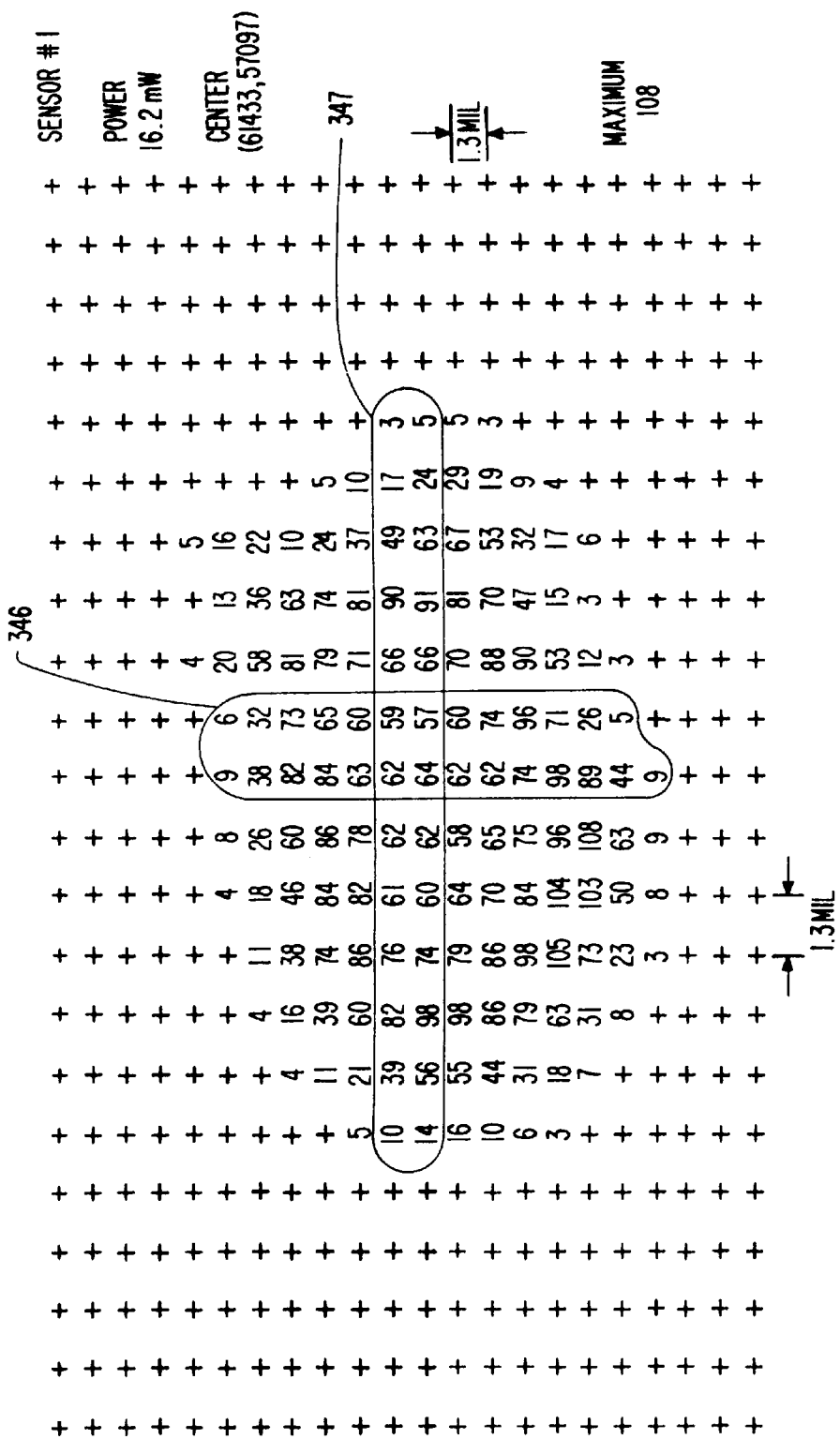
FIG. 57(A) illustrates a plot of a beam profile from the program BEAM.

FIG. 57(A) shows the beam profile obtained by sweeping the laser beam across a pinhole. As indicated in the Figure, an incremental intensity value is obtained for each X and Y location of the beam as it sweeps across the pinhole. These numbers are plotted in FIG. 57(A).

Figure 57B:
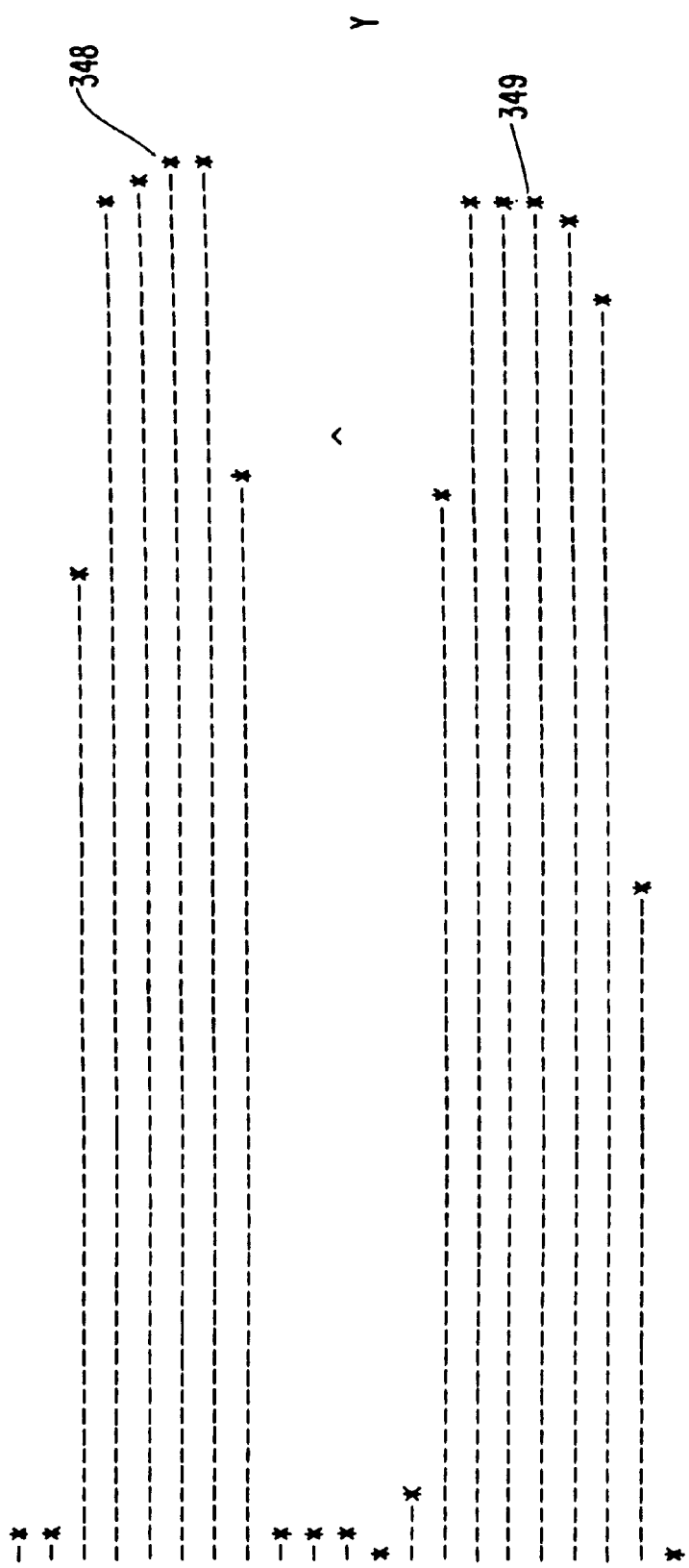
FIG. 57(B) illustrates a plot of beam width in the X and Y directions from the program BEAM.
Figure 58A:
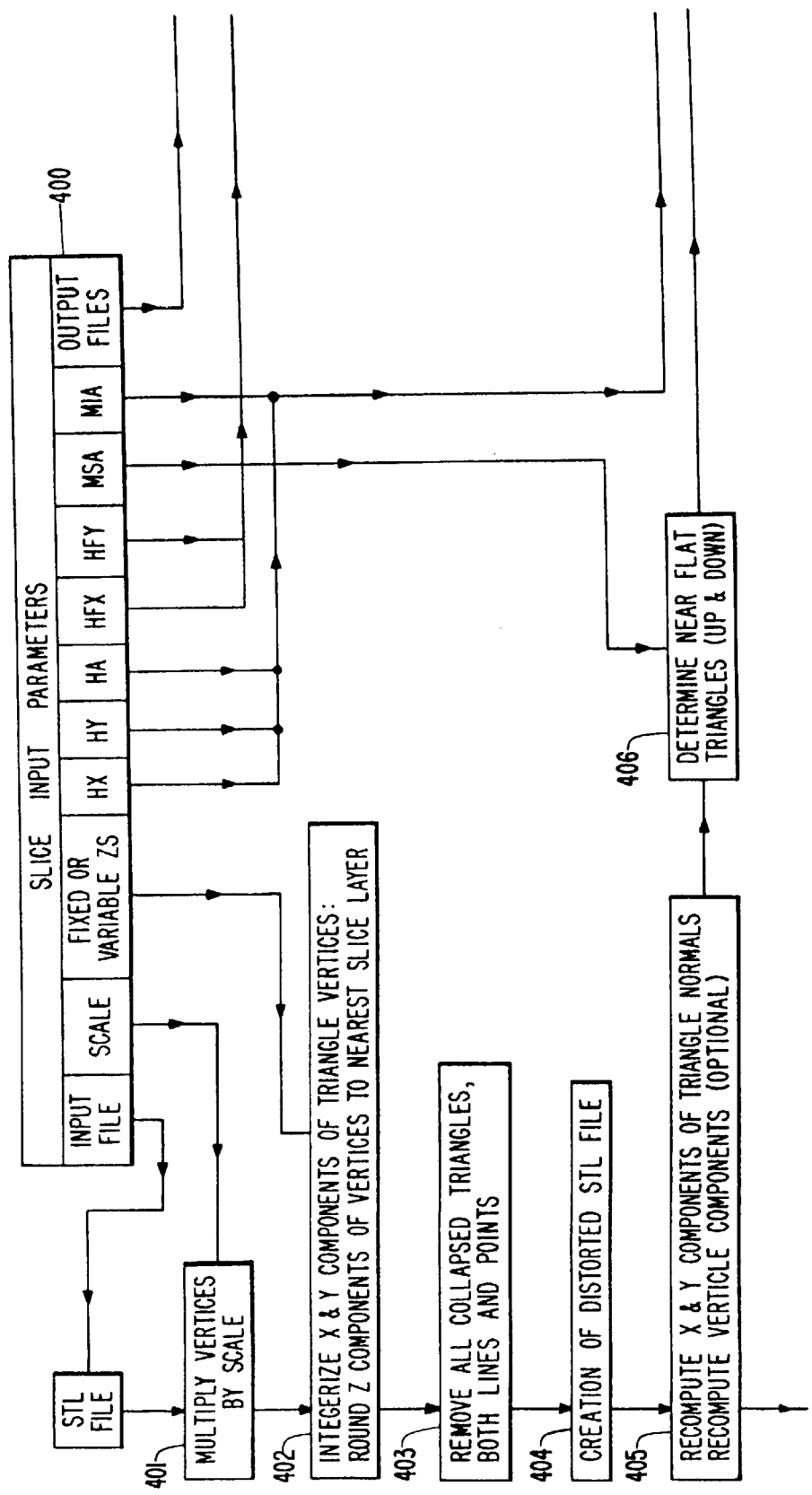
FIG. 58 is a flow chart of the SLICE STYLE algorithm.
Figure 58B:
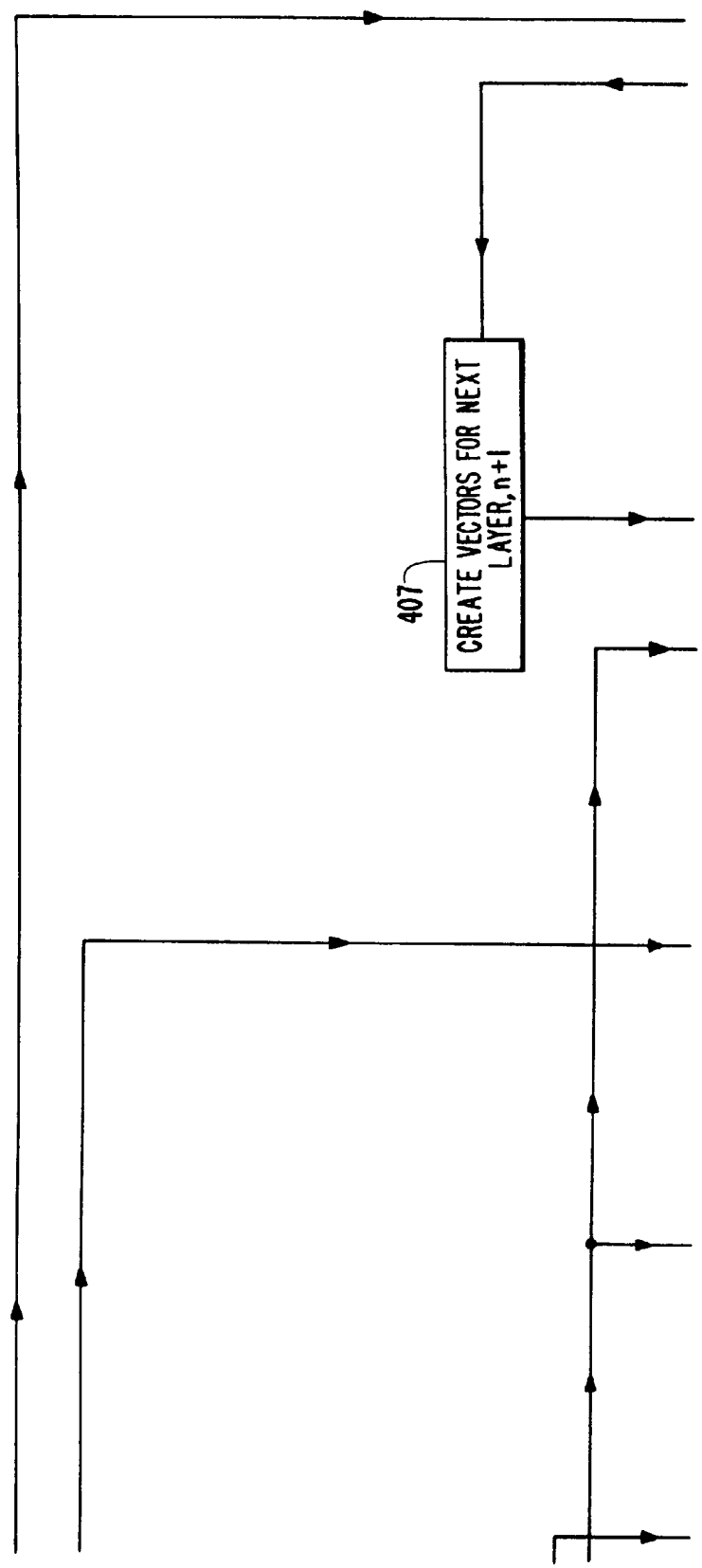
Figure 58C:
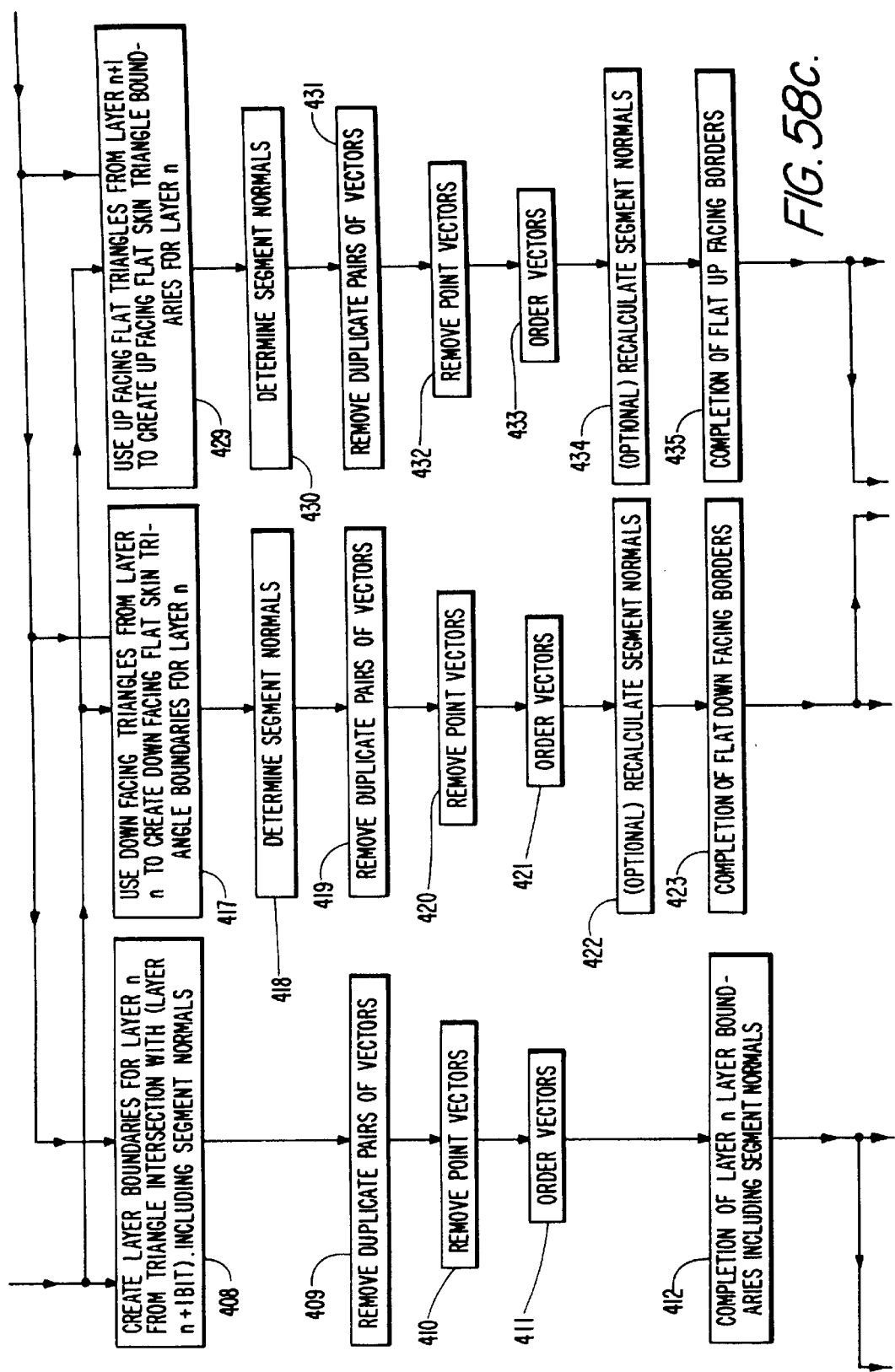
Figure 58E:
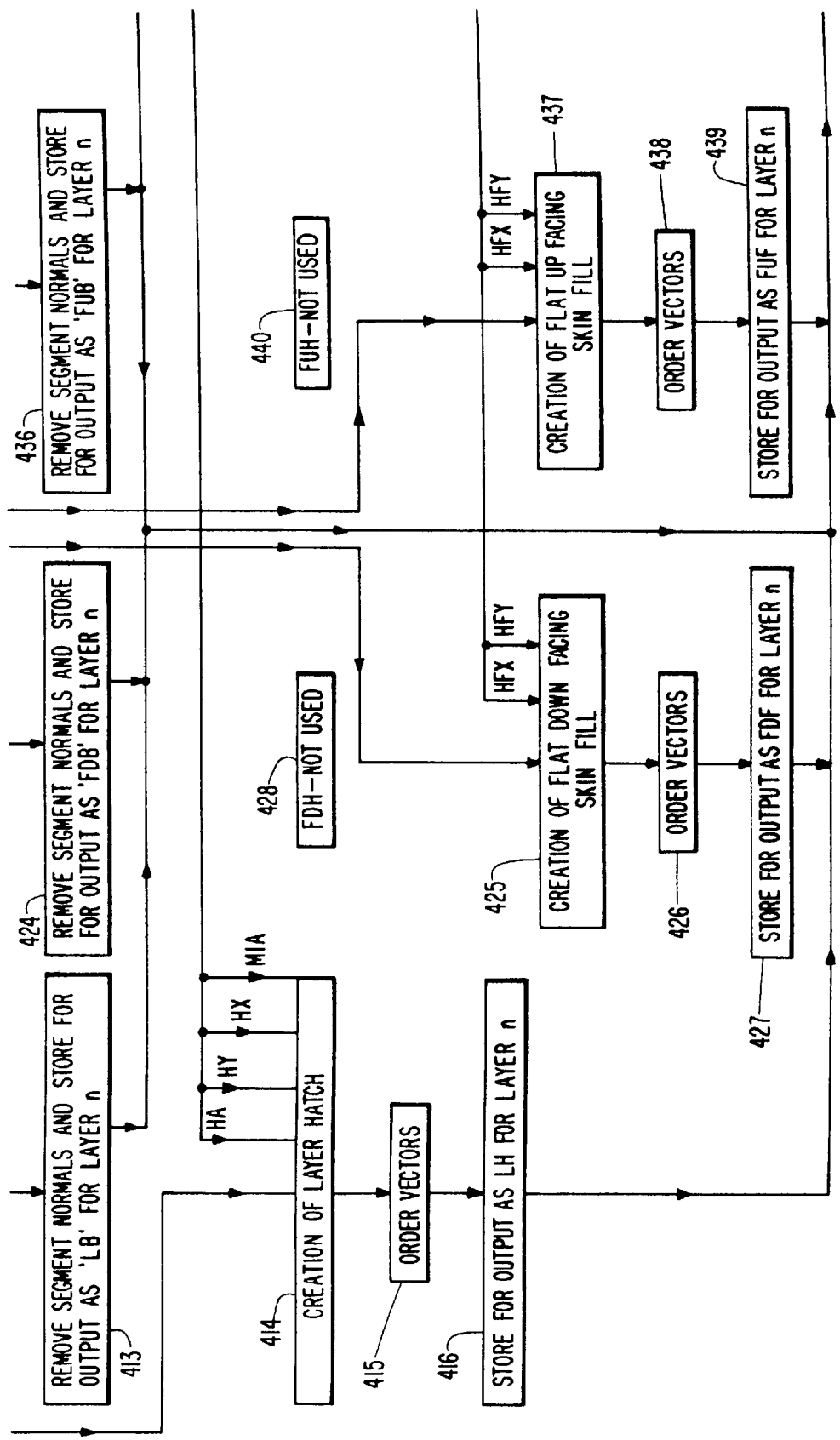
Figure 58F:
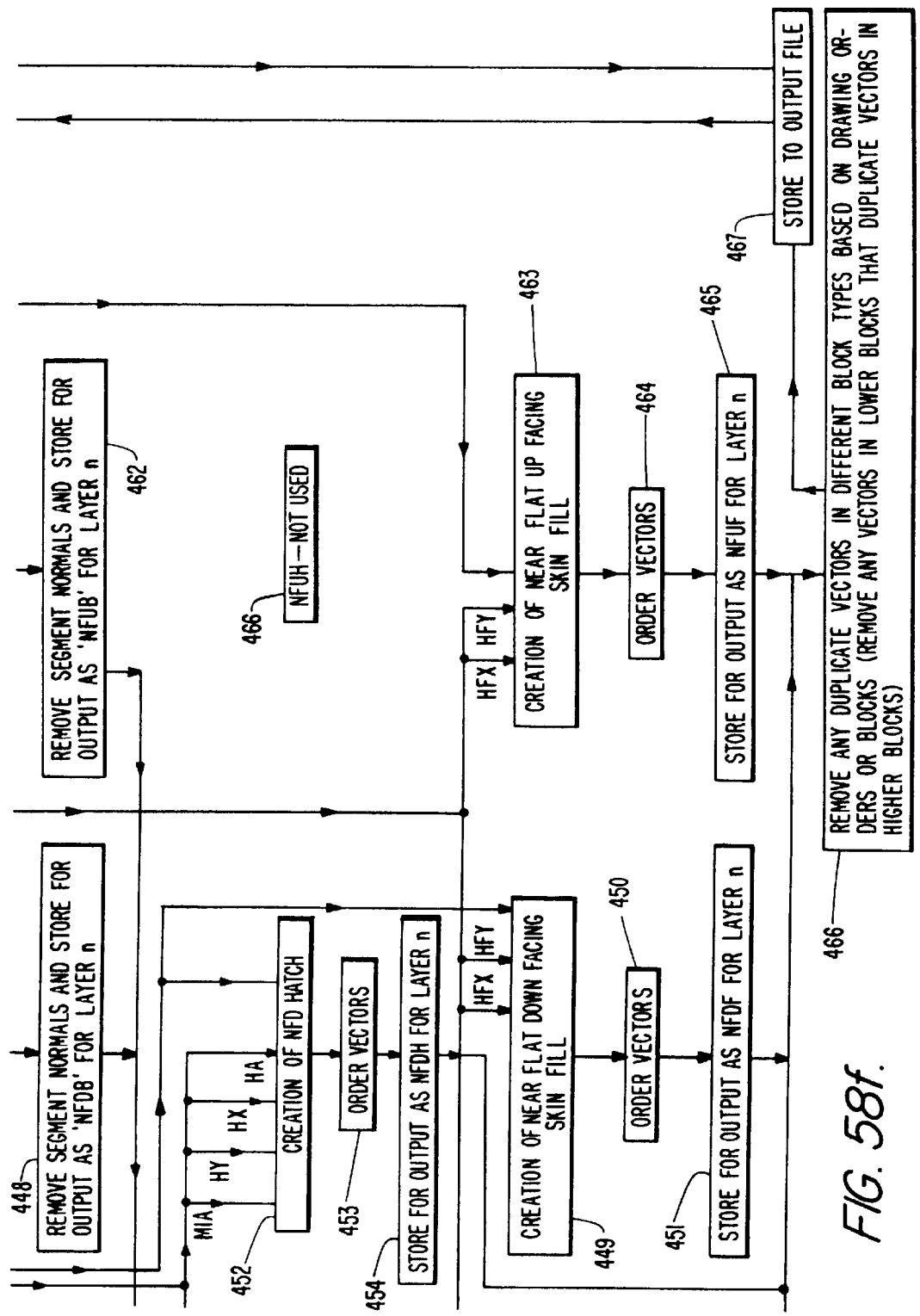

FIG. 57(B) is another report produced by BEAM. It shows the beam profile first along the X direction and then along the Y direction. This report is used to verify reasonable symmetry of the beam, and to show the beam width along the X and Y axis. This feature is very useful for bringing the beam to a good focus at the liquid/sensor level. One adjusts the beam expander (focusing device) until the most desirable focus is found by allowing the width display to update and indicate changes in focus at various beam expander positions. The plates shown in FIG. 57(B) are obtained from the data shown in FIG. 57(A). Two adjacent rows or columns of data in FIG. 57(A) are used to produce one of the values plotted in FIG. 57(B). For example, the data indicated by 346 in FIG. 57(A) is used to compute the value indicated by 348 in FIG. 57(B), and the data indicated by 347 in FIG. 57(A), is used to compute the value indicated by 349 in FIG. 57(B).

BEAM also periodically directs the laser beam to sweep across both pinholes which are placed in known and fixed locations. The sweeping of these pinholes is performed even during the photo curing process to correct for drift correction, an error that occurs over time through drift in the mirrors. Since the location of the pinholes are fixed and known, the laser beam is directed to this location by the dynamic methods. If the passage of light through the pinhole is not detected, a spiral search for the hole is performed until the hole is found. The actual coordinates of the beam are then compared with the estimated components to compute a value which is used to correct for drift.

The data obtained by BEAM sweeping across the calibration plate and the two fixed pinholes is stored in the CALIB.DAT file. Note that BEAM also makes use of the BEAM.PRM file. The BEAM.PRM file is a parameter file which contains the last known positions of the two sensors and contains intensity calibration factors.

Note that if left uncorrected, the above sources of error can result in as much as 33 mils of error. With the corrections discussed above in place, it has been found that only about 4 mils of error due to the mirrors remain.

CALOUT

This program simply takes the X, Y correction data created by BEAM during the sweep of the calibration plate, reformats it, and places it in the STEREO.GEO file for use by STEREO as a lookup table in making geometrical corrections.

The above completes the description of the software architecture of the embodiment described herein. Next, the function of SLICE version 3.20, the program used to convert CAD/CAM data into vector data, will-be described in detail.

DETAILED DESCRIPTION OF SLICE version 3.20

A detailed flow chart of SLICE version 3.20 is included in FIG. 58. As indicated, the first step is to specify certain input parameters required to drive the execution of SLICE version 3.20. This is indicated by step 400 in FIG. 58. The following input parameters should be specified:

- STL file to be sliced
- Scale (Res)
- Fixed or variable Z-spacing (zs)
- Hatch spacing in the X-direction (Hx)
- Hatch spacing in the Y-direction (Hy)
- Hatch spacing at 60/120 degrees (Ha)
- Skin fill spacing in the X-direction (HFx)
- Skin fill spacing in the Y-direction (HFy)
- Minimum surface angle (MSA)
- Minimum intersect angle (MIA)
- Name of SLI file for output vectors Most of these parameters are self-explanatory or are described in the body of the application. The scale is the desired resolution, and will be used to translate the CAD data, which is expressed in terms of CAD units, into vector data, which is expressed in terms of SLICE units. As discussed above, the system is presently capable of a maximum resolution in the X or Y directions of 3556 bits per inch, where each bit represents approximately 0.3 mil. If the CAD units are inches, then a scale value is 3556 provides maximum resolution for building parts. Higher scale values may be useful for other purposes such as ease of interpreting data. In this instance, scale can be any value of 3556 or larger.

The fixed or variable z spacing enables a user to specify the slicing up of the CAD/CAM data into cross-sections of varying thickness. This is an important design parameter of the system, for it enables a user to specify a finer vertical (z-direction) resolution in those regions of the object having the most detail, and less resolution in those regions where the finer detail is not needed.

In general, the layer thickness can range from 5 to 30 mils, with an average of 20 mils. A layer thickness of 5 mils is also common.

Although a 5 mil layer thickness will enable finer resolution, 5 mil layers are typically weak and susceptible to distortion because of curling. A 20 mil layer is much stronger and less susceptible to distortion, but is capable of less resolution.

These (5 mil) layers suffer from the additional problem that the dipping time for a particular thickness will increase with a decrease in layer thickness. This is because at finer layer thicknesses, it will take more time for excess polymer to gravity level.

On the other hand, when the layer thickness is very thick, the curing time can increase to the point that it dominates the reduction of time gained by with the curing of a lesser number of cross-sections.

In sum, total curing time will be large at the extremes, i.e. at both high and low layer thicknesses. It has been found, in general, that a layer thickness of 10 mil will give the optimal building time.

The next step indicated in FIG. 58 is step 401, wherein the triangle vertices of the STL file, which are represented in CAD units, are multiplied by the scale value to convert to SLICE units, i.e. inches to mils.

Step 402 calls for integerizing or rounding the triangle vertices in the X, Y and Z directions to take account of the physical limitations of the system. This step, although not strictly necessary, is performed to achieve computational efficiency. This aids computational efficiency because intergers can be manipulated much faster than floating point numbers.

In the X and Y directions, the highest resolution of the system is, as discussed earlier, 1 bit, which is approximately 0.3 mils. Therefore, the X and Y components of the triangle vertices are rounded to the nearest bit. This implies maximum X and Y resolution is 3556 bits/inch indicating that a scale factor of 3556 fits/inch or higher will yield best resolution. So generally, a scale or resolution factor of 5000 is used, if full resolution is desired. If full resolution is not necessary a scale factor of 1000 bits/inch is used.

In the z-direction, the physical limitations of the system are defined by the chosen layer thickness. Therefore, the Z-components of each triangle vertex are rounded to the nearest cross-section as defined by the chosen layer thickness.

The rounding of the triangle vertices will introduce several distortions which will cause problems in the downstream portions of SLICE 3.20. As discussed in the body of the application, the major problems are the collapsing of certain triangle to single points or lines, or the flipping of certain triangles. The flipping of certain triangles will result in a portion of the surface of an object being covered simultaneously by more than one triangle, and will also result in the triangle normal vector flipping direction to point into the solid rather than away from the solid. In other words, the flipping of triangles causes two of the fundamental format rules for the .STL file to be broken. As will be seen, this will create many problems which must be detected and corrected in the remaining portions of SLICE 3.20.

In step 403, the collapsed triangles are removed from the .STL database. The purpose of removing collapsed triangles is that their presence will be problematic downstream during the generation of hatch and skin vectors. In addition, the collapsed triangles will not be necessary for the complete representation of the surface of the object. As will be seen, hatch and skin vectors are generated between border vectors, border vectors are created at or near the slicing layer, they are generated at the intersection of an XY plane with the triangles spanning the surface of an object. If a collapsed triangle lies at the point of intersection, it will result in the generation of a redundant border vector which can confuse the generation of hatch and skin vectors. The removal of collapsed triangles can result in a triangle vertex touching an adjacent triangle at other than a vertex. This will not be a problem, however, as the vertex rule was only required before the rounding step to insure that no holes would be creased in the surface during rounding, as could occur if the vertex rule were not obeyed. After the rounding step, there is no requirement that the rule be obeyed.

In step 405, the triangle normal vectors, which indicate the orientation of the triangles with respect to the surface they span, are recomputed to take account of any change in direction that may have occurred through the rounding process.

In the embodiment described herein, only the X and Y components of the triangle normals are recomputed, while only the magnitude of the Z-component is updated for use in comparing with the MSA to detect near-flat up or down-facing triangles. The direction of the Z-component is taken from the original STL file data before rounding. The reason why this occurs is that at present, the Z-component of the triangle normals is not used in any downstream processing other than in the detection of near-flat triangles up- or down-facing categories for processing and flat triangles, while the X and Y components are used for the generation of hatch and fill vectors. In the current embodiment, the triangle normals are only used to create a directional vector (to be discussed later) for boundary vectors called a segment normal which points in the X and Y plane only. The magnitude of the Z-component must be recalculated because of the use of the triangle normal in detecting the presence of near-flat skins, but the original sign of the Z-component is used to divide triangles into up-facing or down-facing categories.

The next step, step 406, begins the process of categorizing the triangles as either up or down-facing near-flat triangles. As indicated in the body of the application, and as illustrated in FIG. 59, triangles can be categorized as near-flat triangles, steep triangles, and flat triangles. Steep triangles are triangles whose normals form angles with the vertical axis which are greater than the specified value for MSA, while it is the exact opposite for near-flat triangles, and flat triangles are triangles having normals which point in the Z-direction.

One importance of classifying triangles is that it allows the detection of near-flat areas which trigger the generation of near-flat skin vectors. If these vectors were not created, slanted areas of an object, which would be reproduced as a staircase of stacked cross-sections, would show exposed areas of cross-hatching. These areas should be covered by cured polymer, which polymer will result from the generation of near-flat skin vectors. The detection of these near-flat areas is performed by comparing the angle that the triangle normal makes with respect to the vertical axis, and if the difference is less than or equal to the MSA, classifies the triangle as a near-flat triangle. This comparison is discussed earlier in the body of the application (see FIGS. 26a and 26b, and associated discussion).

With the rounding of the triangle vertices SLICE 3.20 is ready to begin the generation of vectors from the triangles. This is indicted by step 407.

The process begins with the generation of layer boundary vectors, which is performed in step 408. As discussed earlier, the layer boundary vectors for a particular layer are created at the intersection of a horizontal slice with steed and near-flat triangles, which intersection is 1 bit above a particular layer. The lines representing the points of intersection become the layer boundary vectors.

As discussed in the body of the application, the layer boundary vectors are created 1 bit above the slicing layer, since otherwise, the representation of the object would be distorted (see FIG. 29a and associated discussion in the body of the application). Specifically, slicing 1 bit above the layer produces a part having the right vertical height between upfacing and down-facing areas. Another benefit of slicing 1 bit above the layer is that all triangle vertices (which have all been rounded to-layers) will be avoided. As will be discussed further on, this will avoid certain problems in the generation of hatch or skin vectors, which would otherwise occur if the triangle vertices were on the slicing layer. Briefly, the problem would occur since the triangle vertices would confuse SLICE 3.20 regarding the presence of boundary vectors, which in turn, would confuse it regarding when to begin or stop the generation of hatch or skin vectors. FIGS. 23a and 23b and the related discussion provide additional detail regarding the generation of border vectors.

Figure 59B:
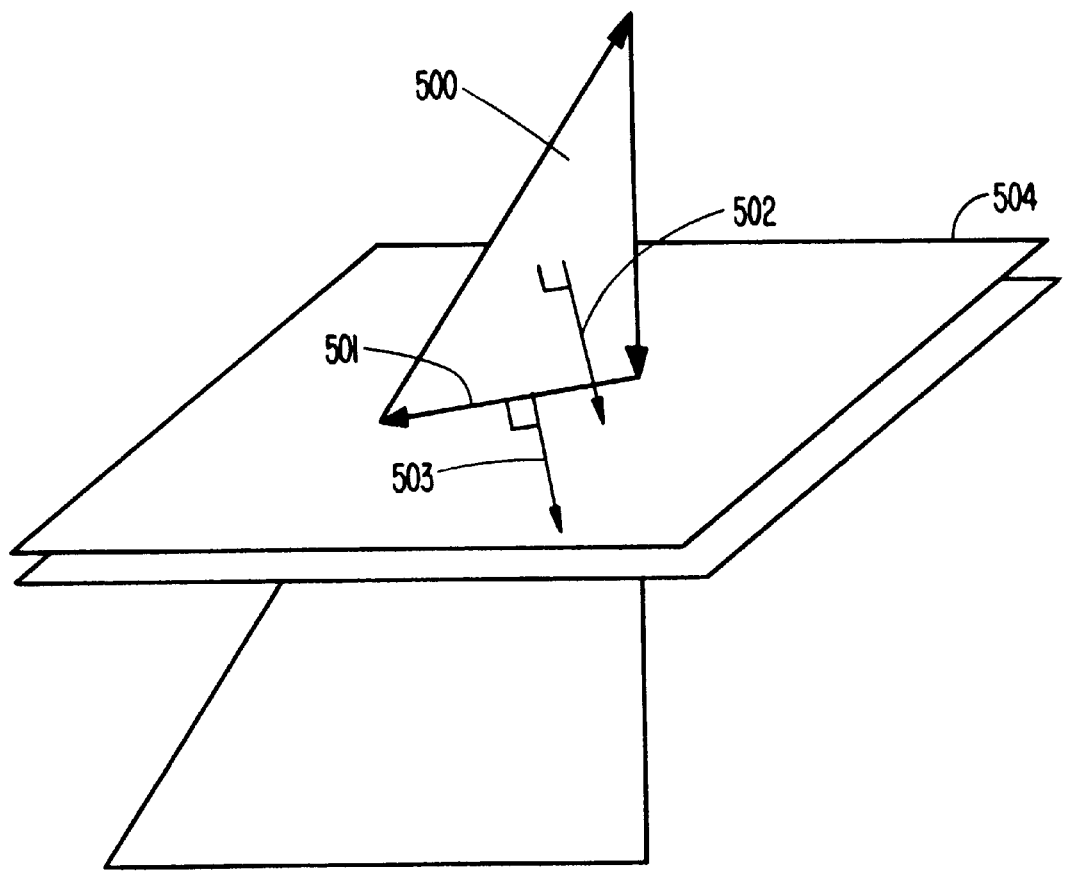
FIG. 59(B) illustrates the derivation of a layer boundary segment normal from the triangle normal of a steep triangle.

Step 408 also includes the substep of creating segment normals for the boundary vectors. Segment normals are related to boundary vectors in the same way that triangle normals are related to the surface triangles: the segment normals are simply meant to show the orientation of a boundary vector with respect to the interior part of the cross-section that it is spanning. In the embodiment described herein, segment normals always point away from the solid part of the cross-section that the boundary vectors are spanning These principals are illustrated in FIG. 59(b). As indicted, surface triangle 500 (which happens to be a steep triangle—it could also have been a near-flat triangle) is sliced by plane 504, which is 1 bit above the slicing layer. The intersection results in the generation of boundary vector 503.

The surface triangle also has triangle normal 502 which indicates the orientation of the triangle with respect to the surface it is spanning. Similarly, the border vector has a segment normal 503, which indicates the orientation of the border vector with respect to the interior of the triangle, and hence the solid part of the cross-section of the solid it is spanning.

Note that the segment normals for the boundary vectors will be created from the triangle normals of the surface triangles from which the boundary vectors are derived. In fact, this is the approach taken by SLICE 3.20.

At present SLICE version 3.20 does not keep track of all information about a segment normal, but only enough to be able to determine which quadrant the segment normal points toward. It turns out that the only information that is required is whether or not the segment normal has a positive or negative X-component, Y-component, and Z-component (for determining category of skin, i.e. up or down-facing). In other words, only six pieces of data are needed.

To create the segment normals for the boundary vectors, SLICE 3.20 will simply indicate the present or absence of X and y components only. It will not keep track of the Z-components, since by definition, all segment normals for the boundary vectors will be in the X-Y plane. SLICE 3.20 will extract the information about the X and Y components from the triangle normal, and use this to create attributes for the segment normal.

Steps 409 and 410 are designed to clean up the border vectors in preparation for the generation of skin and hatch vectors.

Figure 60A:
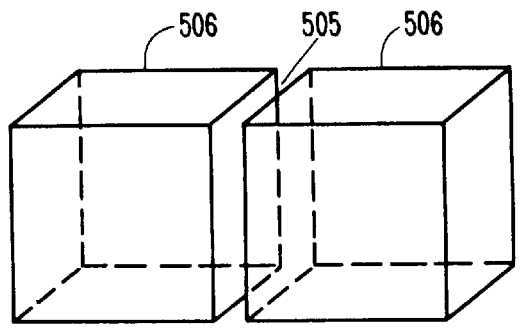
FIG. 60(A) illustrates two objects that are spaced from each other by a small amount on the order of 1 mil.
Figure 60B:
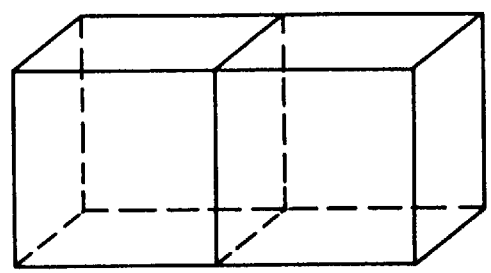
FIG. 60(B) illustrates the objects moving next to each other due to rounding error.
Figure 60C:
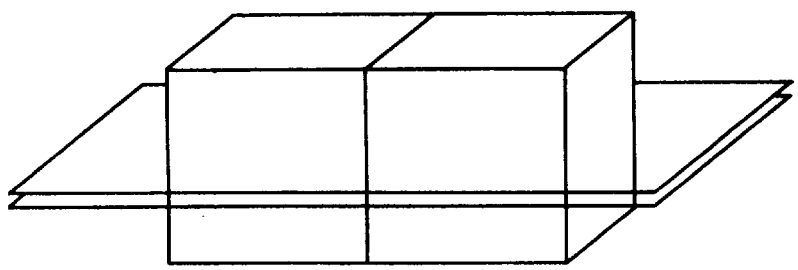
FIG. 60(C) illustrates the intersection of the slicing layer (and the XY plane 1 bit above the slicing layer) with two objects.
Figure 60D:
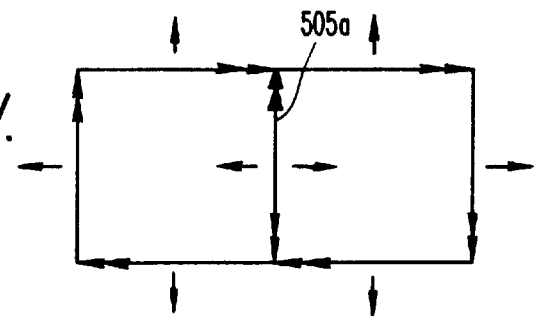
FIG. 60(D) illustrates the layer boundary vectors that result from the intersection shown in FIG. 60(C)
Figure 60E:
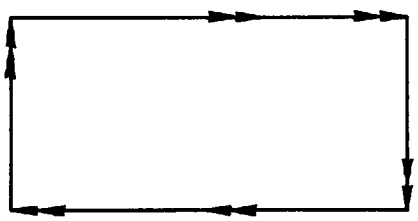
FIG. 60(E) illustrates the layer boundary vectors after removal of the duplicate boundary vectors which are common to the two objects.

As indicated, in step 409,.duplicate pairs of boundary vectors are eliminated. Duplicate boundary vectors can occur for several reasons. This step has little meaning for layer boundaries as it is currently implemented. As implemented only a portion of appropriate vectors will be removed. Presently, for duplicate vectors to be removed they must have matching endpoints, either head to head matching and tail to tail matching or head to tail and tail to head matching. Several situations can occur that result in duplicate pairs of boundaries, but for efficient removal a couple of extra steps need to be added to the present implementation. These steps include removal of sections of duplicate vectors that only overlap along part of their lengths, along with only one being removed if the overlapping vectors have similar segment normals, or if they have opposite normals both are removed one way for duplicate boundaries to occur is when small features collapse creating a double surfaced region of triangles with opposite normals. This is a difficult situation to deal with, because a decision needs to be made as to whether boundaries should be retained or eliminated. Our preferred embodiment is that both boundaries should be removed. This situation is illustrated in FIG. 60A. FIG. 60A depicts a narrow slit (505) between two boxes 506, as designed on a CAD system. FIG. 60B depicts the two boxes and the collapsed slit after scaling the CAD designed part for slicing. FIG. 60C depicts two planes intersecting the part one at a slice later and the other 1 bit above that. FIG. 60D depicts the boundaries and their segment normals as derived from the slice. Boundary 505*a* is actually two boundaries overlapping but with opposite normals. Proper elimination results in the boundaries shown in FIG. 60E. Present implementation may or may not remove the vector depending whether or not endpoints matched.

Duplicate or redundant boundary vectors can also result from the flipping of triangles, which can occur during the rounding and integerizing process of step 402. When a surface triangle flips, there can be a portion of the object which will be covered by more than one surface triangle at the same time. During the step of generating boundary vectors, if this portion of the surface intersects an X-Y plane 1 bit above a slicing layer, then up to three or more overlapping boundary vectors can be generated. In step 408, the redundant vectors can be eliminated. Using the present implementation this elimination is unlikely to be successful.

Figure 61A:
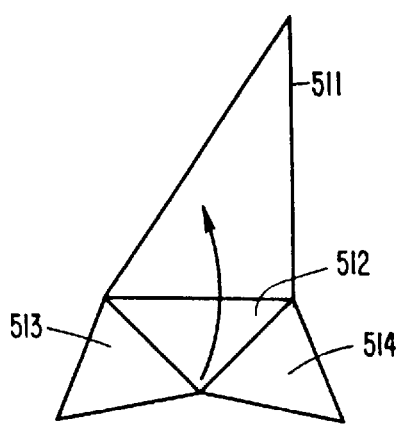
FIG. 61(A) illustrates the flipping of a triangle due to rounding error.

This problem is illustrated in FIG. 61. FIG. 61(A) shows triangle 511 adjacent to triangle 512, which in turn is adjacent to triangles 513 and 514. Because of a rounding error, triangle 512 is caused to flip, and overlap triangle 511. Note that the overlapping of triangle 512 will also distort triangles 513 and 514, which are required to and will continue to abut triangle 512, even after it has flipped.

Figure 61B:
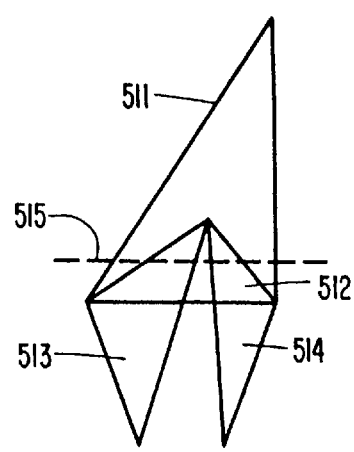
FIG. 61(B) illustrates the overlaying of the triangles after flipping.

After flipping, the situation is as indicted in FIG. 61(B). If it is assumed that plane 515 represents an X-Y plane 1 bit above a slicing layer, then the generation of redundant boundary vectors will result.

Figure 61C:
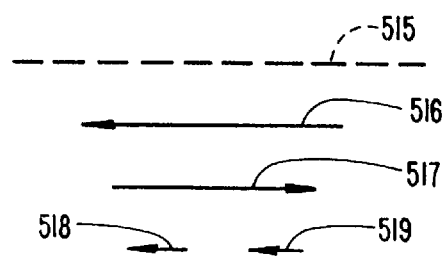
FIG. 61(C) illustrates the overlapping layer boundary vectors that result from slicing at the overlapping areas illustrated in FIG. 61(B)

The duplication of redundancy of boundary vectors is illustrated in FIG. 61(C). Vector 516 resulted from the intersection of plane 515 with triangle 511; vector 517 resulted from the intersection of plane 515 with triangle 512; vector 518 resulted from the intersection of plane 515 with triangle 51 3; and vector 519 resulted from the intersection of plane 515 with triangle 514.

Note that in FIG. 61(C), the boundary vectors are indicated as having a particular direction. In the embodiment described herein, the particular direction will be defined in terms of the segment normals of the boundary vectors. The particular convention chosen is the "left hand rule," which means simply that the direction of a boundary vector will be such that when moving from the tail to the head of the vector, the segment normal will point off to the left.

As mentioned earlier, the segment normals will be obtained from the triangle normals for the boundary vectors. In FIG. 61(C), for example, vector 516 points to the left consistent with its segment normal pointing out of the plane of the paper. Vector 517, on the other hand, points to the right since its segment normal points into the paper. The segment normal points into the paper since it is derived from the triangle normal of triangle 512, which because of the flipping of the triangle, has also flipped direction. Vectors 518 and 519 continue to point to the left since, even though triangles 513 and 514 have become distorted, they have not flipped.

In step 409, redundant vectors such as vectors 518 and 519 along with redundant portions of 517 can be eliminated but they do not necessarily need to be eliminated since the matching algorithm used can properly interpret where hatch should be placed. On the other hand it is preferred that duplicate vectors are removed so that a double or triple exposure of boundaries won't be applied.

In step 410, point vectors will be eliminated. As discussed in the body of this application, point layer boundary vectors will not occur due to triangle vertices, since, as discussed in the body of this application, triangle vertices have been rounded to the slicing layer, and will never be 1 bit above it. There may be situations, however, when the X-Y plane will intersect a narrow portion of a surface triangle, which portion is so narrow, that the resultant border vector Will be rounded to a single point. These point vectors will be eliminated in step 410.

In step 411, the border vectors will be ordered in such a way as to eliminate or minimize jumping of the laser beam especially across uncured liquid photopolymer.

The border vectors will be created in no particular order, and in fact will be created in the order in which the surface triangles are processed. This is illustrated in FIG. 27*a*, which shows the boundary vectors ordered in the sequence in which they were created. Note that if the boundary vectors are left in this order, the laser beam will be caused to jump across areas of uncured polymer, which can cause unwanted curing.

To get around this problem, the border vectors will be reordered as indicted in FIG. 27b, which shows the border vectors ordered according to-how they will be drawn.

Step 412 merely signifies the completion of the generation of the layer boundaries, which comprise boundary vectors placed end to end which span a cross-section at the layer.

Figure 62A:
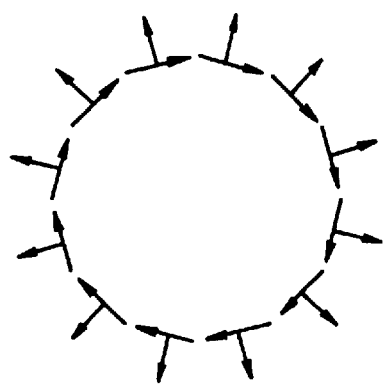
FIG. 62(A) illustrates boundary vectors and their segment normals conforming to the left hand rule.

In addition, each boundary vector has an associated segment normal, and together, the boundary vectors and segment normals that span a layer should obey a convention known as the "left hand rule." According to this convention, if the vectors are placed end to end so that the tail of one abuts the head of the next vector, the vectors will form a clockwise loop if they are outer boundaries and a counter-clockwise loop if they are inner boundaries, and in travelling around the loop in the direction of the vectors, the segment normals should all point to the left. Outer boundaries enclose solid areas, while inner boundaries enclose hollow areas. This is indicted in FIG. 62(A).

Figure 62B:
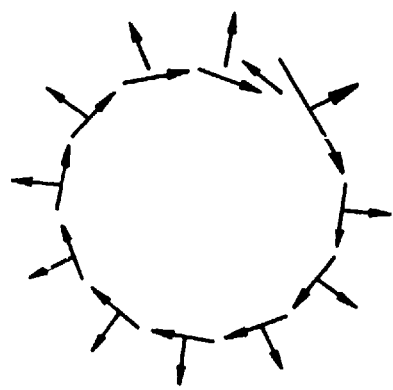
FIG. 62(B) illustrates the flipping of a triangle, and the resultant flipping of a segment normal.

Because of the flipping of triangles, however, there may be situations where a boundary vector and its associated segment normal point in the wrong direction. This is indicted in FIG. 62(B). In all instances, this problem would be eliminated in step 409 if properly applied. In these instances, the misdirected boundary vectors and associated segment normals should not cause problems during the generation of hatch-vectors. If however these considerations are applied to the various skin boundaries problems can occur.

In step 413, the boundary vectors minus the segment normals are stored for output to the SLI file for layer n. The segment normals are not eliminated in this step, but are kept for further processing. They are simply not written out to the SLI file since they are only used for processing internal to SLICE 3.20.

In step 419, the generation of hatch vectors takes place. As indicated in FIG. 58, this step takes as input the HA, HY, HX, and MIA parameters, which together define the desired spacing and type of hatch vectors which will be generated.

HA, HY, HX are explained in the body of the application. If one of these values is zero, the associated hatch vector type will not be generated. MIA is used to generate hatch vectors which are as close as possible to a radial hatch. This is illustrated in FIGS. 24i and 24j and described in the associated text in the body of the application. A radial hatch is not presently allowed since it may result in hatch vectors on adjacent layers not being directly above one another. The benefit of having hatch vectors on adjacent layers above one another is that the cured polymer on the layers corresponding to the hatch vectors will adhere to one another if the hatch vectors are placed directly above each other, which will contribute to the strength of the cured part. With radial hatching, there is no guarantee that hatch vectors on adjacent layers will be above one another. The use of MIA results in achieving as close to a radial hatch as possible on a general part, while at the same time ensuring the hatch vectors on adjacent layers are above one another.

As indicated in the body of the application, the starting and stopping of the generation of hatch vectors will be done by detecting the presence or absence of boundary vectors along parallel hatch paths as illustrated in FIG. 24.

Three methods have been considered for the generation of hatch vectors. These are discussed extensively in the body of the application. The first method, the "on/off" method, operates by detecting the presence of a boundary vector along a hatch path, and if hatch vectors are currently being generated, stops their generation. If they are not currently being generated, this first method begins their generation.

The problem with the first method is that it gets easily confused if it encounters an area along a hatch path where more than one border vector intersect or meet. This may occur if a hatch path simply goes through an area where the head of one border vector touches the tail of another border vector, or an area having duplicate or redundant overlapping border vectors. This occurs when a triangle segment common to two triangles has landed on a slicing layer, or because a triangle has flipped. This problem will manifest itself in the generation of spurious hatch vectors in areas meant to be hollow, or the absence of hatch vectors through areas meant to be solid.

The second method, the "priority on" method, analyzes the boundary vectors and their segment normals to make the decision whether or not to turn on or off the generation of hatch vectors. The segment normals of the boundary vectors should point in the direction away from the solid which the border vectors span (although, as indicted earlier, this relationship may not hold if a triangle has flipped), and the "primary on" method will always begin the generation of hatch vectors when it encounters a border vector having a segment normal indicating that the hatch path is about to travel through a solid region. If an area along a hatch path is encountered where more than one boundary vector intersects or overlaps, the method will continue or begin to generate hatch vectors if any segment normal from any of the boundary vectors indicates entry into a solid. As a result, the generation of hatch vectors will cease only when a boundary vector or vectors is or are encountered where there is no possibility of confusion, no segment normal indicates the entry into a solid.

This method still suffers from the generation of spurious hatch vectors. As a result, a third method, the "net summation" method has been developed.

According to this method, when points along a hatch patch are encountered, where one or more boundary vectors meet or intersect, the signs of segment normals for all the boundary vectors are summed, and a decision to either begin., or turn off, or continue as is the generation of hatch vectors is made based on the net summation.

The method works by comparing the direction of each segment normal with the direction of the hatching path to determine a sign for that normal "+" if the normal is in the same direction as the hatching direction, and "−" if the normal is in the opposite direction. Then, the signs for all the segment normals are summed. If the net sum is "+," hatch vector generation is turned off; if the net sum is "−," hatch generation is turned on; if the net sum is "0," hatch generation will continue as is.

A comparison of these three methods is provided in the body of the application as FIGS. 24a–24h, and the associated narrative. It has been found that the third method, the "net summation" method, is best for dealing with the intersection points of border vectors, and for dealing with duplicate or redundant border vectors caused by flipping triangles.

Figure 63A:
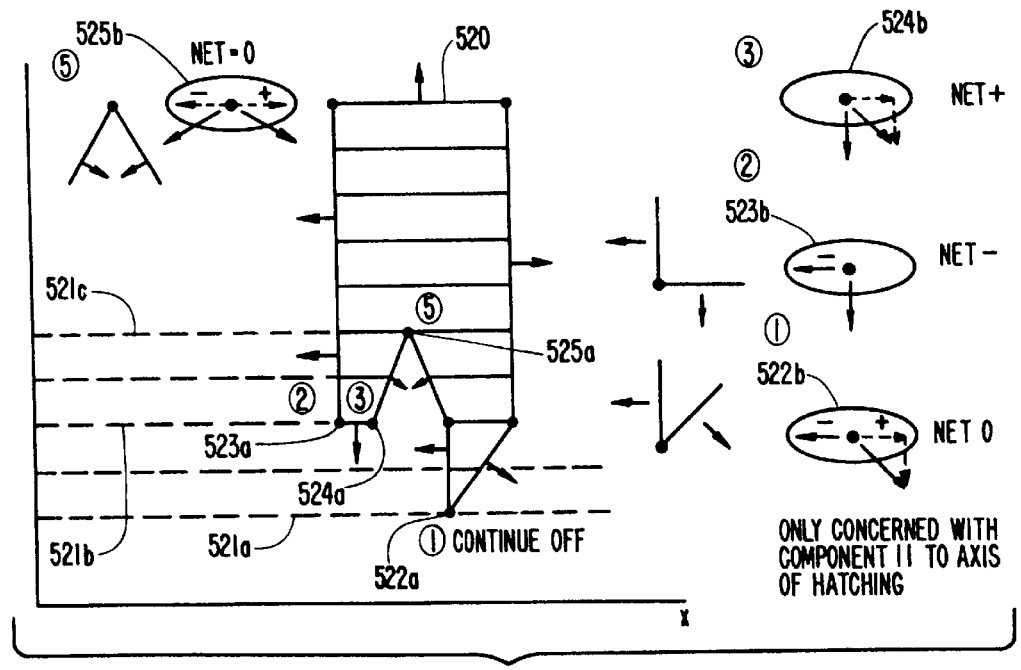
FIG. 63(A) illustrates the "net summation" hatch vector generation algorithm.

The operation of the third method will be explained with reference to FIG. 63(A). As indicted, layer boundary 520 spans a cross-section of an object, which layer boundary is comprised of layer boundary vectors and their associated segment normals. Also indicated are hatching paths 521(A) –521(C).

As indicated, hatching path 521(A) intersects point I'11' of the boundary, indicated as 522(A), which is the intersection point of two boundary vectors. As indicated at 522(B), the net direction of the segment normals with respect to the hatching path direction is determined. Since the net direction is "0," hatch generation, initially off, will continue off. This is the proper decision as indicated.

Hatching path 521(B) intersects point "2" of the boundary, indicated as 523(A), which is the intersection point of two boundary vectors. As indicated at 523(B), the net direction of the segment normals with respect to the hatch path direction is negative, indicating that hatching should be turned on. The hatch path also intersects point "3" of the layer boundary, indicated as 524(A). As indicated at 524(B), the net direction of the segment normals is positive, indicated that hatch vector generation should be turned off. As illustrated, these are correct decisions.

Hatching path 521(C) intersects point "5," which is indicated as 525(A). As indcted at 525(B), the net direction of the segment normals at this point is "0," indicating that hatch generation should continue as is, which is to continue on. This is a correct decision.

Figure 63B:
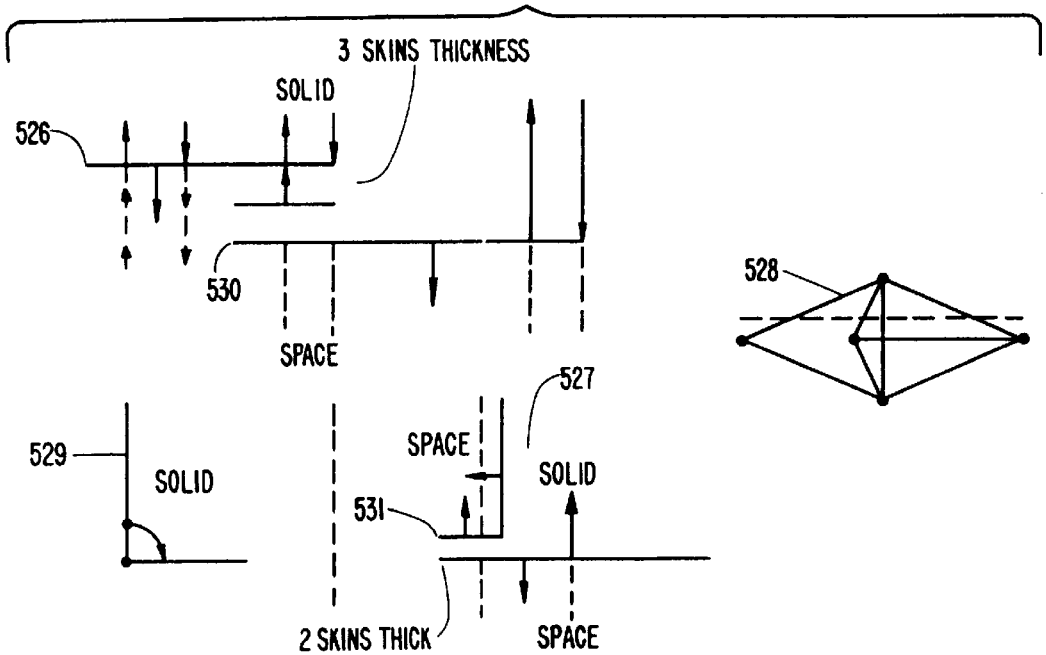
FIG. 63(B) illustrates the performance of the "net summation" hatch generation algorithm in the case of flipping triangles.

The "net summation method is also advantageous for dealing with the problem of flipping triangles. With flipping triangles, two situations will be encountered: situations where an area will be surfaced by three triangles, and situations where an area will be surfaced by two triangles. The surfacing of an area by three triangles is indicated by 526 in FIG. 63(B), which corresponds to area 528 also shown in that Figure. The surfacing of an area by two triangles is indicated by 527 in FIG. 63(B), which corresponds to 529, which shows the flipping of a triangle at the corner of a solid.

The point of overlap in 526 is indicted by 530. As indicated, if the hatching path direction is into the solid, the net summation of the direction of the segment normals will always be negative, signalling the turning on or hatch generation. If the hatching path direction is away from the solid into space, the net summation will be positive, signalling the turning off of hatch vector generation.

The point of overlap in 527 is illustrated by 531. As indicated, the point of overlap will be in an area of free space, and regardless of the incident direction of the hatching path at the point of overlap, the net direction of the segment normals will always be "0," and hatch generation will always continue as is, i.e. off, through the area of overlap.

In step 415, the hatch vectors will be ordered with the objective of minimizing the amount of time the laser beam will pass over uncured polymer, i.e. hollow areas, and maximizing the amount of time the laser beam is directed to pass over cured polymer, i.e. solid areas. The ordering of hatch vectors is illustrated in FIGS. 27c–27e, and discussed in the associated text in the body of the application.

In step 416, the hatch vectors are labelled held for output as LH vectors for layer n into the SLI file.

Step 417 continues the generation of boundary vectors, this time from down-facing flat triangles. These are known as flat down-facing boundary vectors (FDB) unlike the case with layer boundary vectors, however, which were determined at 1 bit above the slicing layer, flat down-facing boundary vectors are determined right at the slicing level since flat triangles are only found right on a SLICE layer due to rounding of vertices.

Figure 64A:
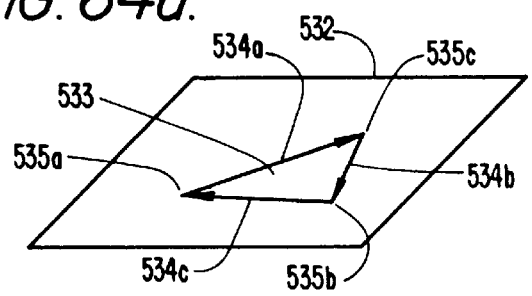
FIG. 64(A) illustrates a flat up-facing triangle.

A flat down-facing triangle will fit entirely within the plane of a slicing layer as indicated in FIG. 64(A), which shows flat down-facing triangle 533 within slicing layer 532. As a result, the FDB vectors will in fact be the triangle segments indicted as 534(A), 534(B) and 534(C) in the Figure.

Figure 64B:
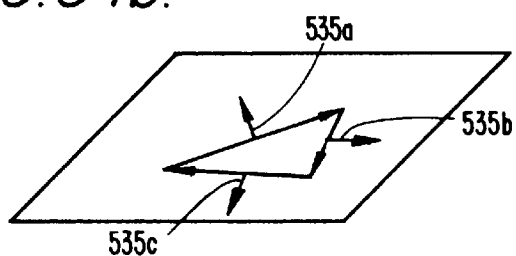
FIG. 64(B) illustrates the segment normals for the vector 5 spanning the triangle.

In step 418, the segment normals for the. FDB vectors are derived. Unlike the case with the LB vectors, however, the segment normals are not derived from the triangle normals, but will in fact be derived from the relative locations of the triangle vertices, which will be determinative of the direction of the segment normals. With reference to FIG. 64(A) for example, the segment normal for segment 534(A) is determined by comparing its endpoints, 535(A) and 535(C), with the vertex 535(B) This comparison will indicate the orientate on of the segment with respect to the interior of the triangle it is bordering, and will be used to generate a segment normal pointing away from the interior. A similar comparison will take place for segments 534(B) and 534(C), by comparing endpoints 535(B) and 535(C) with 535(A), and by comparing endpoints 535(A) and 535(B) with 535(C), respectively. The segment normals which form these comparisons are shown in FIG. 64(B), which shows segment normals 535(A), 535(B), and 535(C), corresponding to boundary vectors 534(A), 534(B), and 534(C), respectively. Note that the boundary vectors are also assigned a direction to conform to the left hand rule, i.e. according to which the segment normal always points off to the left as the vector is traversed from its tail to its head.

Figure 64C:
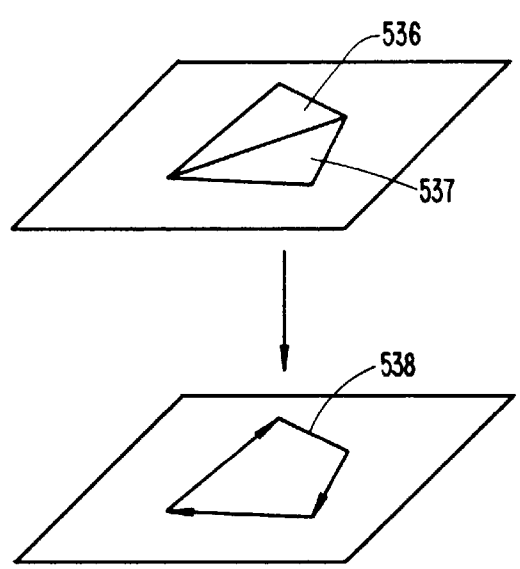
FIG. 64(C) illustrates the removal of duplicate vectors forming common sides to adjacent flat up-facing triangles.

In step 419, duplicate FDB vectors are removed. This is a relatively simple process, and requires analyzing all of the down-facing flat triangles on a slicing layer, and eliminating all boundary vectors derived from segments that are common to two triangles. This is illustrated in FIG. 64(C), which shows triangles 536 and 537 sharing a common segment, which is two FDB vectors, one for triangle 536, the other for triangle 537. Both of these boundary vectors will be eliminated in step 419.

The remaining area enclosed by the remaining four FDB boundary vectors is indicated by 538 in FIG. 64(C). Note that duplicate boundary vectors are eliminated to simplify calculation of skin fill vectors, and reducing the number of skin vectors considerably since one hatch or fill vector is created each time a boundary is crossed even if the boundary indicates "continue as is."

In step 420, all point vectors will be removed. Point vectors can result from collapsing of triangles due to rounding on the slicing layers.

In step 421, the FDB vectors are reordered to minimize the passage of the laser beam over uncured photopolymer.

In step 422, the direction of segment normals can be recalculated to take account of triangles that may have flipped due to rounding distortions on the X-Y plane. As indicated earlier, this can occur when all vertices are rounded to the nearest bit.

Figure 65A:
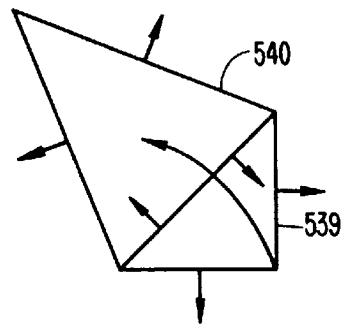
FIG. 65(A) illustrates the flipping of a triangle.

The problem is illustrated in FIG. 66. As indicated in FIG. 65(A), triangle 539 is caused to flip over into triangle 540 due to a rounding distortion. Both triangles are flat down-facing triangles, and the FDB vectors which will be generated will coincide with the triangle segments. In addition, the segment normals are as indicated.

Figure 65B:
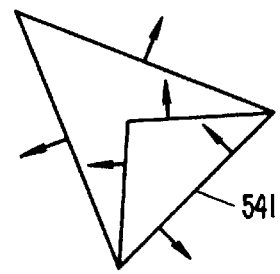
FIG. 65(B) illustrates the segment normals after the flipping has occurred.
Figure 66A:
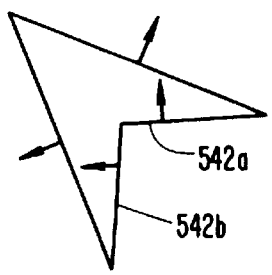
FIG. 66(A) illustrates the removal of duplicate boundary vectors and the flipping of segment normals.
Figure 66B:
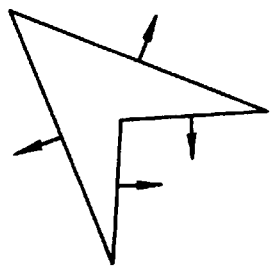
FIG. 66(B) illustrates reversing the segment normals.

In FIG. 65(B), the duplicate boundary vectors associated with segment 541 will be removed, and the situation indicted in FIG. 66(A) will result. The direction of the boundary vectors which remain after the elimination of the duplicate boundary vectors is indicated.

As can be seen, there is a fundamental flaw in these boundary loops. The loop can not be traversed without encountering vectors that point in the wrong direction and normals that point the wrong way. The correction to this problem can be implemented in various ways ranging from simple checks that detect and solve the problem some of the time to more complex methods that solve the problem most of the time to more sophisticated methods that solve the problem all the time.

The situation has the potential for causing problems in the generation of skin vectors since skin fill is derived by the same algorithm as hatch vectors and therefore depends on segment normals to properly indicate solid regions, and also has the potential of causing problems with beam width compensation (this will be discussed later). Therefore, step 422 involves recalculating the direction of the segment normals based on detection of flipped triangles and reversal of these segments and normals if necessary, or simply majority of vectors in any loop are considered to have correct normals so minority of segment normals are reversed or by a other more sophisticated techniques. If this correction is made to FIG. 66(A), the situation in FIG. 66(B) results.

Step 423 signals the completion of the generation of flat down-facing skin borders, which are comprised of a series of FDB vectors placed end to end, and conforming to the left hand rule.

Step 424 involves removing the segment normals, and saving the vectors for storage in the SLI file with the FDB label.

In step 425, flat down-facing skin vectors are created from the FDB vectors in a manner closely analogous to the way hatch vectors are created from the LB vectors. The only differences are that the spacing between skin vectors is typically much less, and skin vectors are generally only created in the X or the Y direction, not both, and not at 60/120 degrees, as with hatch vectors.

In step 426, the skin vectors are ordered using the same algorithms as used to order the layer hatch vectors, the purpose of the algorithm being to minimize the passage of the beam over uncured polymer.

In step 427, the skin vectors are labelled with FDF, stored for output in the SLI file as FDF vectors for layer n.

As indicated in step 428, hatch vectors are not generated from the FDB vectors. This is because these vectors are redundant which to layer hatch vectors will already be created as from layer border vectors.

In step 429, flat up-facing triangles are analyzed, and used to generate flat up-facing skin boundaries. The process of generating flat up-facing skin boundary vectors is entirely analogous to that for obtaining flat down-facing boundary vectors, except that the vectors for layer n are derived from triangles on layer n+1. The reasons for this are that STYLE 1 (which is the style that is used to generate oversized parts, and which is the style which is currently implemented on SLICE version 3.20) generates layer border and layer hatch vectors 1 bit above a slicing layer, and 1 bit above an up-facing skin triangle will by definition be in open space. Thus, all flat up-facing boundary vectors will generate cured polymer which will be fully floating unless it is moved down 1 layer since it will not have any cured polymer from layer hatch or layer boundary vectors on which it can be supported.

Figure 67:
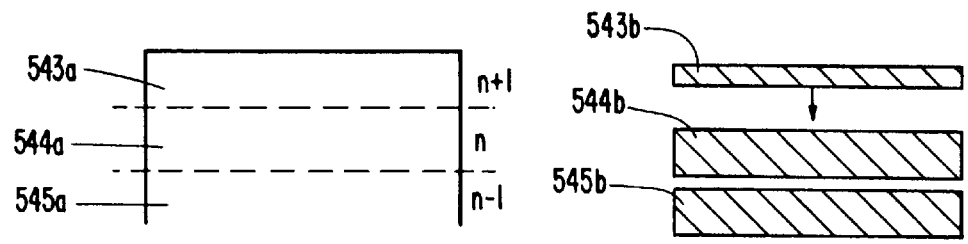
FIG. 67 illustrates L-he movement of flat up-facing skin from layer n+1 to layer n as per STYLE 1.

This situation is illustrated in FIG. 67. As indicated, layers n+1, n and n−1, are respectively indicated as 543(A), 544(A), and 545(A). The corresponding cured polymer that will result for each layer is shown in FIG. 67. As indicated, layer n+1 will result in the generation of flat up-facing boundary and skin vectors, which when cured, yield the cured polymer indicated by 543(B). Layer n+1 will not result in the generation of layer hatch and boundary vectors since those vectors will be obtained by slicing 1 bit above the layer, which is free space. Layers n and n−1, however, will result in the generation of layer hatch and border vectors, which will result in cured polymer 544(B) and 545(B), respectively.

Since skin fill vectors are cured at a shorter depth than the layer hatch and boundary vectors, the cured polymer resulting from those vectors, 543(B) in FIG. 67, will be free floating unless the cured polymer is placed on layer n. This is accomplished by associating the skin boundary and fill vectors generated by slicing layer n+1 with layer n.

Steps 430–436 pertaining to flat up-facing fill are exactly analogous to steps 418–427, respectively, and will not be discussed further. The only differences are that in step 436, the boundary vectors are labelled as FUB vectors before outputting to the SLI file, and in step 439, the skin fill vectors are labelled as FUF vectors before outputting to the SLI file. Also, as indicated in 440, hatch vectors (FUH vectors) will not be generated from the FUB vectors, since they will be redundant to LH vectors, which will already have been generated at layer n from the LB vectors.

In the above discussion, it has been tacitly assumed that the difference between flat up-facing and down-facing triangles is easily determined. This is normally a simple process, and is based on looking at the direction of the triangle normal: if it is pointing up in the Z-direction, a flat upfacing triangle is present, while if it is pointing down in the Z-direction, a flat down-facing triangle is present.

However, this process will become complicated in those situations where flipped triangles are present. This is because in these instances, a particular area on the surface of an object may be covered by up to three or more triangles, each having a triangle normal, and the process of detecting the presence of an up or down-facing skin will be more ambiguous than if a single triangle normal were involved. In this instance, as described in the body of the application, an algorithm analogous to the "net summation" algorithm can be used to compute the net direction of the triangle normals in the overlapping areas of the flipped triangle. If the net direction is up-facing, an up-facing flat triangle will be assumed, and step 429 and its progeny will be invoked. If the net direction is down-facing, a down-facing flat triangle is assumed, and step 417 and its progeny will be invoked, if the net normal is "0" then no skin will be created in that area. The present implementation is to not recalibrate the Z-components of normals after rounding and then deal with misdirected segments and segment normals as necessary.

In step 441, near-flat down-facing trapezoid boundaries for layer n are formed from the intersection of near-flat down-facing triangles with slicing layers at levels n and n+1.

Figure 68:
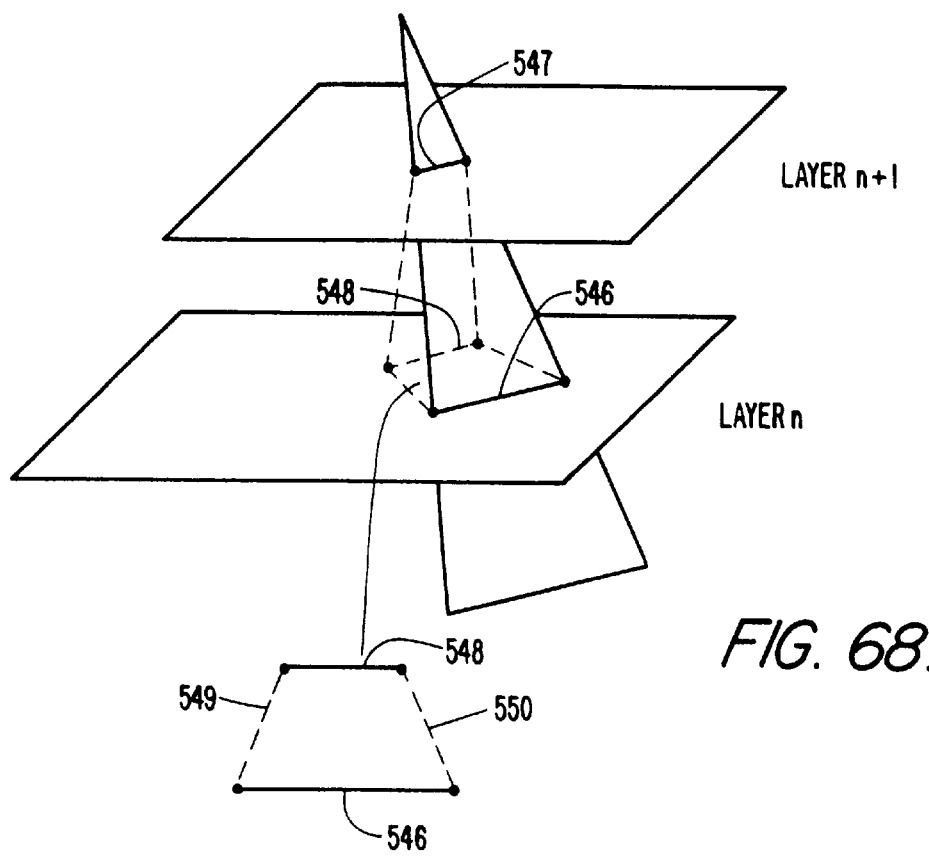
FIG. 68 illustrates the generation of a trapezoid from a near-flat down-facing triangle.

This situation is illustrated in FIG. 68, which shows a near-flat down-facing triangle intersecting slicing layers n and n+1 at segments 546 and 547 respectively. Next, segment 547 is moved down to layer n to form segment 548 as indicated. Segments 546 and 548 are used to form the first two boundary vectors of the trapezoid. The next two boundary vectors which span the trapezoid, 549 and 550, respectively, are formed by simply connecting the end parts of segments 549 and 550.

Figure 69:
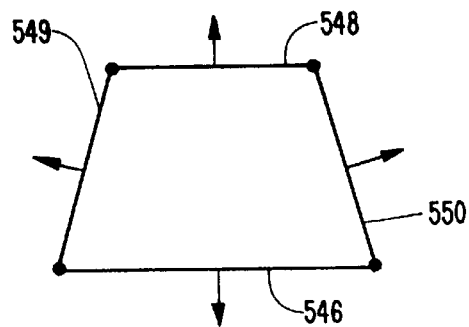
FIG. 69 illustrates the segment normals associated with the trapezoid.
Figure 70:
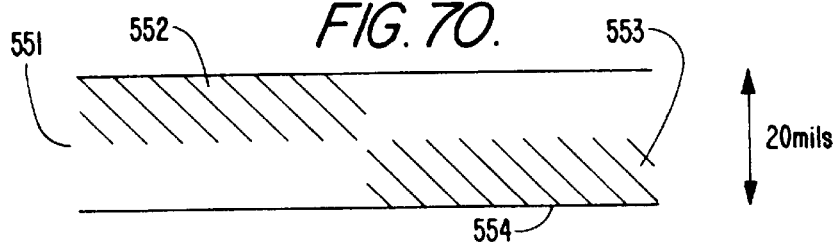
FIG. 70 illustrates the placement of skin fill at the top or bottom of a layer.

In step 442, the segment normals for the segments surrounding the trapezoid are computed. As indicated in the body of the application, the direction of the segment normals are computed based on the relative position of the vertices of the trapezoid in a manner entirely analogous to the determination of the direction of segment normals associated with flat up or down-facing triangles. In other words, the positions of the endpoints of a segment are compared with the other vertices of the trapezoid, and the comparison used to determine the direction of the segment normals. The end result is displayed in FIG. 69, which illustrates the segment normals and the associated trapezoid segments.

In step 443, duplicate vectors are removed. Duplicate vectors are defined as those vectors which form a common boundary between two adjacent trapezoids which have been generated from near-flat down-racing triangles. These will be removed for the same reasons as removal for duplicate boundaries from flat skin areas.

In step 444, point vectors will be removed. As before, these will be generated by a triangle vertex landing on a slicing layer, or by the collapse of short trapezoid boundaries when endpoints intergized, and will be removed to eliminate problems in the generation of hatch and fill vectors from the near-flat border vectors.

In step 445, the vectors will be reordered to minimize the passage of the laser beam over uncured polymer.

In step 446, the segment normals associated with the trapezoid segments will be recalculated to correct for the problem of flipping triangles, which can occur with near-flat triangles as with any other triangle. The problem will manifest itself by trapezoid segment normals pointing to the interior of the near-flat skin areas rather than the exterior. The segment normals can be recalculated in a similar manner to that for flat skin boundaries.

Step 447 signals the completion of the generation of near-flat down-facing borders which comprise a series of near-flat down-facing border vectors and their associated segment normals, which border vectors are placed end to end, and which border vectors obey the left hand rule with respect to their segment normals.

In step 448, the segment normals are removed, and the border vectors are labelled as NFDB vectors and stored for output to the SLI file.

In step 449, the generation of near-flat down-facing skin fill vectors is performed. This process is performed using the near-flat down-facing skin border vectors from the skin/hatch vector generation algorithms discussed above.

In step 450, the skin vectors are ordered to minimize the passage over the uncured photopolymer using the algorithms described in the body of the application (which apply to the generation of the hatch and skin-vectors), and in step 451, the skin vectors are labelled as NFDF vectors, and stored for output to the SLI file.

In step 452, near-flat down-facing hatch vectors are generated. It may seem anomalous that near-flat down-facing hatch vectors must be generated when in analogous situations discussed earlier, i.e. flat-up and down-facing skin vectors, flat-up and down-facing hatch vectors were not generated.

Near-flat down-facing skin vectors are different since they will always generate cured polymer which will be unsupported until supported by cured polymer generated by near-flat down-facing hatch vectors. Every other type of skin vector, i.e. flat up- or down-facing skin vectors or even near-flat up-facing skin vectors, will generate cured photopolymer which will be supported by polymer cured from layer hatch and boundary vectors. This is illustrated in FIGS. 29f and 29g, and the associated text, in the body of the application.

Therefore, in step 452, the hatch vectors required to support the near-flat down-facing skin vectors are formed from the near-flat down-facing boundary vectors. The algorithms used are as discussed earlier.

In step 453, the hatch vectors are ordered to minimize the passage of the laser beam over uncured photopolymer, and in step 454, the hatch vectors are labelled as NFDH vectors, and stored for output to the SLI file.

In step 455, near-flat up-facing boundary vectors are formed. These vectors are formed from one triangle at a time by first forming a trapezoid from the intersection of a near-flat up-facing triangle with slicing layers n+1 and n. Then the segment from the layer n+1 intersection is moved down to layer n, and in conjunction with the other segments formed at the intersection with layer n is used to form a trapezoid on layer n.

Figure 71:
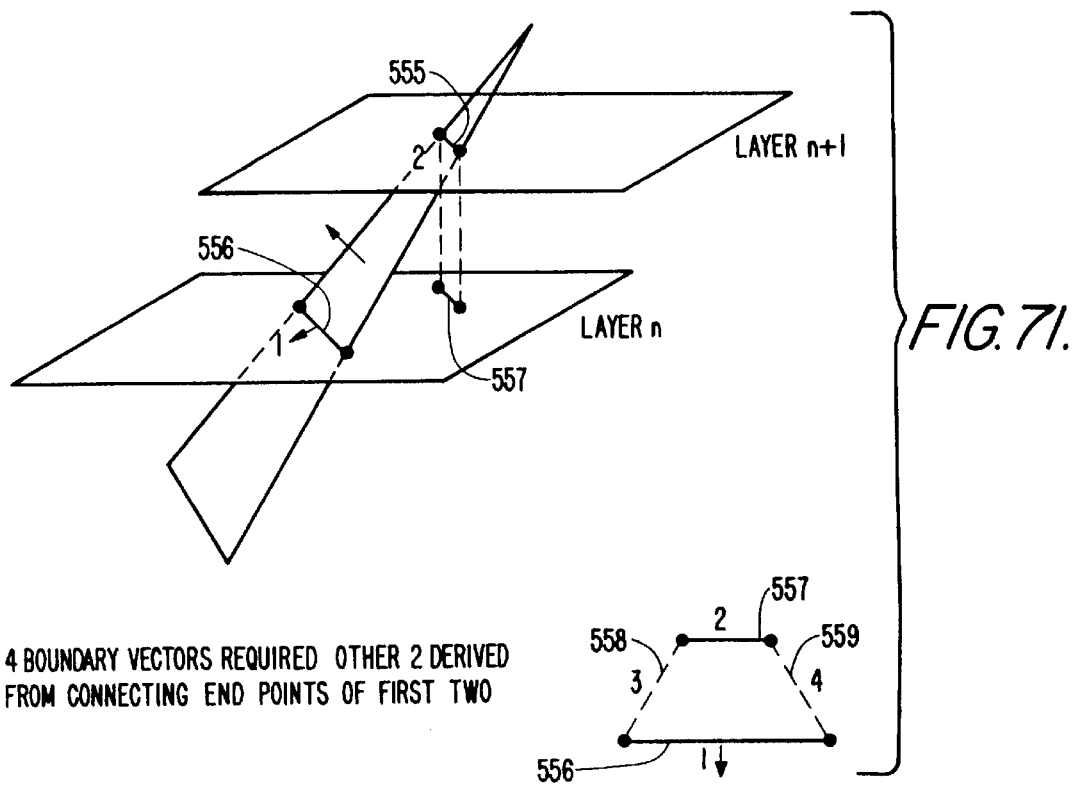
FIG. 71 illustrates the generation of a trapezoid from a near-flat up-facing-triangle.
Figure 72A:
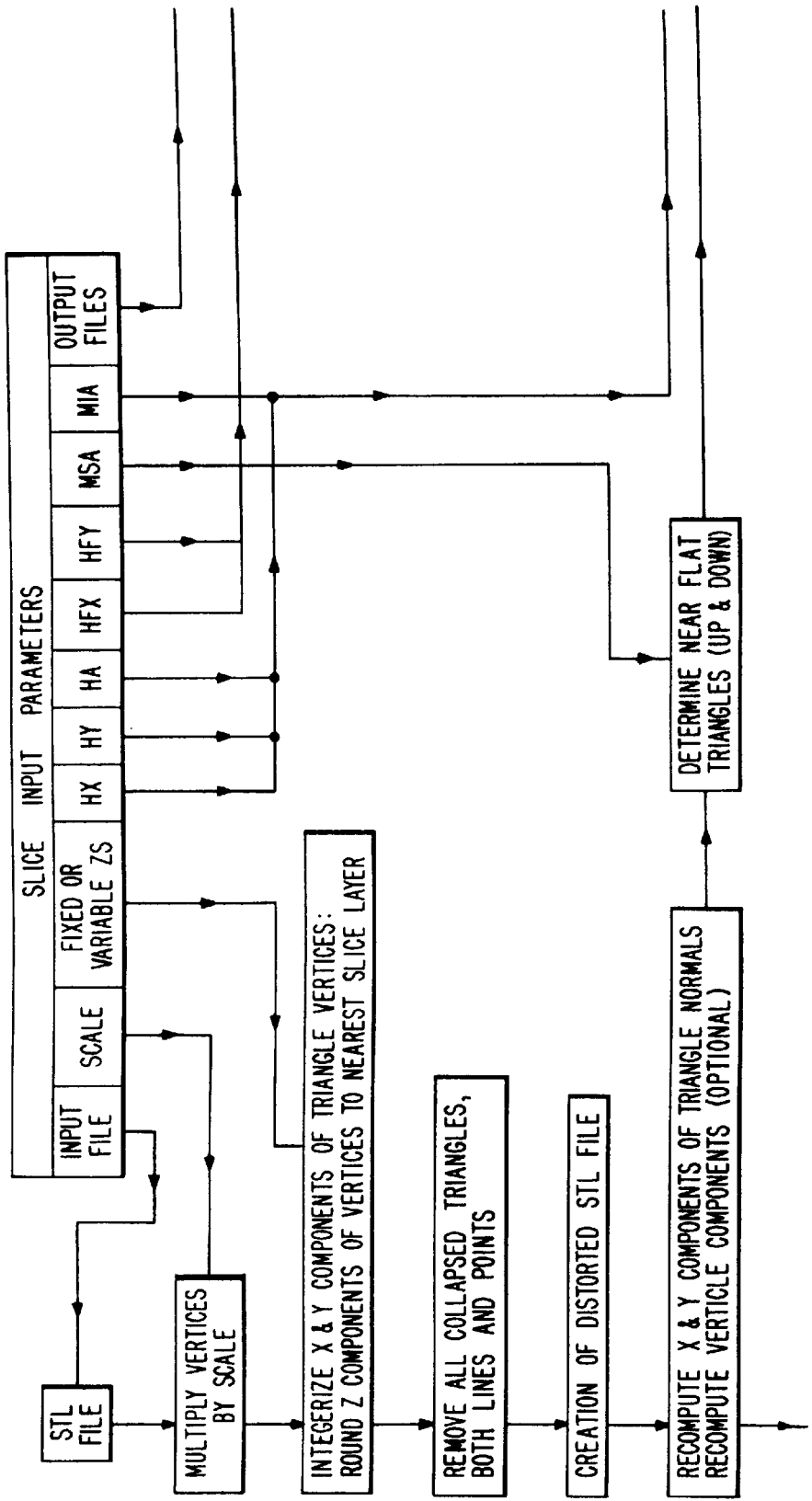
FIG. 72 is a flow chart of the SLICE STYLE 2 algorithm.
Figure 72B:
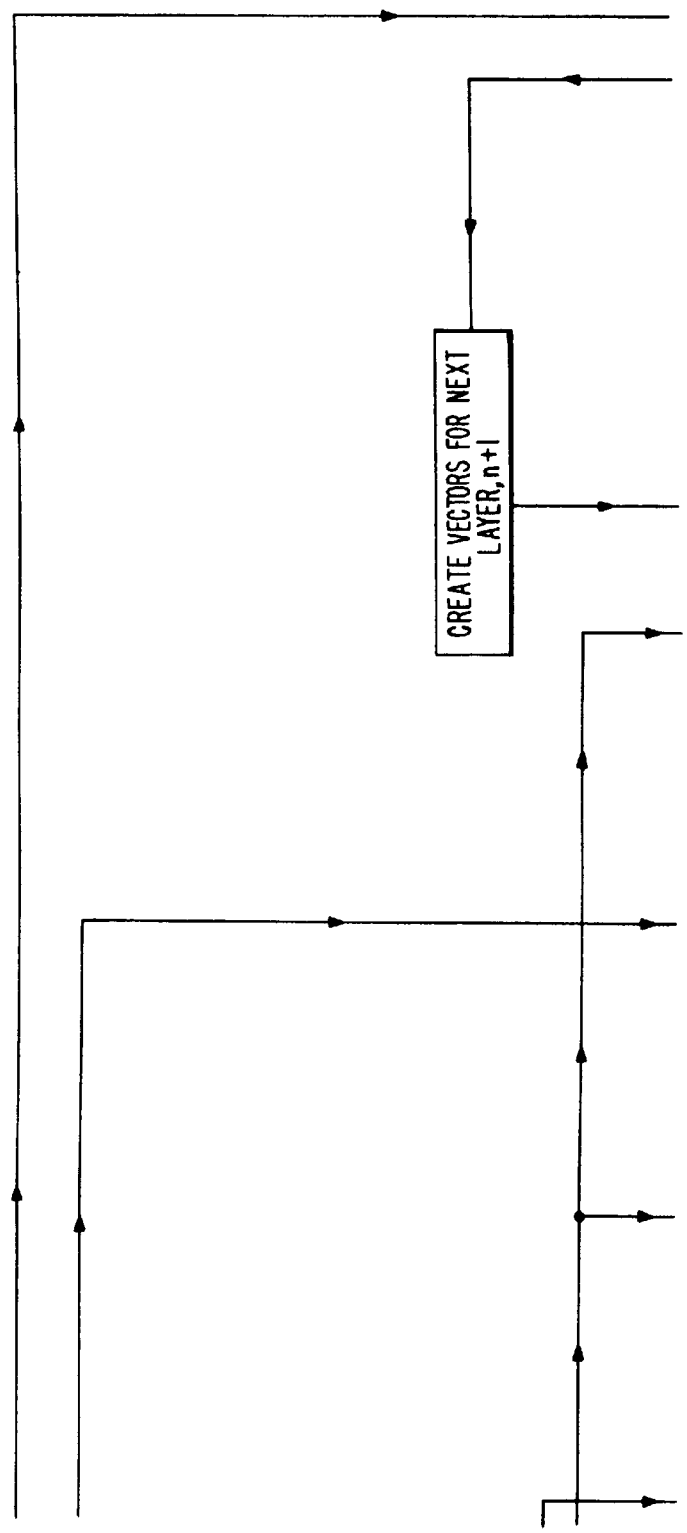
Figure 72C:
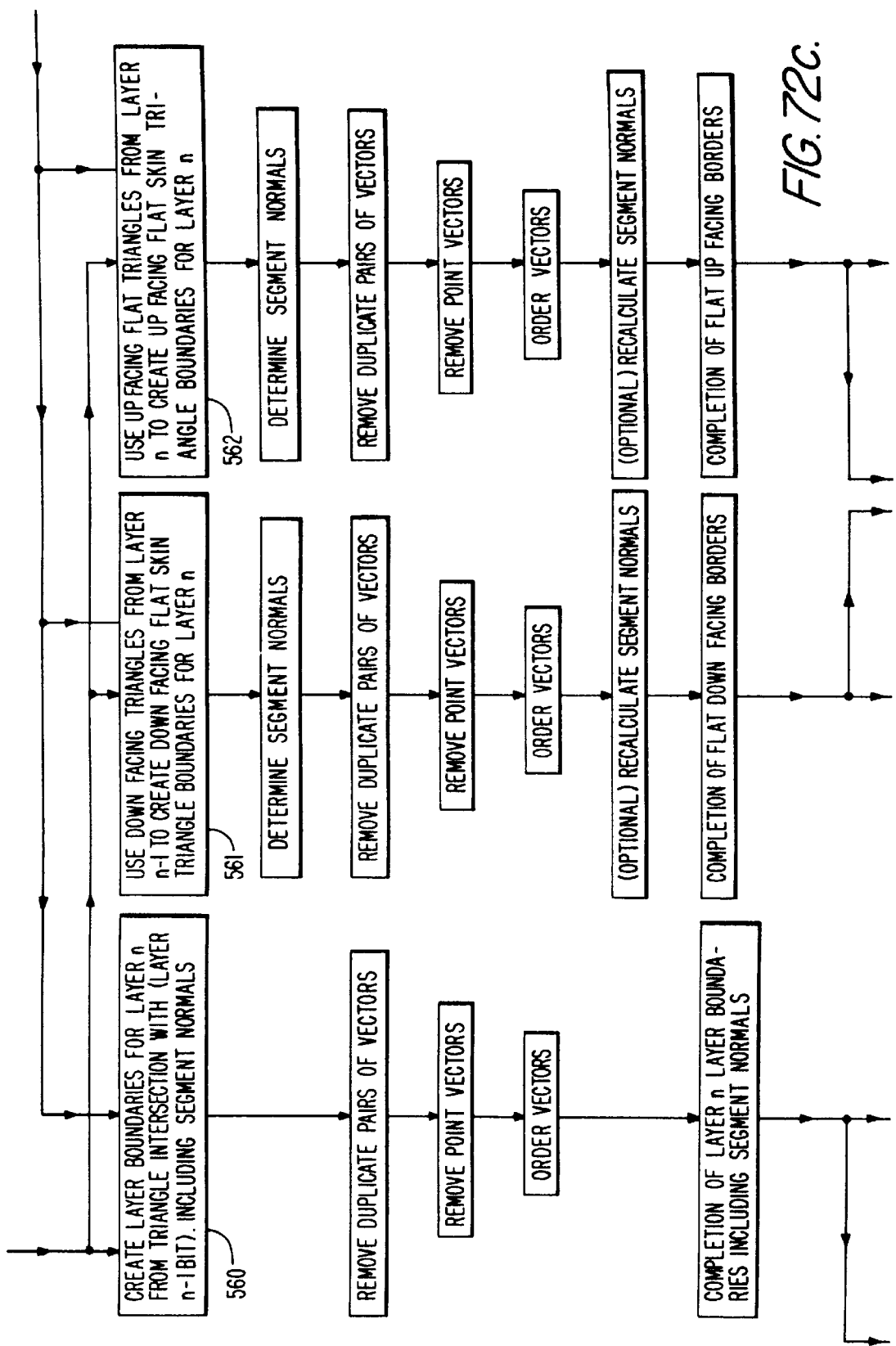
Figure 72E:
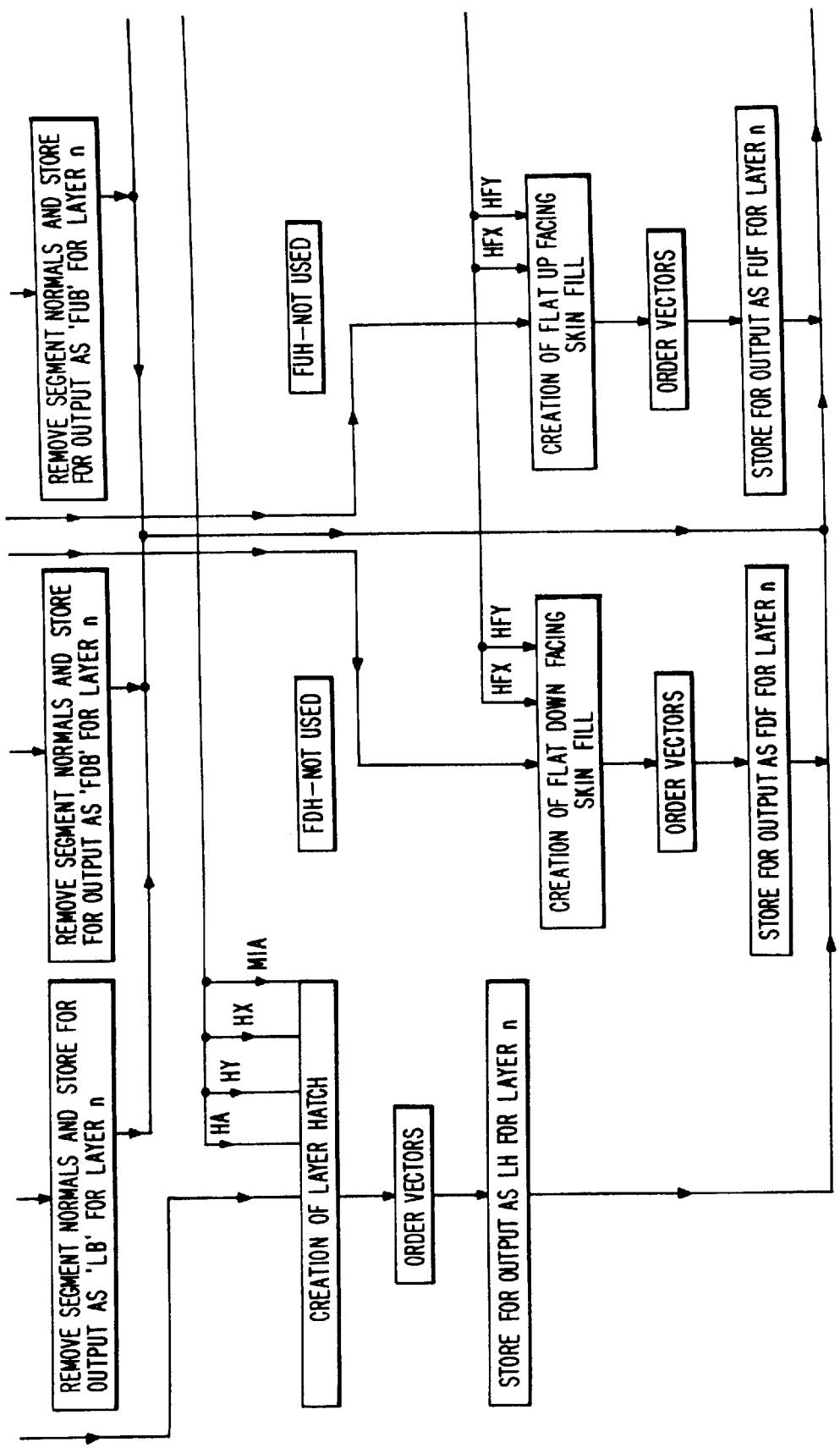
Figure 72F:
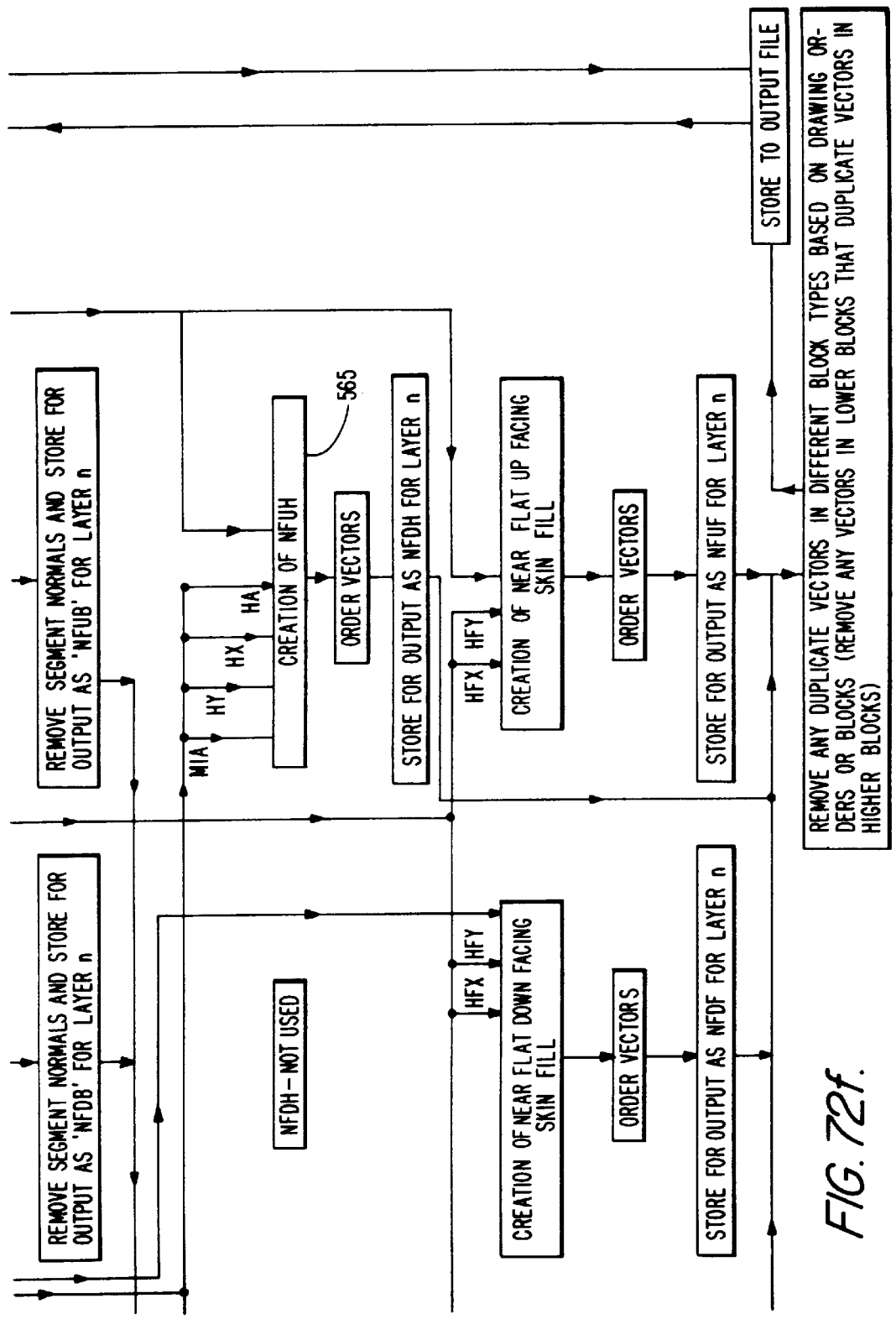

This is illustrated in FIG. 71, which shows a near-flat up-facing triangle intersecting layer n+1 at segment 555, and layer n at segment 556. Segment 555 is then moved down to layer n, and the end parts of segments 557 and 556 are connected to form a trapezoid, along with two additional segments, 558 and 559, which together span the trapezoid.

In step 456, the segment normals are determined as before by comparing the relative positions of the endpoints of the segments, and in step 457, duplicate vectors forming a common side to adjacent trapezoids are eliminated. In step 458, point vectors due to triangle vertices, or collapsing of tiny border vectors due to rounding errors, are eliminated, and in step 459, the border vectors are limited to minimize the passage of the laser beam over uncured polymer. In step 460, the segment normals for the trapezoids are recalculated to correct for the problem of flipping triangles and the attendant problem of segment normals, and in step 461, the completion of the generation of a near-flat up-facing border is signalled. A near-flat up-facing border comprises a series of near-flat up-facing border vectors which are placed end to end, and which, in conjunction with their segment normals, satisfy the left hand rule.

In step 462, the segment normals are removed, the vectors are labelled as NFUB vectors, and then stored for output to the SLI file.

In step 463, near-flat up-facing skin fill vectors are formed using the algorithms already discussed in conjunction with the NFUB vectors, and in step 464, the vectors are ordered for the reasons already discussed. In step 465, the skin fill vectors are labelled as NFUF vectors, and stored for output to the SLI file.

In step 466, duplicate vectors are removed. Between block types, since all boundary hatch vectors are usually drawn with the same cure, and since a vector only needs to be drawn once to cure the proper amount of polymer, duplicates to vectors can be eliminated as being redundant. For example, the vectors of type LB will be drawn first, followed by type LH boundary followed by type NFDB followed by the remaining 8 blocks this order of drawing the vector types was listed earlier in this application. Layer boundaries are placed in the SLI file then before placing LH vectors into the SLI file the LH vectors are compared to the LB vectors so that duplicates can be removed, then the remaining LH vectors are put into the SLI file. Next NFDB vectors are compared to LB vectors, and LH vectors so that duplicates can be removed, then the remaining NFDB vectors are placed in the SLI file. This procedure continues until all boundary and hatch vectors have been compared. Since skin fill vectors are usually given less cure than boundary and hatch they do not need to be drawn where they duplicate other skin vectors, boundary, or hatch vectors. This elimination of vectors continues until all block types have been processed. With the final result being what goes into the SLI file, in the right order of course, and in step 467, all data stored for output is stored in the SLI file. Then, SLICE 3.20 moves back to step 407 to repeat the above-described process for the next layer. This will continue until all layers have been handled.

Figure 29I:
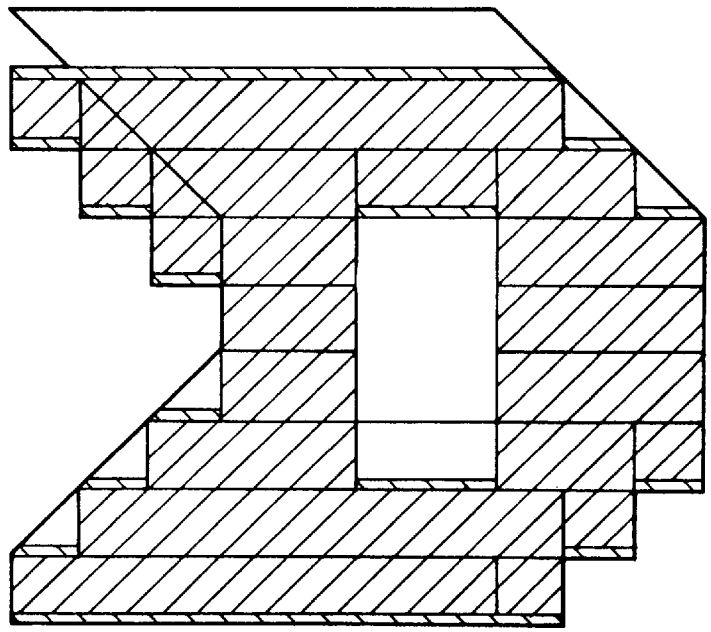

FIG. 58 represents the process called STYLE 1 presently used by SLICE version 3.20 for building parts. The characteristic of this process, as described in the body of the application, and as illustrated in FIGS. 29*h* and 29*i*, is that it will build oversized parts, which can be sanded down to yield an accurate replica of the object.

FIG. 72 represents another process called STYLE 2 for building oversized parts, not currently implemented in SLICE version 3.20, but which will be implemented in future versions of SLICE. This process is illustrated in FIGS. 30*a*–30*j* and discussed extensively in the associated text in the body of the application. However, its main differences with STYLE 1 will now be noted.

The first difference is that, as indicated in step 560 of FIG. 72, layer hatch and boundary vectors are formed at 1 bit below a slicing layer as opposed to 1 bit above. The next difference is that, as indicated in step 561, down-facing flat triangles from layer n-i are used to determine down-facing skin boundary and fill vectors for layer n. This is analogous to the creation of up-facing skin boundary and fill vectors at layer n+1 for layer n. Also, as indicated in step 562, the up-facing skin boundary and fill vectors for layer n in STYLE 2 are created at layer n.

Next, as indicted in step 563, near-flat down-facing border and skin fill vectors for layer n are created from the intersection of near-flat down-facing triangles with slicing layers n and n–1. This is in contrast to the situation in STYLE 1, where near-flat down-facing border and skin fill vectors were created from the intersection of near-flat down-facing triangles with slicing layers n and n+1. Another difference is that near-flat down-facing hatch vectors are not created in STYLE 2, while they were created in STYLE 1 to provide the necessary structural support for near-flat down-facing skin fill.

Also, as indicated in step 564, near-flat up-facing skin boundary and fill vectors for layer n are created from near-flat up-facing triangles intersecting layers n and n–1. This is in contrast to the creation of such vectors in STYLE 1 from near-flat up-facing-triangles intersecting slicing layers n and n+1. Finally, as indicated in 565, near-flat up-facing hatch vectors will be generated from the near-flat up-facing border vectors. This is because in STYLE 2, unlike the situation in STYLE 1, the cured polymer from the near-flat up-facing skin boundary and fill vectors will be free floating unless hatch vectors are generated to provide structure. This is analogous to the situation in STYLE 1, where the polymer from the near-flat down-facing skin boundary and fill vectors would be left free floating unless hatch vectors were generated to provide structure.

Two additional styles, STYLES 3 and 4, are extensively discussed in the body of the application, and are also illustrated in FIGS. 31*a*–31*j* (STYLE 3), and in FIGS. 31*k*–31*s* (STYLE 4). These styles are useful for generating undersized parts, which must be filled in and cured with additional polymer in a subsequent processing step. STYLES 3 and 4 are not yet implemented in version 3.20 of SLICE, but are expected to be implemented in future versions.

Additional styles which are expected to be implemented in later versions of SLICE include the curing of a part having dimensions which are the average of the dimensions of an oversized part, as developed according to STYLES 1 and 2, and an undersized part, as developed according to styles 3 and 4. By taking the average, the part will be close in resolution to the object, and will require fewer if any post-processing sanding or filling steps. Moreover, any type of average can be taken, including but not limited to the geometric average, or arithmetic average. Parts produced according to this approach will be useful for certain high speed applications, where the time to perform the filling or sanding post-processing steps is not available, and where high precision is not important.

Another style which is expected to be available in future versions of SLICE is the use of a topological average to produce a part. In this approach, the purpose is to ensure that certain topological features of an object, i.e. a 1 mil gap between 2 blocks, or a 1 mil flagpole extending out of an object, are not lost, since such features might otherwise disappear during the stereolithography process due to rounding distortions. In those instances where certain of these topological features are necessary to reproduce in a part, this style contemplates a user being able to flag those features which must be reproduced in the final part.

A new layer border and hatch generation algorithm is expected to be implemented in future versions of SLICE. A key aspect of the algorithm is that layer boundary and hatch vectors will be generated exactly at the slicing layer, not 1 bit above as in STYLE 1, or 1 bit below, as in STYLE 2. The major advantage of this algorithm is that it will significantly ease the computational burden now required to implement STYLES 3 and 4, which burden is due to the requirement of taking intersections of areas encompassed by boundary vectors. Another benefit of this algorithm is that it will enable the detection of downfacing skin fill areas, so that full curing to 6 mil beyond the layer thickness, e.g. 26 mil, can be suppressed in these areas, and curing only to the layer thickness, e.g. 20 mil is allowed. In this instance, 6 mils of error will be eliminated.

Figure 73:
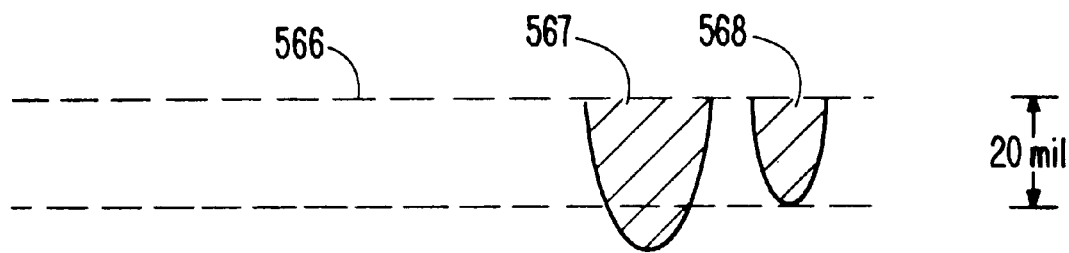
FIG. 73 illustrates the difference in cure depth which results if over-curing by 6 mils to adhere to an adjacent layer.

As mentioned above, a significant benefit of generating layer border and hatch vectors at the slicing layer instead of 1 bit above or below is that it will enable flat down-facing skin fill to be generated at the correct cure thickness, e.g. 20 mil, instead of a cure thickness which is 6 mil beyond the desired cure thickness. This problem will occur because LB and LH vectors will be generated in flat down-facing skin areas, as well as areas without down-facing features. One reason why is that the LB vectors will be generated 1 bit above the slicing layer, while the FDB vectors will be generated right at the slicing layer, with the result that the LB and FDB vectors may not have the same endpoints. If they had the same endpoints, they could be recognized as duplicate vectors, and could be eliminated. The reason why the LB and LH vectors yield a cure depth of 6 mils beyond the layer thickness is that they are used to adhere adjacent cross-sections to one another, for which purpose 6 mils of extra cure depth is added. This problem is illustrated in FIG. 73, which illustrates a flat down-facing area representing the bottom of a part. As indicated, the layer thickness should be 20 mil. However, cured polymer 567 results from undesired and inadequate LB (and hence LH) vectors which cause curing 6 mils beyond the 20 mil desired thickness. The elimination of the undersized LB (and LH) vectors would enable the proper cure depth, i.e. 20 mil, to be obtained as indicated at 568. STYLE 1 will generate FDH vectors for flat down-facing areas, but these vectors could be programmed to yield a 20 mil cure depth, so that eliminating the LB and LH vectors would have a beneficial impact.

Figure 74A:
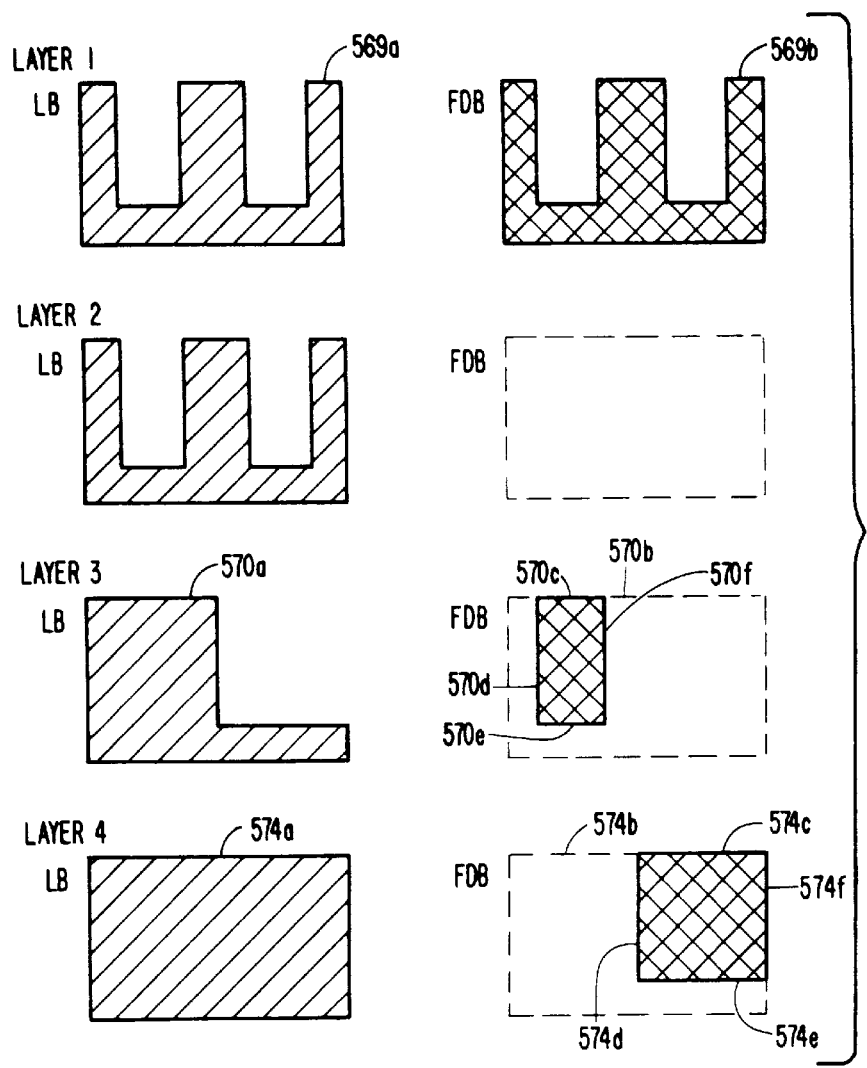
FIG. 74(A) illustrates four slicing layers of an object, highlighting the FDB vectors.

The elimination of duplicate LB (and LH) vectors in flat down-facing areas can be illustrated using FIG. 74, which illustrates the LB vectors, and the FDB vectors, associated with four different slicing layers of a part.

Regarding the first layer, the LB vectors are indicated as 569(A), while the FDB vectors are indicated as 569(B). Since the LB and FDB vectors are generated at the same slice layer and completely duplicate one another, the LB vectors can be easily eliminated.

Regarding the second layer, there is no flat downfacing area to worry about.

Regarding the third layer, the LB vectors are indicated as 570(A), while the FDB vectors are indicated as 570(B). As can be seen, the LB vectors and the FDB vectors will only be duplicated at segment 570(C), and the LB vectors for this segment can be eliminated.

Figure 74B:
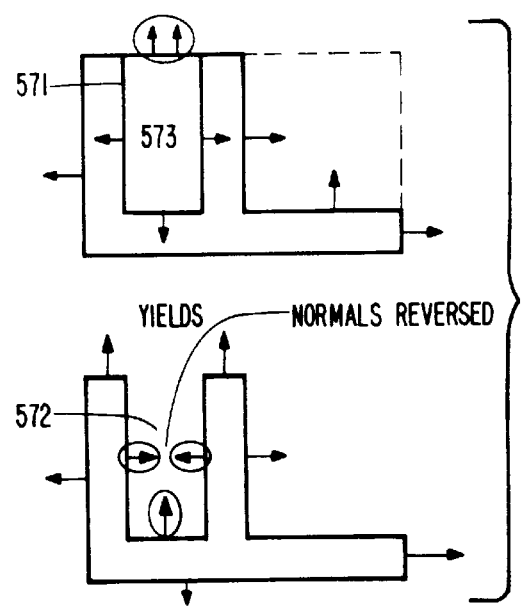
FIG. 74(B) illustrates reversing segment normals for LB vectors to stop hatching in an area.

In addition, the FDB vectors and their segment normals for the other 3 sides, 570(D)–570(F), will be copied to create new LB vectors for these three segments as indicated by 571 in FIG. 74 (B). The LB vectors are created in order to stop the generation of LH vectors in hollow region 573 in FIG. 74(B). However, assuming the "net summation hatching" algorithm is in place for generating hatch vectors, since the segment normals are pointed into the solid region instead of out of the solid region, LH vectors will still be generated inside hollow area 573. Therefore, to get around this problem, the segment normals will be reversed as indicated by 572 in FIG. 74(B). With this change in place, the generation of LH vectors inside region 573 will be suppressed.

With regards to layer 4, the LB vectors are indicated by 574(A), while the FDB vectors are indicated by 574(B). The LB vectors associated with segments 574(C) and 574(F) will be removed the segments associated with 574(D) and 574(E) will be copied into new LB vectors for these two segments. In addition, the segment normals associated with these two segments will be reversed, so that the generation of LH vectors in the flat down-facing area will be suppressed in a similar way to the suspension of those vectors in layer 3.

Another benefit of this algorithm is that it will significantly improve the computational efficiency of the STYLE 3 and 4 algorithms, and should facilitate their implementation, with the result that undersized parts can be more easily obtained. In addition, the generation of undersized parts as per STYLES 3 and 4 in conjunction with the generation of oversized parts as per STYLES 1 and 2 will enable the implementation of the averaging STYLES mentioned earlier.

STYLE 3 indicates that the layer boundaries for STYLE 3 (layer n) will surround the areas enclosed by the layer boundaries of STYLE 1 (layer n) minus the intersection of the areas enclosed by the layer boundaries of STYLE 1 (layer n) with the areas endorsed by up-facing near-flat boundaries from STYLE 1 (layer n).

Figure 75A:
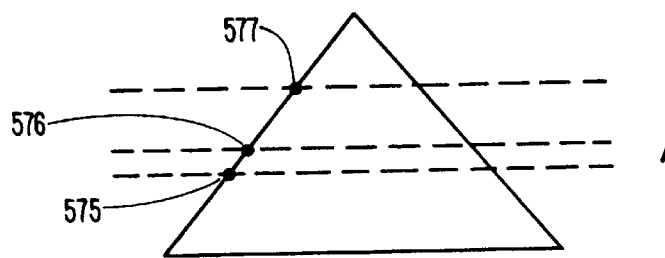
FIG. 75(A) illustrates that obtaining LB vectors 1 bit above the slicing layer means that FUB vectors will not duplicate LB vectors.
Figure 75B:
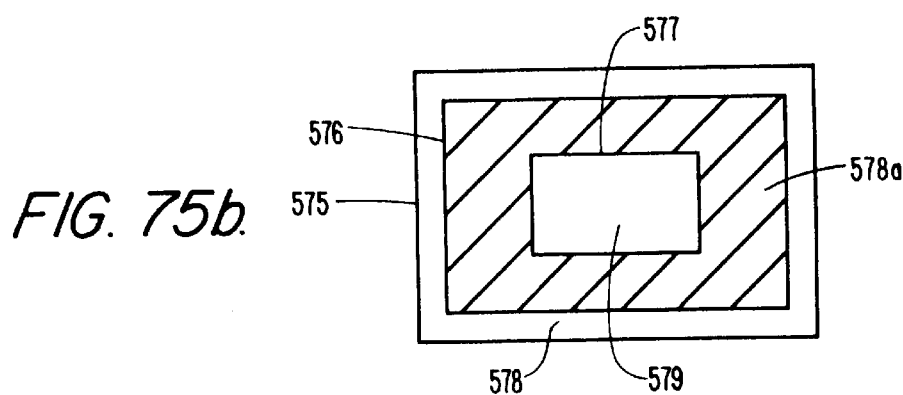
FIG. 75(B) illustrates the determination of the area required by STYLE 3.

Therefore, with respect to FIGS. 75(A) and 75(B), the layer boundary associated with layer n is indicated as 576, which is 1 bit above the slicing layer. The up-facing near-flat boundaries are indicated as 575 and 577. The layer boundaries for STYLE 3, as called for by the above description, are the border vectors (577) for the area 579 but to obtain this from the three boundary loops requires a 2 dimensional area analysis to obtain the desired boundaries which is somewhat complex. If the layer boundary vectors and near-flat up-facing skin boundary vectors are generated at the same layer, 575 and 576 will be duplicates, and area 578 and 578(A) in FIG. 75(B) will disappear. If duplicate vectors are removed this leaves only the area 579 and boundaries 577 remaining which are exactly the layer boundaries desired (with segment normals reversed). This will tremendously ease the computational burden required to implement STYLE 3 since the computation of the intersection called for by STYLE 3 can be implemented through simple vector addition and subtraction. If vectors are not obtained at the same level, as indicated in FIG. 75(B), the intersection requires keeping track of more than one two-dimensional area, and cannot be computed using simple vector addition and subtraction.

Beam Width Compensation

Beam width compensation will now be described. Beam width compensation had been implemented in previous versions of SLICE, but several improvements in the algorithm for beam width compensation are available in SLICE version 3.20.

The basic concept of beam width compensation is to adjust the border vectors of a solid inward to the solid by ½ of the beam width so that the final cured part will more closely resemble the original. If no compensation were made for beam width, the final cured part could be off by as much as a full beam width, i.e. 7–20 mils.

A simple adjustment of the boundary vectors by ½ of the beam width will, however, cause several other distortions. This section discusses several of these distortions, and the method of getting around them which have been adopted.

Figure 76A:
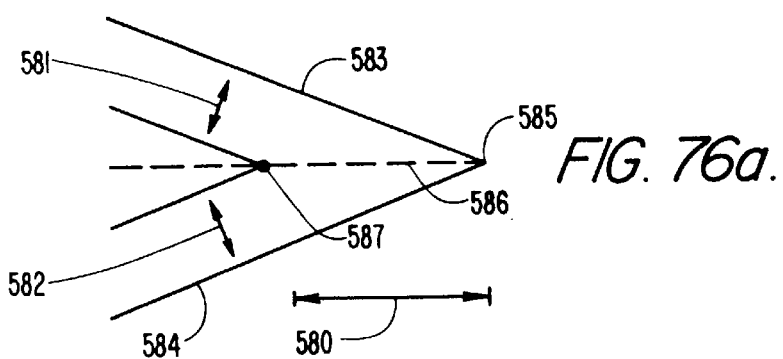
FIG. 76(A) illustrates distortion at a sharp point caused by beam width compensation.

The first problem is the vertex problem, which will be illustrated with reference to FIG. 76(A).

As indicated in the Figure, the contour of an object, indicated at 583 in the Figure, forms a sharp vertex. Beam width compensation begins by moving vertex point 585 along axis 586 to 587 until the distance 581 and the distance 582 are approximately ½ beam width each. A problem with this approach is that the distance 580 may be several inches, which will give rise to a large distortion in the part.

One solution is to simply move the vertex closer to point 585, but this will result in distortion along the entire length of segments 583 and 584, this is the present implementation where we limit the distance 580 to less than or equal to two beam widths.

Figure 76B:
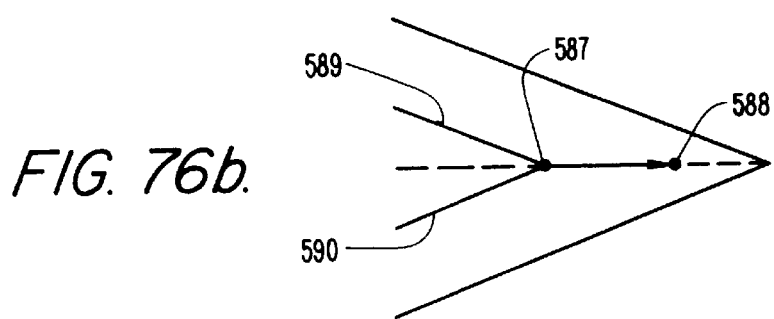
FIG. 76(B) illustrates a way of solving for the distortion.

Another solution is illustrated in FIG. 76(B). This situation is simply to move the beam and cure the polymer from points 587 to 588 (and also to move the beam along path 589, and along path 590). This yields a much more accurate part, and is planned for implementation in the future.

Figure 77A:
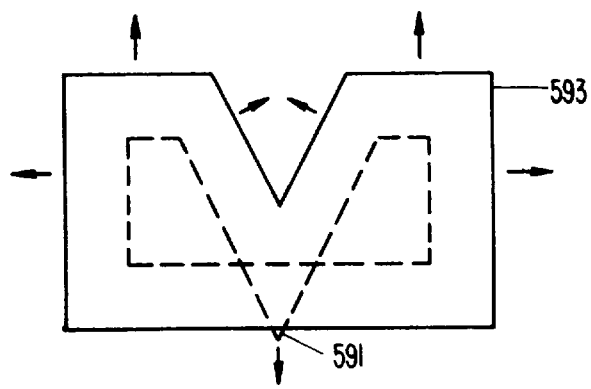
FIG. 77(A) illustrates Type 2 distortion caused by beam width compensation.
Figure 77B:
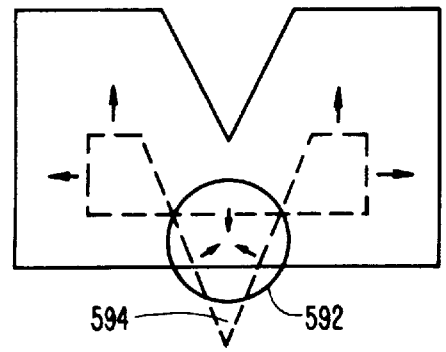
FIG. 77(B) illustrates the apparent flipping of segment normals at the point of distortion illustrated in FIG. 77(A)

A second problem is illustrated in FIG. 77(A). As indicated, the dotted line represents the change made to the boundary (solid line) for beam width compensation. As indicated by 591, this will result, in some instances, in a distortion around the point of a vertex. Besides the distortion, another problem is indicated in FIG. 77(B), where the segment normal vectors associated with the area at the vertex have apparently reversed.

As indicated in FIG. 77(A), although initially all the segment normals on the border 593 point outwards, once the borders have been compensated, a situation can arise, as indicated in 591, where the segment normals vertex inward. Therefore, besides the distortion of the point, another problem is that the pointing of the segment normals will cause misgeneration of hatch vectors in the area surrounding 594. This is because the segment normals erroneously indicate that solid surrounds area 594.

In sum, the first major problem that occurs with beam width compensation is the extension of a hollow or the removal of solid at sharp points.

A second major problem with beam width compensation is the crossover problem; whereby vectors crossover each other forming sections of inside/out boundaries which can give trouble when attempting to hatch or fill between boundaries, but an additional problem exists that is whenever a crossover occurs it indicates the feature is too small to accurately draw, but in an attempt to still be as accurate as possible we should draw the boundaries with no gap between (either a gap from crossing over, or a gap from not offsetting far enough is less than the best possible representation) even to the extent of exposing it on one boundary. There have been two distinct types of crossover problems observed, type 1 shows a flipping of a vector (violation of left hand rule for vectors) whenever a crossover takes place, whereas type 2 crosses over but does not give a warning that a problem has occurred.

Figure 77C:
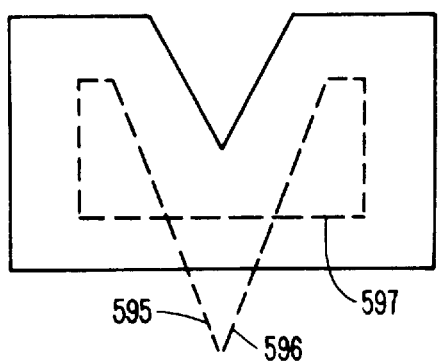
FIG. 77(C) illustrates an aggravated form of the distortion illustrated in FIG. 77(A)

The type 2 vector crossover problem is illustrated in FIG. 77(C), whereby vector 595 is caused to crossover vector 597, and whereby vector 596 is also caused to crossover vector 597. As indicated in FIG. 77(B), the problem arises because compensation causes the area 594 to be formed with segment normals apparently reversed. Note that this occurred even though no flipping of segment normals took place.

Figure 78A:
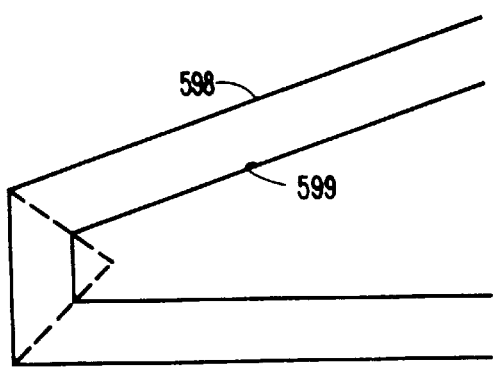
FIG. 78(A) illustrates beam width compensation at a sharp vertex.
Figure 78B:
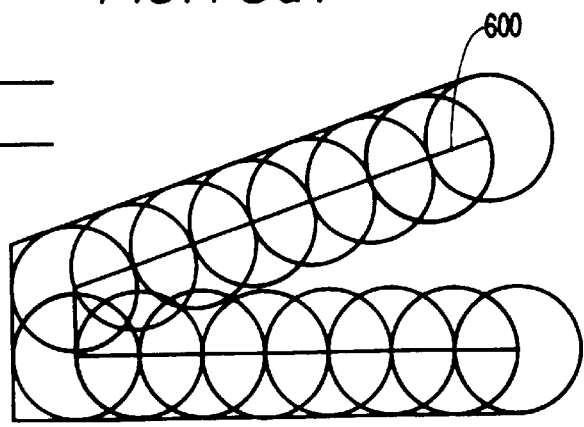
FIG. 78(B) illustrates the passage of the laser beam along the sharp vertex of FIG. 78(A)

The type 1 vector crossover problem is illustrated in FIGS. 78(A)–78(D). FIGS. 78(A)–(B) illustrate the situation where beam width compensation works correctly. With respect to FIG. 78(A), 598 represents the layer boundary surrounding the solid of a part which has not been compensated for beam width,. while 599 represents the layer boundary compensated for beam width. With respect to FIG. 78(B), 600 represents the passage of the laser beam along layer boundary 599, and as indicated, the compensation has yielded no distortion of the part.

Figure 78C:
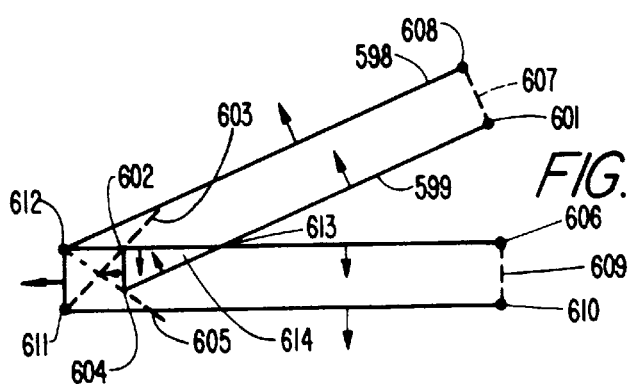
FIG. 78(C) illustrates Type 1 crossover of offset layer boundary vectors caused by beam width compensation.

In FIG. 78(C), on the other hand, a problem known as the crossover problem has occurred. As indicated in the Figure, 598 represents the layer boundary not yet offset, while 599 represents the offset layer boundary. Note that compensated for layer boundary 599 will be formed on a point by point basis.

First, it is assumed that the segments between endpoints 608 and 612, 612 and 611, and 611 and 610, all represent layer boundary vectors.

These vectors will be offset on an endpoint by endpoint basis. First, endpoint 608 will be moved ½ of the beam width along path 607 to form endpoint 601; next, endpoint 612 will be moved ½ beam width along path 605 to form endpoint 604; next, endpoint 611 will be moved ½ beam width along path 603 to form endpoint 602; and endpoint 610 is moved ½ beam width along path 609 to form endpoint 606. Thus, the offset for layer boundary consists of the layer border vectors 601 to 604, 604 to 602, and 602 to 606.

As a result of the compensation, border vectors 601–604, and 602–606 cross over at 613. In addition, the segment normals along the offset layer boundary no longer are consistent with the left hand rule. This is evident when considering that portion of the layer boundary which spans the area 614. As indicated, in moving clockwise around this area, (which was the original rotation of boundaries) the segment normals point into the area, and do not obey the left hand rule.

Figure 78D:
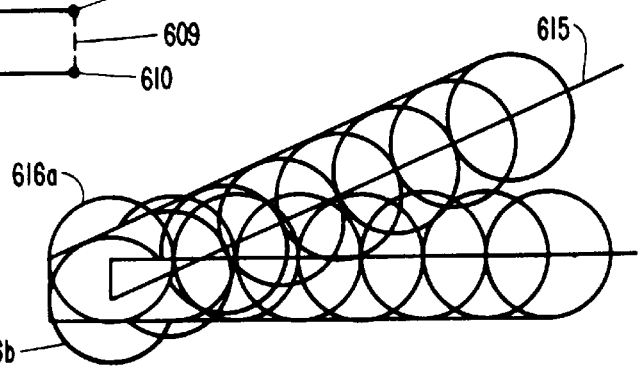
FIG. 78(D) illustrates the passage of the laser beam along with the crossover layer boundary vectors of FIG. 78(C)

The crossover manifests itself as distortion in the final cured part. As indicated in FIG. 78(D), 615 represents the passage of the laser beam. As indicated, there will be significant distortion at the areas indicated by 616(A) and 616(B). This distortion is due to boundaries, if crosshatching was attempted chances are the situation would be worse.

The difference between the crossover problem illustrated in FIGS. 77 and 78 is that FIG. 77 represents the crossover of type 2 vectors, while FIG. 78 represents the crossover of type 1 vectors. In other words, FIG. 78 illustrates the flipping of segment directions while FIG. 77 does not. If all crossovers flipped segment directions it would be a relatively easy task to identify and correct.

The crossover in FIG. 78 can be detected as follows. First, any two vectors if extended far enough will intersect at some point. With reference to FIG. 78(C), the intersection between vector 601–604, of vector 602–606, is determined by extending the 77 vectors if necessary. In this particular example, the vectors do not have to be extended, since they in fact already intersect at 613. Next, since the endpoints of each vector are known, the coordinates of the intersection point are compared with the endpoints of the vectors to determine whether the intersection point is situated between the endpoints of the vectors. If so, it is assumed that a crossover has occurred.

Once the crossover has been detected, there are several possible solutions. One solution is to block the migration of point 612 along with bisecting line 605, and to block the migration of point 611 along bisecting line 603 in FIG. 78(C) to prevent a crossover. This can be accomplished by locating the midpoint of bisecting line 605, and preventing point 612 from moving beyond the midpoint. In addition, the midpoint of bisecting line 603 is determined, and point 611 will be prevented from moving beyond that midpoint.

Figure 78E:
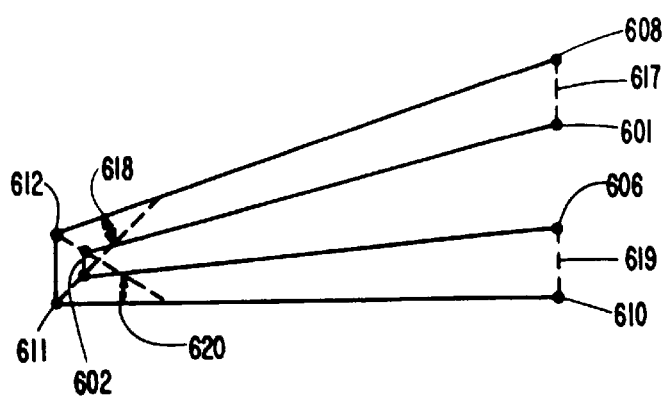
FIG. 78(E) illustrates backing off the offsetting of the endpoints of certain layer boundary vectors to avoid the crossover of FIG. 78(C)

The end result is indicated in FIG. 78(E). The problem that occurs with this solution is that there may be significant distortion along the lengths of boundary vectors 608–612, and 610–611. This is because the distance between these boundary vectors and the offset boundary vectors will no longer be ½ the beam width along the entire length of the boundary vectors. With respect to FIG. 78(E), although the distance between the points 601 and 608, and between 606 and 610, as by indicated 617 and 619 respectively, is still ½ the beam width, the distances 618 and 620 may be substantially less than ½ the beam width.

Figure 79:
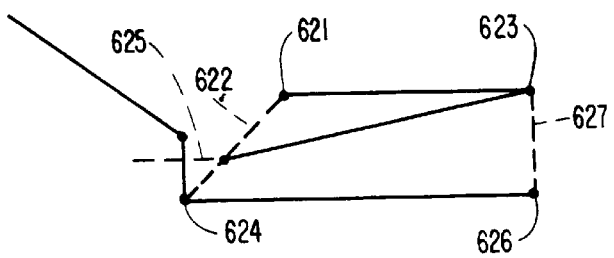
FIG. 79 illustrates the false correction of a crossover.

Another problem that may occur with this approach is that the proper migration of vector endpoints may be blocked even if there would have been no crossover. This situation is illustrated with respect to FIG. 79.

As indicated in the Figure, beam width compensation begins by first moving endpoint 626 ½ beam width along path 627 to point 623. Next, the algorithm attempts to move endpoint 624 along path 625 to point 621, where it is simultaneously ½ been width from the local portion of the layer boundary. However, as indicated earlier, the above algorithm will prevent point 622 from moving beyond the midpoint of line segment 624–621, and this point ends up at 622. Moreover, this point is less than ½ the beam width from boundary vector 624–626, and so significant distortion along this path will be introduced. This in spite of the fact that the point could have been left at 621 with no crossover occurring.

A third problem is that the algorithm of blocking migration of the endpoints to the extent it is effective, is only effective in correcting for the crossover of type 1 vectors. It does not deal with the problem of crossover of type 2 vectors which is illustrated in FIGS. 77(A)–77(C).

A suggested algorithm for handling the aforementioned problems will now be described.

The algorithm proceeds by sequentially offsetting the endpoints of each boundary vector that forms a loop, one endpoint at a time. After each endpoint is offset, the algorithm checks for crossover, and if present, the algorithm modifies the endpoints appropriately without adherence to a fixed rule based on blocking migration of the endpoints along a bisecting line.

The algorithm solves the problem of false positive detection of crossovers problem mentioned above with respect to FIG. 79 since it is invoked only if an actual crossover is detected. In addition, as will be seen, the algorithm works even for type 2 crossed-over vectors.

As mentioned above, once a crossover is detected, the algorithm backs off on the migration of an endpoint to the extent necessary to prevent crossover. The algorithm is not limited to backing up an endpoint to the midway point at a bisecting line, as discussed above.

Figure 80A:
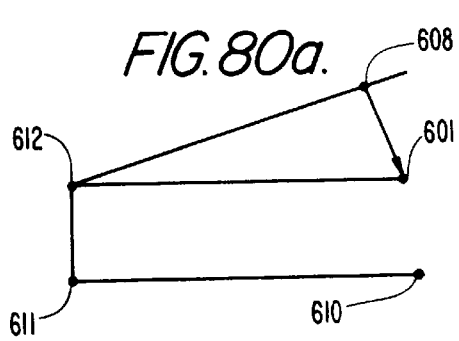
FIG. 80(A) illustrates offsetting a first endpoint for beam width compensation at a sharp vertex.
Figure 80B:
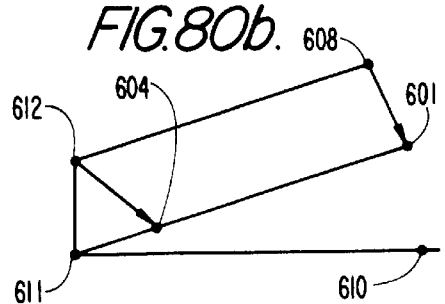
FIG. 80(B) illustrates offsetting a second endpoint for beam width compensation at a sharp vertex.
Figure 80C:
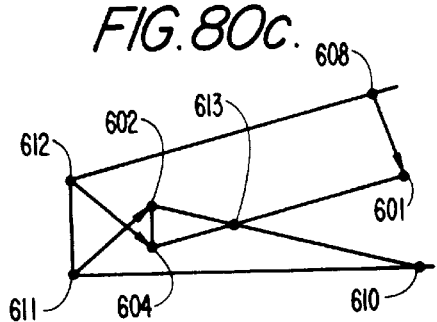
FIG. 80(C) illustrates offsetting a third endpoint for beam width compensation, and the detection of a crossover.

The operation of the algorithm can be obtained with reference to FIG. 80. With reference to FIG. 80(A), endpoint 608 of boundary vector 608–612 is offset by ½ beam width to point 601 and a crossover checked for. Since no crossover is present, the boundary vectors are now considered to be the vectors 601–612, 612–611, and 611–610. With reference to-Figure 80(B), endpoint 612 of vector 601–612 is now offset ½ beam width to point 604, and a crossover checked for. Since no crossover is detected, the boundary vectors are how considered to the vectors 601–604, 604–611, and 611–610. With reference to FIG. 80(C), endpoint 611 is next offset ½ beam width to point 602, and a crossover checked for. At this point, the boundary vectors are tentatively considered to be 601–604, 604–602, and 602–610.

As before, a crossover will be detected by computing the point of intersection on a pairwise basis between all boundary vectors in a loop, and then checking to see whether this point is an internal point, i.e. between the endpoints, for the vectors under consideration. In the example of FIG. 80(C), the following two pairwise comparisons of the vectors-will be made: 601–604 with 604–602, and 601–604 with 602–610. At this stage of processing, the algorithm will detect a crossover during the latter pairwise comparison.

Figure 81A:
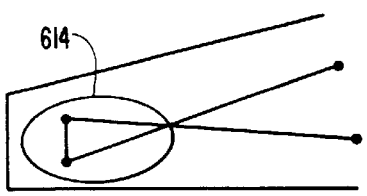
FIG. 81(A) illustrates the crossed-over portion of the layer boundary vectors at a sharp vertex after beam width compensation.
Figure 81B:
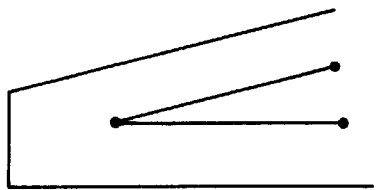
FIG. 81(B) illustrates eliminating the crossed-over portion of FIG. 81(A) as a method of avoiding crossover.
Figure 81C:
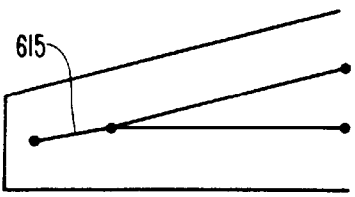
FIG. 81(C) illustrates eliminating the crossed-over potion of FIG. 81(A) by replacing it with a single vector.

The next stage of processing is to decide to what extent to back off the movement of the vector endpoints in order to avoid the crossover. One approach, illustrated in FIG. 81(A), is simply to delete the portions of the vectors indicated by 614 to arrive at the boundary vector illustrated in FIG. 81(B). Alternatively, the area indicated by 614 could be collapsed into a single vector as indicated by 615 in FIG. 81(C). Other approaches to backing off endpoints to avoid crossover are possible.

The above illustrated the use of the algorithm in detecting and correcting the crossover of adjoining vectors. Next, the operation of the algorithm in detecting and correcting for crossover of type 2 vectors will be described.

Figure 82A:
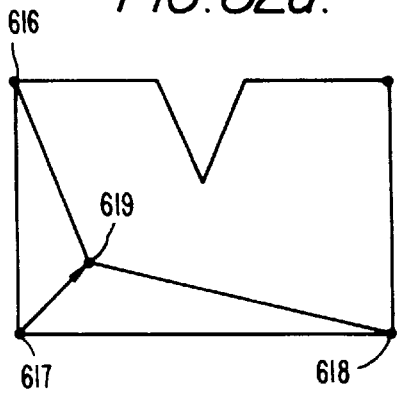
FIG. 82(A) illustrates offsetting a first endpoint for beam width compensation in a Type 2 situation.
Figure 82B:
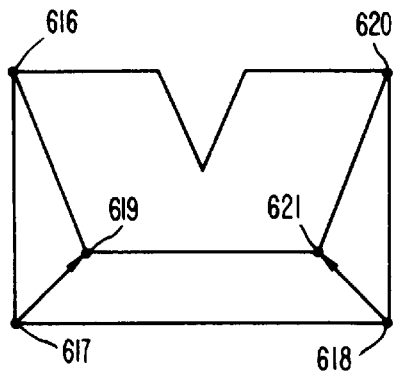
FIG. 82(B) illustrates offsetting a second endpoint for beam width compensation in the example of FIG. 82(A)
Figure 82C:
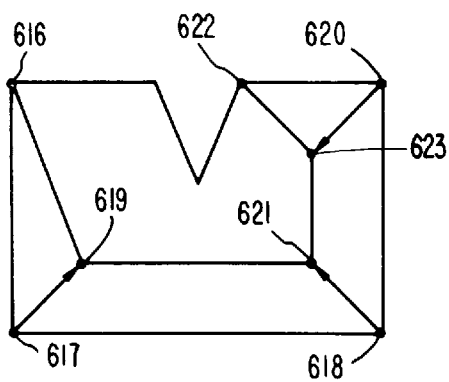
FIG. 82(C) illustrates offsetting a third endpoint for beam width compensation in the example of FIG. 82(A)

With reference to FIG. 82(A), endpoint 617 is offset ½ beam width to 619, and crossover checked for. As before, a pairwise comparison and crossover check of all the boundary vectors in a loop will be performed. Since none is detected, the algorithm proceeds. Then, with reference to FIG. 82(B), endpoint 618 is moved to 621, and a pairwise crossover check performed. Since none is detected, the algorithm proceeds. Next, with reference to FIG. 82(C), endpoint 620 is moved to 623, and a pairwise crossover check is performed. Since none is detected, the algorithm proceeds.

Figure 82D:
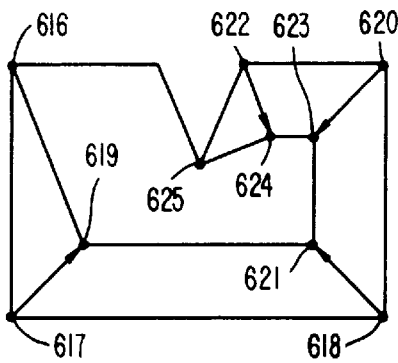
FIG. 82(D) illustrates offsetting a fourth endpoint for beam width compensation in the example of FIG. 82(A)

With reference to FIG. 82(D), endpoint 622 is moved to 624, and a pairwise crossover check performed. Since none is detected, the algorithm proceeds.

Figure 82E:
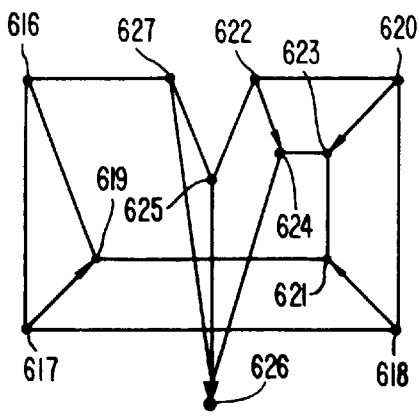
FIG. 82(E) illustrates offsetting a fifth endpoint for beam width compensation in the example of FIG. 82(A) and the deletion of a crossover.

With reference to FIG. 82(E) endpoint 625 is moved to 626, and a pairwise crossover check performed. At this point, crossovers between vectors 624–626 and 619–621, and between vectors 626–627 and 619–621, are detected.

Figure 83A:
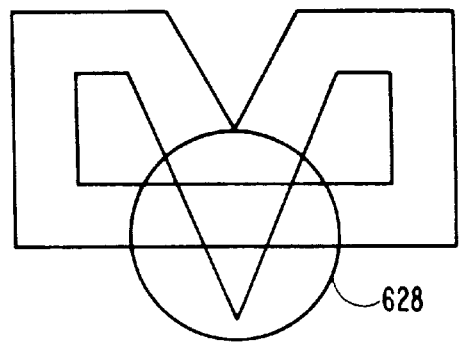
FIG. 83(A) illustrates the crossed-over portions of the layer boundary vectors in the example of FIG. 82(A)
Figure 83B:
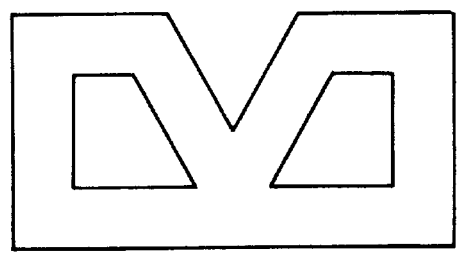
FIG. 83(B) illustrates handling the crossover by eliminating the portion of the layer boundary vectors of FIG. 83(A)

The next step in the algorithm is to determine how to back off the endpoints to prevent crossover. With reference to FIG. 83(A), one approach is to simply cut off the vectors in the circled area indicated by 628 in order to arrive at the boundary vectors indicated by FIG. 83(B).

Figure 83C:
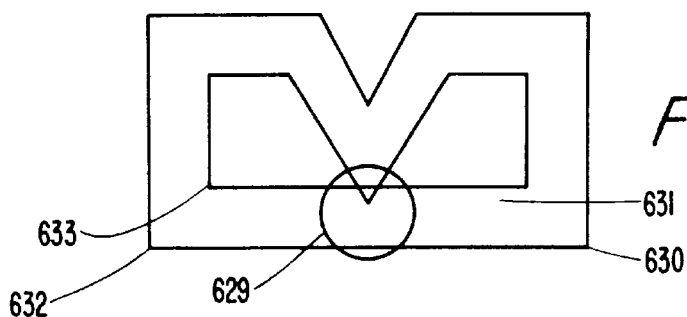
FIG. 83(C) illustrates the presence of crossover after beginning the offsetting of endpoints from a different endpoint than in FIG. 82(A)
Figure 83D:
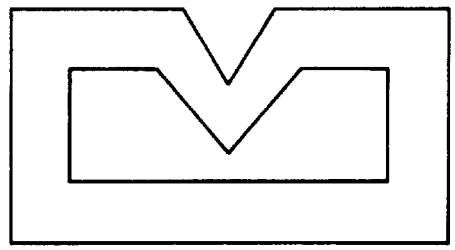
FIG. 83(D) illustrates backing up the endpoints to eliminate the crossover detected in FIG. 83(C)
Figure 84A:
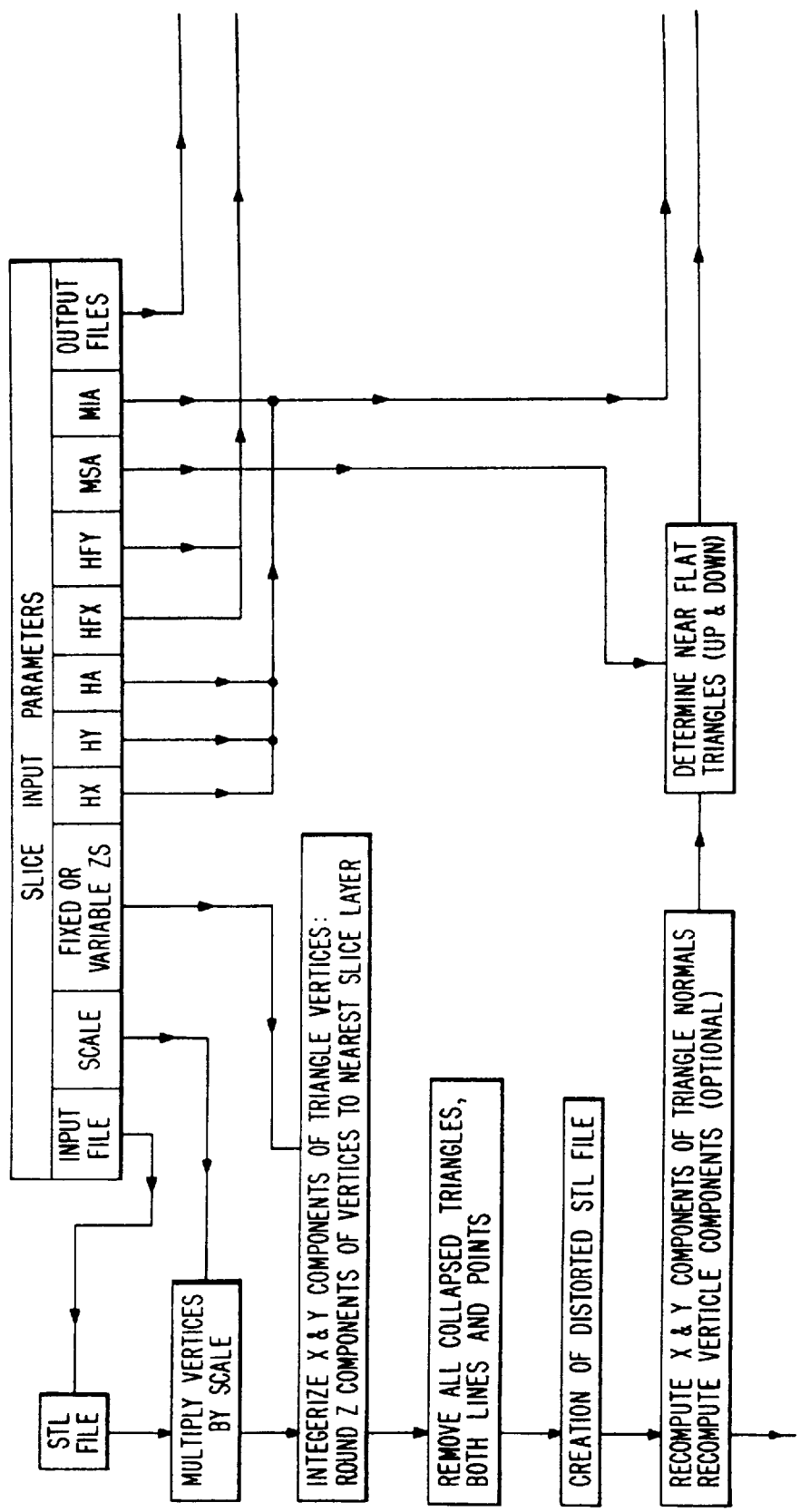
FIG. 84 illustrates a SLICE 320 STYLE 1 flow chart with beam width compensation added.
Figure 84B:
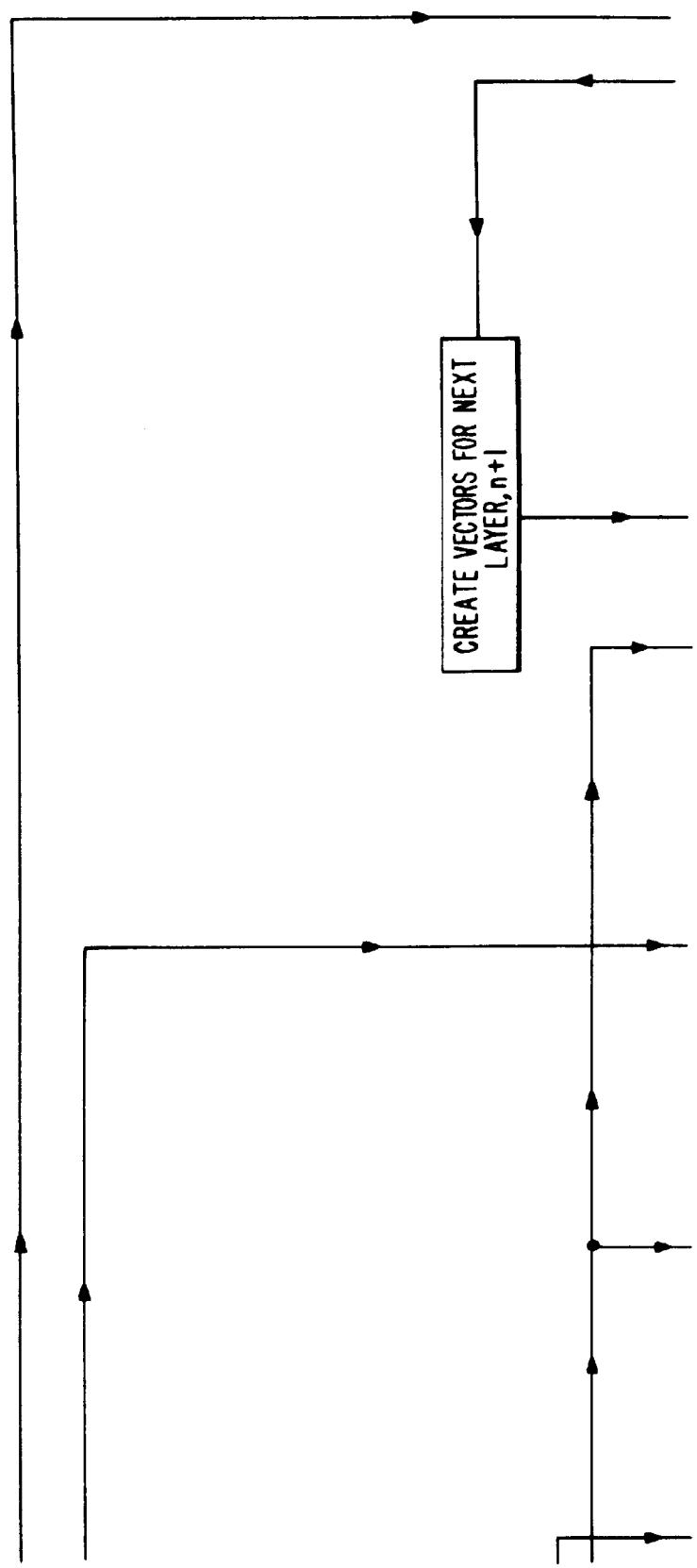
Figure 84C:
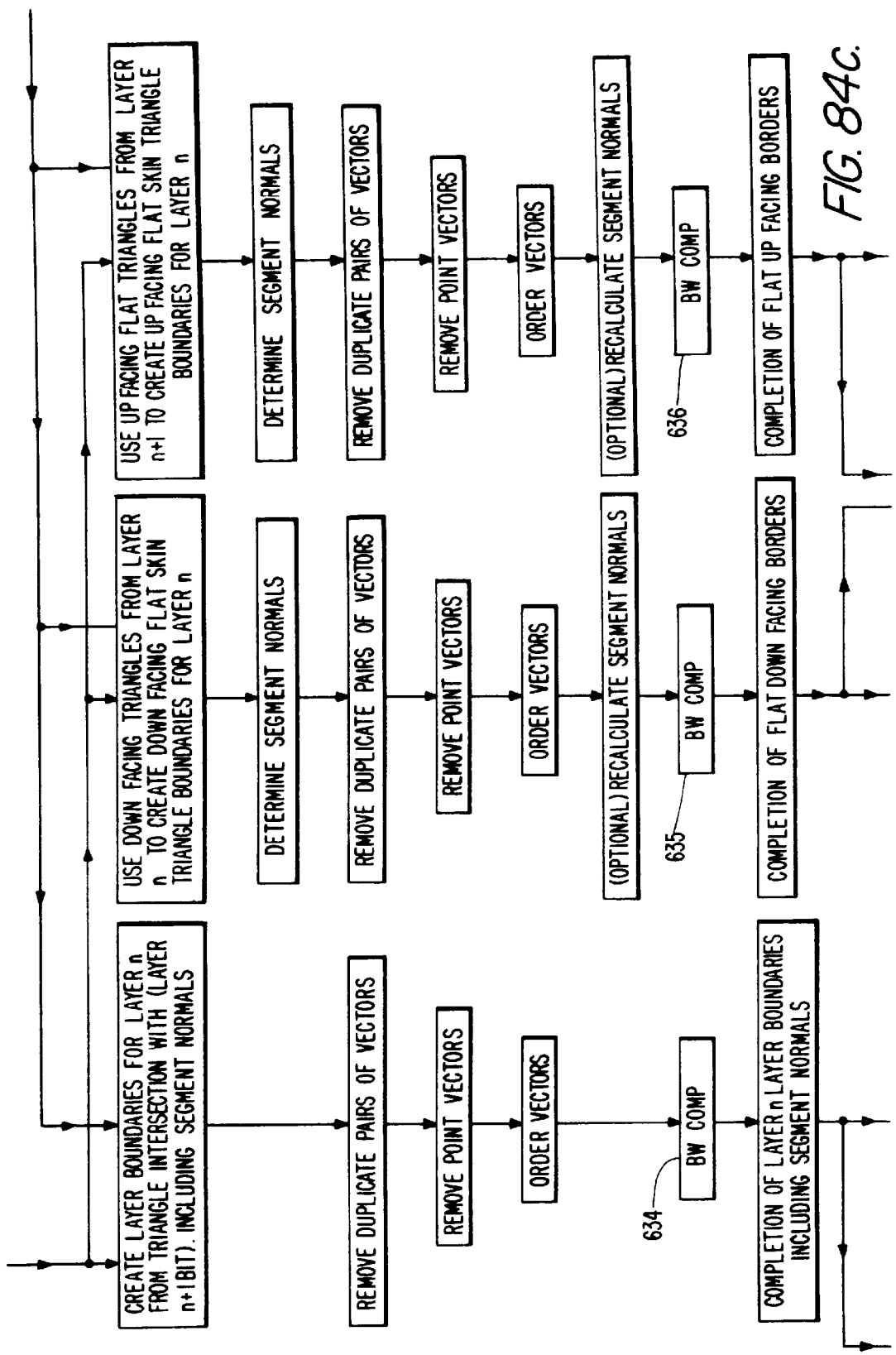
Figure 84D:
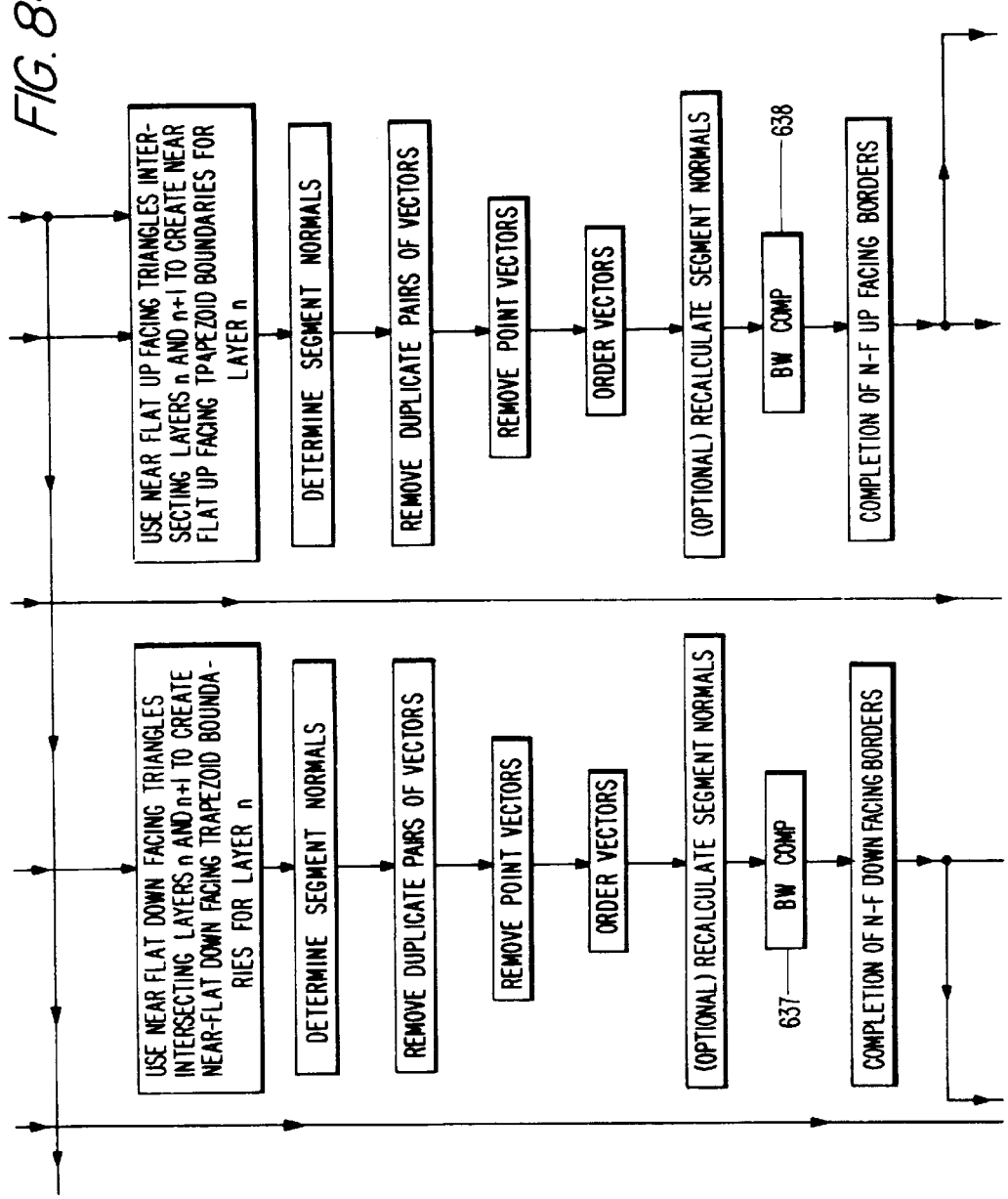
Figure 84E:
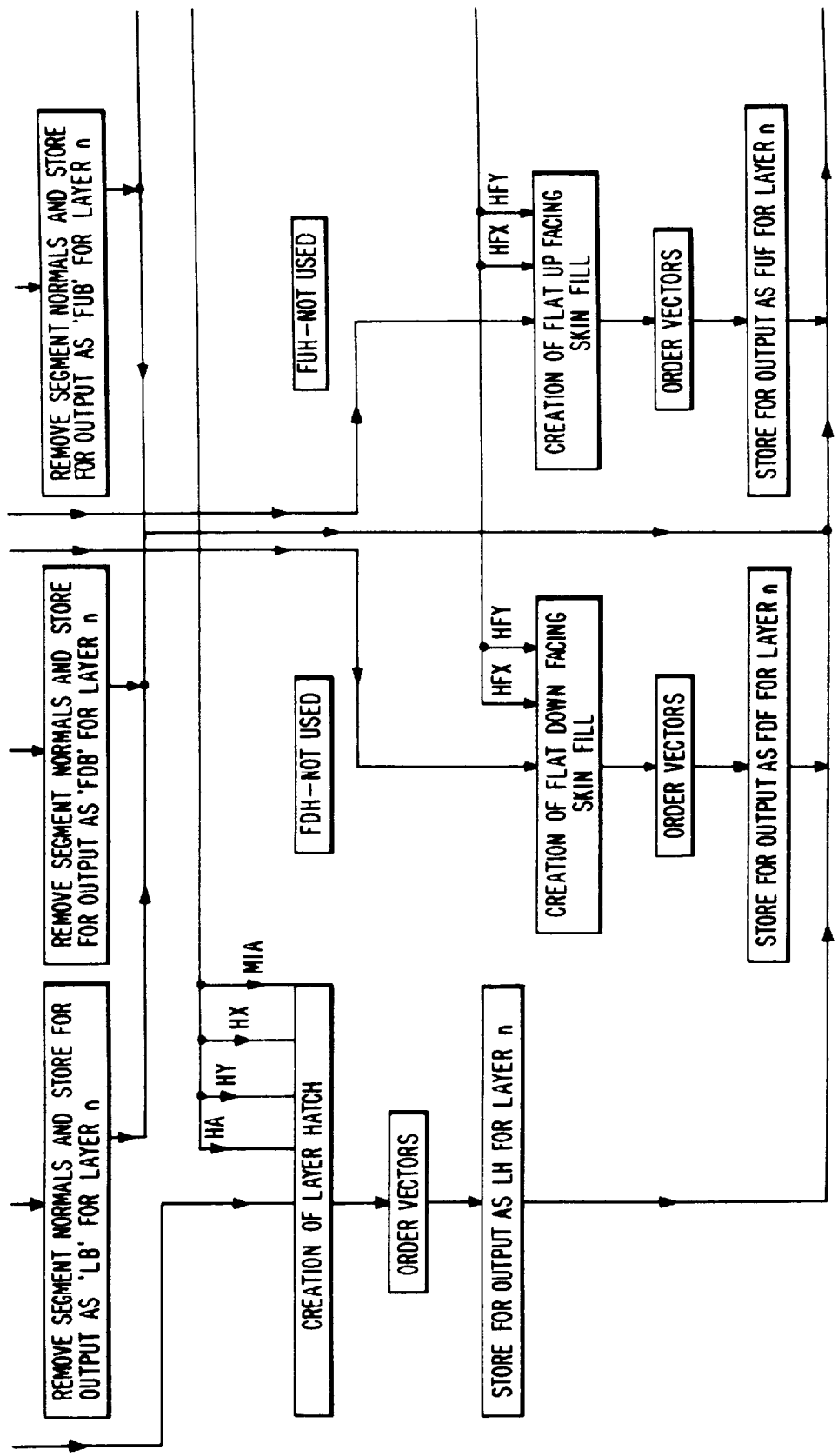
Figure 84F:
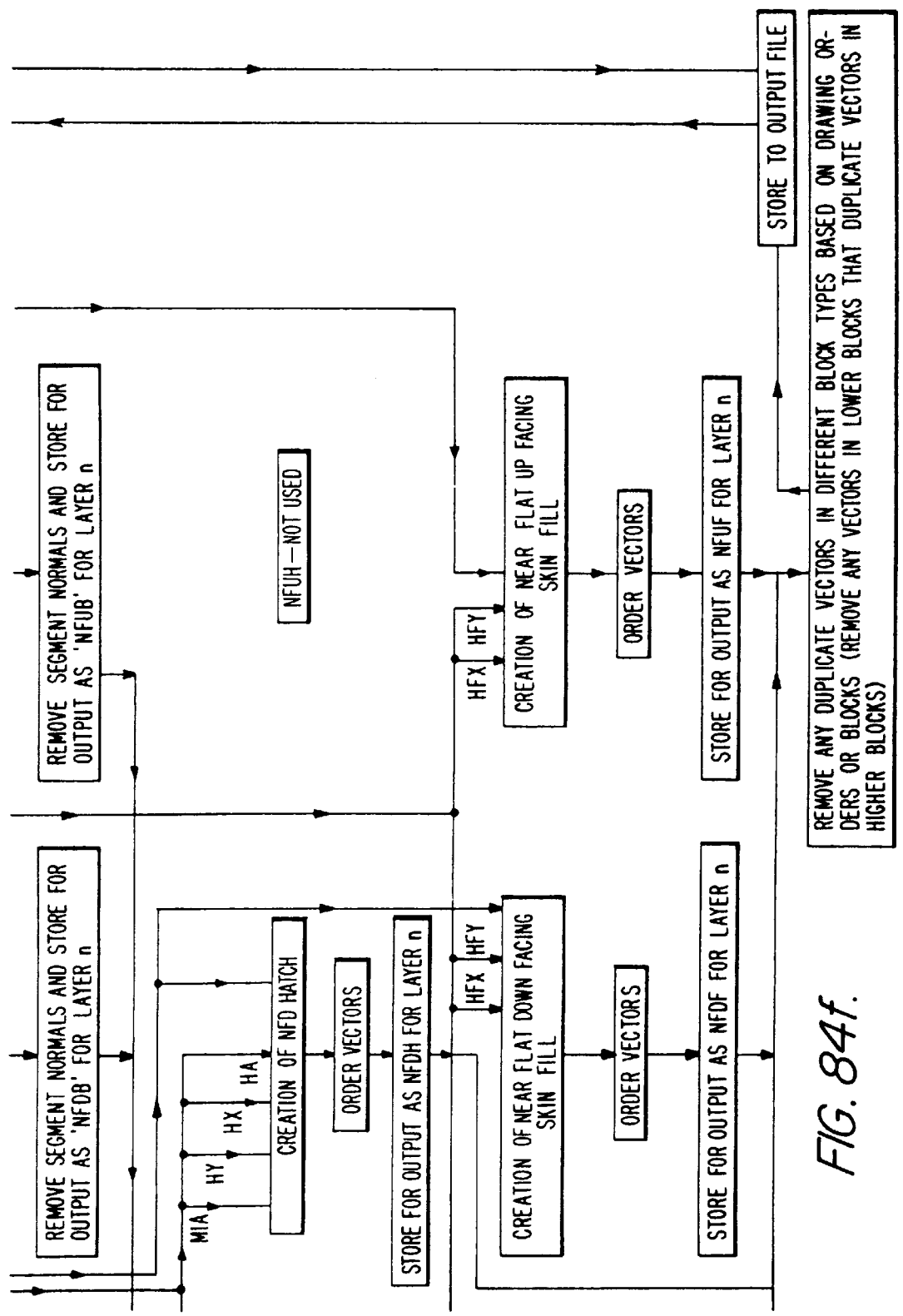

An aspect of the algorithm is that the detection and correction of crossovers will depend on which endpoint of which vector is used to begin the sequence of offsetting steps. In FIG. 83(C), for example, the endpoint indicated by 629 was used to begin the offsetting process, and assuming the sequencing of endpoints proceeds counter-clockwise, a crossover was detected when endpoint 630 is moved to 631. At this point, one approach to backing off would consist of moving endpoint 631 closer to 630, and also moving endpoint 633 closer to 632 so that the situation illustrated in FIG. 83(D) results.

Another approach to backing off, which will be independent of the endpoint where offsetting begins, is to complete offsetting even after a crossover has been detected until all endpoints of all boundary vectors in the loop have been offset, and to then make a decision as to the optimal way to back off.

Implementation of Beam-Width Compensation

At present, beam width compensation is implemented using beam width measurements taken from the banjotops. These measurements are input by a user, and used to determine the offsets of the boundary vectors. Required offset is manually specified as a parameter to slice.

An alternative implementation, which will be available in future versions of the system, is to estimate the appropriate offset adjustment by combining beam profile information with known and measured properties of the resin. This is known as automatic beam width compensation.

The appropriate offset adjustment will be derived from a prediction of the profile of a cured trace which prediction is obtained from beam intensity profile measurements and known properties of the resin. This is described in a related patent application, pertaining to a method and apparatus for beam profiling; U.S. Ser. No. 268,816, now U.S. Pat. No. 5,058,988 which is herein incorporated by reference as though set forth in full herein.

Alternatively, the beam width adjustment can still be determined from the banjotop measurements, with the banjotop measurements recalibrated using changes in the beam intensity profile since the banjotops were last run.

Beam width compensation is presently implemented in SLICE version 3.20. Several steps have been added to SLICE version 3.20 for beam width compensation, which steps are not reflected in FIGS. 58 and 72. These steps will now be described.

With reference to FIG. 84, which is the STYLE 1 flowchart of SLICE, the step of performing beam width compensation will be performed on all the border vector types before the vector data is written out to the .SLI file, and before hatch and skin fill vectors are generated from the border vector data. Therefore, as indicated in FIG. 84, beam width compensation steps 634–638 will be respectively added for layer boundary vectors, flat down-facing border vectors, flat up-facing border vectors, near-flat down-facing border vectors, and near-flat up-facing border vectors.

Figure 85:
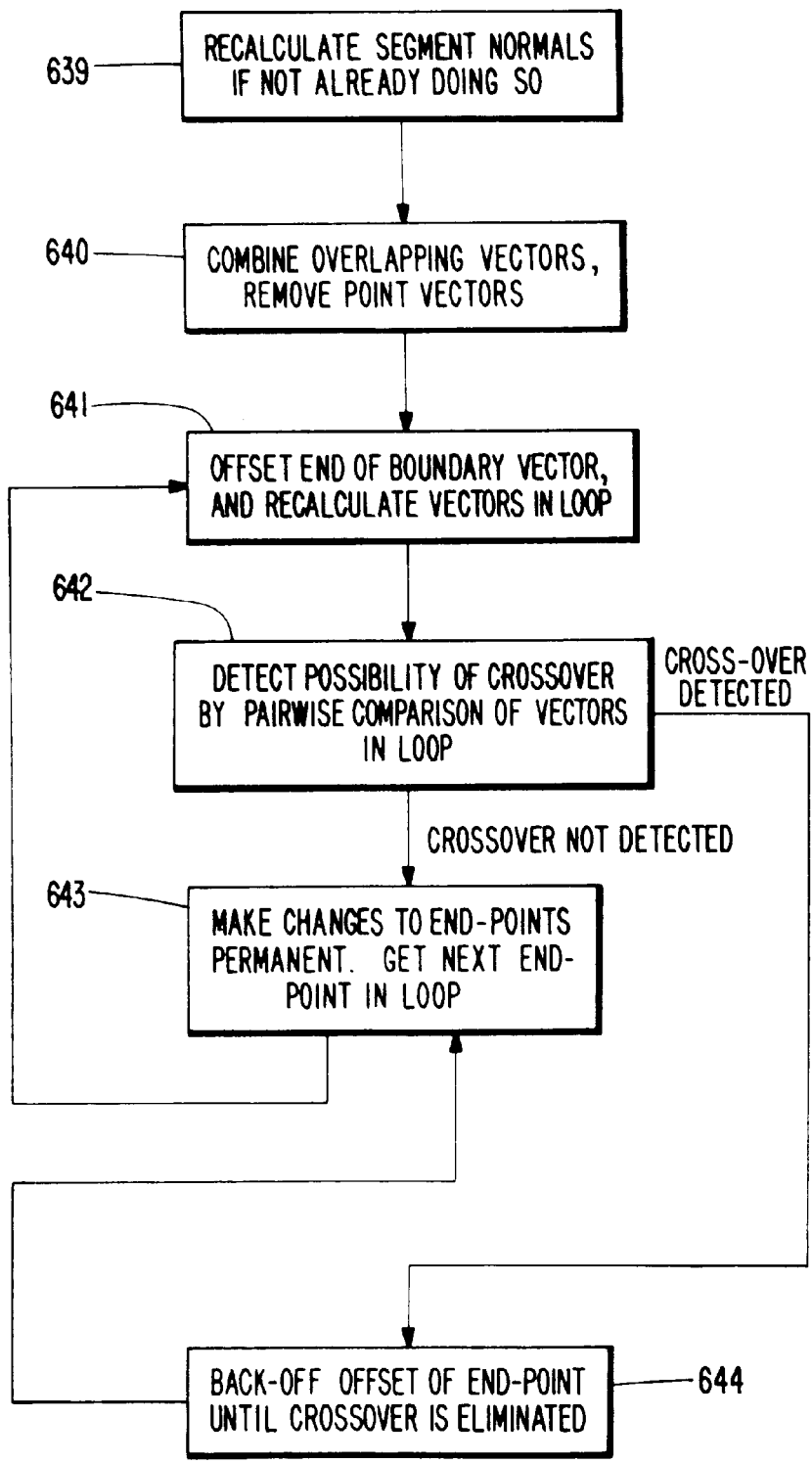
FIG. 85 is a flow chart illustrating the beam width compensation substeps.

The beam width compensation substeps for each border vector type will be the same, which substeps are flowcharted in FIG. 85. As indicated, in substep 639, the segment normals for the boundary vectors are recomputed if not already done so in previous processing steps. As indicated in FIG. 84, the recalibration of segment normals is presently being performed for all but the boundary layer vectors. In the absence of beam width compensation, it is not necessary to recompute the segment normals for these vectors, since they are only being used to generate hatch and skin fill vectors, and any flips of segments normals will be corrected for by the "net summation" hatch or skin fill vector generation algorithm.

With beam width compensation, however, the segment normals are used in the offsetting substep (substep 641 in FIG. 85) to determine in what direction the offset should be. Since the segment normals should point away from a solid, the offset is performed in the opposite direction to the segment normal. Therefore, it is now necessary to recompute segment normals for layer border vectors. For the other border vector types, this substep, indicated as optional in the FIGS. 58 and 72 flowcharts, is mandatory in FIGS. 84 and 85. As discussed earlier, segment normals may get reversed because of the flipping of triangles due to rounding. In this substep, they are corrected for by using-the left hand rule, and by checking against the segment normals of other border vectors in the loop.

In substep 640, overlapping border vectors are combined, and point vectors are removed. This substep is performed because it allows small vectors to be attached to longer vectors thereby removing some of the improper offsetting that results from limiting endpoint offsetting when the only fear of crossover exists instead of basing offset limiting what this step really does is attempt to line up vectors that changed directions due to integration. In addition, this substep represents a significant departure of SLICE version 3.20 from past versions of SLICE. Since it lays the ground work for implementing the improved offsetting algorithm based on crossover detect.

Substeps 641–644 have already been discussed extensively. In substep 641, an endpoint of a boundary vector is offset in the direction opposite its segment normal, and the boundary vectors tentatively recomputed. In substep 642, a precise comparison of the boundary vectors in the loop is performed to detect a crossover. If a crossover is not detected, in substep 643, the changes to the boundary vectors are made permanent, and the process repeats with the next endpoint in the loop. If a crossover is detected, in substep 644, the endpoint last offset is backed up until the crossover is eliminated, the border vectors recomputed and the changes made permanent, and the process is repeated with the next endpoint in the loop.

WEB SUPPORTS

Web supports are described in related co-pending U.S. patent application Ser. No. 182,801, now U.S. Pat. No. 4,999,143 which is herein incorporated by reference as though set forth in full herein. In addition, web supports are described in Appendix D of that application, which appendix is also filed as Appendix D with the subject application.

Web supports are presently being used to support a part while it is being created and possibly post-cured. Their primary advantage is that they provide good structural support parallel to the axis of the support, which is the axis along which the web is formed.

Another benefit of web supports is their ease of creation. At present, there are two ways to create web supports: 1) in the CAD/CAM system, wherein the web supports are defined each as individual miniature boxes, i.e. tall, long and narrow, and 2) by creating a box with internal cross-hatching below the part being cured. In this latter approach, the already implemented SLICE algorithms for generating hatch vectors could be used to generate the web supports. The box could be created in a separate .STL file, placed into its own SLI file, then merged with the Object SLI file after slicing. Specifically, a straight web could be created by hatching in the X or Y-directions (not both). A crisscrossed web support could be implemented by hatching in the X and Y directions. A triangular web support could be implemented by hatching at 60/120 degrees and in either the X or the Y directions. In addition, the hatch spacing should be chosen to be 1/411 to ill depending on the support needed.

A third benefit is that the platform of the z-stage elevator typically has holes in it, and web supports will not fall into the holes, unlike other types of supports, which can.

A fourth benefit is that web supports will be built on the platform at the time when the part is being built. Each layer of the part is cured by first curing its border vectors, followed by its hatch or skin fill vectors. In curing the polymer at the border, a problem called birdnesting may arise. Birdnesting is a distortion that occurs when cured polymer representing a border of a layer is cured and left free-floating in the resin. The distortion results through the delay in the drawing of hatch and skin fill vectors, which will provide structure to the border. By the time the hatch or skin fill vectors are drawn, the border may have moved due to movement of the liquid polymer in which it is floating. Birdnesting is discussed in more detail in related co-pending U.S. patent application Ser. No. 183,015, now U.S. Pat. No. 5,015,424 which is herein incorporated by reference as though set forth in full herein.

By drawing web supports before part boundaries they help solve the birdnesting problem since they provide a support that the polymer created by drawing the border vectors can adhere to before the hatch and skin fill vectors are drawn. With other types of supports, i.e. post supports, the polymer drawn from the border vectors will typically surround and not adhere to the posts, so that birdnesting still will be a problem.

The new and improved stereolithographic method and apparatus has many advantages over currently used methods for producing plastic objects. The method avoids the need of producing tooling drawings and tooling. The designer can work directly with the computer and a stereolithographic device, and when he is satisfied with the design as displayed on the output screen of the computer, he can fabricate a part for direct examination information defining the object being specially processed to reduce cure and distortion, and increase resolution, strength and accuracy of reproduction. If the design has to be modified, it can be easily done through the computer, and then another part can be made to verify that the change was correct. If the design calls for several parts with interacting design parameters, the method becomes even more useful because all of the part designs can be quickly changed and made again so that the total assembly can be made and examined, repeatedly if necessary. Moreover, the data manipulation techniques of the present invention enable production of objects with reduced stress, curl and distortion, and increased resolution, strength accuracy, speed and economy of production, even for difficult and complex object shapes.

After the design is complete, part production can begin immediately, so that the weeks and months between design and production are avoided. Ultimate production rates and parts costs should be similar to current injection molding costs for short run production, with even lower labor costs than those associated with injection molding. Injection molding is economical only when large numbers of identical parts are required. Stereolithography is particularly useful for short run production because the need for tooling is eliminated and production set-up time is minimal. Likewise, design changes and custom parts are easily provided using the technique. Because of the ease of making parts, stereolithography can allow plastic parts to be used in many places where metal or other material parts are now used. Moreover, it allows plastic models of objects to be quickly and economically provided, prior to the decision to make more expensive metal or other material parts.

While a variety of stereolithographic systems have been disclosed for the practice of the present invention, they all have in common the concept of drawing upon a substantially two-dimensional surface and extracting a three-dimensional object from that surface.

The present invention satisfies a long existing need in the art for a CAD and CAM system capable of rapidly, reliably, accurately and economically designing and fabricating three-dimensional plastic parts and the like.

It will be apparent from the foregoing that, while particular forms of the invention have been illustrated and described, various modifications can be made without departing from the spirit and scope of the invention. Accordingly, it is not intended that the invention be limited, except as by the appended claims.

What is claimed is:

1. Apparatus for forming a three-dimensional object on a substantially cross-section by cross-section basis from a building material which is normally in a solid state and which is flowable when maintained at or above a flowable temperature, comprising:

at least one computer programmed to convert data descriptive of a faceted representation of the object into data descriptive of object cross-sections;

means for maintaining the building material at or above the flowable temperature thereby forming flowable building material;

a dispenser responsive to the at least one computer for selectively dispensing successive layers of the flowable building material according to the data descriptive of object cross-sections; and a building environment which is maintained below the flowable temperature and into which the flowable building material is dispensed.

2. A method for forming a three-dimensional object on a substantially cross-section by cross-section basis from a building material which is normally in a solid state and which is flowable when maintained at or above a flowable temperature, comprising:

providing data descriptive of a faceted representation of the object;

converting the data to data descriptive of object cross-sections;

maintaining the building material at or above the flowable temperature thereby forming flowable building material; and selectively dispensing successive layers of the flowable building material according to the data descriptive of object cross-sections into a building environment which is maintained below the flowable temperature to form a three-dimensional object.

3. Apparatus for forming a three-dimensional object on a substantially cross-section by cross-section basis from a building material which is normally in a solid state and which is flowable when maintained at or above a flowable temperature,. comprising:

means for maintaining the building material at or above the flowable temperature thereby forming flowable building material;

a building environment maintained at a temperature below the flowable temperature;

at least one computer coupled to a CAD computer, the at least one computer programmed to convert data descriptive of the object generated on the CAD computer to data descriptive of a faceted representation of the object, and convert the data descriptive of the faceted object representation to data descriptive of object cross-sections; and a dispenser responsive to the at least one computer for selectively dispensing successive layers of the flowable material into the building environment according to the data descriptive of object cross-sections.

4. A method for forming a three-dimensional object on a substantially cross-section by cross-section basis from a building material which is normally in a solid state and which is flowable when maintained at or above a flowable temperature, comprising:

maintaining the building material at or above the flowable temperature thereby forming flowable building material;

providing a building environment maintained at a temperature below the flowable temperature;

providing data descriptive of the object generated on a CAD computer;

converting the data descriptive of the object to data descriptive of a faceted representation of the object;

converting the data descriptive of the faceted object representation to data descriptive of object cross-sections; and selectively dispensing the flowable building material into the building environment according to the data descriptive of object cross-sections to form a three dimensional object.

5. Apparatus for forming a three-dimensional object on a substantially cross-section by cross-section basis from a building material which is normally in a solid state and which is flowable when maintained at or above a flowable temperature, comprising:

means for maintaining the building material at or above the flowable temperature thereby forming flowable building material;

a building environment maintained at a temperature below the flowable temperature;

at least one computer programmed to convert data descriptive of the object into data descriptive of cross-sections of the object, the cross-sectional data specifying at least in part, portions of a cross-section where building material is to be dispensed thereby creating areas between the portions on that cross-section substantially without dispensed building material: and a dispenser responsive to the at least one computer for selectively dispensing successive layers of the flowable building material into the building environment according to the cross-sectional data.

6. The apparatus of claim 5 wherein the at least one computer converts data which specifies portions of the cross-section that comprise lines where building material is to be disposed.

7. A method for forming a three-dimensional object on a substantially cross-section by cross-section basis from a building material which is normally in a solid state and which is flowable when maintained at or above a flowable temperature, comprising:

maintaining the building material at or above the flowable temperature thereby forming flowable building material;

providing a building environment maintained at a temperature below the flowable temperature;

converting data descriptive of the object into data descriptive of cross-sections of the object, the cross-sectional data specifying at least in part, portions on a cross-section where building material is to be dispensed thereby creating areas between the portions on that cross-section substantially without dispensed building material: and selectively dispensing successive layers of the flowable building material into the building environment according to the cross-sectional data to form a three-dimensional object.

8. The method of claim 7 wherein the portions comprise lines.

9. Apparatus for forming a three-dimensional object on a substantially cross-section by cross-section basis from a building material which is normally in a solid state and which is flowable when maintained at or above a flowable temperature, comprising:

means for maintaining the building material at or above the flowable temperature thereby forming flowable building material;

a building environment maintained at a temperature below the flowable temperature;

at least one computer programmed to convert a representation of the object to representations of object cross-sections, the cross-sectional representations specifying first areas on a cross-section where building material is to be dispensed and second areas on that cross-section substantially without dispensed building material, the first areas enclosing the second areas, the second areas originally being solid in the representation of the object; and a dispenser responsive to the at least one computer for selectively dispensing successive layers of the flowable building material Into the building environment according to the cross-sectional representations.

10. A method for forming a three-dimensional object on a substantially cross-section by cross-section basis from a building material which is normally in a solid state and which is flowable when maintained at or above a flowable temperature, comprising:

maintaining the building material at or above the flowable temperature thereby forming flowable building material;

providing a building environment maintained at a temperature below the flowable temperature;

converting a representation of the object to representations of object cross-sections, the cross-sectional representation specifying first areas on a cross-section where building material is to be dispensed and second areas on that cross-section substantially without dispensed building material the first areas enclosing the second areas, the second areas originally being solid in the representation of the object; and selectively dispensing successive layers of the flowable building material into the building environment according to the cross-sectional representations to form a three-dimensional object.

\* \* \* \* \*